US011502261B2

(12) United States Patent
Hong et al.

(10) Patent No.: US 11,502,261 B2
(45) Date of Patent: Nov. 15, 2022

(54) COMPOUND AND ORGANIC LIGHT EMITTING DEVICE USING THE SAME

(71) Applicant: LG CHEM, LTD., Seoul (KR)

(72) Inventors: Wanpyo Hong, Daejeon (KR); Min Seung Chun, Daejeon (KR); Kyung Seok Jeong, Daejeon (KR); Jin Joo Kim, Daejeon (KR); Ok Keun Song, Daejeon (KR); Hongsik Yoon, Daejeon (KR)

(73) Assignee: LG CHEM LTD., Seoul (KR)

( * ) Notice: Subject to any disclaimer, the term of this patent is extended or adjusted under 35 U.S.C. 154(b) by 545 days.

(21) Appl. No.: 16/487,420

(22) PCT Filed: May 2, 2018

(86) PCT No.: PCT/KR2018/005102
§ 371 (c)(1),
(2) Date: Aug. 20, 2019

(87) PCT Pub. No.: WO2018/203666
PCT Pub. Date: Nov. 8, 2018

(65) Prior Publication Data

US 2020/0058885 A1 Feb. 20, 2020

(30) Foreign Application Priority Data

May 2, 2017 (KR) ........................ 10-2017-0056389

(51) Int. Cl.
*H01L 51/50* (2006.01)
*H01L 51/00* (2006.01)
(Continued)

(52) U.S. Cl.
CPC ........ *H01L 51/0094* (2013.01); *C07F 7/0812* (2013.01); *C09K 11/06* (2013.01);
(Continued)

(58) Field of Classification Search
None
See application file for complete search history.

(56) References Cited

U.S. PATENT DOCUMENTS 7,846,558 B2 12/2010 Je et al.
2009/0053557 A1* 2/2009 Spindler ............ H01L 51/0058 428/690
(Continued)

FOREIGN PATENT DOCUMENTS

CN 106467554 A 3/2017
JP 2011243597 A 12/2011
(Continued)

OTHER PUBLICATIONS

Takuji Hatakeyama, et al., "Ultrapure Blue Thermally Activated Delayed Fluorescence Molecules: Efficient HOMO-LUMO Separation by the Multiple Resonance Effect", Advanced Material, 2016, vol. 28, pp. 2777-2781.
(Continued)

*Primary Examiner* — Gregory D Clark
(74) *Attorney, Agent, or Firm* — Dentons US LLP

(57) ABSTRACT

The present disclosure relates to a compound represented by Formula 1 and an organic light emitting device using the same. The compound used as a material of an organic
(Continued)

material layer of the organic light emitting device provides improved efficiency, low driving voltage, and improved lifetime characteristic.

11 Claims, 3 Drawing Sheets

(51) Int. Cl.
*C07F 7/08* (2006.01)
*C09K 11/06* (2006.01)

(52) U.S. Cl.
CPC .... *C09K 2211/1018* (2013.01); *H01L 51/001* (2013.01); *H01L 51/5012* (2013.01); *H01L 51/5016* (2013.01)

(56) References Cited

U.S. PATENT DOCUMENTS

| | | | |
|---|---|---|---|
| 2014/0058099 A1 | 2/2014 | Wakamiya et al. | |
| 2015/0236274 A1 | 8/2015 | Hatakeyama et al. | |
| 2016/0152418 A1 | 6/2016 | Morgan | |
| 2016/0268520 A1 | 9/2016 | Mizuki et al. | |
| 2018/0094000 A1* | 4/2018 | Hatakeyama | H01L 51/008 |
| 2018/0301629 A1 | 10/2018 | Hatakeyama et al. | |
| 2020/0020859 A1* | 1/2020 | Hatakeyama | C07F 5/027 |

FOREIGN PATENT DOCUMENTS

| | | | |
|---|---|---|---|
| JP | 2012234873 | A | 11/2012 |
| KR | 1020000051826 | A | 8/2000 |
| KR | 1020140013001 | A | 2/2014 |
| KR | 1020160119683 | A | 10/2016 |
| TW | 201638096 | A | 11/2016 |
| WO | 2003012890 | A2 | 2/2003 |
| WO | 2015041352 | A1 | 3/2015 |
| WO | 20160152418 | A1 | 9/2016 |
| WO | 20160152544 | A1 | 9/2016 |
| WO | 20150102118 | A1 | 3/2017 |

OTHER PUBLICATIONS

Soichiro Nakatsuka, et al., “Divergent Synthesis of Heteroatom-Centered 4,8,12-Triazatriangulenes”, Angewandte Chemie, Mar. 29, 2017, vol. 129, pp. 5169-5172.

Truong Ba Tai, et al., “Theoretical Design of n-Conjugated Heteropolycyclic Compounds Containing a Tricoordinated Boron Center”, The Journal of Physical Chemistry, 2013, vol. 117, pp. 14999-15008.

* cited by examiner

【FIG. 1】
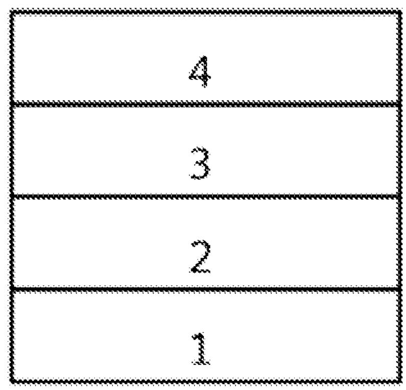
【FIG. 2】
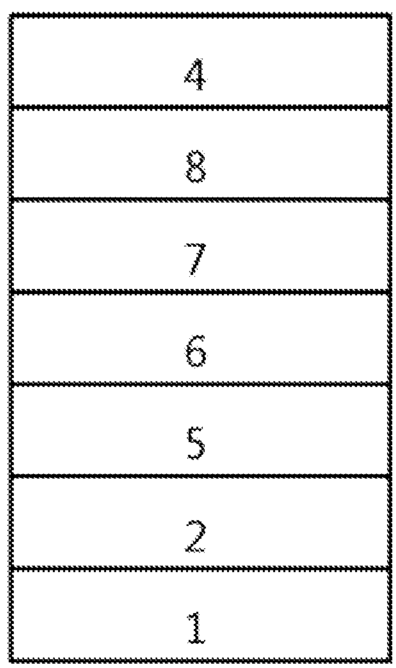

【FIG. 3】
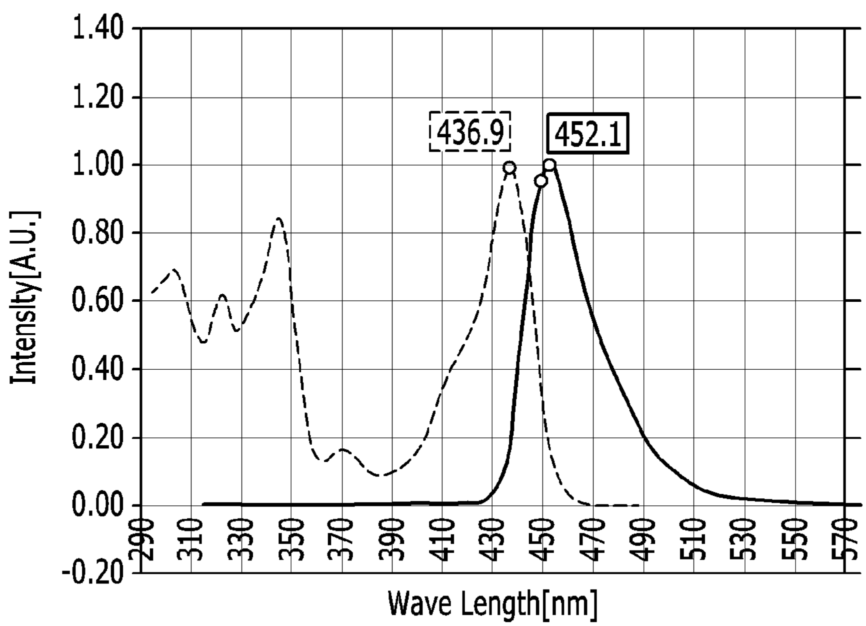

【FIG. 4】
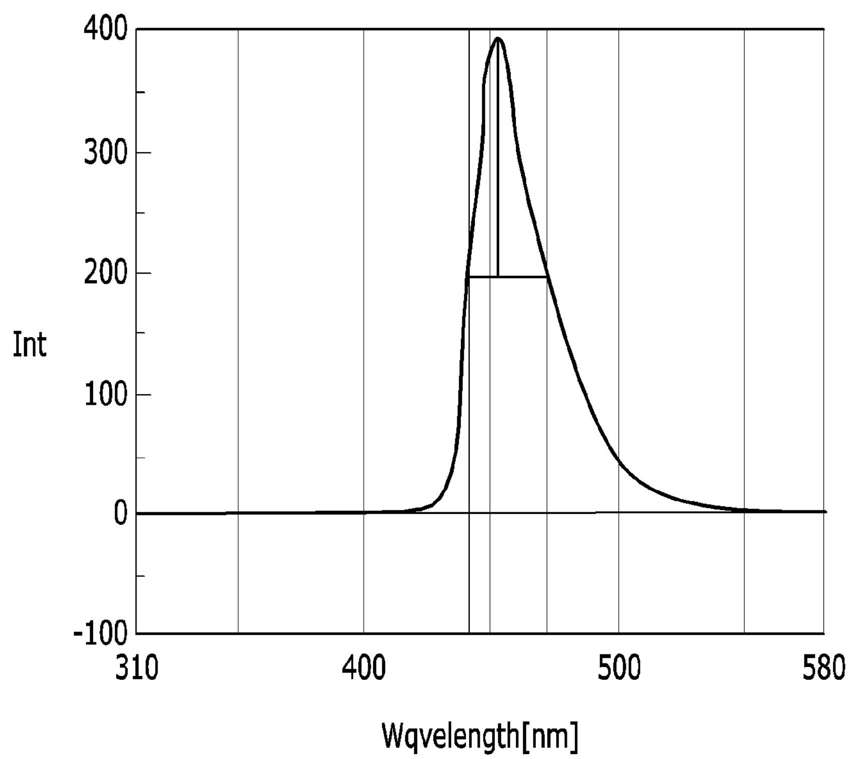

COMPOUND AND ORGANIC LIGHT EMITTING DEVICE USING THE SAME

CROSS-REFERENCE TO RELATED APPLICATION(S)

This application claims the benefit of priority of Korean Patent Application No. 10-2017-0056389 filed on May 2, 2017, the full disclosure of which is incorporated herein by reference.

TECHNICAL FIELD

The present disclosure relates to a novel compound and an organic light emitting device including the same.

BACKGROUND ART

In general, an organic light emitting phenomenon refers to one where electrical energy is converted into light energy by using an organic material. The organic light emitting device using the organic light emitting phenomenon has characteristics such as a wide viewing angle, excellent contrast, a fast response time, and excellent luminance, driving voltage, and response speed, and thus many studies have proceeded.

The organic light emitting device generally has a structure which includes an anode, a cathode, and an organic material layer interposed between the anode and the cathode. The organic material layer frequently has a multilayered structure that includes different materials in order to enhance efficiency and stability of the organic light emitting device, and for example, the organic material layer may be formed of a hole injection layer, a hole transport layer, a light emitting layer, an electron transport layer, an electron injection layer, and the like. In the structure of the organic light emitting device, if a voltage is applied between two electrodes, the holes are injected from an anode into the organic material layer and the electrons are injected from the cathode into the organic material layer, and when the injected holes and the electrons meet each other, excitons are formed, and light is emitted when the excitons fall to a ground state again.

There is a continuing need for the development of new materials for the organic materials used in such organic light emitting devices.

RELATED ART

Patent Literature (Patent Literature 0001) Korean Patent Laid-open Publication No. 10-2000-0051826

DETAILED DESCRIPTION OF THE DISCLOSURE

Technical Problem

The present disclosure relates to a novel compound and an organic light emitting device including the same.

Technical Solution

The present disclosure provides a compound represented by the following Formula 1, or containing a structural unit represented by the following Formula 1:

[Formula 1]

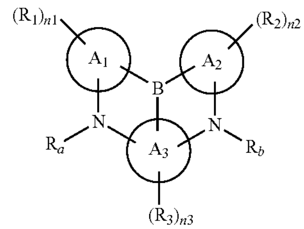

wherein, in Formula 1, rings $A_1$ to $A_3$ are each independently a $C_{6-20}$ aromatic ring or a $C_{2-60}$ heteroaromatic ring containing at least one heteroatom selected from the group consisting of N, O, and S, $R_a$, $R_b$, and $R_1$ to $R_3$ are each independently hydrogen; deuterium; a halogen; a cyano; a nitro; a substituted or unsubstituted silyl; a substituted or unsubstituted amino; a substituted or unsubstituted $C_{1-60}$ alkyl; a substituted or unsubstituted $C_{1-60}$ haloalkyl; a substituted or unsubstituted $C_{1-60}$ alkoxy; a substituted or unsubstituted $C_{1-60}$ haloalkoxy; a substituted or unsubstituted $C_{3-60}$ cycloalkyl; a substituted or unsubstituted $C_{2-60}$ alkenyl; a substituted or unsubstituted $C_{6-60}$ aryl; a substituted or unsubstituted $C_{6-60}$ aryloxy; or a substituted or unsubstituted $C_{2-60}$ heteroaryl containing at least one heteroatom selected from the group consisting of N, O, and S, with the proviso that at least one of $R_a$, $R_b$, and $R_1$ to $R_3$ is a substituted or unsubstituted silyl group, or is substituted with a silyl group, $R_a$ is optionally connected to the ring $A_1$ or $A_3$ by a single bond, —O—, —S—, —C $(Q_1)(Q_2)$-, or —$N(Q_3)$-, $R_b$ is optionally connected to the ring $A_2$ or $A_3$ by a single bond, —O—, —S—, —$C(Q_4)(Q_5)$-, or —$N(Q_6)$, and the rings $A_1$ and $A_2$ are optionally connected to each other by a single bond, —O—, —S—, —$C(Q_7)(Q_8)$-, or —$N(Q_9)$-, wherein $Q_1$ to $Q_9$ are each independently hydrogen; deuterium; a $C_{1-10}$ alkyl; or a $C_{6-20}$ aryl, and n1 to n3 are each independently an integer of 0 to 10.

The present disclosure also provides an organic light emitting device including: a first electrode; a second electrode provided at a side opposite to the first electrode; and at least one layer of the organic material layers provided between the first electrode and the second electrode, wherein the at least one layer of the organic material layers includes a compound represented by Formula 1.

Advantageous Effects

The compound represented by Formula 1 described above can be used as a material of an organic material layer of an organic light emitting device, and enable improvement of the efficiency, low driving voltage, and/or improvement of the lifetime characteristic when applied to the organic light emitting device.

BRIEF DESCRIPTION OF DRAWINGS

FIG. 1 shows an example of an organic light emitting device including a substrate 1, an anode 2, a light emitting layer 3, and a cathode 4.

FIG. 2 shows an example of an organic light emitting device including a substrate 1, an anode 2, a hole injection layer 5, a hole transport layer 6, a light emitting layer 7, an electron transport layer 8, and a cathode 4.

FIG. 3 is a graph in which the absorption peak wavelength of the compound 1 is measured by fluorescence spectrophotometry.

FIG. 4 is a graph in which the half-value width of the compound 1 is measured by fluorescence spectrophotometry.

DETAILED DESCRIPTION OF THE EMBODIMENTS

Hereinafter, the present disclosure will be described in more detail in order to aid in understanding the disclosure.

In the present specification,

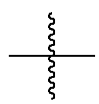

means a bond connected to another substituent group.

As used herein, the term "substituted or unsubstituted" means that substitution is performed by one or more substituent groups selected from the group consisting of deuterium; a halogen group; a cyano group; a nitro group; a hydroxyl group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; or a heterocyclic group containing at least one of N, O, and S atoms, or there is no substituent group, or substitution is performed by a substituent group where two or more substituent groups of the exemplified substituent groups are connected or there is no substituent group. For example, the term "substituent group where two or more substituent groups are connected" may be a biphenyl group. That is, the biphenyl group may be an aryl group, or may be interpreted as a substituent group where two phenyl groups are connected.

In the present specification, the number of carbon atoms in a carbonyl group is not particularly limited, but is preferably 1 to 40. Specifically, the carbonyl group may be compounds having the following structures, but is not limited thereto.

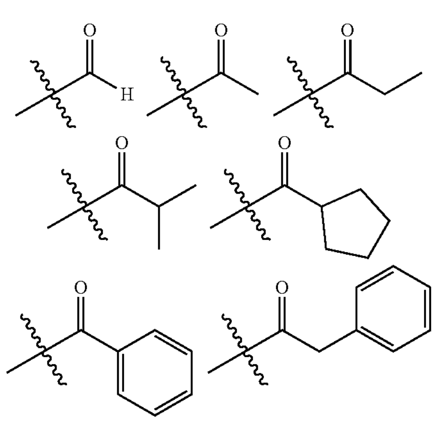

In the present specification, the ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be compounds having the following structures, but is not limited thereto.

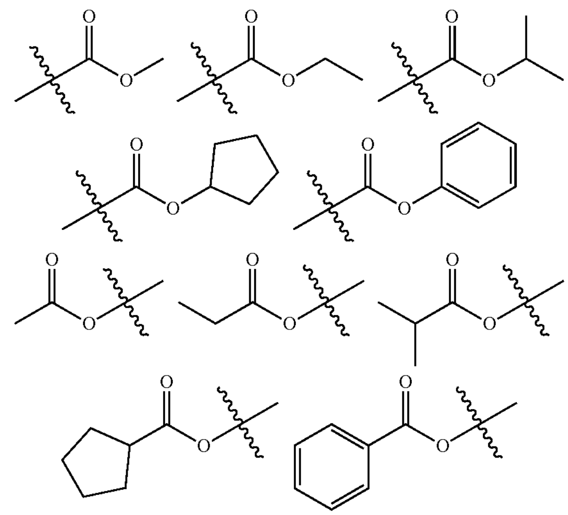

In the present specification, the number of carbon atoms in an imide group is not particularly limited, but is preferably 1 to 25. Specifically, the imide group may be compounds having the following structures, but is not limited thereto.

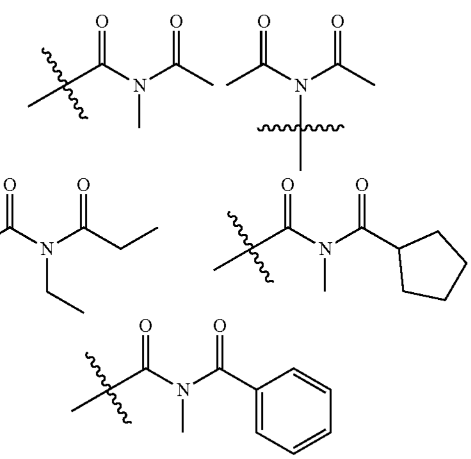

In the present specification, the silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but is not limited thereto.

In the present specification, the boron group specifically includes a trimethylboron group, a triethylboron group, a t-butyldimethylboron group, a triphenylboron group, a phenylboron group, and the like, but is not limited thereto.

In the present specification, examples of a halogen group include fluorine, chlorine, bromine, and iodine.

In the present specification, the alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present specification, the alkenyl group may be a straight chain or a branched chain, and the number of carbon atoms thereof is not particularly limited, but is preferably 2 to 40. According to one embodiment, the alkenyl group has 2 to 20 carbon atoms. According to another embodiment, the alkenyl group has 2 to 10 carbon atoms. According to still another embodiment, the alkenyl group has 2 to 6 carbon atoms. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenyl-vinyl-1-yl, 2-phenyl-2-(naphthyl-1-yl)vinyl-1-yl, 2,2-bis(di-phenyl-1-yl)vinyl-1-yl, a stilbenyl group, a styrenyl group, and the like, but are not limited thereto.

In the present specification, the cycloalkyl group is not particularly limited, but the number of carbon atoms thereof is preferably 3 to 60. According to one embodiment, the cycloalkyl group has 3 to 30 carbon atoms. According to another embodiment, the cycloalkyl group has 3 to 20 carbon atoms. According to another embodiment, the cycloalkyl group has 3 to 6 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the aryl group is not particularly limited, but preferably has 6 to 60 carbon atoms, and may be a monocyclic aryl group or a polycyclic aryl group. According to one embodiment, the aryl group has 6 to 30 carbon atoms. According to another embodiment, the aryl group has 6 to 20 carbon atoms. The aryl group may be a phenyl group, a biphenyl group, a terphenyl group, or the like as the monocyclic aryl group, but is not limited thereto. Examples of the polycyclic aryl group include a naphthyl group, an anthracenyl group, a phenanthryl group, a pyrenyl group, a perylenyl group, a chrycenyl group, a fluorenyl group, and the like, but are not limited thereto.

In the present specification, a fluorenyl group may be substituted, and two substituent groups may be connected to each other to form a spiro structure. In the case where the fluorenyl group is substituted,

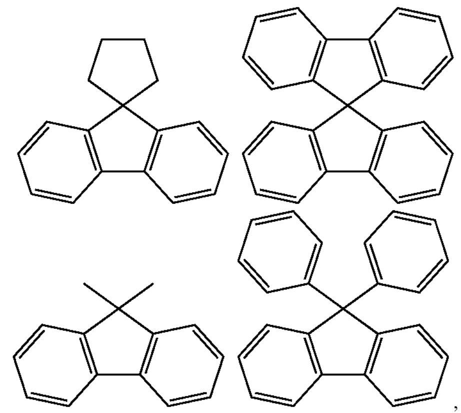

and the like can be formed. However, the structure is not limited thereto.

In the present specification, the heteroaryl group is a heteroaryl group containing at least one of O, N, Si, and S as a heteroatom, and the number of carbon atoms thereof is not particularly limited, but is preferably 2 to 60. Examples of the heteroaryl group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group, and the alkylamine group is the same as the aforementioned examples of the alkyl group. In the present specification, the heteroaryl in the heteroarylamine can be applied to the aforementioned description of the heteroaryl group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heteroaryl group can be applied except that the heteroarylene is a divalent group. In the present specification, the aforementioned description of the aryl group or cycloalkyl group can be applied except that the hydrocarbon ring is not a monovalent group but is formed by combining two substituent groups. In the present specification, the aforementioned description of the heteroaryl group can be applied, except that the heterocycle is not a monovalent group but is formed by combining two substituent groups.

Meanwhile, the present disclosure provides a compound represented by Formula 1 or a compound containing a structural unit represented by Formula 1.

As used herein, the compound containing a structural unit represented by Formula 1 refers to a compound containing at least one monovalent group derived from the structural unit represented by Formula 1; or a compound that is condensed by sharing at least one ring of the rings $A_1$ to $A_3$ of Formula 1.

In addition, the compound represented by Formula 1 or the compound containing a structural unit represented by Formula 1 has at least one substituted or unsubstituted silyl group, or at least one silyl group-substituted group.

Here, the silyl group means all of tri($C_{1-60}$ alkyl)silyl; substituted or unsubstituted tri($C_{6-60}$ aryl)silyl; substituted or unsubstituted di($C_{1-60}$ alkyl)($C_{6-60}$ aryl)silyl; and substituted or unsubstituted ($C_{1-60}$ alkyl)di($C_{6-60}$ aryl)silyl substituents.

Further, the amino group includes all of mono- or di-($C_{1-60}$ alkyl)amino; mono- or di-($C_{6-60}$ aryl)amino; mono- or di-($C_{2-60}$ heteroaryl)amino; ($C_{1-60}$ alkyl)($C_{6-60}$ aryl)amino; and ($C_{6-60}$ aryl)($C_{2-20}$ heteroaryl)amino substituents.

In Formula 1, the rings $A_1$ to $A_3$ may each independently be benzene, naphthalene, carbazole, dibenzofuran, or dibenzothiophene rings.

Specifically, the compound represented by Formula 1 may be represented by one of the following Formulas 1-1 to 1-13:

[Formula 1-1]

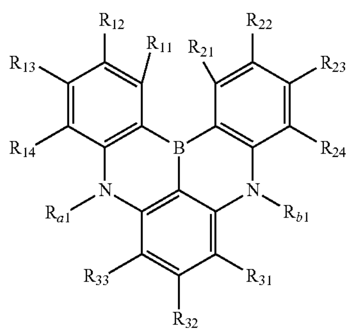

[Formula 1-2]

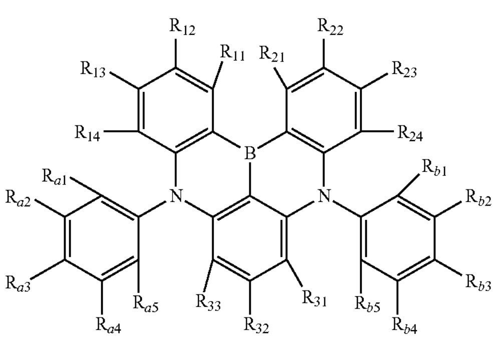

[Formula 1-3]

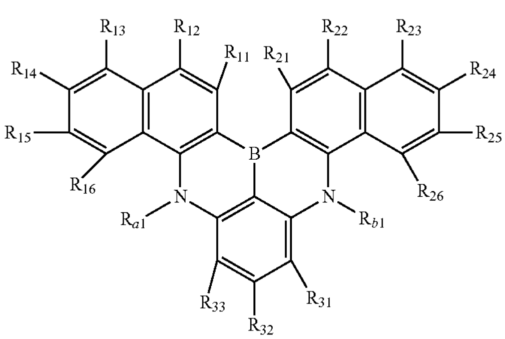

-continued

[Formula 1-4]

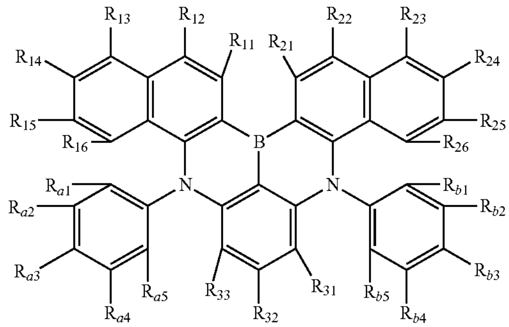

[Formula 1-5]

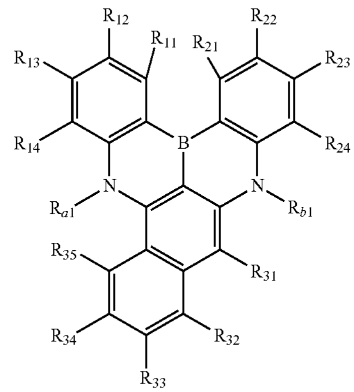

[Formula 1-6]

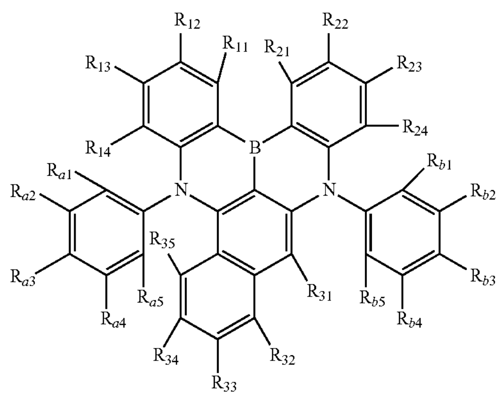

[Formula 1-7]

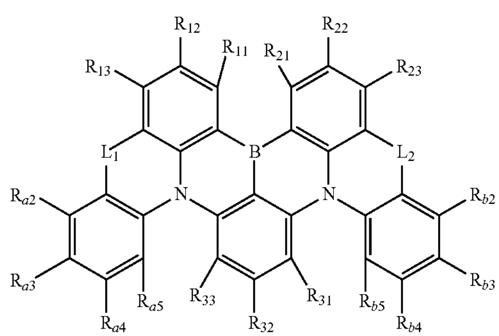

-continued

[Formula 1-8]

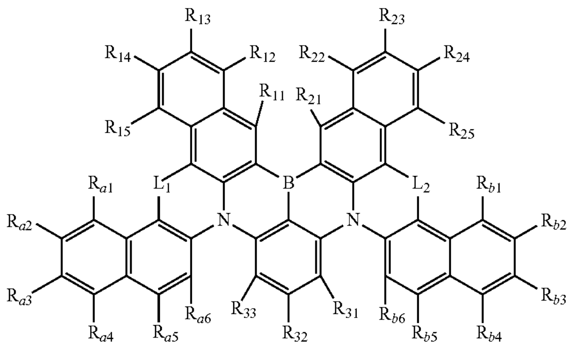

[Formula 1-9]

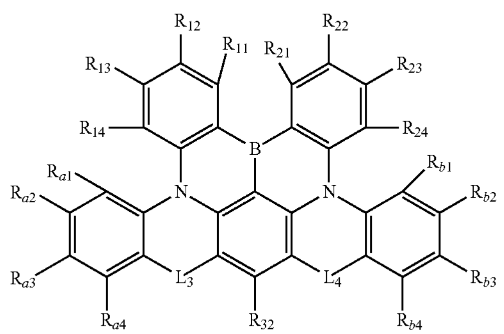

[Formula 1-10]

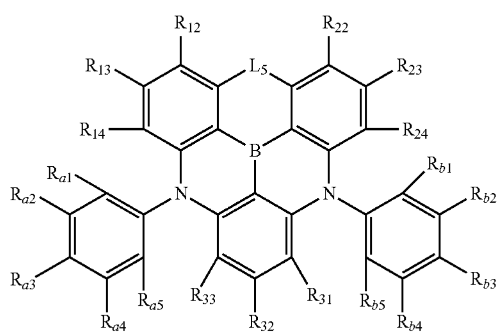

[Formula 1-11]

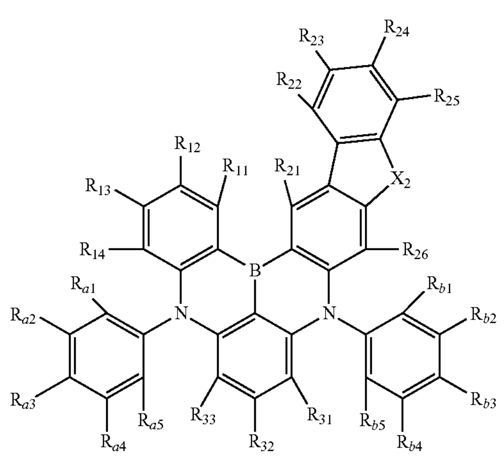

-continued

[Formula 1-12]

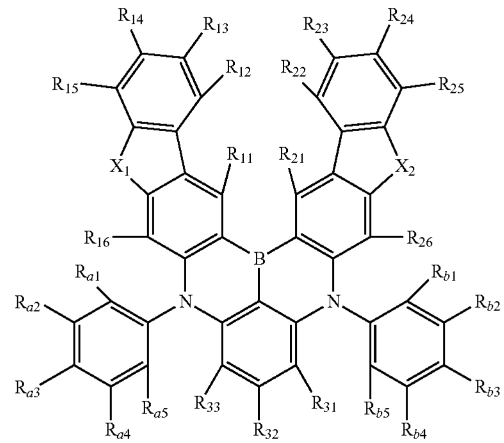

[Formula 1-13]

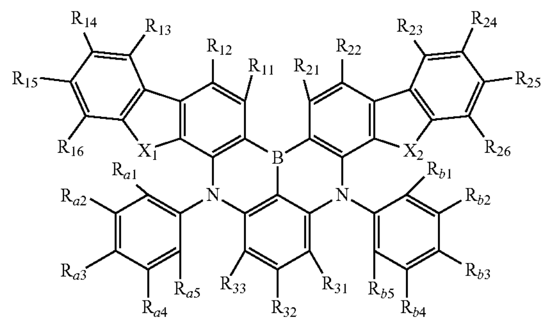

wherein, in Formulas 1-1 to 1-13, $X_1$ and $X_2$ are each independently O, S, or N($C_{6-20}$ aryl), $L_1$ to $L_5$ are each independently a single bond, —O—, —S—, —C($C_{1-4}$ alkyl)($C_{1-4}$ alkyl)-, or —N($C_{6-20}$ aryl)-, $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ are each independently hydrogen; deuterium; a halogen; a substituted or unsubstituted tri($C_{1-20}$ alkyl)silyl; a substituted or unsubstituted tri($C_{6-20}$ aryl)silyl; a substituted or unsubstituted di($C_{6-20}$ aryl)amino; a substituted or unsubstituted ($C_{6-20}$ aryl)($C_{2-20}$ heteroaryl)amino; a substituted or unsubstituted $C_{1-20}$ alkyl; a substituted or unsubstituted $C_{1-20}$ haloalkyl; a substituted or unsubstituted $C_{1-20}$ alkoxy; a substituted or unsubstituted $C_{1-20}$ haloalkoxy; a substituted or unsubstituted $C_{6-20}$ aryl; a substituted or unsubstituted $C_{6-20}$ aryloxy; or a substituted or unsubstituted $C_{2-20}$ heteroaryl containing at least one heteroatom selected from the group consisting of N, O, and S, wherein adjacent substituents of $R_{a1}$ to $R_{a6}$ and $R_{b1}$ to $R_{b6}$ may be connected to each other to form a substituted or unsubstituted $C_{6-20}$ aromatic ring, with the proviso that at least one of $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ in one formula is a substituted or unsubstituted tri($C_{1-20}$ alkyl)silyl group, or a substituted or unsubstituted tri($C_{6-20}$ aryl)silyl group; or is substituted by a tri($C_{1-20}$ alkyl)silyl group or a tri($C_{6-20}$ aryl)silyl group.

For example, in Formulas 1-1 to 1-13, $X_1$ and $X_2$ may each independently be O, S, or N($C_6H_5$).

Further, in Formulas 1-1 to 1-13, $L_1$ to $L_4$ may each independently be a single bond, —O—, —S—, or —C($CH_3$)$_2$-, and $L_5$ may be —N($C_6H_5$)—.

Further, in Formulas 1-1 to 1-13, at least one of $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ in one formula may be —$Si(CH_3)_3$ or —$SiC_6H_5)_3$; or may be substituted by —$Si(CH_3)_3$ or —$Si(C_6H_5)_3$.
Further, in Formulas 1-1 to 1-13, $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ may each independently be hydrogen; deuterium; a halogen; —$Si(CH_3)_3$; —$Si(C_6H_5)_3$; —$CH_3$; —$CH(CH_3)_2$; —$C(CH_3)_3$; —$CF_3$; or —$OCF_3$; and may be selected from the group consisting of:
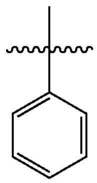
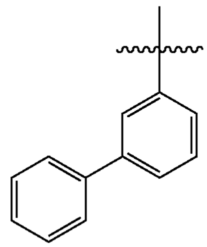
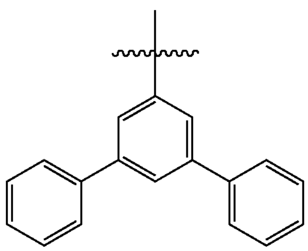
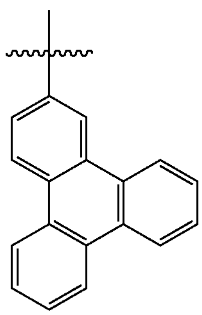
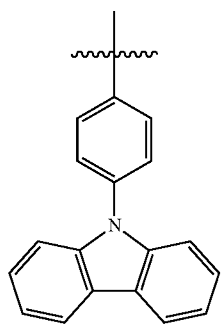
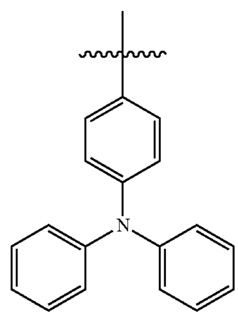
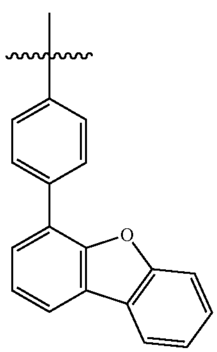
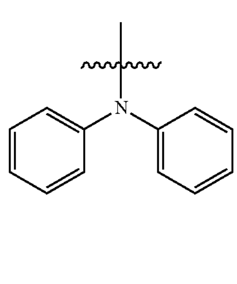
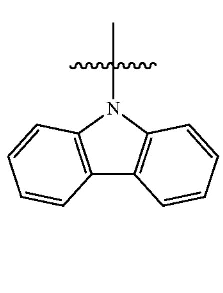
-continued
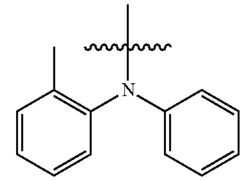
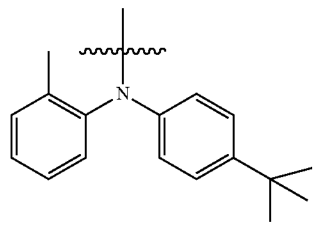
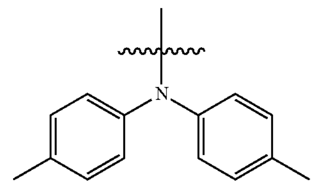
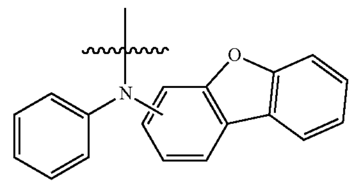
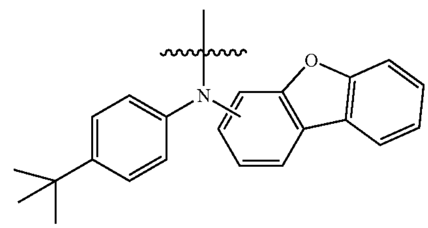
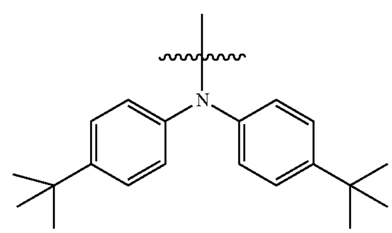
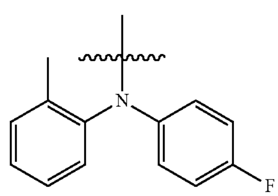
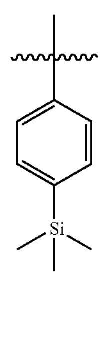
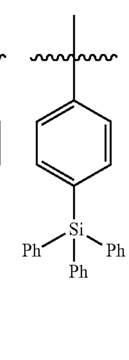

-continued
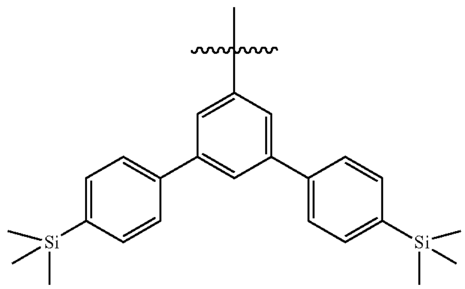
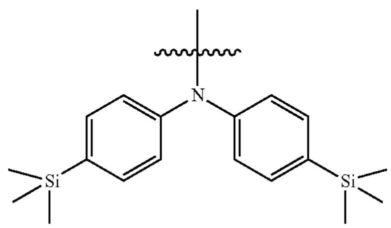
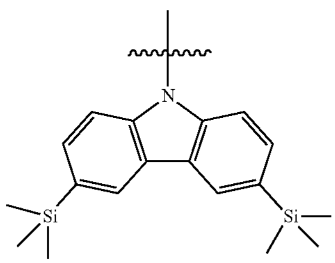
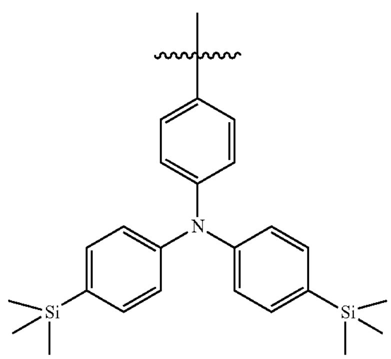
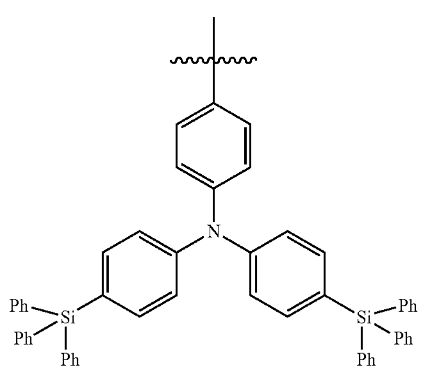
wherein Ph means a phenyl group.
Specifically, for example, the compound represented by Formula 1 can be represented by any one of the following Formulas 1-1A to 1-13A:
[Formula 1-1A]
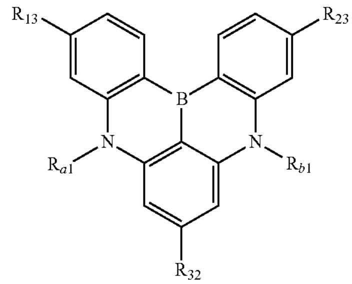
[Formula 1-2A]
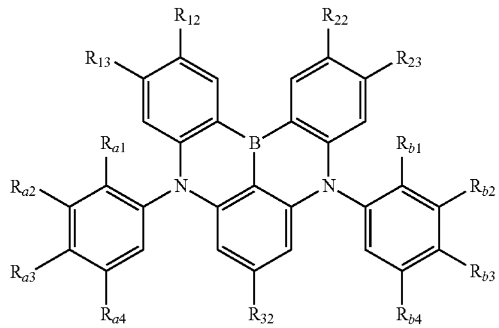
[Formula 1-3A]
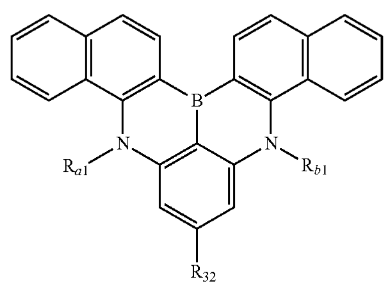
[Formula 1-4A]
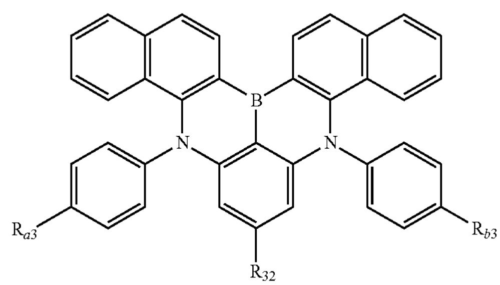
[Formula 1-5A]
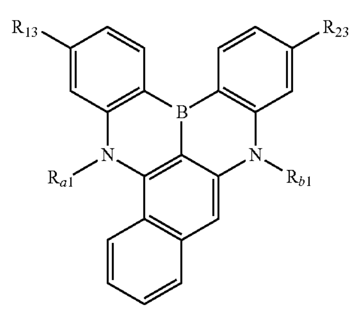

-continued

[Formula 1-6A]

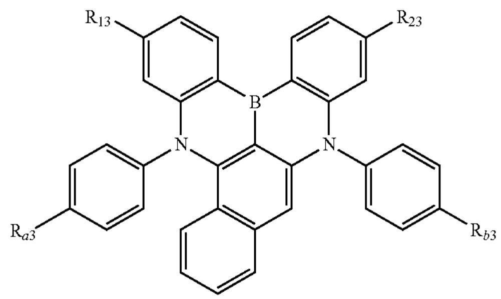

[Formula 1-7A]

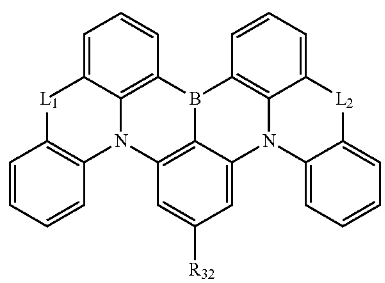

[Formula 1-8A]

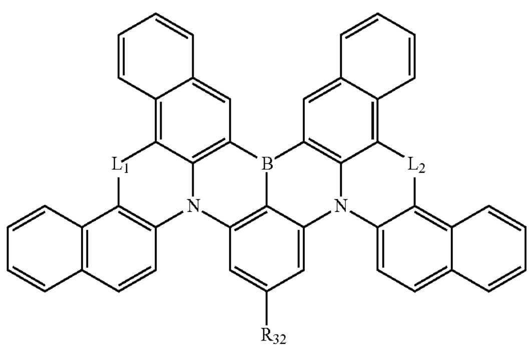

[Formula 1-9A]

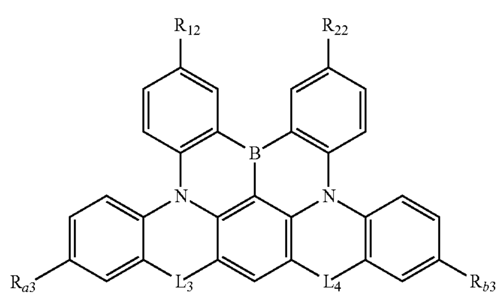

[Formula 1-10A]

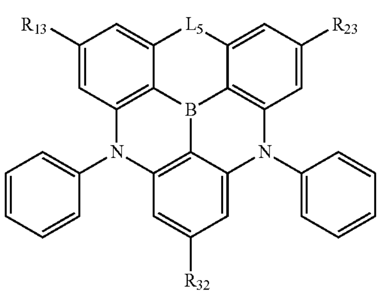

-continued

[Formula 1-11A]

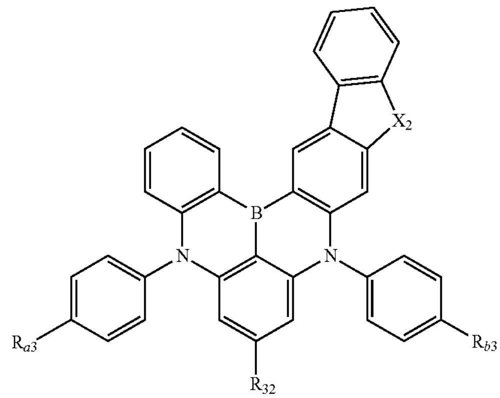

[Formula 1-12A]

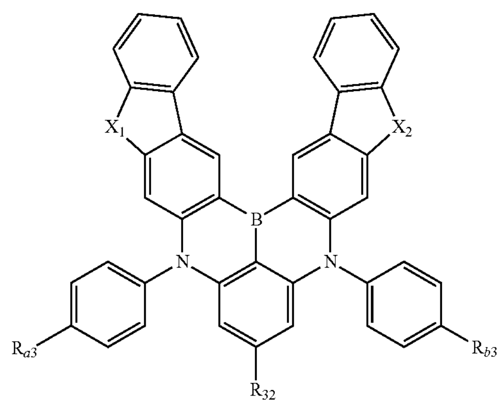

[Formula 1-13A]

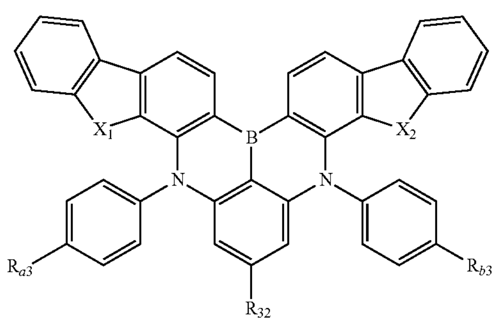

wherein, in Formulas 1-1A to 1-13A, $X_1$, $X_2$, $L_1$ to $L_5$, $R_{a1}$ to $R_{a4}$, $R_{b1}$ to $R_{b4}$, $R_{12}$, $R_{13}$, $R_{22}$, $R_{23}$, and $R_{32}$ are as defined in Formulas 1-1 to 1-13 respectively, with the proviso that at least one of $R_{a1}$ to $R_{a4}$, $R_{b1}$ to $R_{b4}$, $R_{12}$, $R_{13}$, $R_{22}$, $R_{23}$, and $R_{32}$ in one formula is —$Si(CH_3)_3$ or —$Si(C_6H_5)_3$; or is substituted by —$Si(CH_3)_3$ or —$Si(C_6H_5)_3$.

Meanwhile, the compound containing a structural unit represented by Formula 1 may be represented by one of the following Formulas 2-1 to 2-7:
[Formula 2-1]
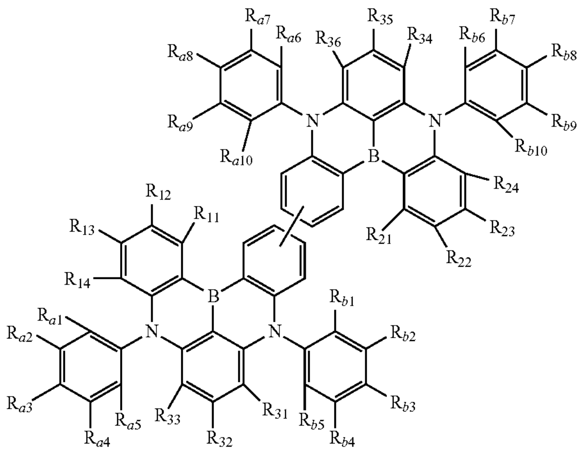
[Formula 2-2]
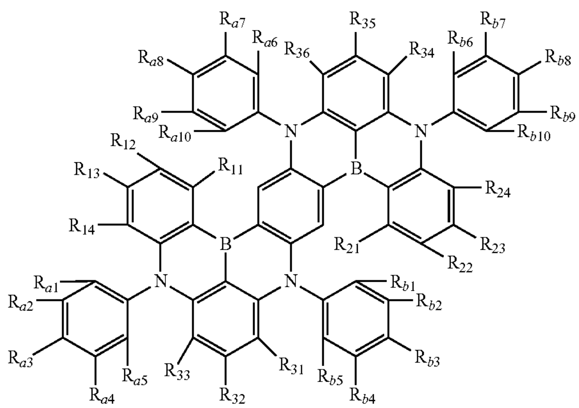
[Formula 2-3]
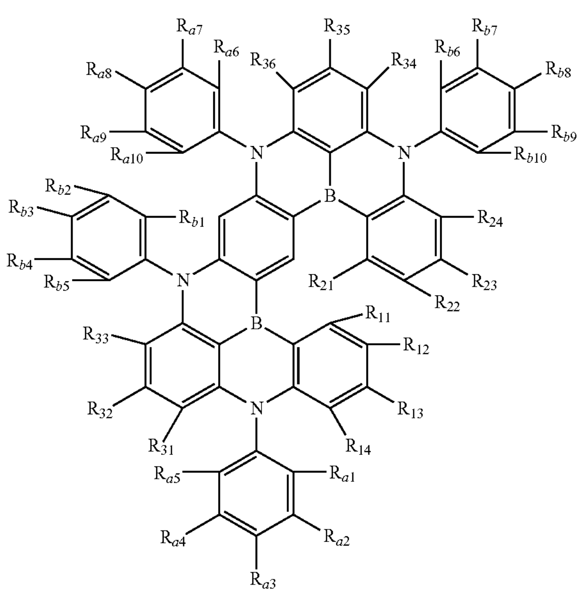
-continued
[Formula 2-4]
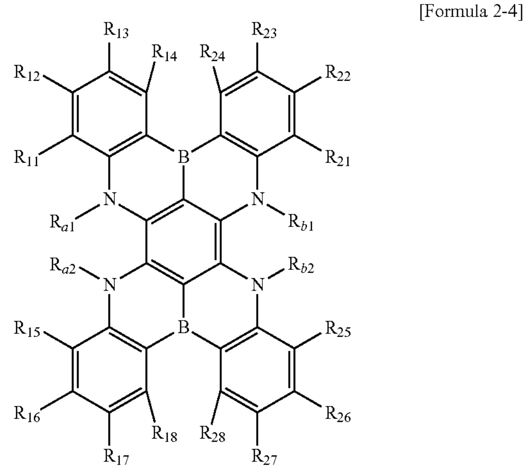
[Formula 2-5]
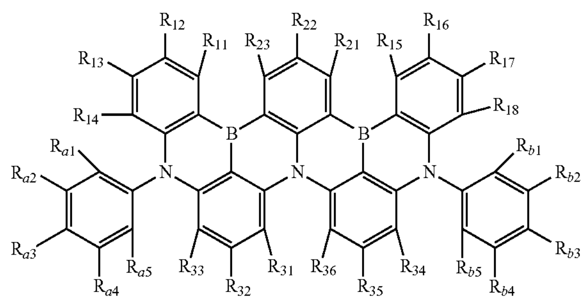
[Formula 2-6]
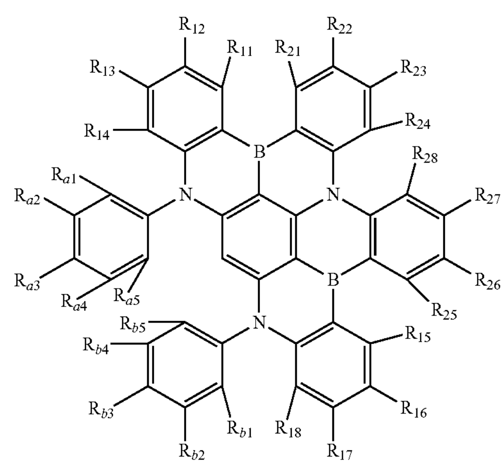

-continued

[Formula 2-7]

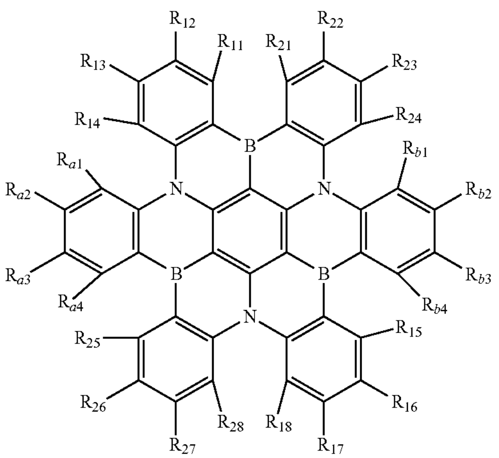

wherein, in Formulas 2-1 to 2-7, $R_{a1}$ to $R_{a10}$, $R_{b1}$ to $R_{b10}$, $R_{11}$ to $R_{18}$, $R_{21}$ to $R_{28}$, and $R_{31}$ to $R_{36}$ are each independently hydrogen; deuterium; a halogen; a substituted or unsubstituted tri($C_{1-20}$ alkyl)silyl; a substituted or unsubstituted tri($C_{6-20}$ aryl)silyl; a substituted or unsubstituted $C_{1-20}$ alkyl; a substituted or unsubstituted $C_{1-20}$ haloalkyl; a substituted or unsubstituted $C_{1-20}$ alkoxy; a substituted or unsubstituted $C_{1-20}$ haloalkoxy; a substituted or unsubstituted $C_{6-20}$ aryl; a substituted or unsubstituted $C_{6-20}$ aryloxy; or a substituted or unsubstituted $C_{2-20}$ heteroaryl containing at least one heteroatom selected from the group consisting of N, O, and S, wherein adjacent substituents of $R_{a1}$ to $R_{a6}$ and $R_{b1}$ to $R_{b6}$ are optionally connected to each other to form a substituted or unsubstituted $C_{6-20}$ aromatic ring, with that proviso that at least one of $R_{a1}$ to $R_{a10}$, $R_{b1}$ to $R_{b10}$, $R_{11}$ to $R_{18}$, $R_{21}$ to $R_{28}$, and $R_{31}$ to $R_{36}$ in one formula is a substituted or unsubstituted tri($C_{1-20}$alkyl)silyl group or a substituted or unsubstituted tri($C_{6-20}$ aryl)silyl group; or is substituted by a tri($C_{1-20}$ alkyl)silyl group or a tri($C_{6-20}$ aryl)silyl group.

For example, in Formulas 2-1 to 2-7, at least one of $R_{a1}$ to $R_{a10}$, $R_{b1}$ to $R_{b10}$, $R_{11}$ to $R_{18}$, $R_{21}$ to $R_{28}$, and $R_{31}$ to $R_{36}$ is —$Si(CH_3)_3$, or may be substituted by —$Si(CH_3)_3$.

Further, in Formulas 2-1 to 2-7, $R_{a1}$ to $R_{a10}$, $R_{b1}$ to $R_{b10}$, $R_{11}$ to $R_{18}$, $R_{21}$ to $R_{28}$, and $R_{31}$ to $R_{36}$ may each independently be hydrogen, —$Si(CH_3)_3$, or —$CH_3$.

Specifically, for example, the compound containing a structural unit represented by Formula 1 may be represented by one of the following Formulas 2-1A to 2-7A:

[Formula 2-1A]

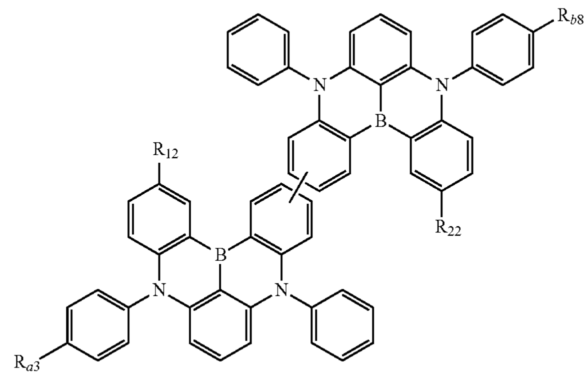

[Formula 2-2A]

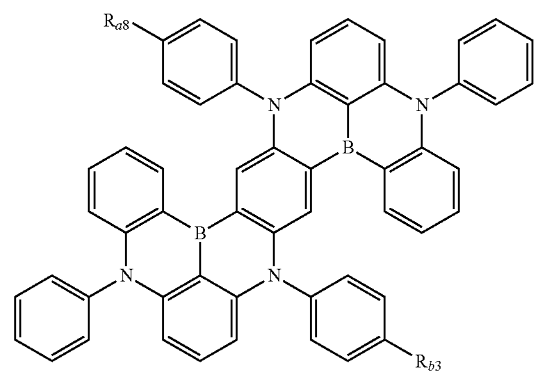

[Formula 2-3A]

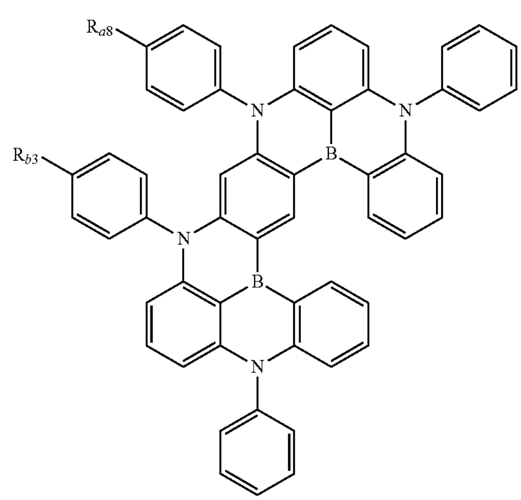

-continued

[Formula 2-4A]

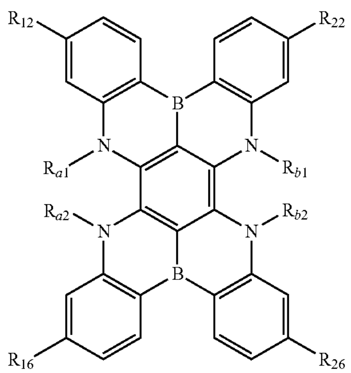

[Formula 2-5A]

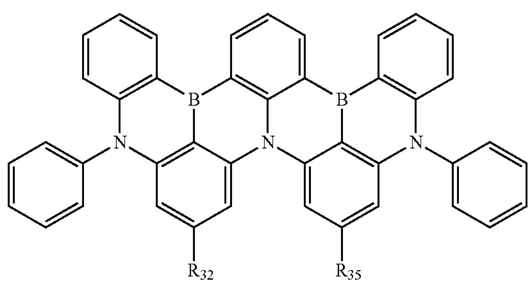

[Formula 2-6A]

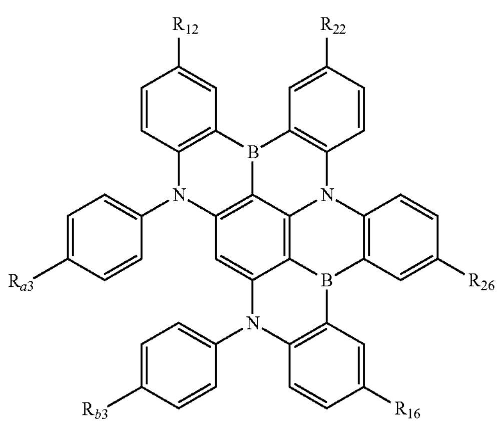

[Formula 2-7A]

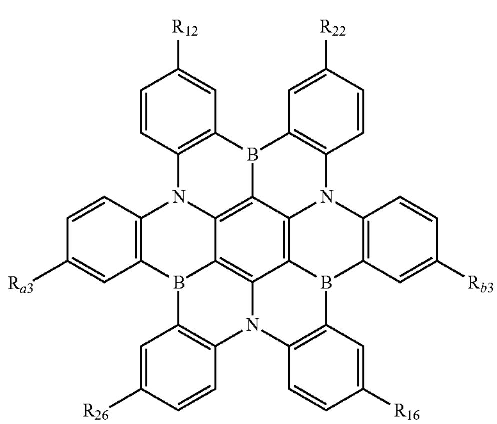

wherein, in Formulas 2-1A to 2-7A, $R_{a1}$ to $R_{a3}$, $R_{a8}$, $R_{b1}$ to $R_{b3}$, $R_{b8}$, $R_{12}$, $R_{16}$, $R_{22}$, $R_{26}$, $R_{32}$, and $R_{35}$ are as defined in Formulas 2-1 to 2-7, respectively, with the proviso that at least one of $R_{a1}$ to $R_{a3}$, $R_{a8}$, $R_{b1}$ to $R_{b3}$, $R_{b8}$, $R_{12}$, $R_{16}$, $R_{22}$, $R_{26}$, $R_{32}$, and $R_{35}$ in one formula is —$Si(CH_3)_3$, or is substituted by —$Si(CH_3)_3$.

More specifically, for example, the above compound may be any one selected from the group consisting of the following compounds:

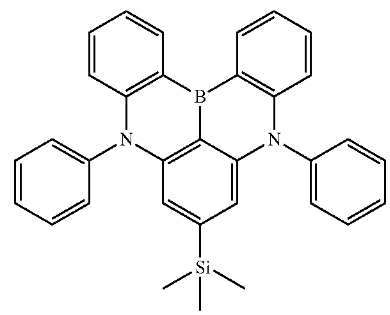

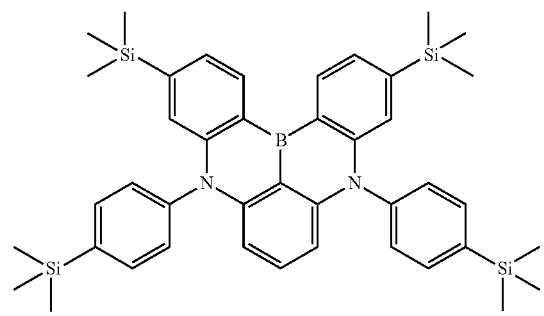

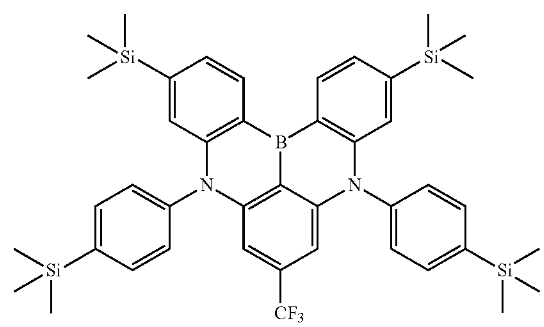

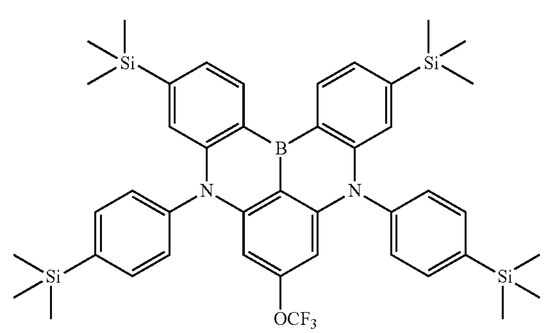

-continued
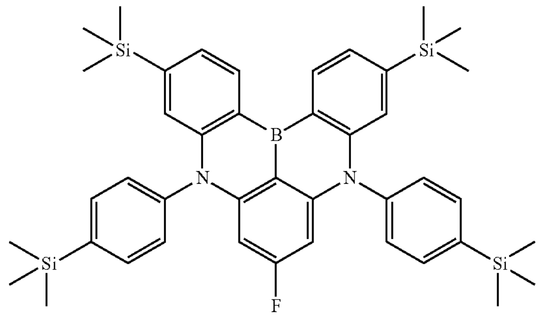
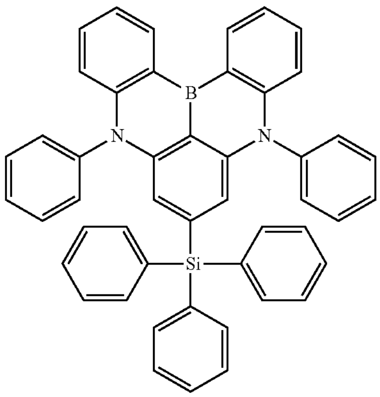
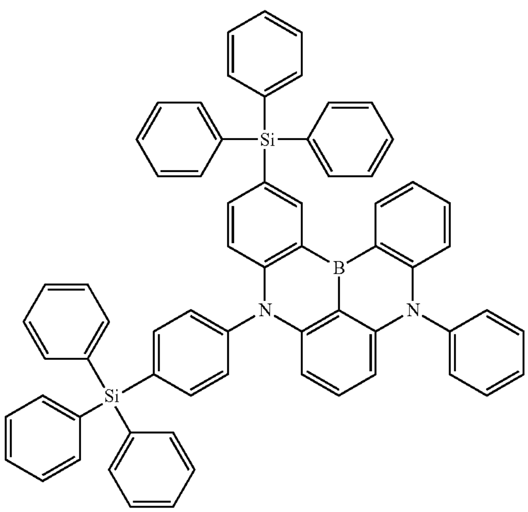
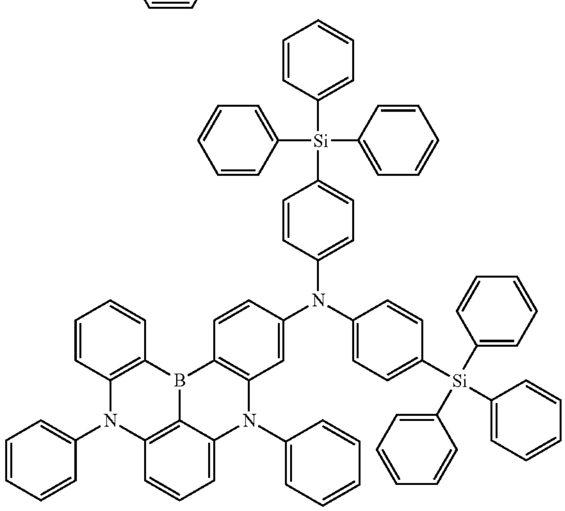
-continued
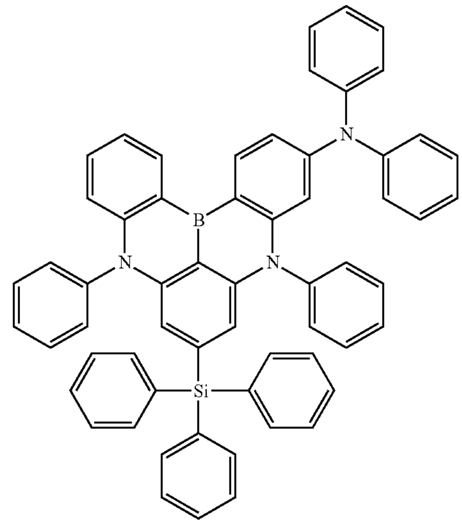
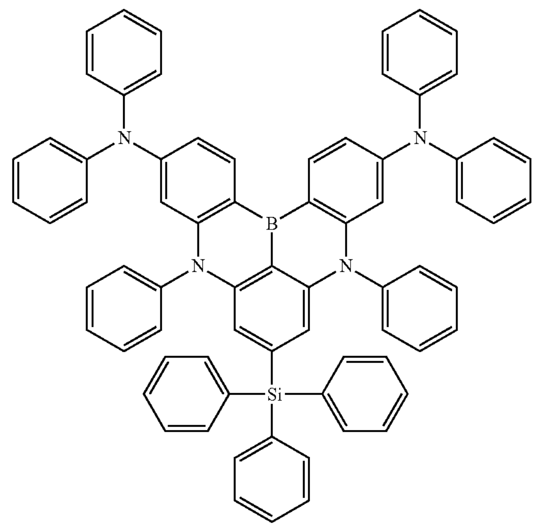
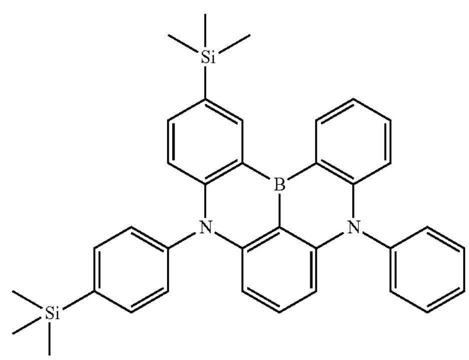

-continued
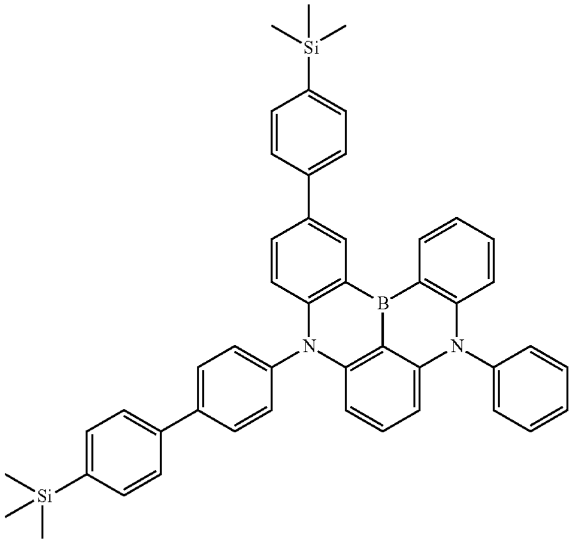
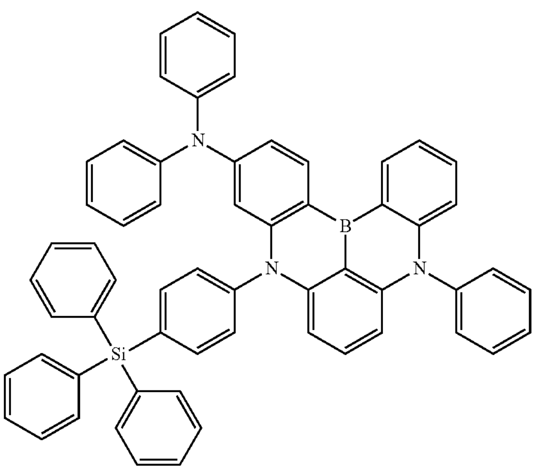
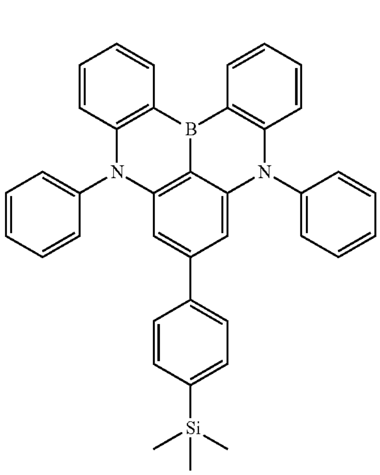
-continued
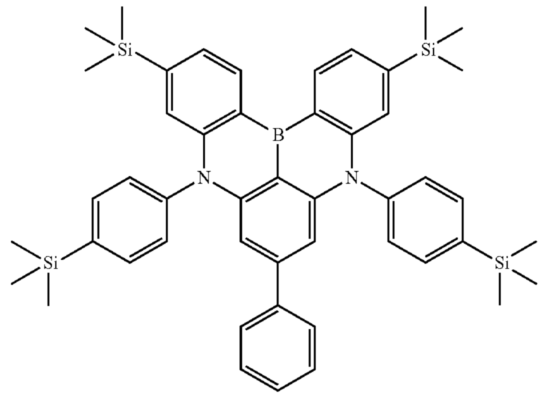
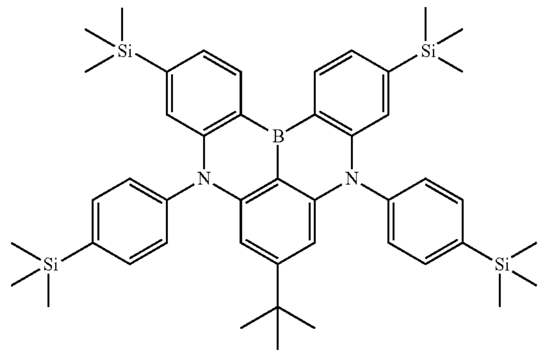
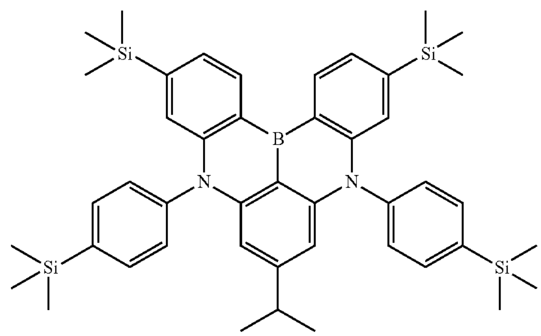
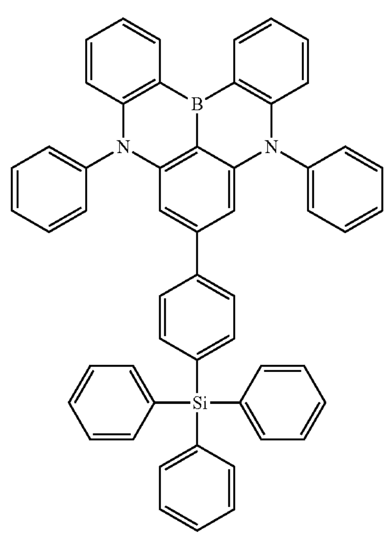

-continued
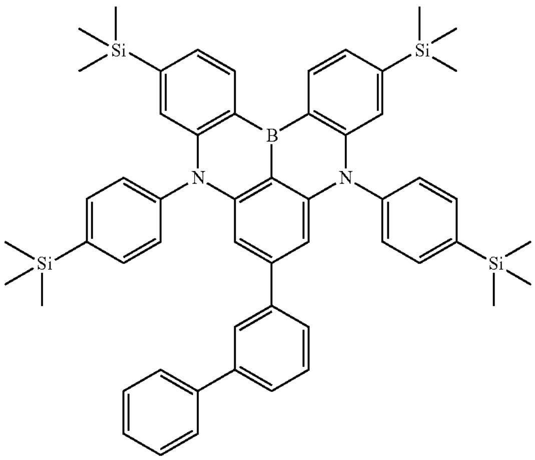
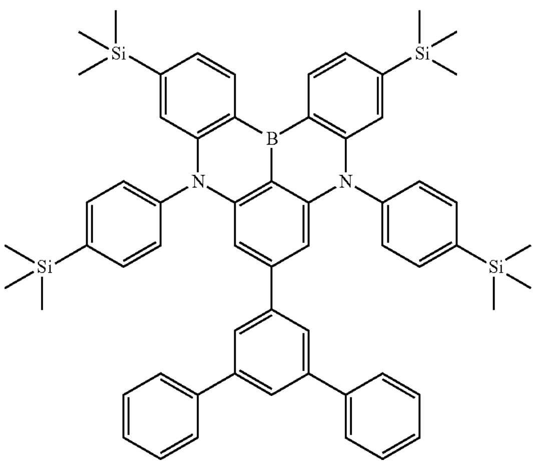
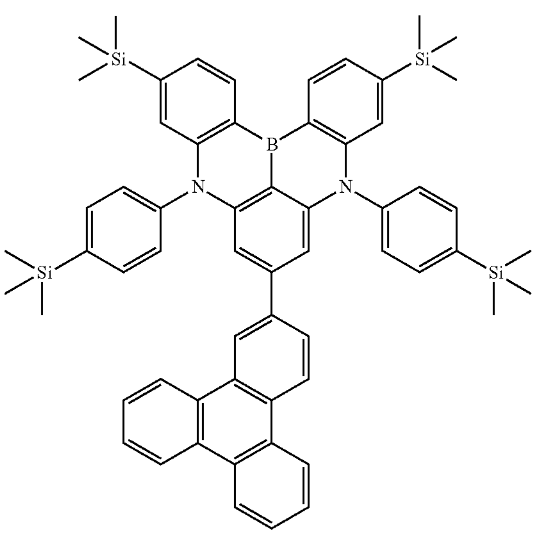
-continued
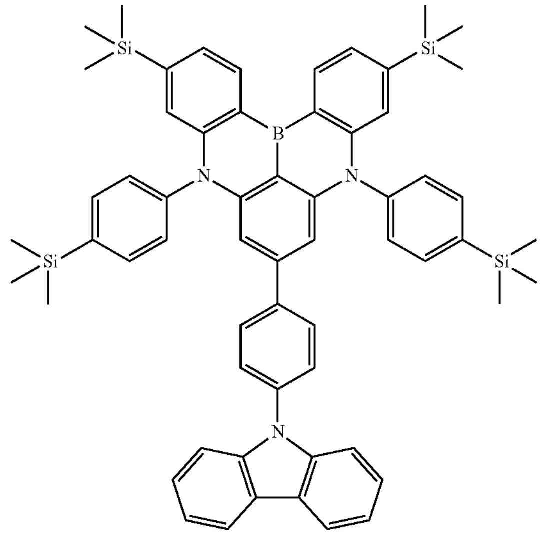
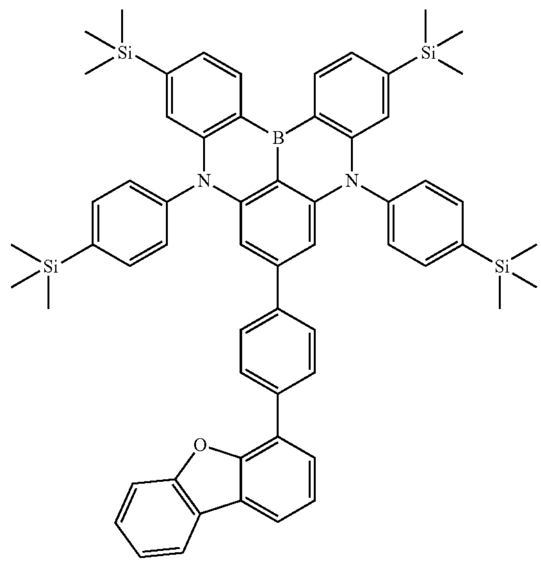
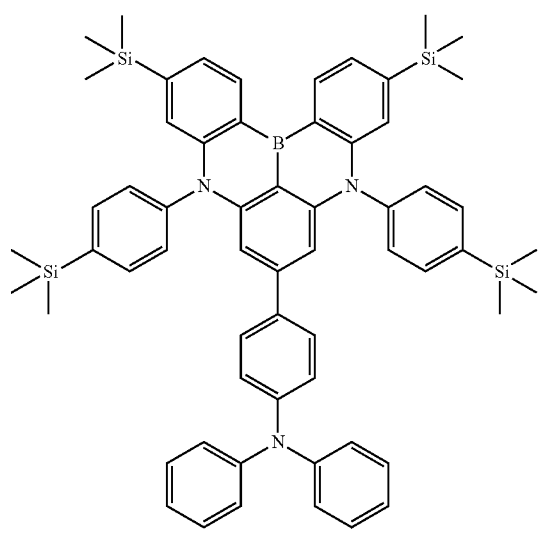

-continued
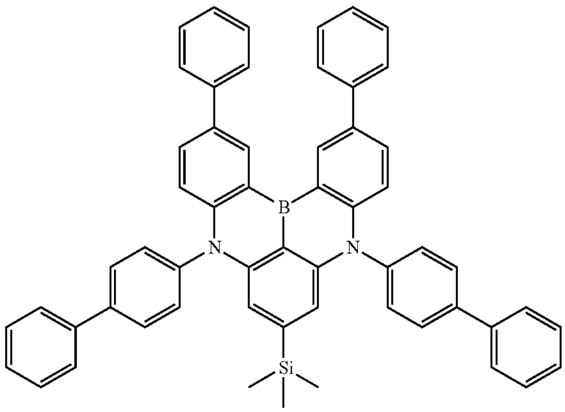
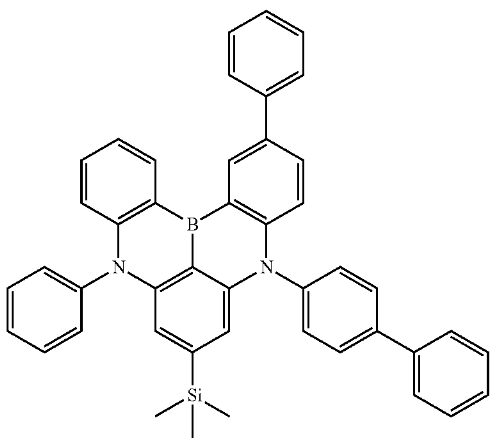
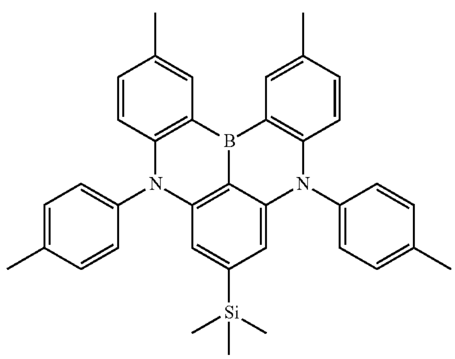
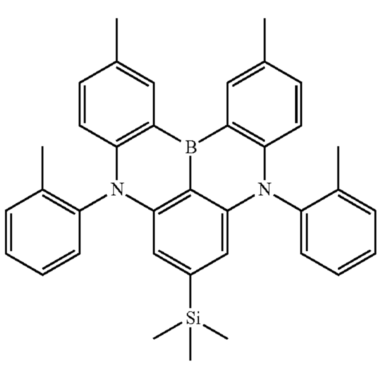
-continued
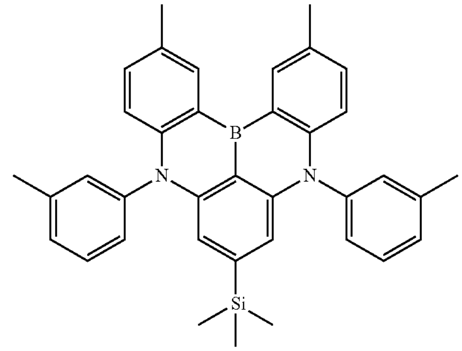
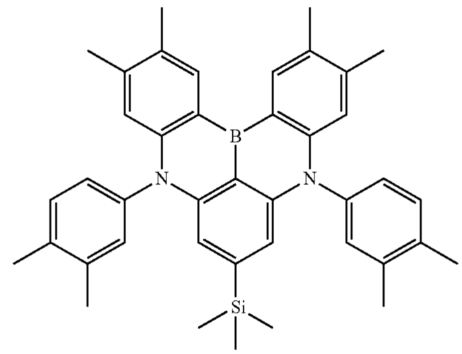
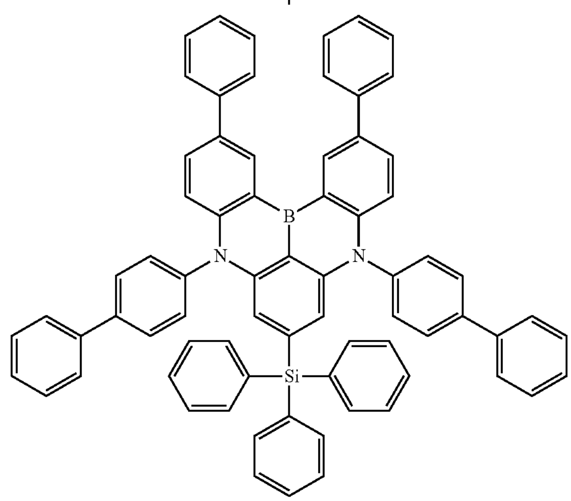
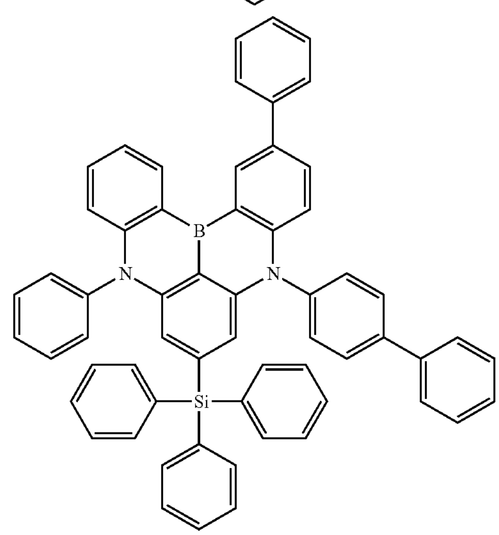

-continued
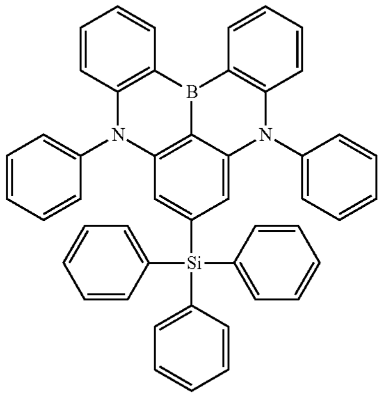
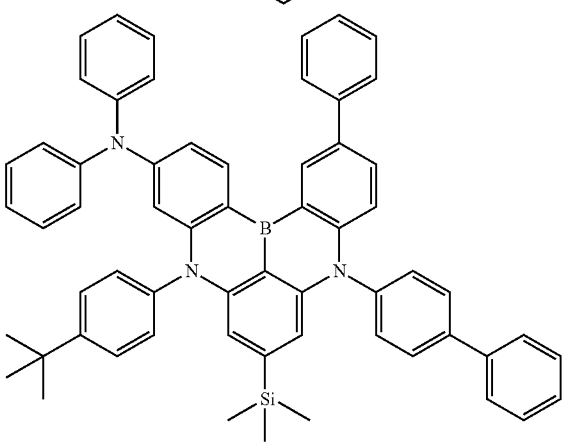
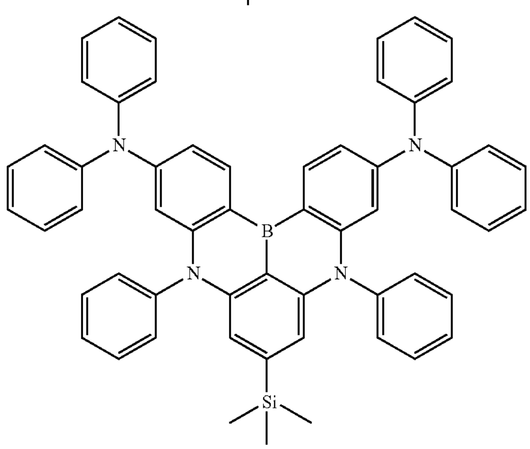
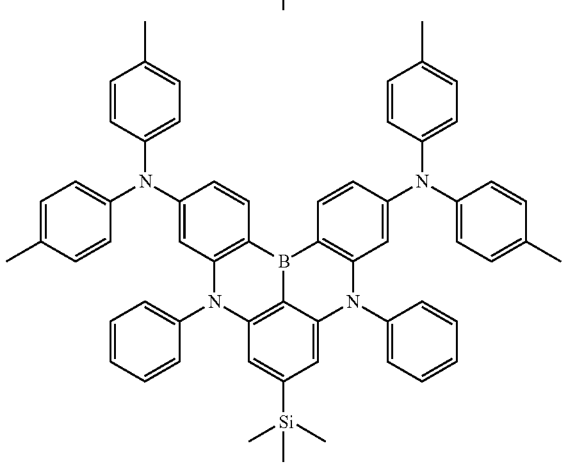
-continued
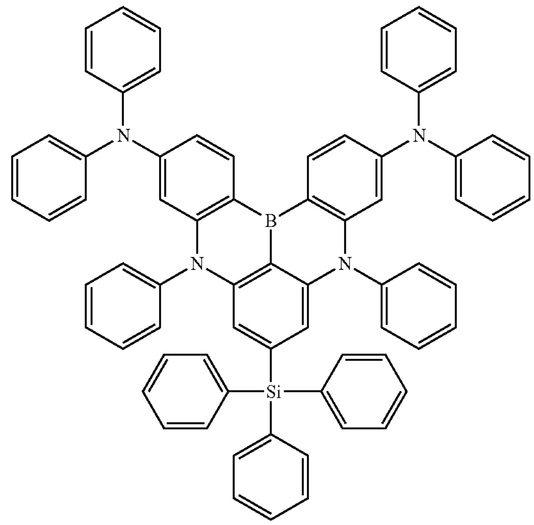
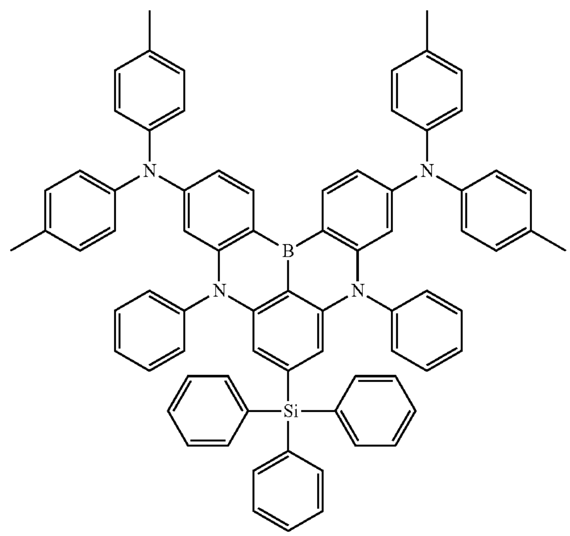
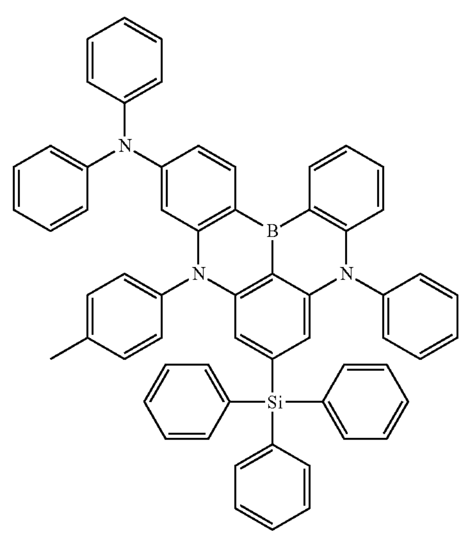

-continued
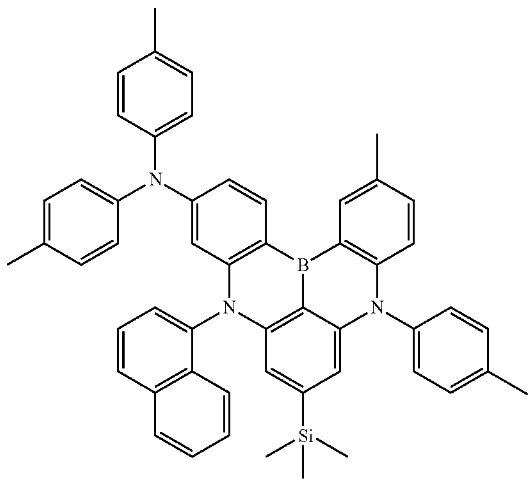
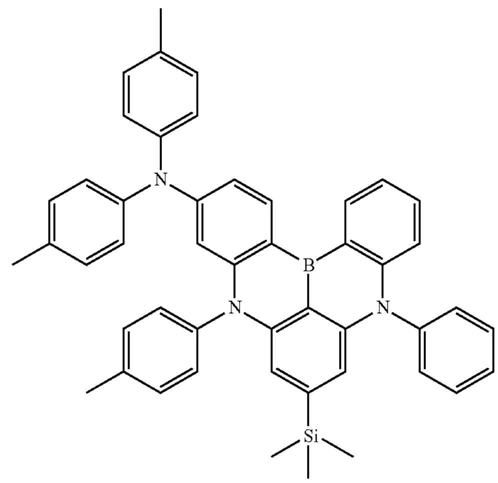
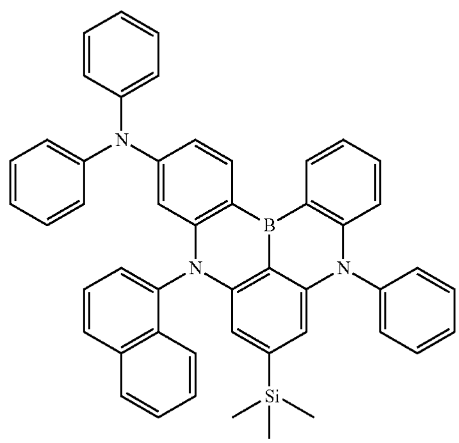
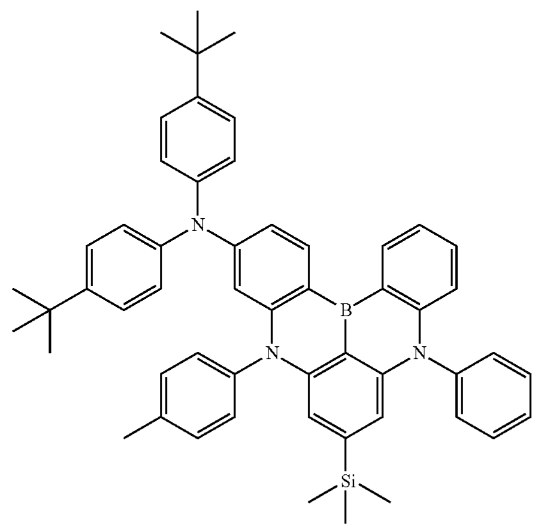
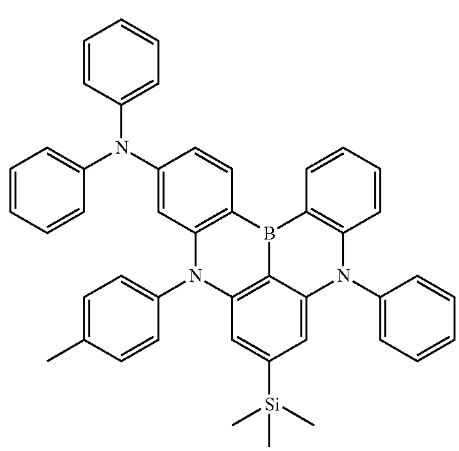
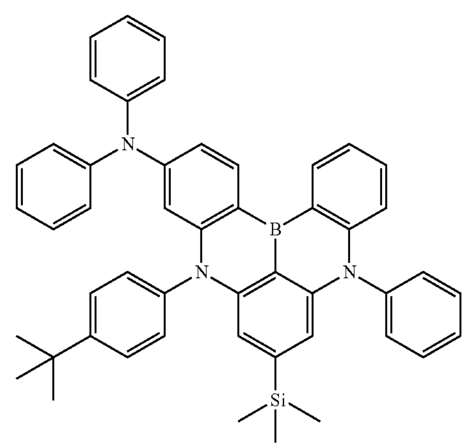
-continued -continued
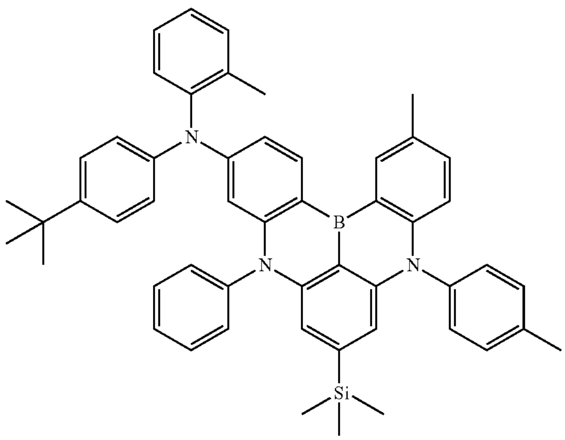
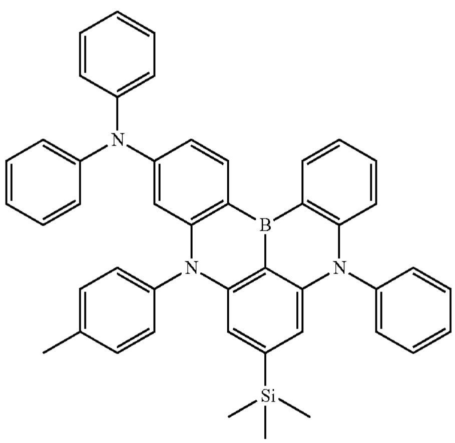
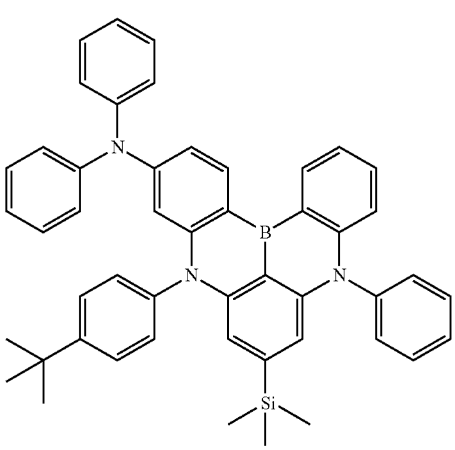
-continued
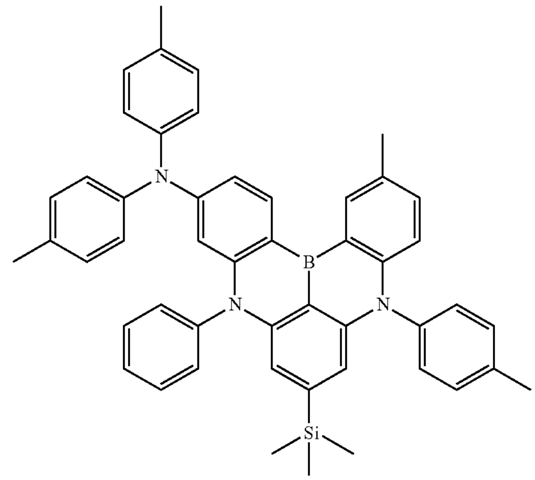
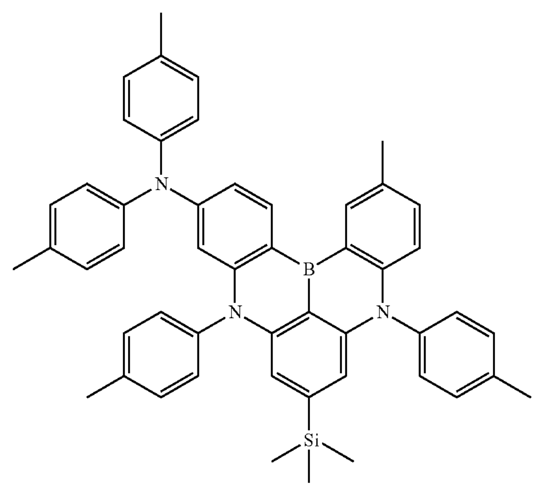
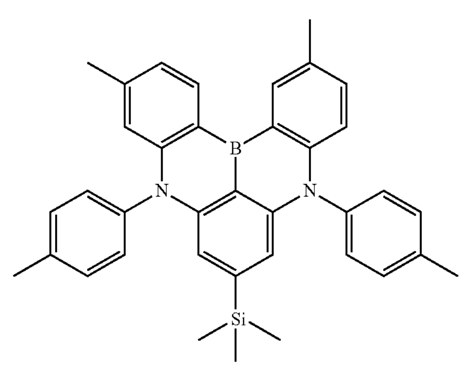

-continued
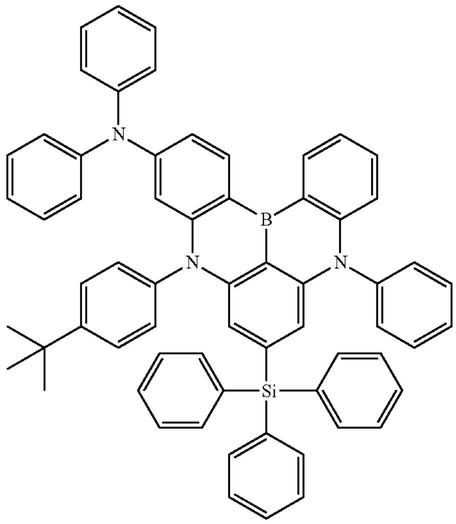
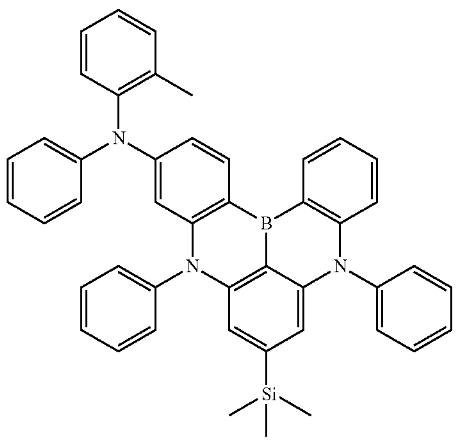
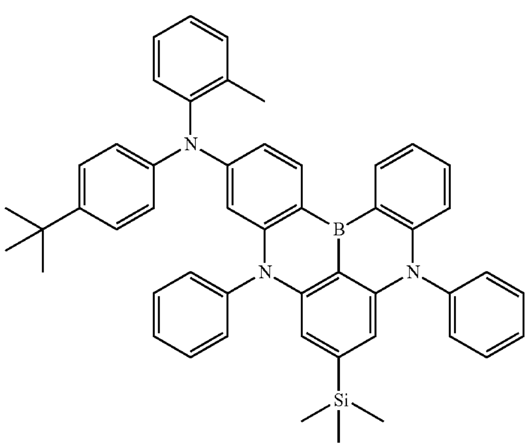
-continued
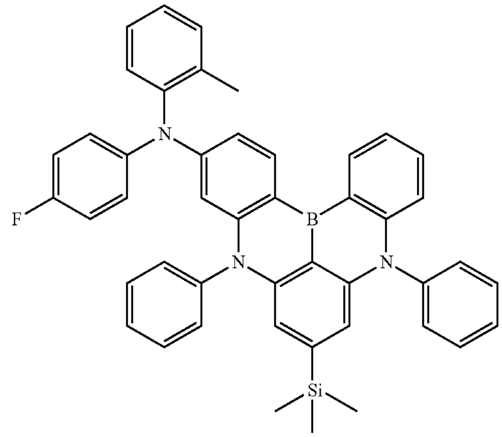
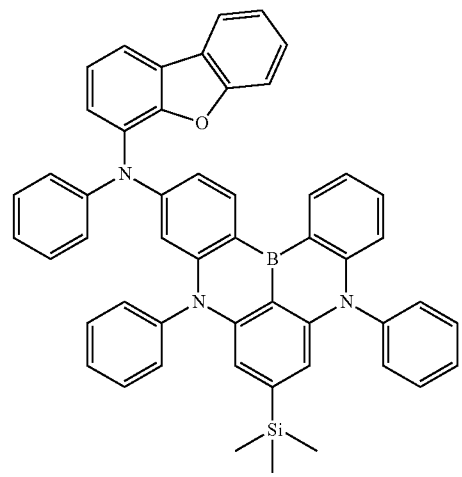
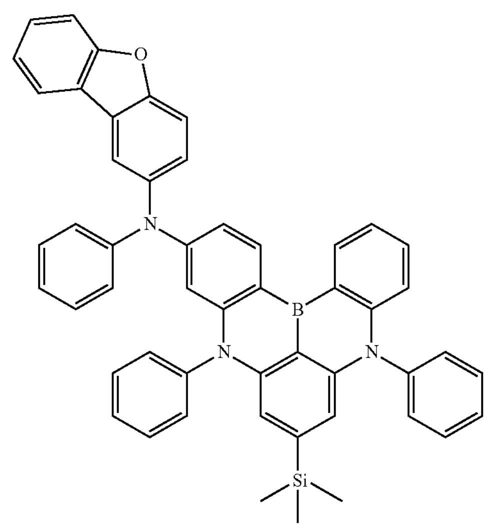

-continued
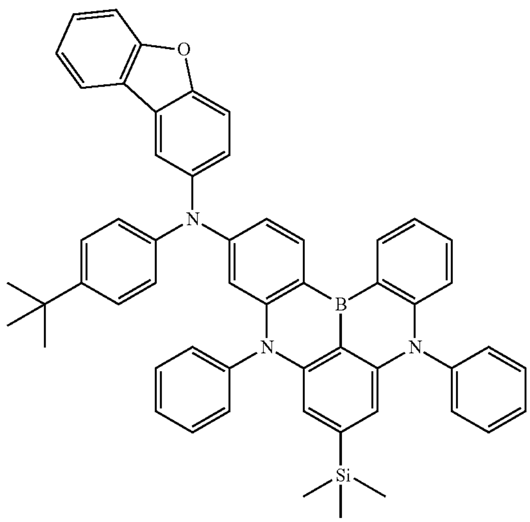
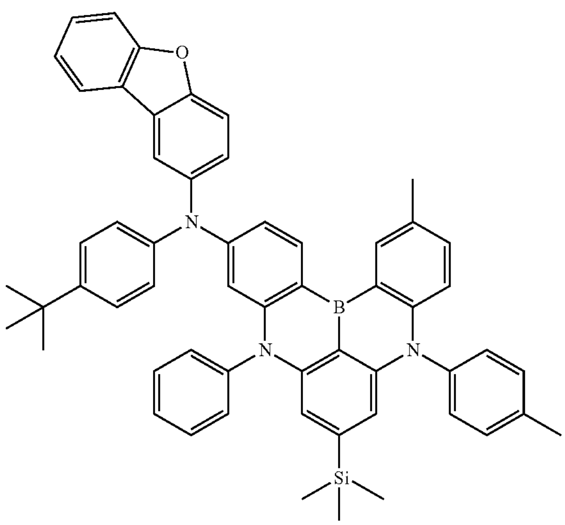
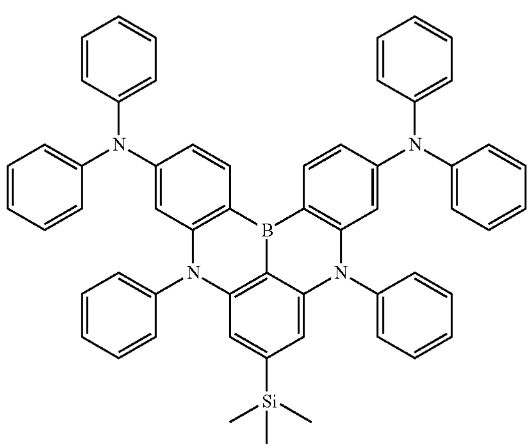
-continued
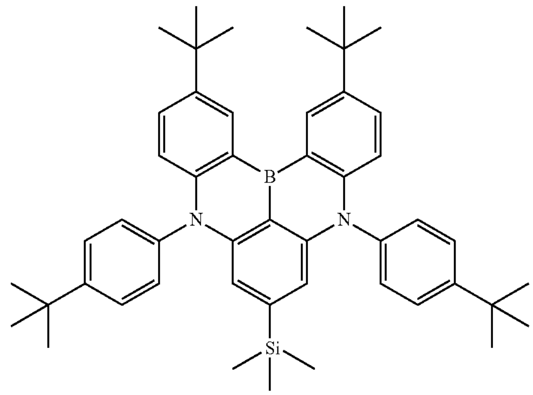
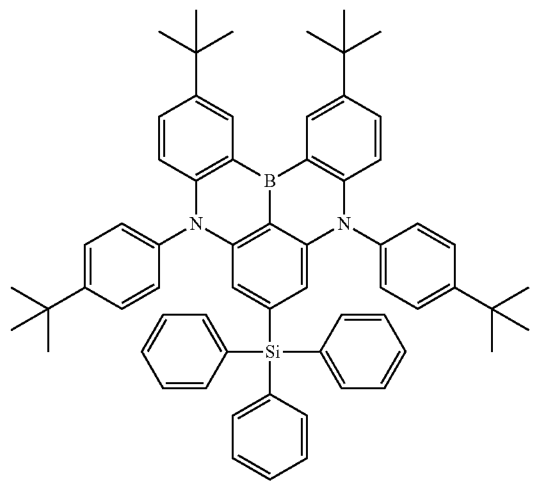
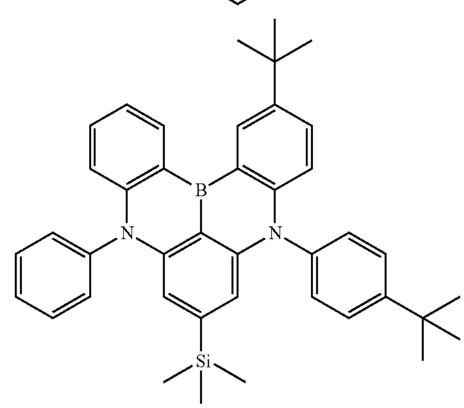
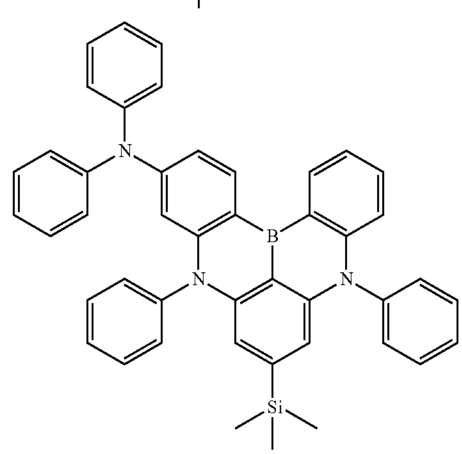

-continued
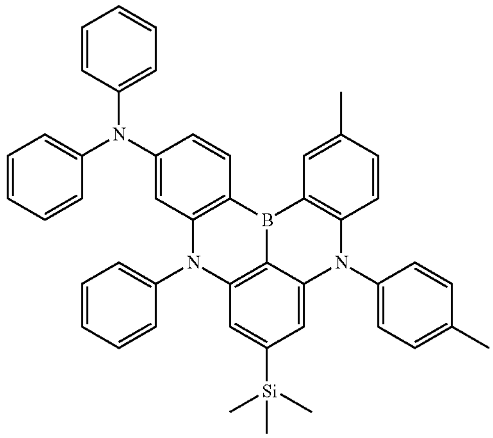
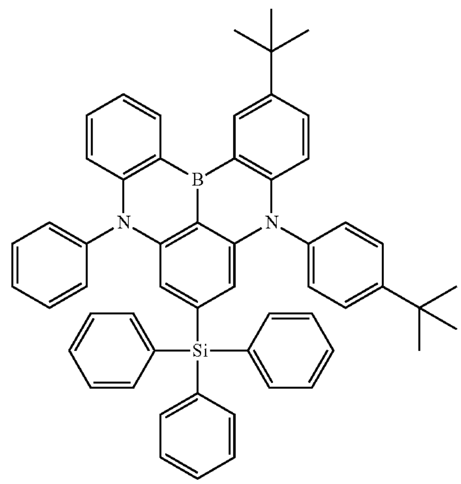
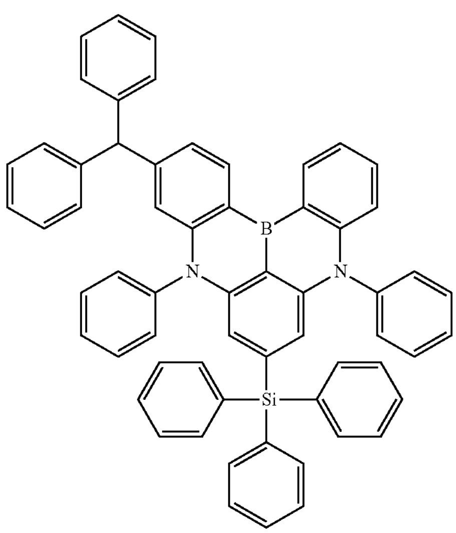
-continued
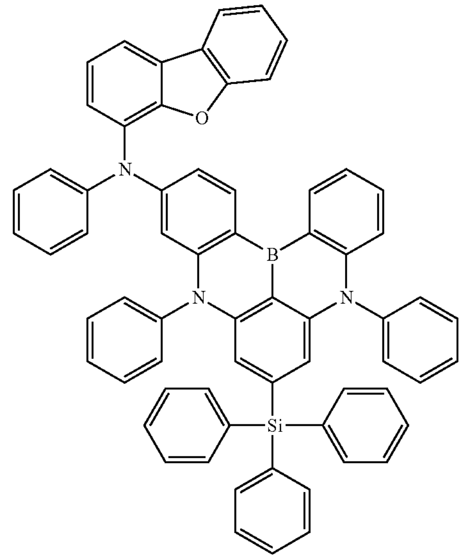
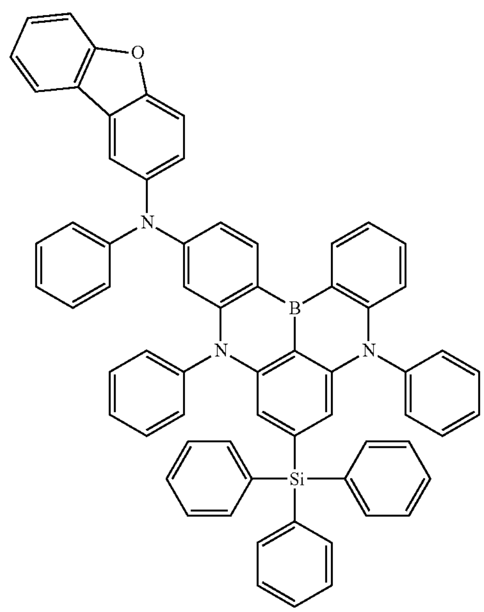

-continued
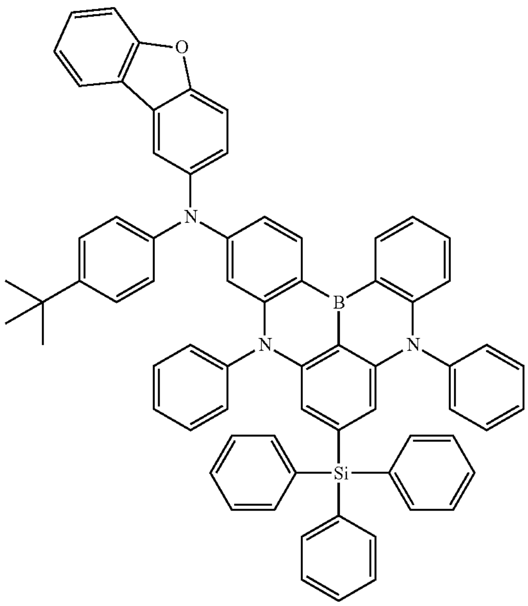
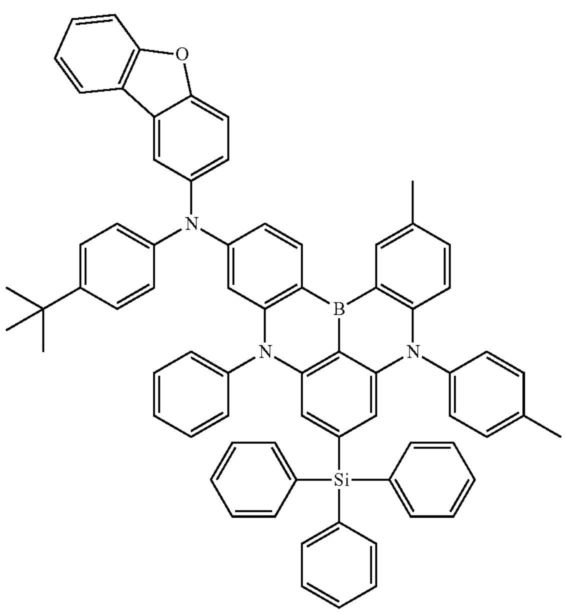
-continued
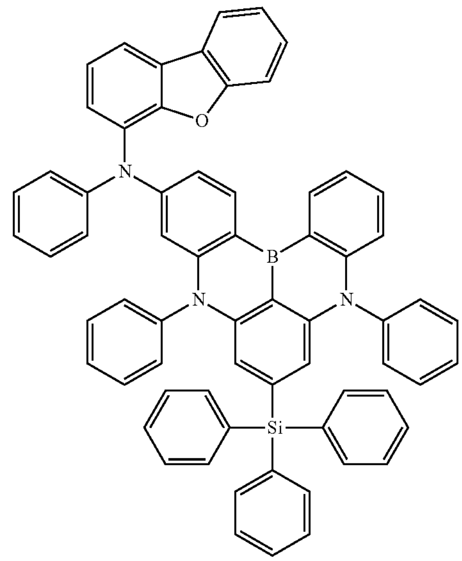
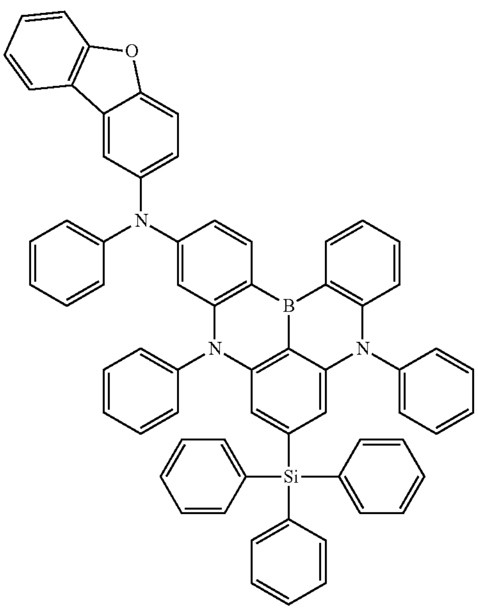
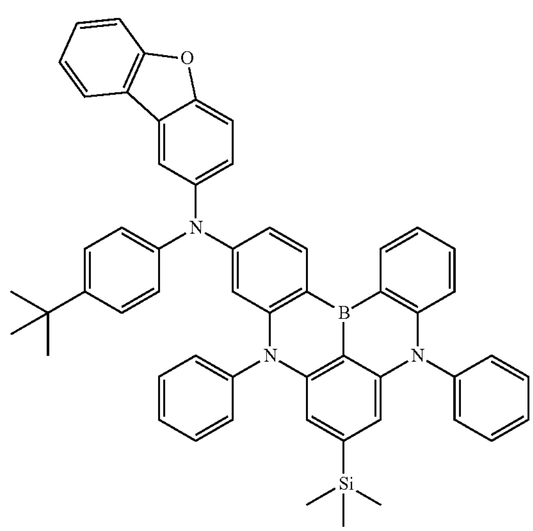

-continued
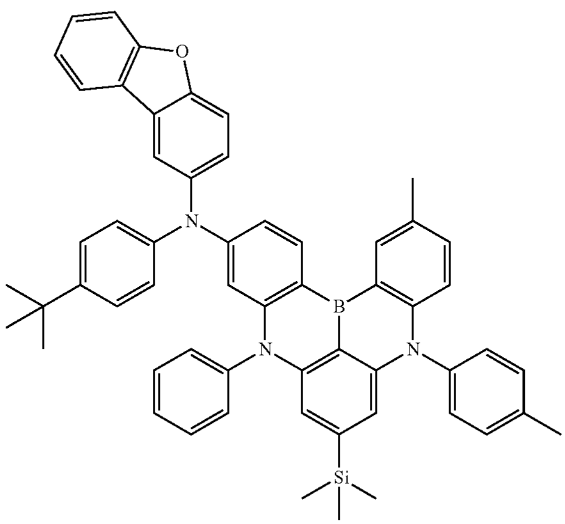
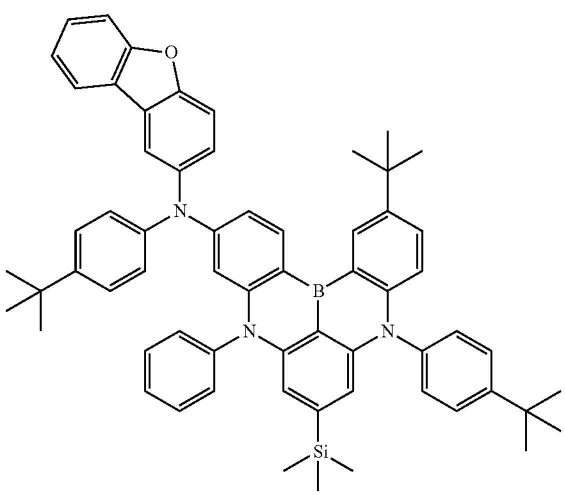
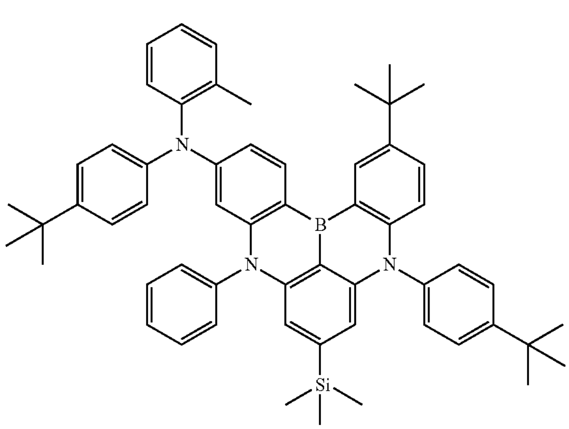
-continued
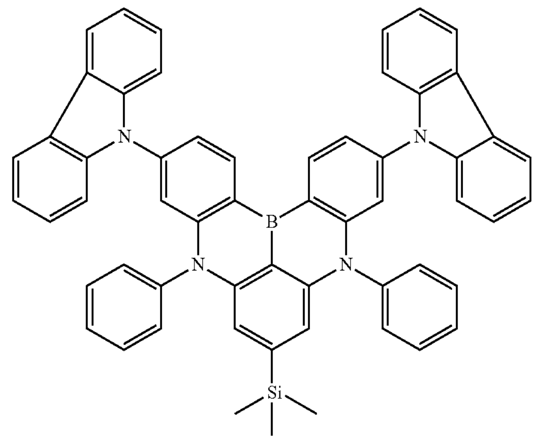
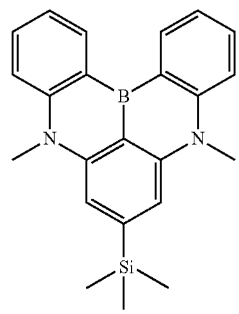
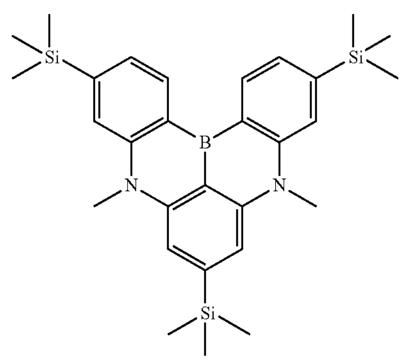
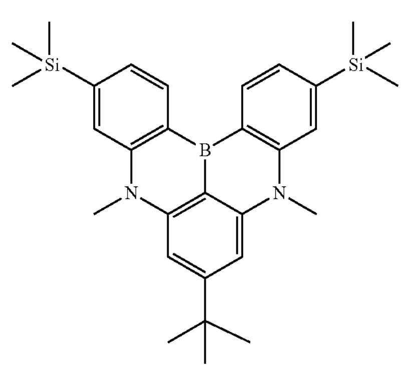

-continued
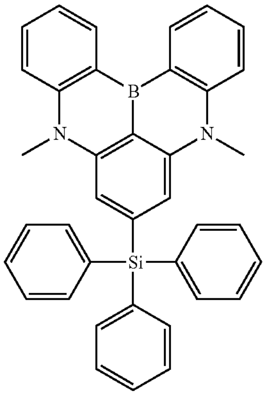
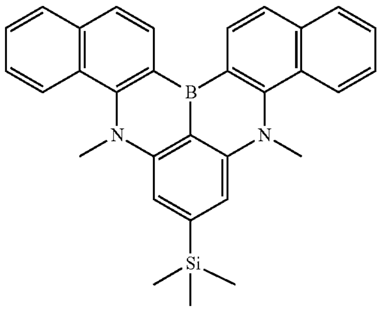
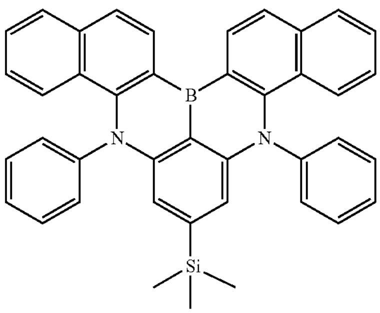
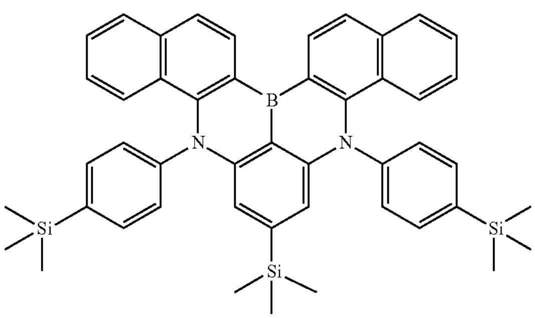
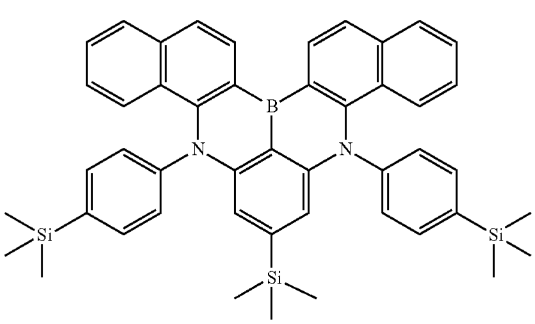
-continued
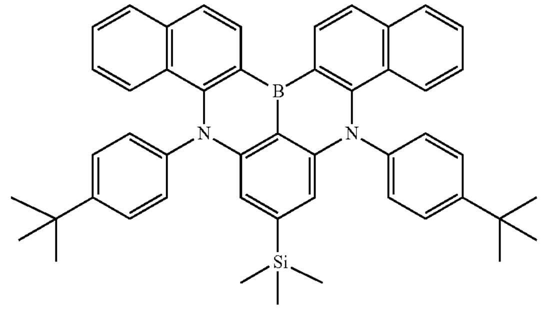
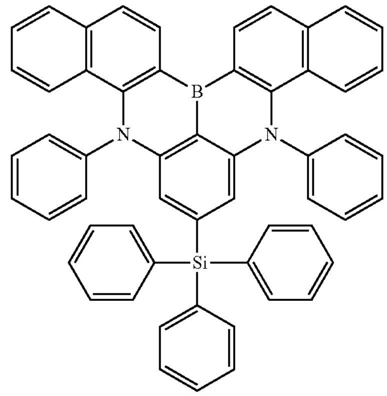
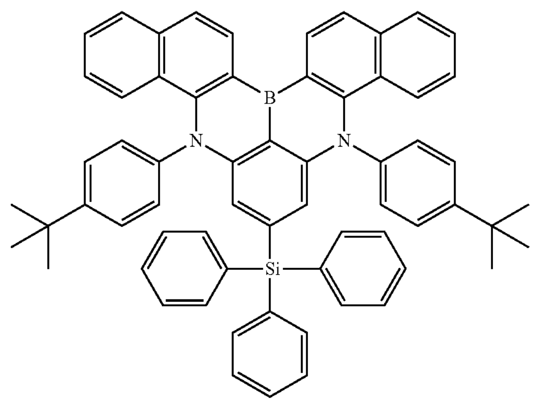
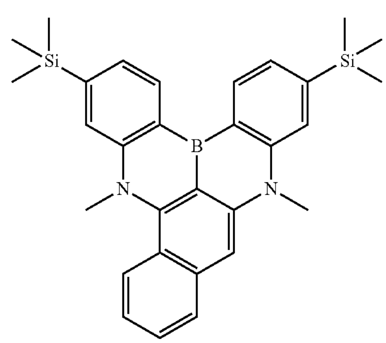

-continued
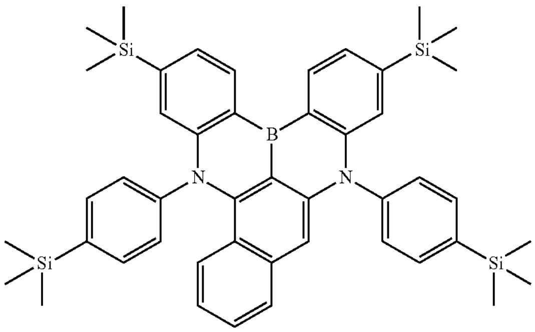
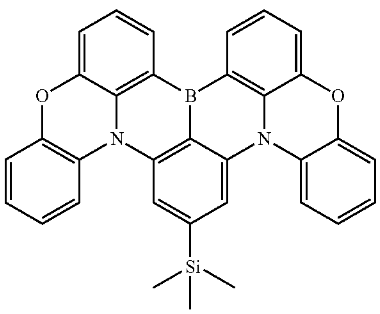
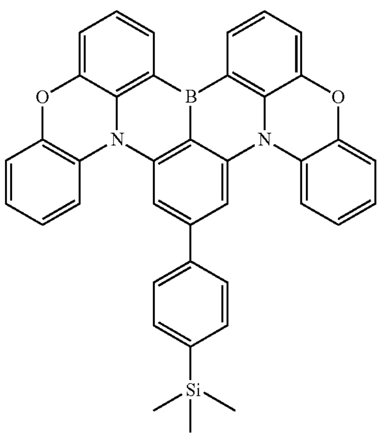
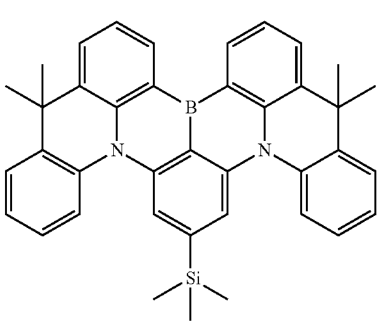
-continued
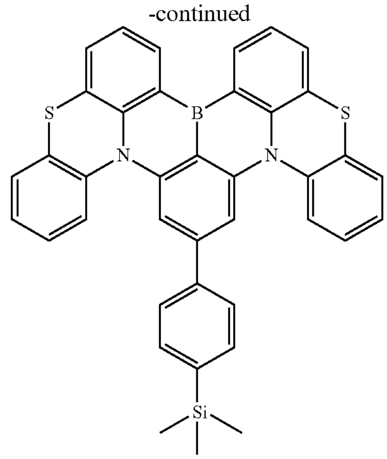
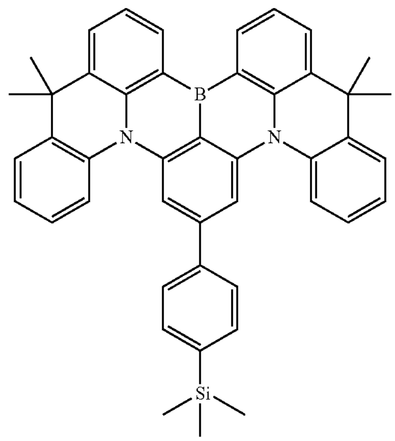
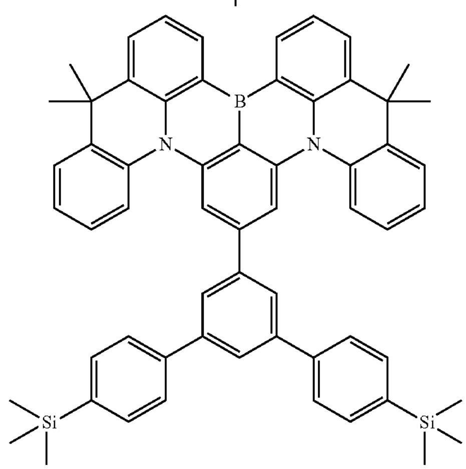
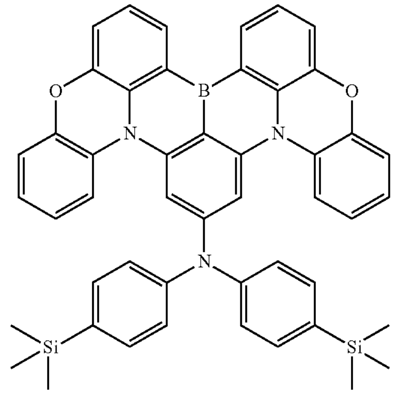

-continued
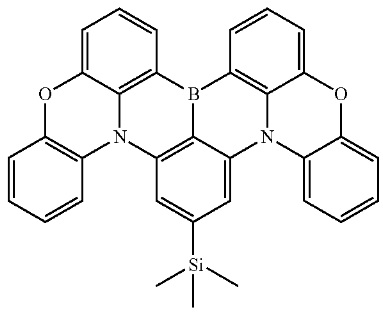
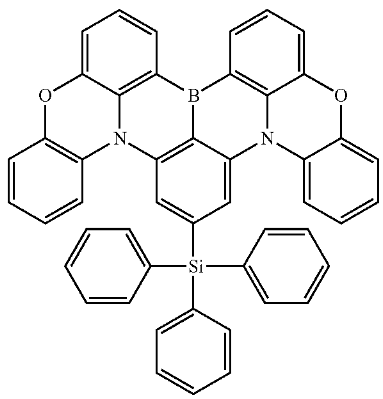
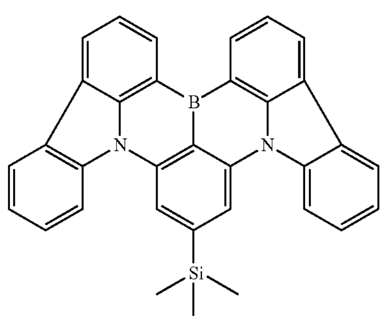
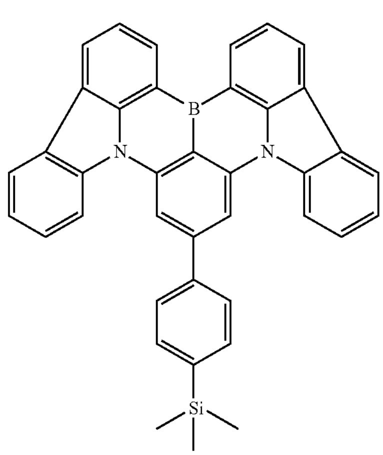
-continued
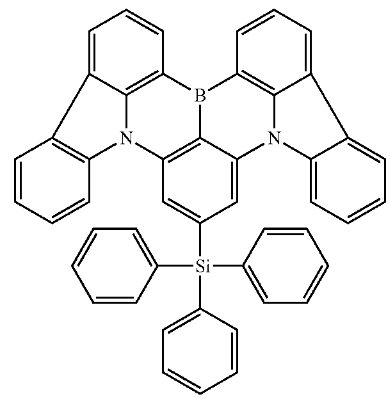
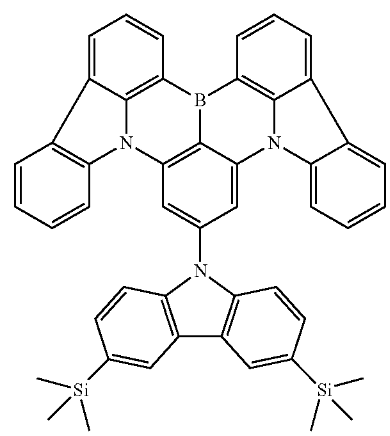
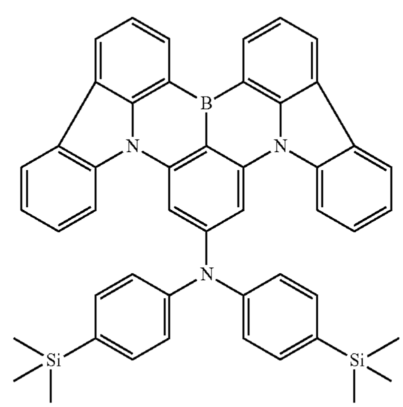

-continued
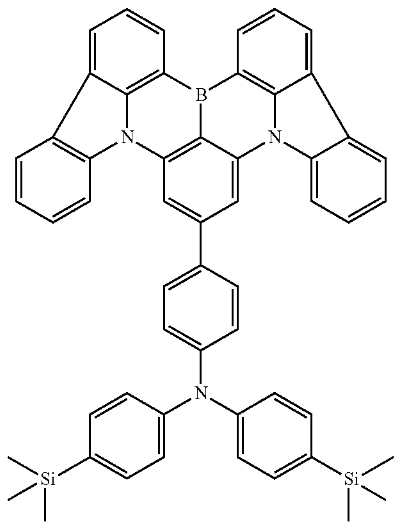
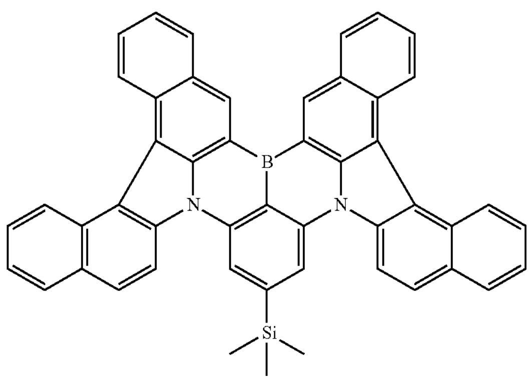
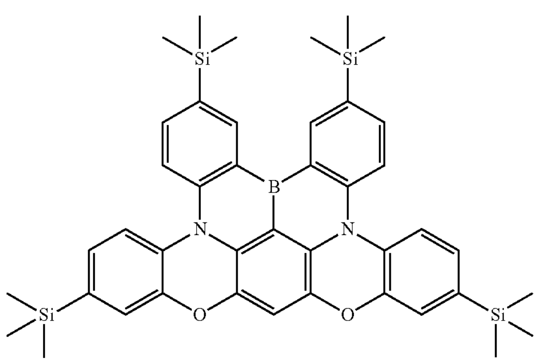
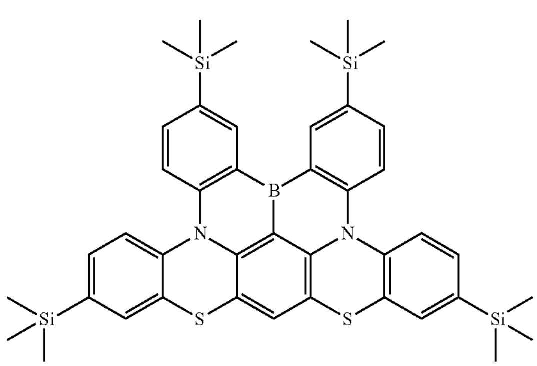
-continued
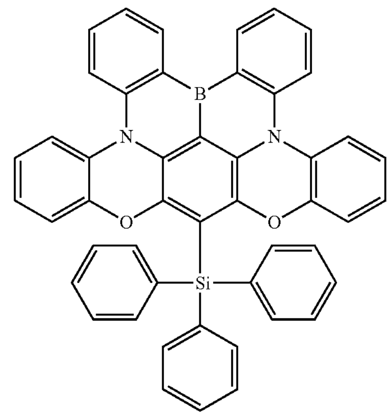
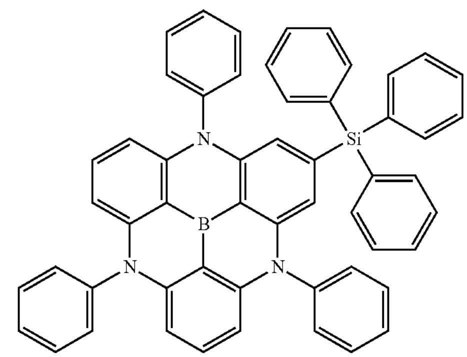
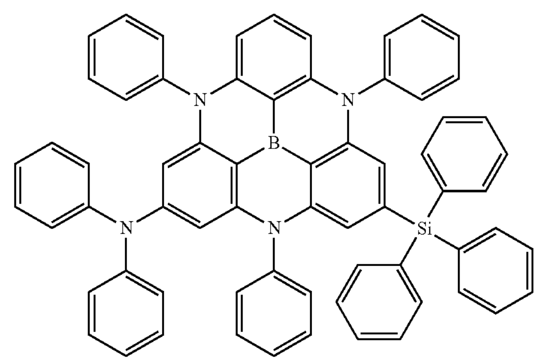
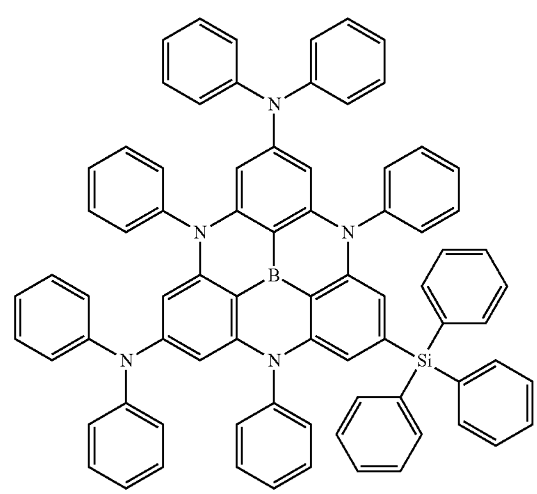

-continued
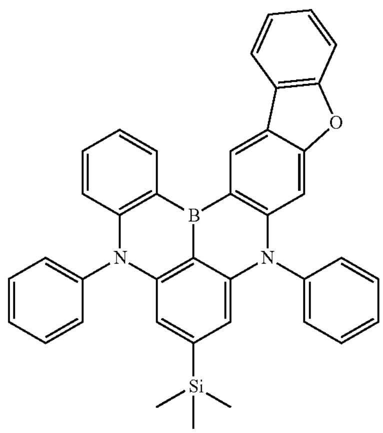
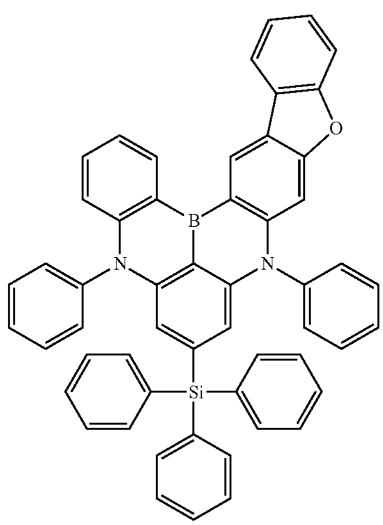
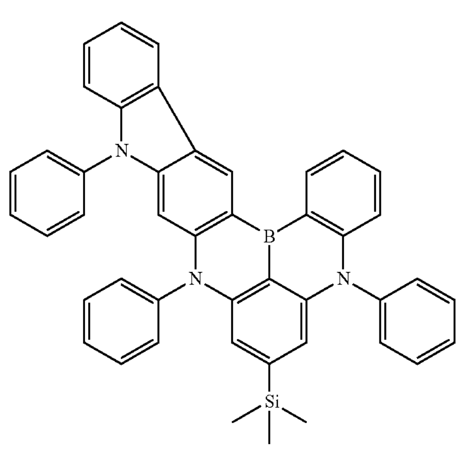
-continued
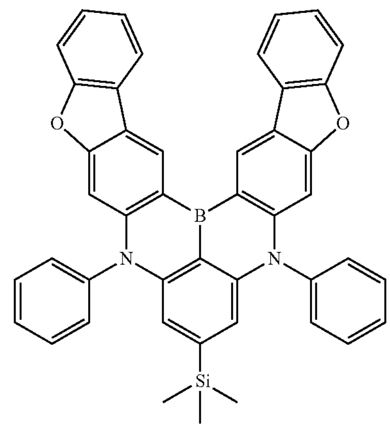
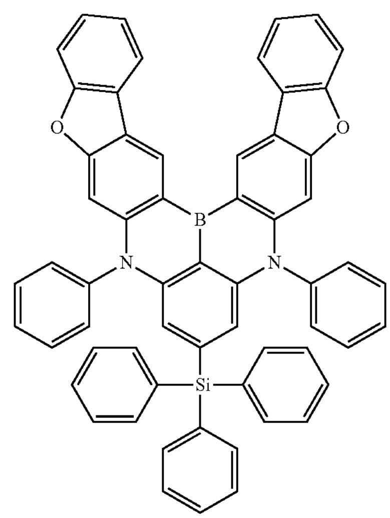
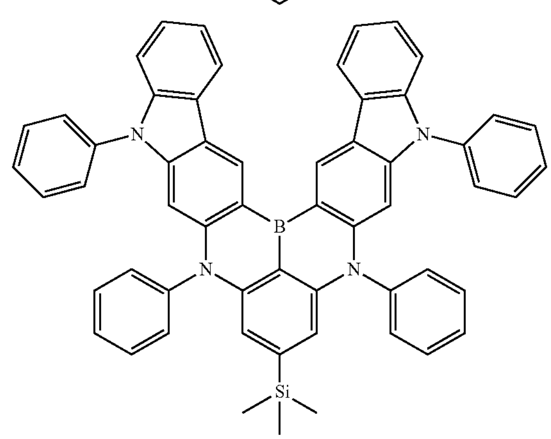
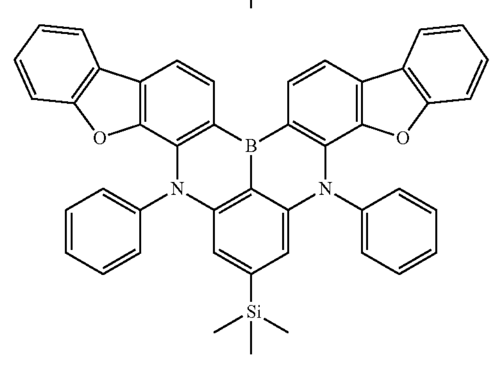

-continued
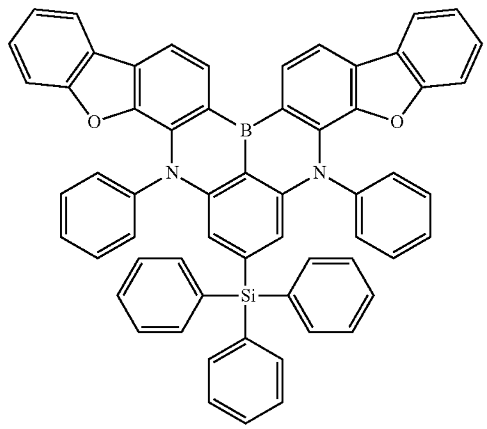
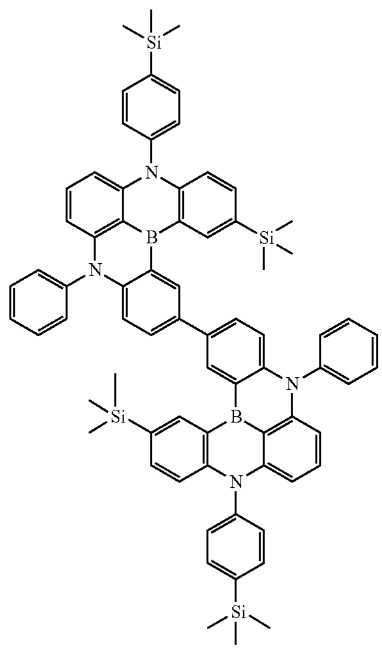
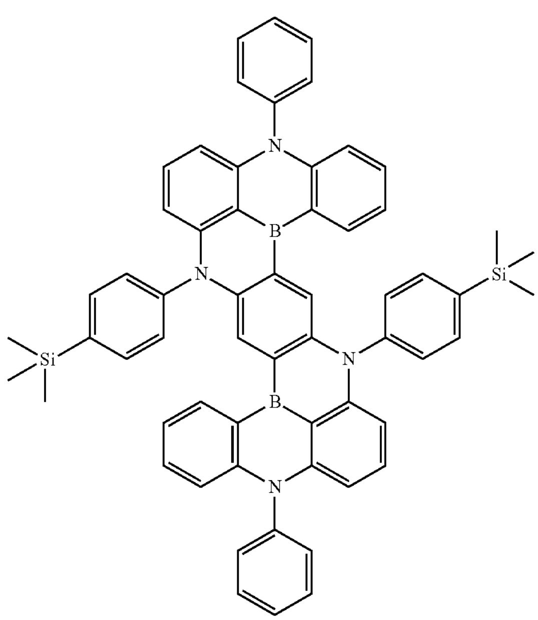
-continued
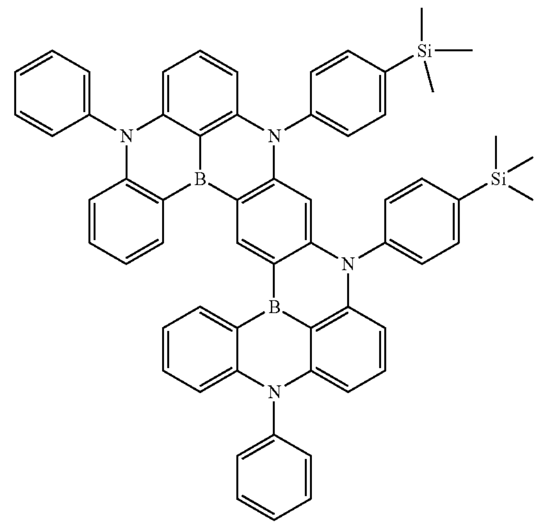
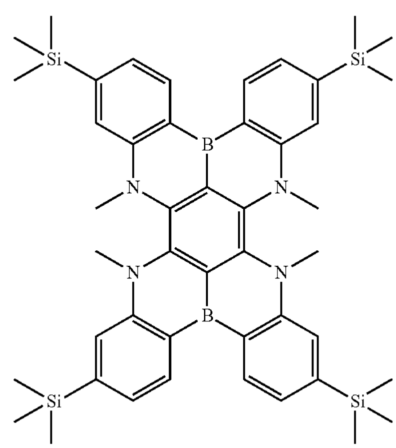
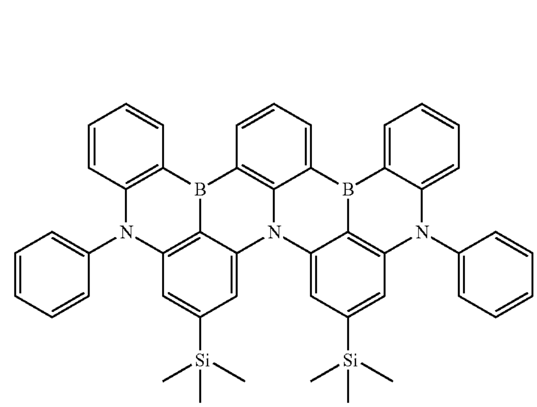

-continued
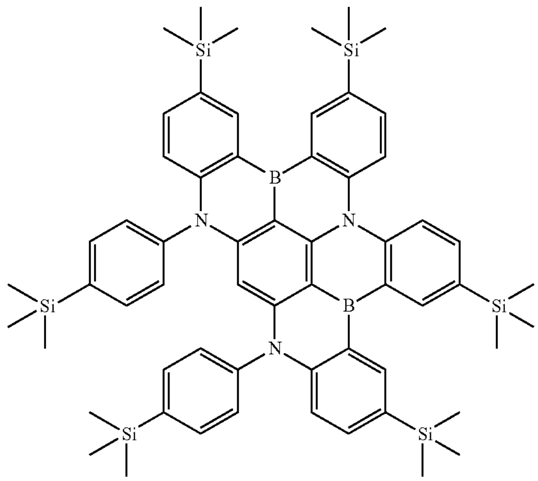
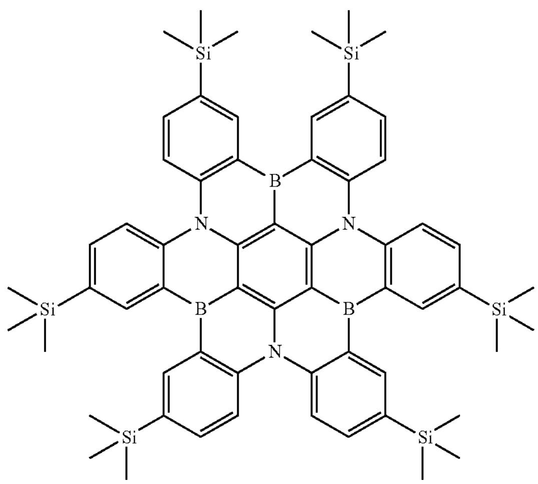
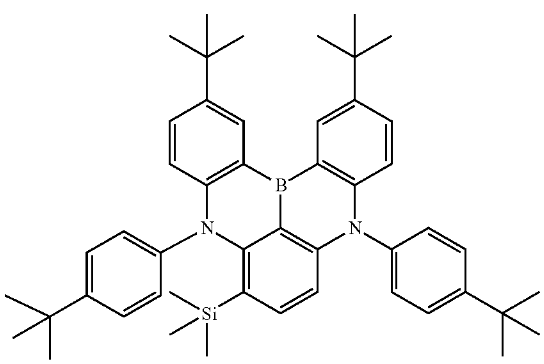
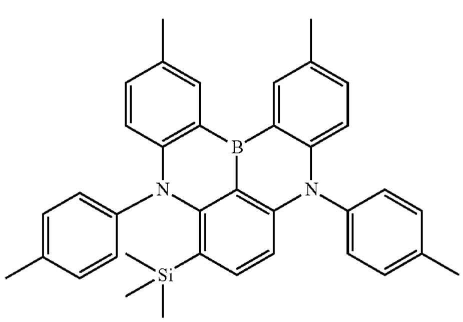
-continued
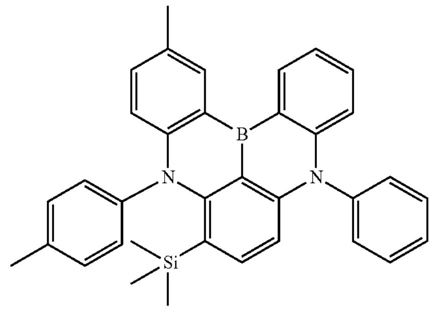
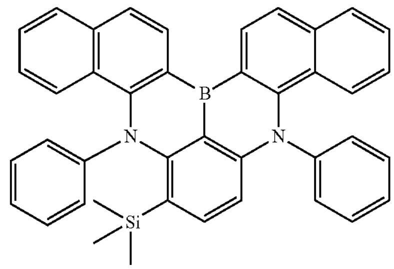
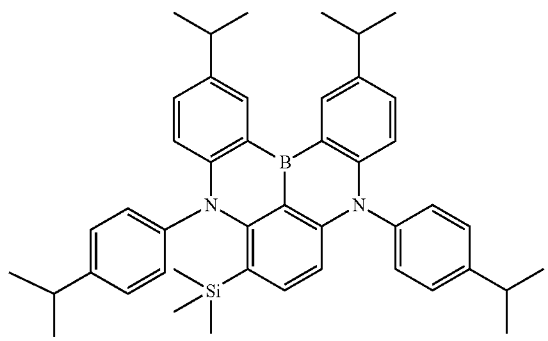
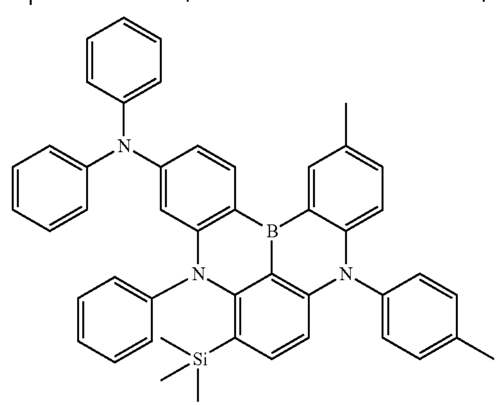
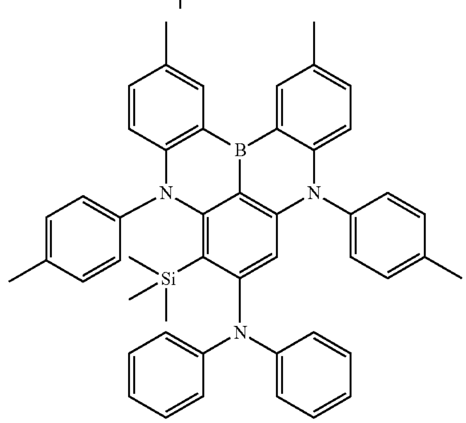

-continued
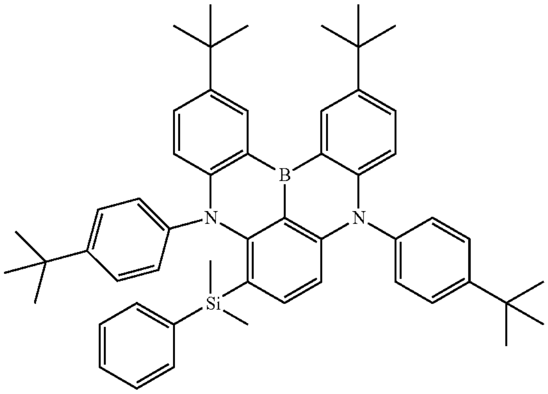
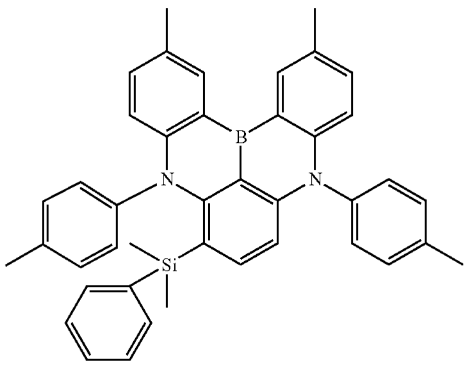
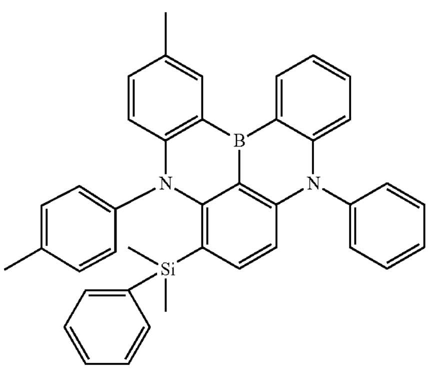
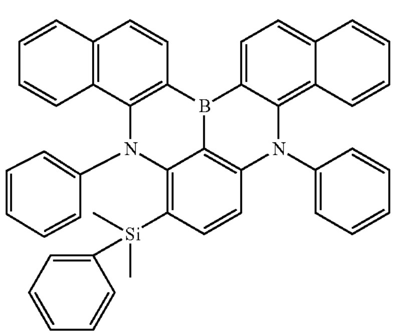
-continued
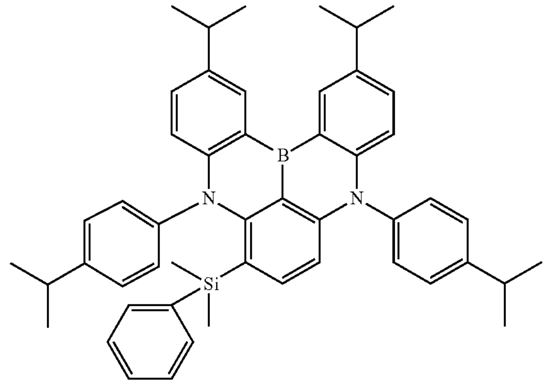
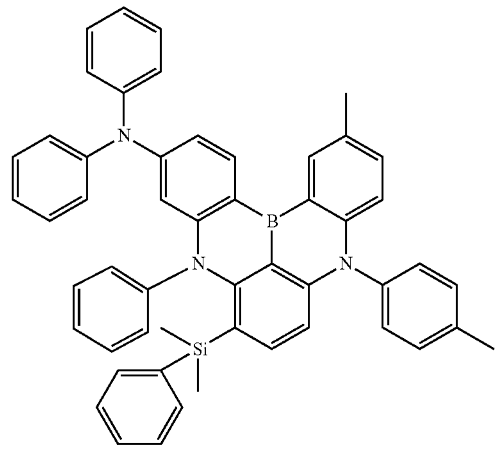
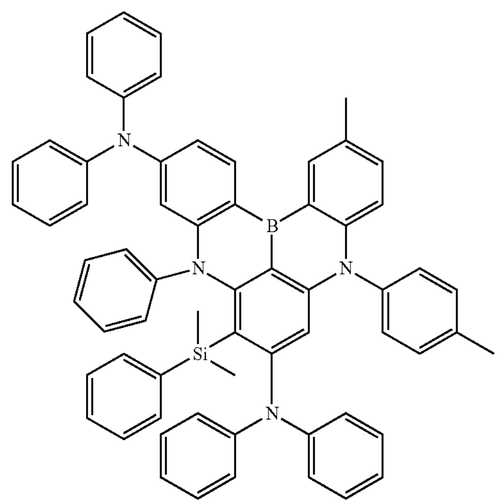
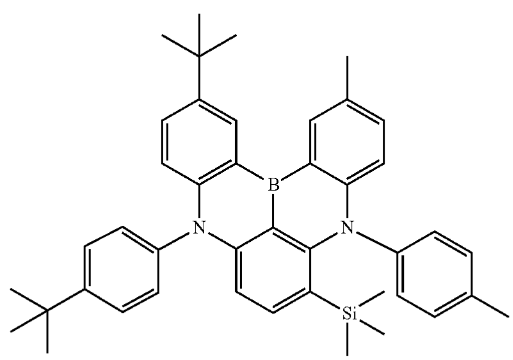

-continued
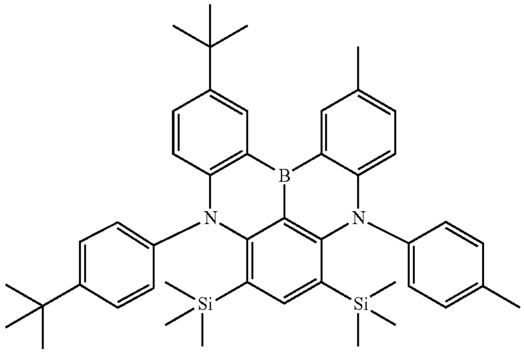
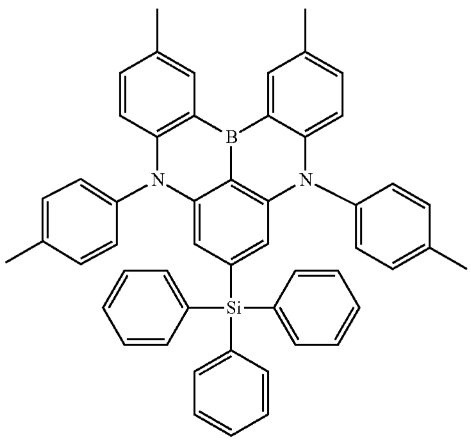
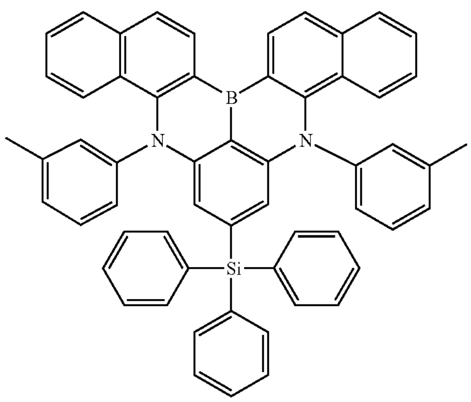
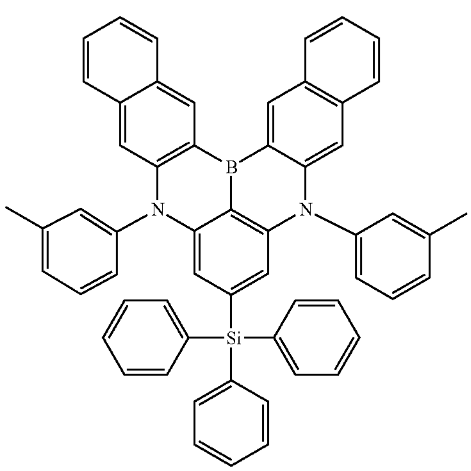
-continued
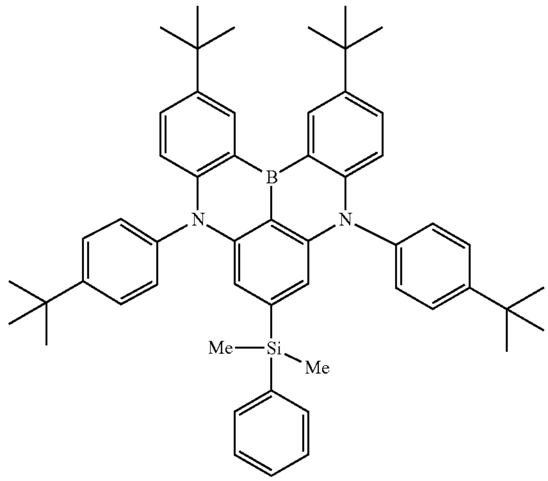
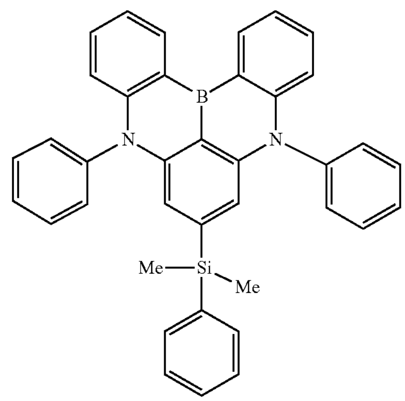
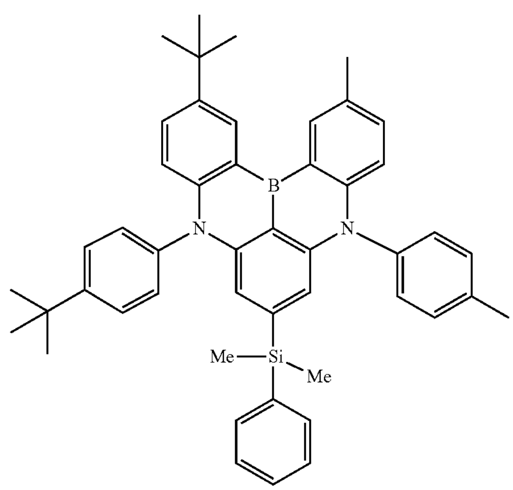

-continued
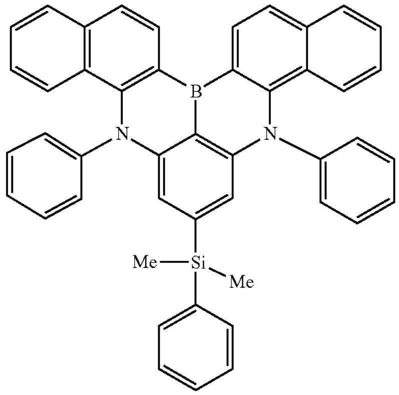
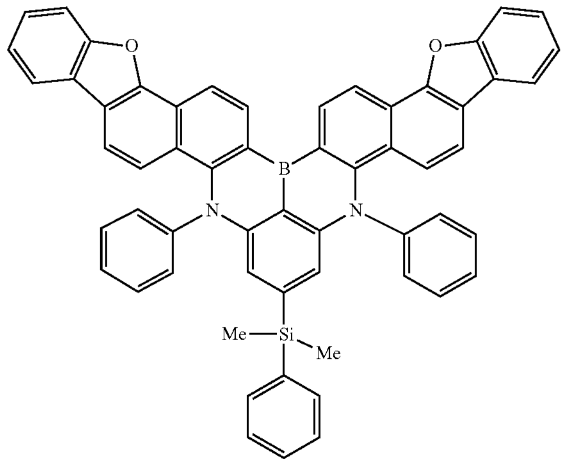
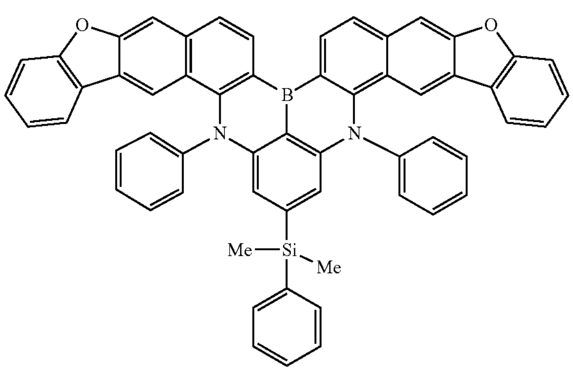
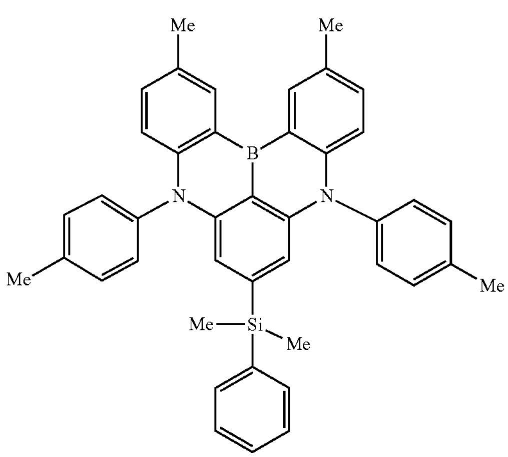
-continued
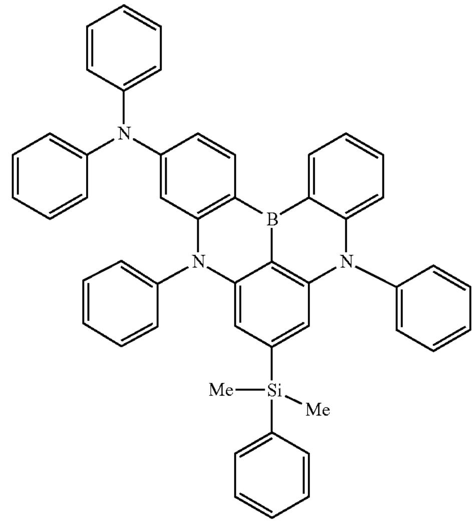
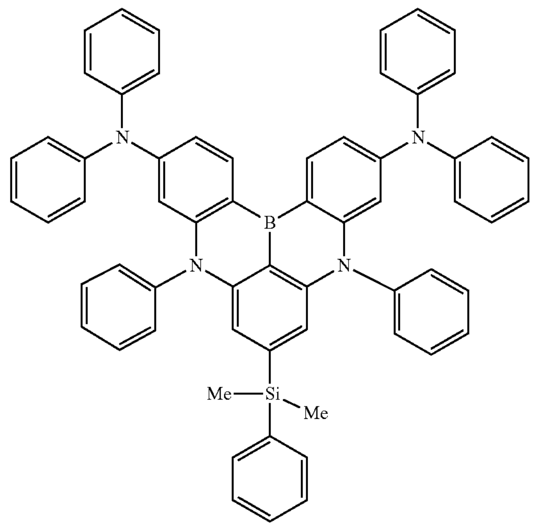
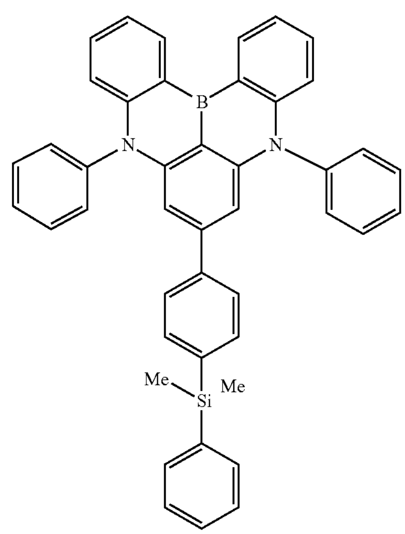

-continued
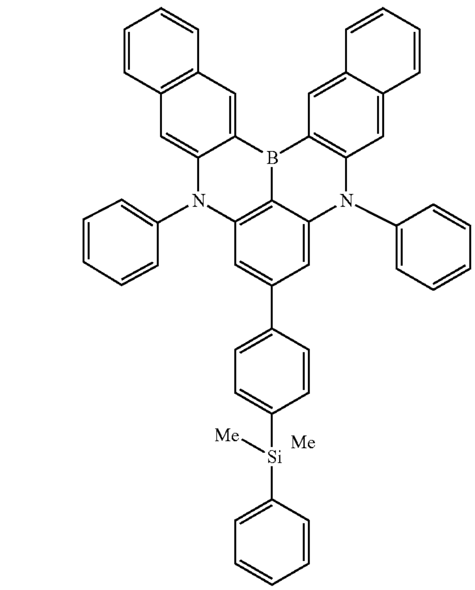
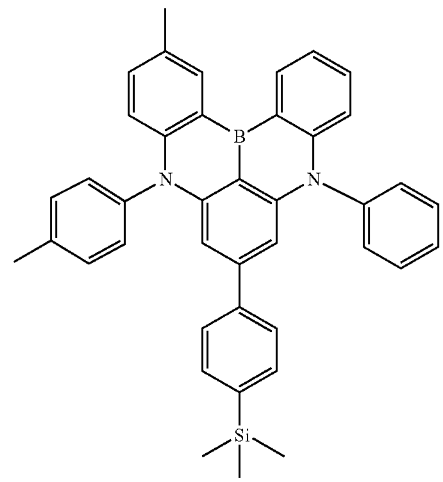
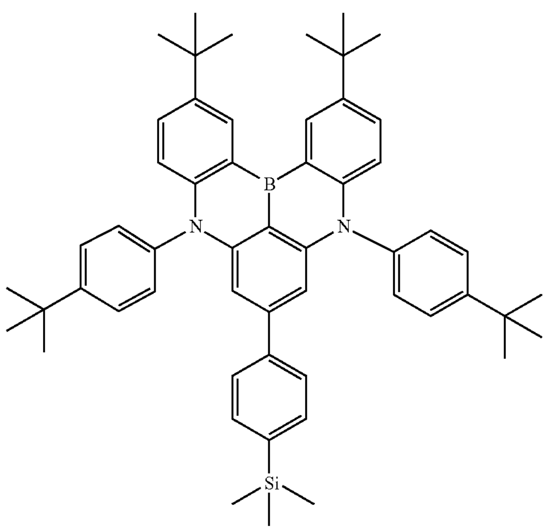
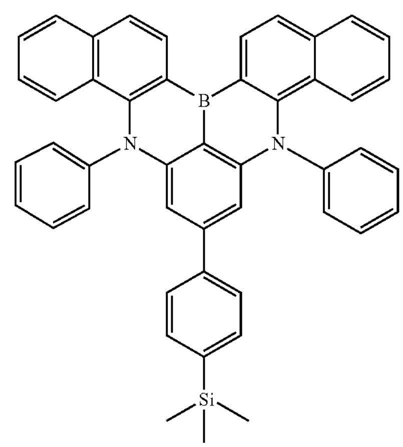
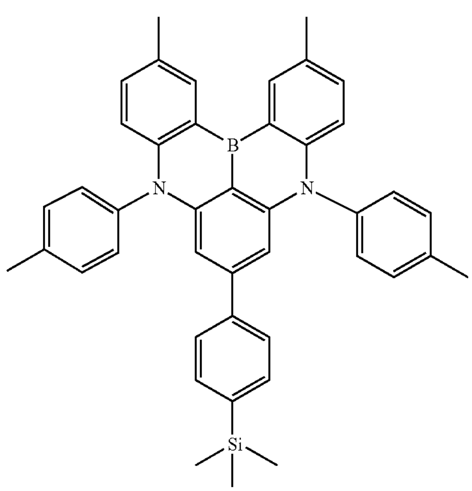
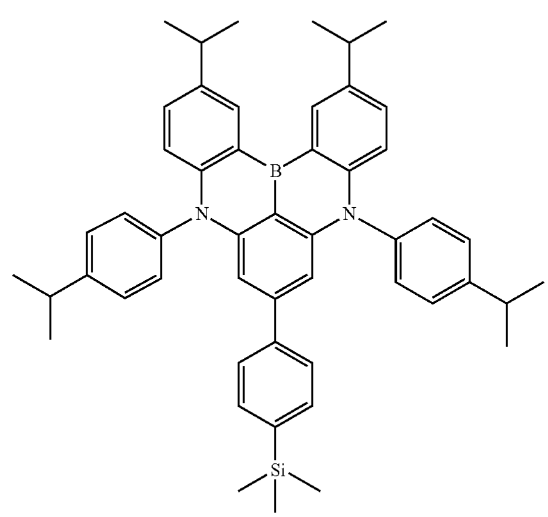

-continued
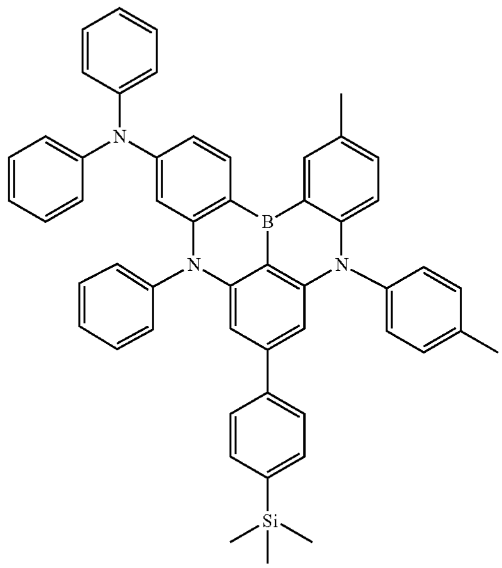
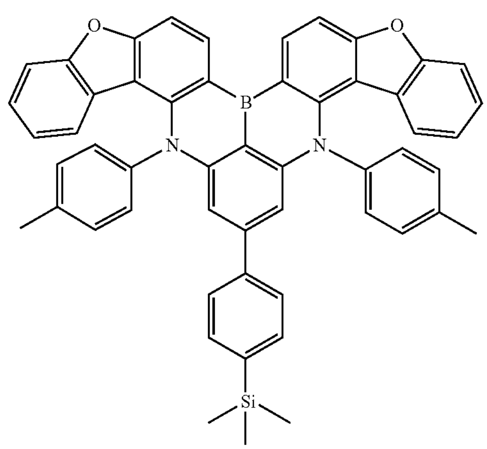
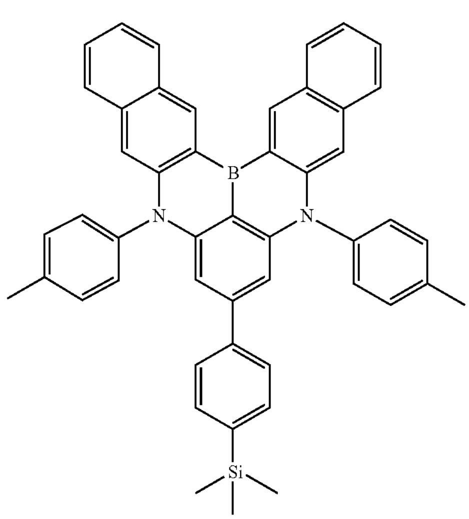
-continued
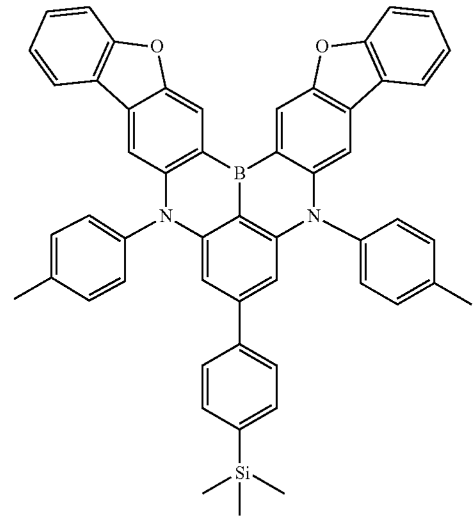
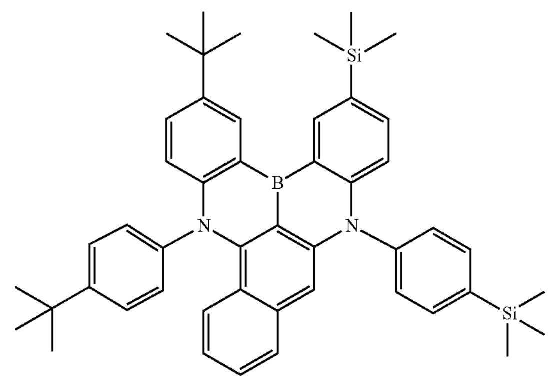
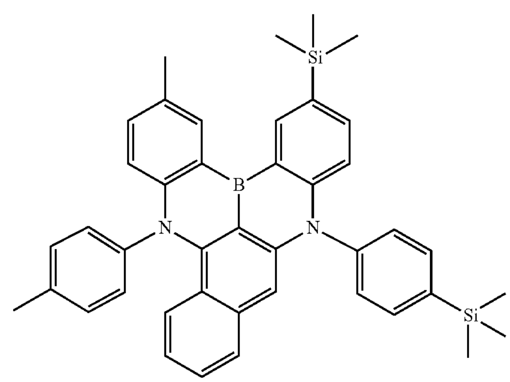
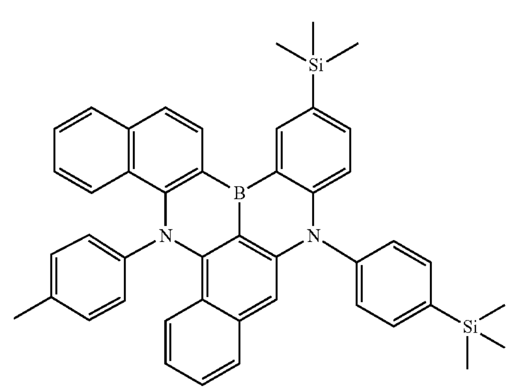

-continued
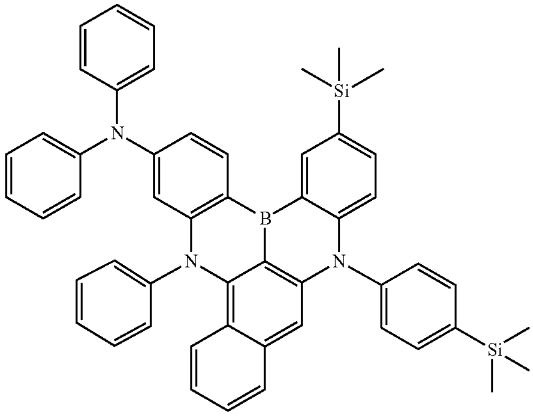
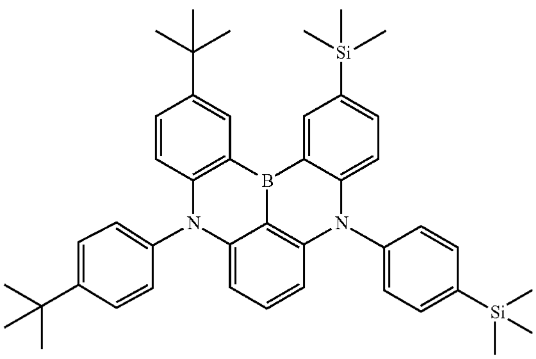
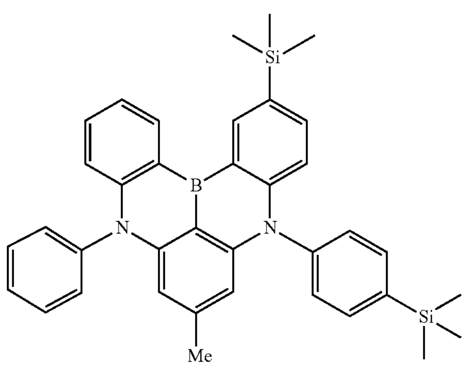
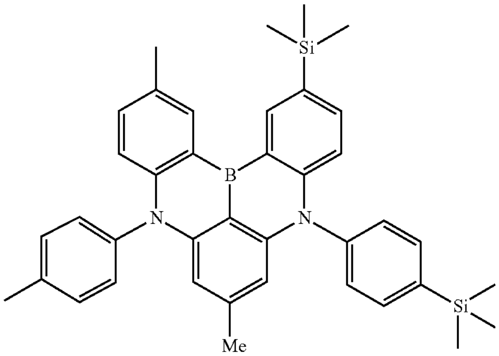
-continued
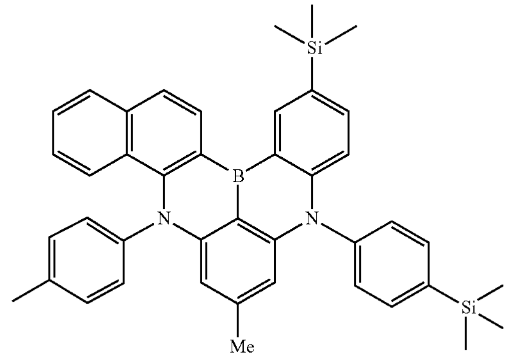
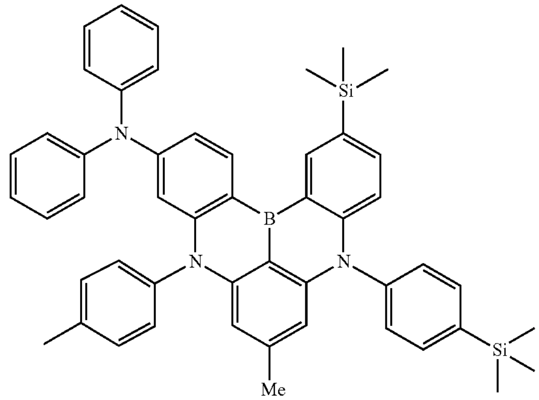
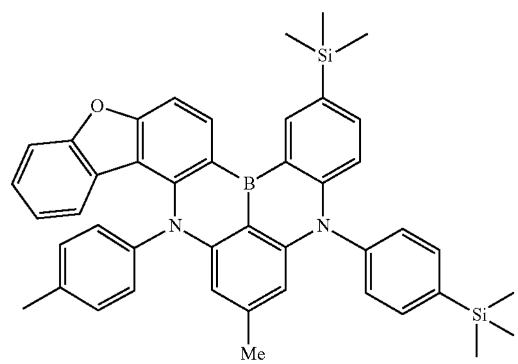
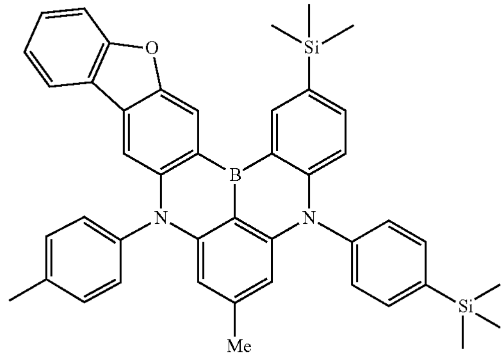

-continued
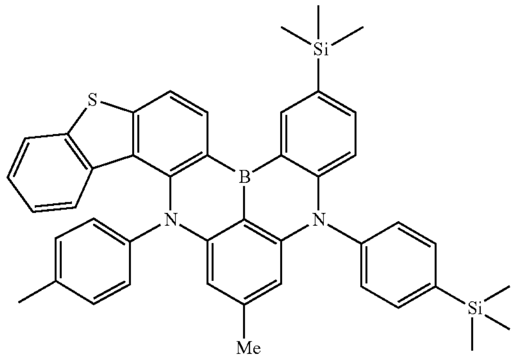
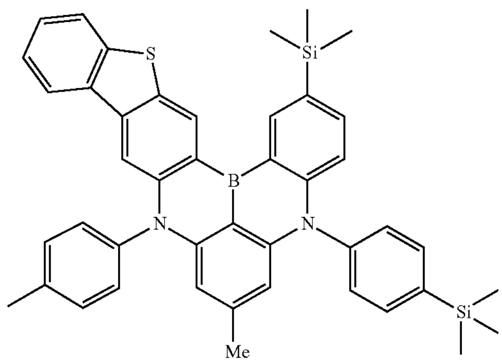
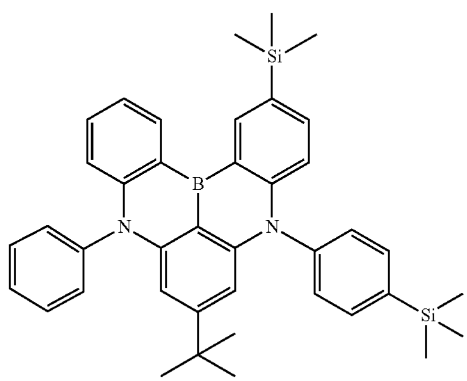
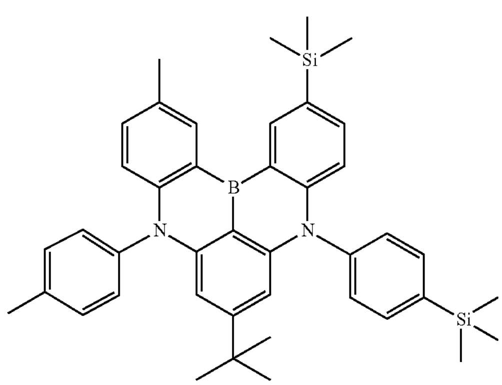
-continued
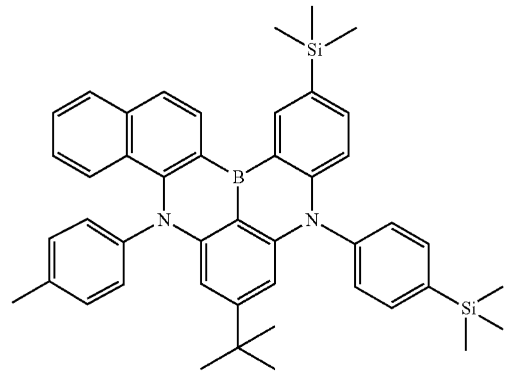
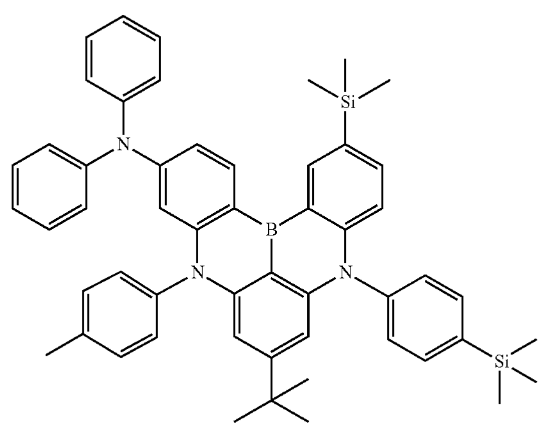
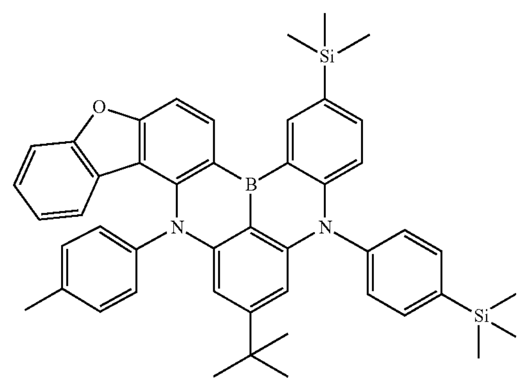
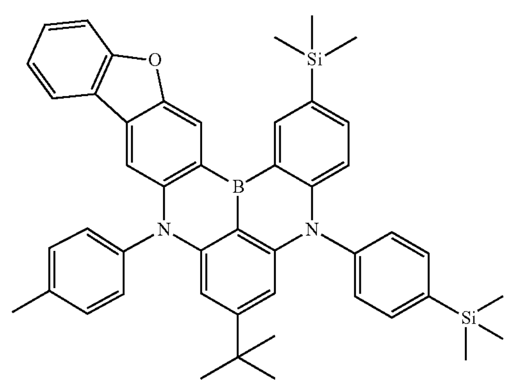

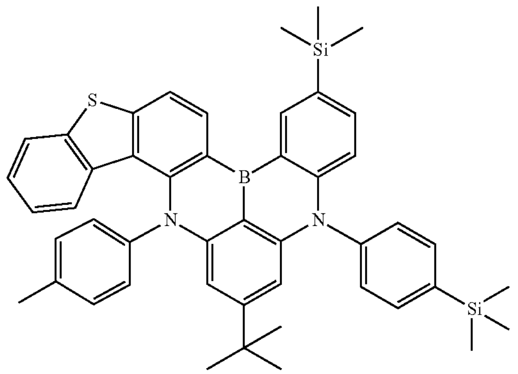
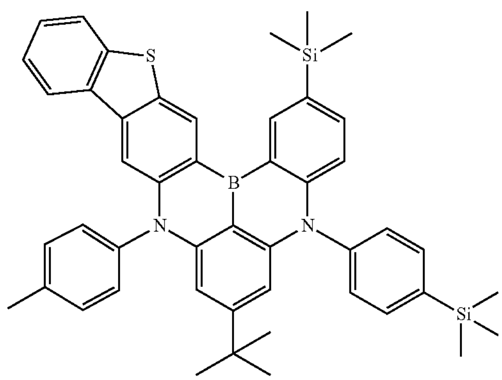
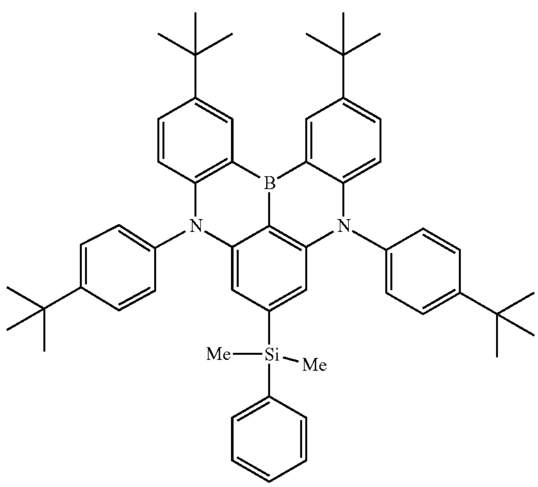
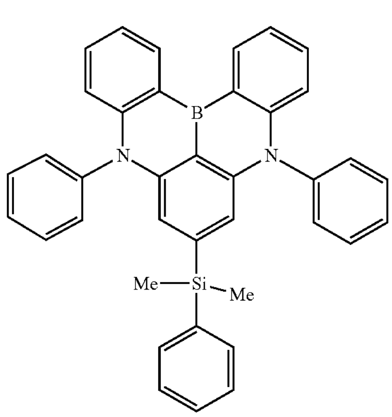
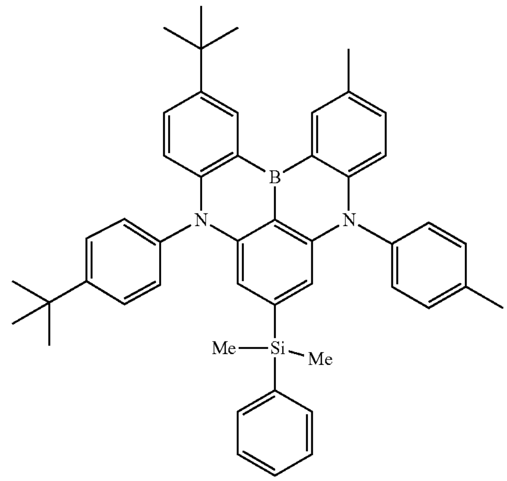
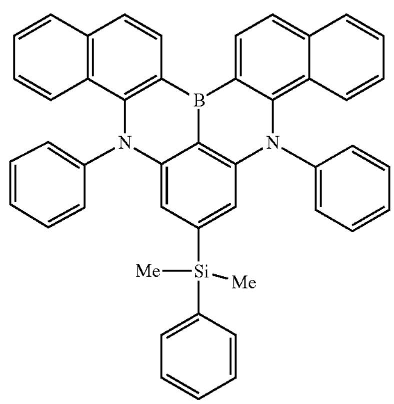
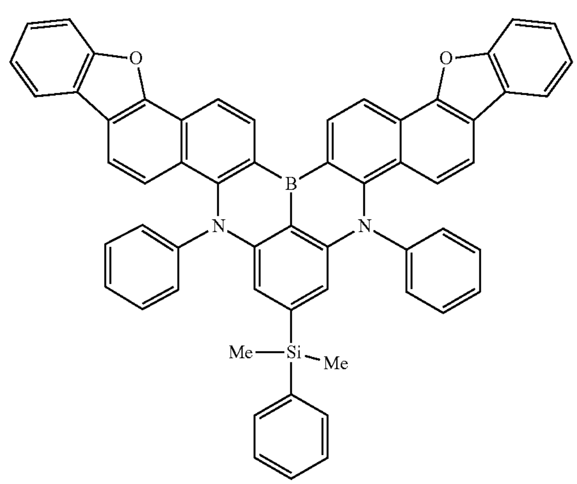

-continued
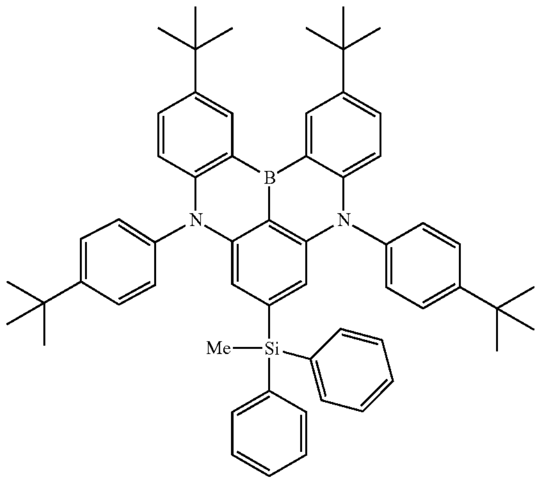
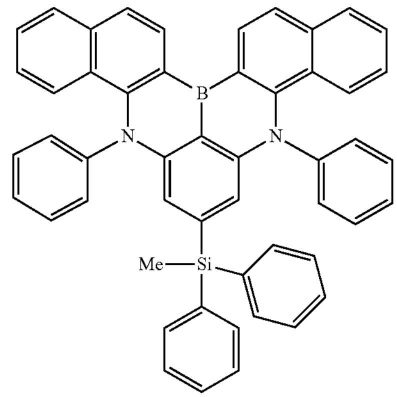
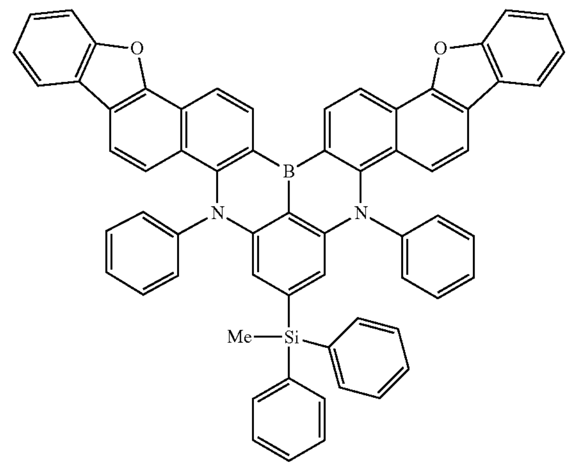
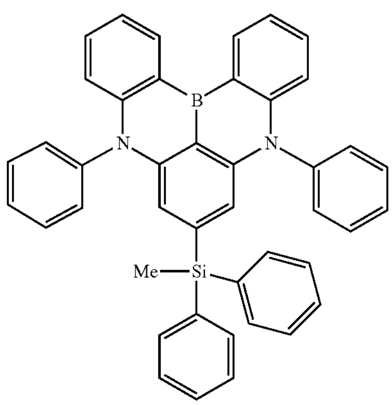
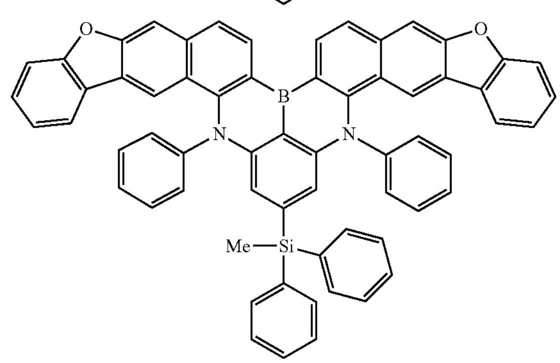
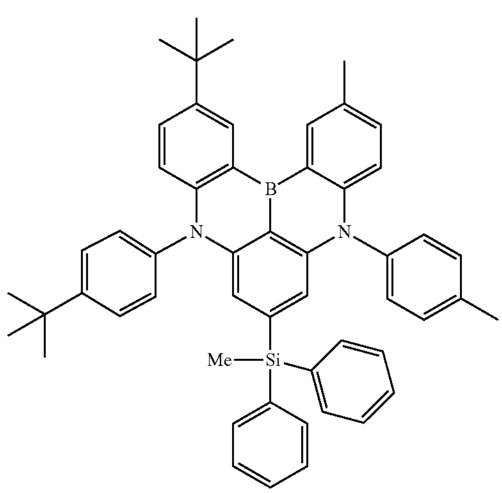
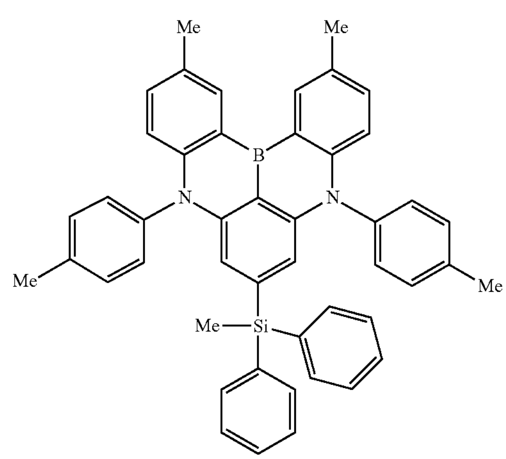

-continued
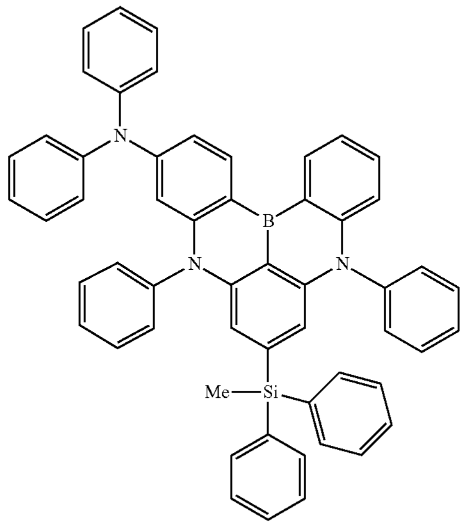
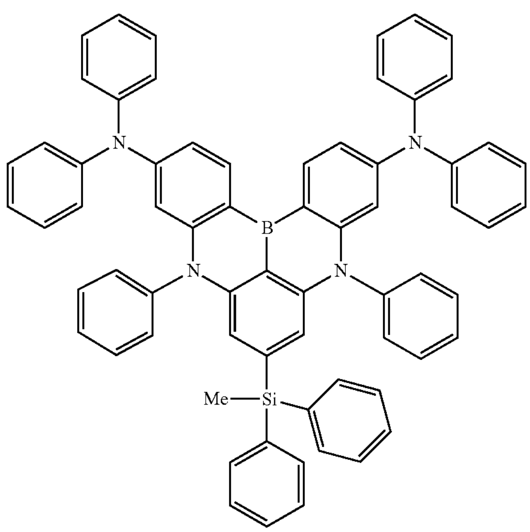
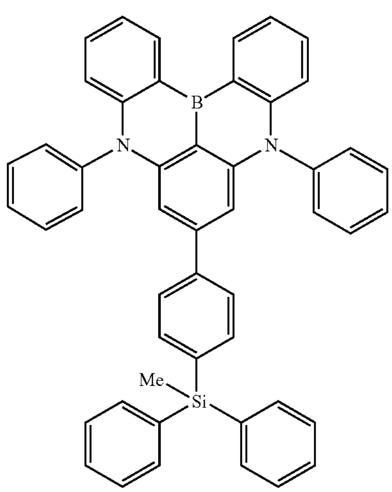
-continued
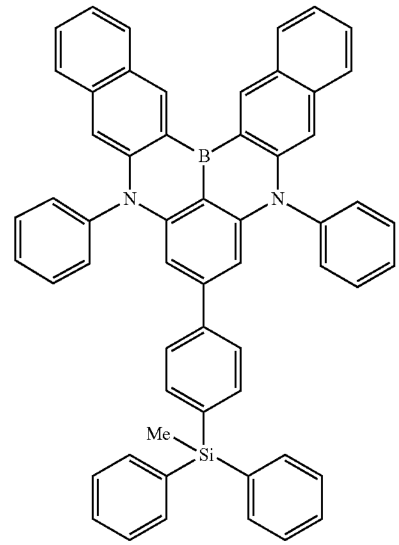
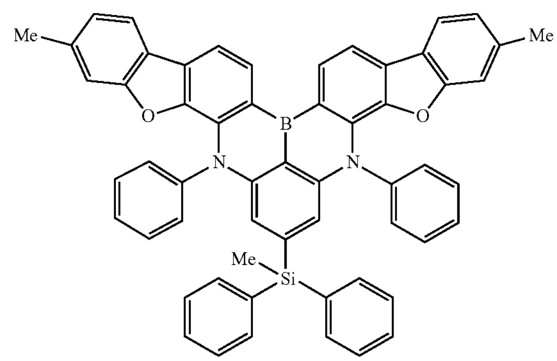
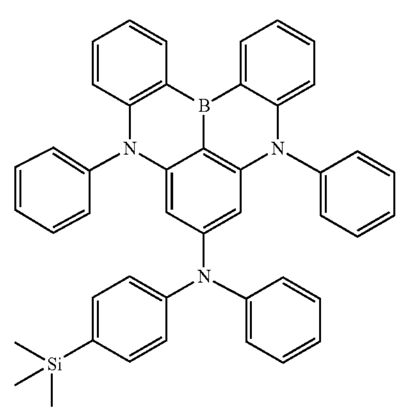

-continued
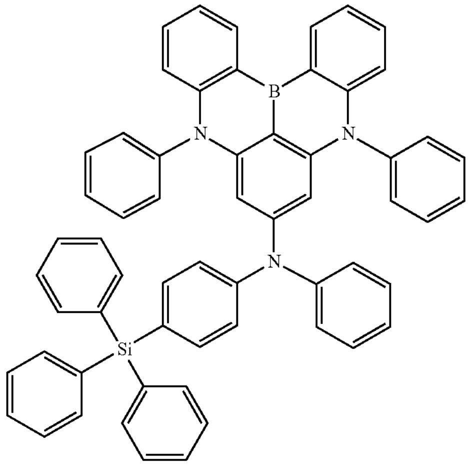 [SMILES: c1ccc(N(c2ccc([Si](c3ccccc3)(c3ccccc3)c3ccccc3)cc2)c2cc3c4c(c2)N(c2ccccc2)c2ccccc2B4c2ccccc2N3c2ccccc2)cc1]
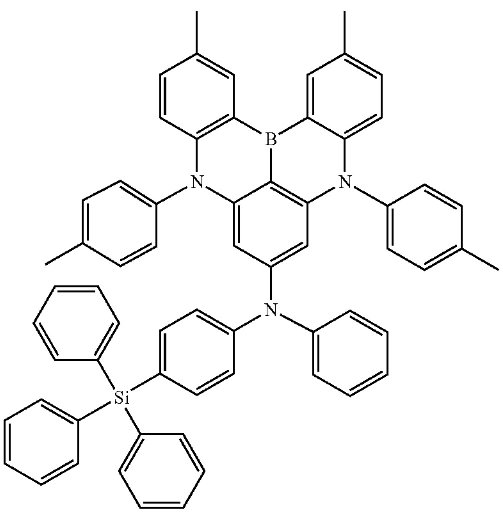
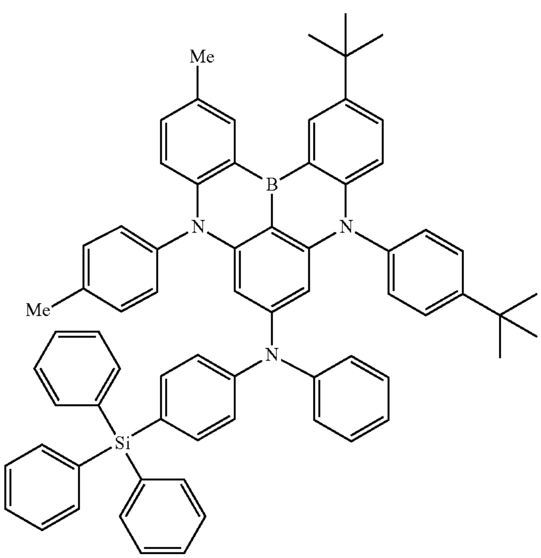
-continued
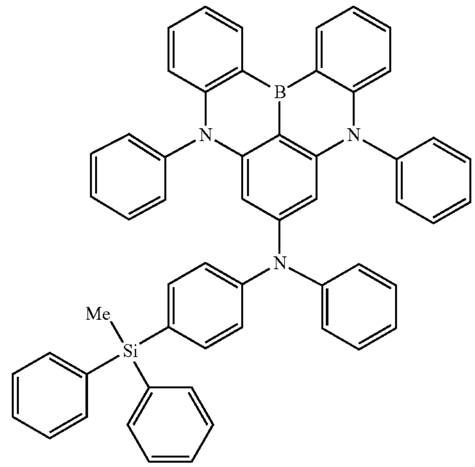
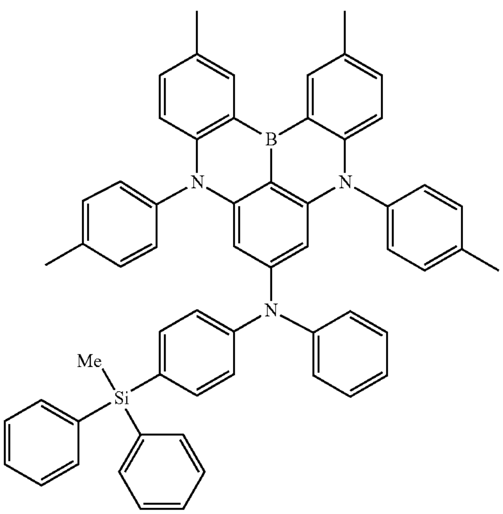
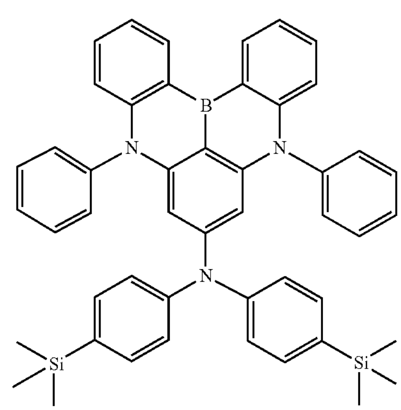

-continued

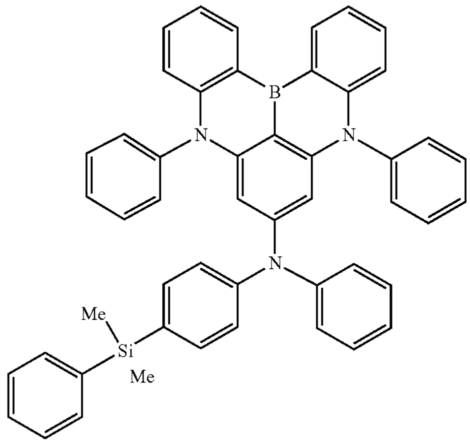

The compound represented by Formula 1 and the compound containing a structural unit represented by Formula 1 each have at least one substituted or unsubstituted silyl group, or have a substituent group substituted with at least one silyl group. Thereby, in an organic light emitting device employing the same, particularly a blue thermally activated delayed fluorescence (TADF) device and a blue fluorescent device, the quantum efficiency can be improved as compared with an organic light emitting device employing a compound having no silyl substituent.

Meanwhile, the compound represented by Formula 1 can be prepared, for example, by the preparation method as shown in the following Reaction Scheme 1. The preparation method can be further specified in the preparation examples to be described later.

[Reaction Scheme 1]

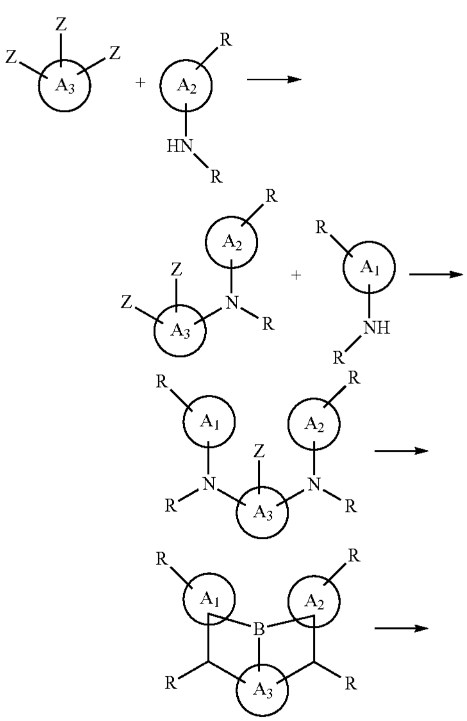

-continued

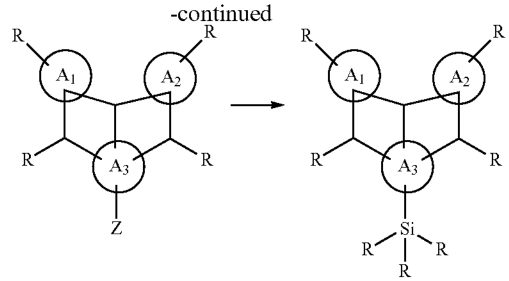

In Reaction Scheme 1, $A_1$ to $A_3$ are as defined in Formula 1, R is as defined for $R_a$, $R_b$, and $R_1$ to $R_3$ in Formula 1, and Z means a halogen or hydrogen.

The compound represented by Formula 1 can be prepared by appropriately substituting the starting material according to the structure of the compound to be prepared with reference to Reaction Scheme 1.

Meanwhile, the present disclosure provides an organic light emitting device including the compound represented by Formula 1. In one example, the present disclosure provides an organic light emitting device including: a first electrode; a second electrode provided at a side opposite to the first electrode; and at least one layer of organic material layers provided between the first electrode and the second electrode, wherein the at least one layer of the organic material layers includes a compound represented by Formula 1.

The organic material layer of the organic light emitting device of the present disclosure may have a single layer structure, or it may have a multilayered structure in which two or more organic material layers are stacked. For example, the organic light emitting device of the present disclosure may have a structure including a hole injection layer, a hole transport layer, a light emitting layer, an electron transport layer, an electron injection layer, and the like as the organic material layer. However, the structure of the organic light emitting device is not limited thereto, and it may include a smaller number of organic layers.

The organic material layer of the organic light emitting device of the present disclosure may have a single layer structure, but it may have a multilayered structure in which two or more organic material layers are stacked. For example, the organic light emitting device of the present disclosure may have a structure further including a hole injection layer and a hole transport layer between the first electrode and the light emitting layer, and an electron transport layer and an electron injection layer between the light emitting layer and the second electrode, in addition to the light emitting layer as an organic material layer. However, the structure of the organic light emitting device is not limited thereto, and it may include a smaller or greater number of organic layers.

Further, the organic light emitting device according to the present disclosure may be a normal type of organic light emitting device in which an anode, at least one organic material layer, and a cathode are sequentially stacked on a substrate. Further, the organic light emitting device according to the present disclosure may be an inverted type of organic light emitting device in which a cathode, at least one organic material layer, and an anode are sequentially stacked on a substrate. For example, the structure of an organic light emitting device according to an embodiment of the present disclosure is illustrated in FIGS. 1 and 2.

FIG. 1 shows an example of an organic light emitting device including a substrate 1, an anode 2, a light emitting layer 3, and a cathode 4. In such a structure, the compound represented by Formula 1 may be included in the light emitting layer.

FIG. 2 shows an example of an organic light emitting device including a substrate 1, an anode 2, a hole injection layer 5, a hole transport layer 6, a light emitting layer 7, an electron transport layer 8, and a cathode 4. In such a structure, the compound represented by Formula 1 may be included in at least one layer of the hole injection layer, the hole transport layer, the light emitting layer, and the electron transport layer, and it is preferably included in the light emitting layer.

The organic light emitting device according to the present disclosure may be manufactured by materials and methods known in the art, except that at least one layer of the organic material layers includes the compound represented by Formula 1. In addition, when the organic light emitting device includes a plurality of organic material layers, the organic material layers may be formed of the same material or different materials.

For example, the organic light emitting device according to the present disclosure can be manufactured by sequentially stacking a first electrode, an organic material layer, and a second electrode on a substrate. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming an organic material layer including the hole injection layer, the hole transport layer, the light emitting layer, and the electron transport layer thereon, and then depositing a material that can be used as the cathode thereon. In addition to such a method, the organic light emitting device may be manufactured by sequentially depositing a cathode material, an organic material layer, and an anode material on a substrate.

In particular, the compound represented by Formula 1 may be included in the light emitting layer, and the light emitting layer is not manufactured by a solution coating method including an organic solvent, but is manufactured by a vacuum deposition method, thereby enabling improvement of the efficiency and the low driving voltage, and/or improvement of the lifetime characteristic.

In addition to such a method, the organic light emitting device may be manufactured by sequentially depositing a cathode material, an organic material layer, and an anode material on a substrate (International Publication WO 2003/012890). However, the manufacturing method is not limited thereto.

For example, the first electrode is an anode and the second electrode is a cathode, or the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SNO_2$:Sb; conductive polymers such as poly(3-methylthiophene), poly[3,4-(ethylene-1,2-dioxy)thiophene] (PEDOT), polypyrrole, polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; and a multilayered structure material such as LiF/AI, $LiO_2$/Al, and the like, but are not limited thereto.

The hole injection layer is a layer for injecting holes from the electrode, and the hole injection material is preferably a compound which has an ability of transporting the holes, a hole injecting effect in the anode, and an excellent hole injecting effect to the light emitting layer or the light emitting material, that prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer. Specific examples of the hole injection material include a compound represented by Formula 1 according to the present disclosure, or a metal porphyrin, an oligothiophene, an arylamine-based organic material, a hexanitrilehexaazatriphenylene-based organic material, a quinacridone-based organic material, a perylene-based organic material, anthraquinone, polyaniline, a polythiophene-based conductive polymer, and the like, but are not limited thereto.

The hole transport layer is a layer that receives holes from a hole injection layer and transports the holes to the light emitting layer. The hole transport material is suitably a material having large mobility to the holes, which may receive holes from the anode or the hole injection layer and transfer the holes to the light emitting layer. Specific examples thereof include an arylamine-based organic material, a conductive polymer, a block copolymer in which a conjugate portion and a non-conjugate portion are present together, and the like, but are not limited thereto.

The light emitting material is a material capable of emitting light in the visible light region by combining holes and electrons respectively transported from the hole transport layer and the electron transport layer, and having good quantum efficiency for fluorescence or phosphorescence. Specific examples include an 8-hydroxy-quinoline aluminum complex ($Alq_3$); carbazole-based compounds; dimerized styryl compounds; BAlq; 10-hydroxybenzoquinoline-metal compounds; benzoxazole, benzothiazole, and benzimidazole-based compounds; poly(p-phenylenevinylene)(PPV)-based polymers; spiro compounds; and polyfluorene, rubrene, and the like, but are not limited thereto.

The light emitting layer may include a host material and a dopant material as described above. The compound represented by Formula 1 may be a dopant material, and the content of the dopant material may be 0.5 to 20% by weight with respect to the total content of the light emitting layer.

The host material may further include a fused aromatic ring derivative, a heterocycle-containing compound, or the like. Specifically, the host material is preferably a compound represented by the following Formula 3.

[Formula 3]

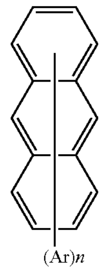

In Formula 3,

Ar is a $C_{6-20}$ aryl or a $C_{2-60}$ heteroaryl containing at least one heteroatom selected from the group consisting of N, O, and S, and n may be an integer of 1 to 10.

The compound represented by Formula 3 may be a compound represented by the following Formula 4.

[Formula 4]

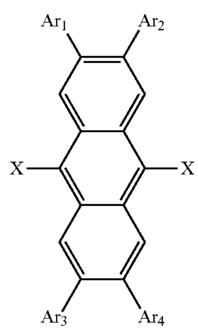

In Formula 4, $Ar_1$ to $Ar_4$ are each independently a $C_{6-20}$ aryl or a $C_{2-60}$ heteroaryl containing at least one heteroatom selected from the group consisting of N, O, and S, X may be a compound selected from the group consisting of:

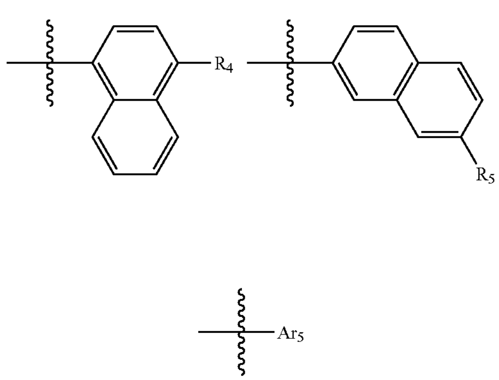

where $R_4$ and $R_5$ are each independently hydrogen, phenyl, biphenylyl, terphenylyl, quaterphenylyl, naphthyl, phenanthryl, fluorenyl, benzofluorenyl, chrysenyl, triphenylenyl, pyrenylyl, dibenzofuryl, dibenzothienyl, carbazolyl, benzocarbazolyl, or phenyl substituted carbazolyl, and $Ar_5$ is phenyl, biphenylyl, terphenylyl, naphthyl, phenanthryl, fluorenyl, chrysenyl, triphenylenyl, pyrenylyl, carbazolyl, or phenyl-substituted carbazolyl.

The electron transport layer is a layer receiving the electrons from the electron injection layer and transporting the electrons to the light emitting layer, the electron transport material is a material that can receive the electrons well from the cathode and transport the electrons to the light emitting layer, and a material having large mobility to the electrons is suitable. Specific examples thereof include an 8-hydroxyquinoline $A_1$ complex; a complex including $Alq_3$; an organic radical compound; a hydroxyflavone-metal complex; and the like, but are not limited thereto. The electron transport layer may be used together with a predetermined desired cathode material as used according to the prior art. Particularly, an example of an appropriate cathode material is a general material having a low work function and followed by an aluminum layer or a silver layer. Specific examples thereof include cesium, barium, calcium, ytterbium, and samarium, and each case is followed by the aluminum layer or the silver layer.

The electron injection layer is a layer injecting the electrons from the electrode, and a compound which has an ability of transporting the electrons, an electron injecting effect from the cathode, and an excellent electron injecting effect to the light emitting layer or the light emitting material, that prevents movement of an exciton generated in the light emitting layer to the hole injection layer, and has an excellent thin film forming ability is preferable. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and derivatives thereof, a metal complex compound, a nitrogen-containing 5-membered cycle derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present disclosure may be a front emission type, a back emission type, or a double side emission type according to the material used.

In addition, the compound represented by Formula 1 may be included in an organic solar cell or an organic transistor in addition to an organic light emitting device.

The preparation of the compound represented by Formula 1 and the organic light emitting device including the same will be described in detail in the following examples. However, these examples are presented for illustrative purposes only, and the scope of the present disclosure is not limited thereto.

Example 1: Synthesis of Formula 1

(1-a) Synthesis of Intermediate 1-A

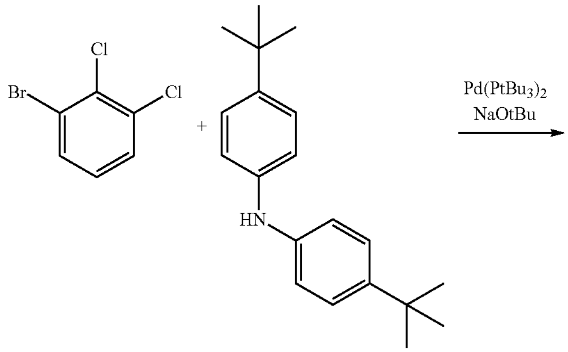

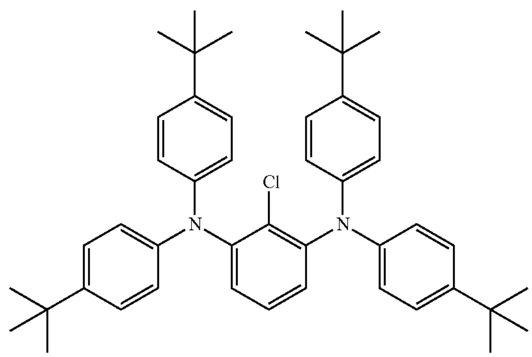

1-A

A flask containing 1-bromo-2,3-dichlorobenzene (22.6 g), bis(4-(tert-butyl)phenyl)amine (58.0 g), $Pd(PtBu_3)_2$ (0.5 g), NaOtBu (25.0 g), and xylene (260 ml) was heated to 130° C. and stirred for 4 hours. The reaction solution was cooled to room temperature, and water and ethyl acetate are added to separate liquid layers. The solvent was then distilled off under reduced pressure. It was purified by silica gel column chromatography (developer:hexane/ethyl acetate=50%/50% (v/v)) to obtain Intermediate 1-A (20.4 g). The mass spectrum of the solid was measured, and as a result, a peak was confirmed at M/Z=671.

(1-b) Synthesis of Intermediate 1-B

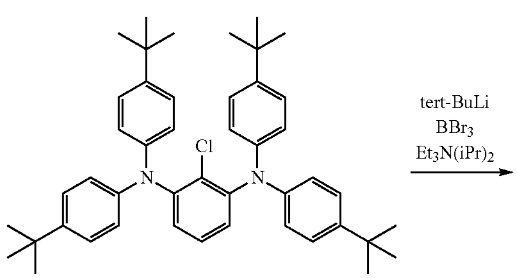

1-A

-continued

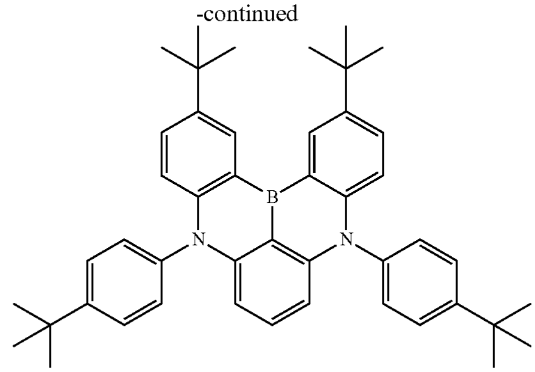

1-B

A 1.7 M tert-butyllithium pentane solution (9.2 ml) was added to a flask containing Intermediate 1-A (10.0 g) and tert-butylbenzene (160 ml) at 0° C. under an argon atmosphere. After completion of the dropwise addition, the temperature was raised to 70° C., and the mixture was stirred for 4 hours to distill off pentane. After cooling to −40° C., boron tribromide (1.6 ml) was added thereto, and the mixture was warmed to room temperature and stirred for 4 hours. Thereafter, the mixture was cooled again to 0° C., and N,N-diisopropylethylamine (6.6 ml) was added thereto and stirred at room temperature, followed by stirring at 80° C. for 4 hours. The reaction solution was cooled to room temperature, and water and ethyl acetate were added thereto to separate liquid layers. The solvent was then distilled off under reduced pressure. Acetonitrile was added thereto to obtain Intermediate 1-B (2.8 g). The mass spectrum of the obtained solid was measured, and as a result, a peak was confirmed at M/Z=645.

(1-c) Synthesis of Intermediate 1-C

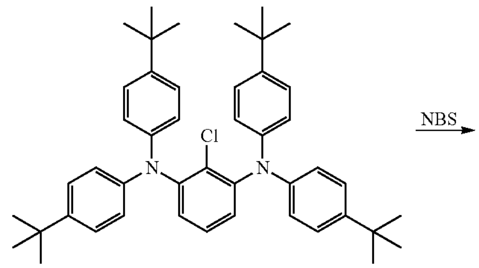

1-B

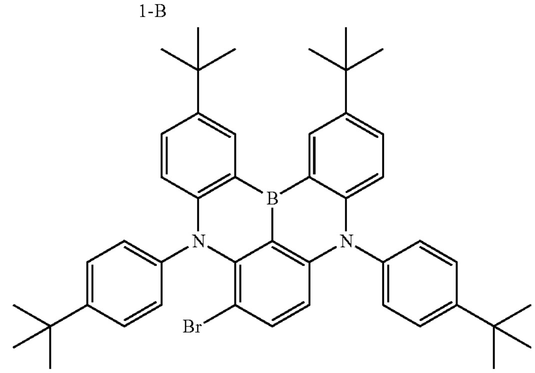

1-C

Intermediate 1-B (4.0 g) was dissolved in 300 ml of chloroform, and N-bromosuccinimide (1.2 g) was added thereto over 30 minutes and then stirred at room temperature for 4 hours. Distilled water was added to the reaction solution to complete the reaction, and the organic layer was extracted. The reaction solution was concentrated, and Compound 1-C (2.0 g) was obtained using column chromatography (developer:hexane/ethyl acetate=50%/50% (v/v)). A peak was confirmed at M/Z=724.

(1-d) Synthesis of Compound 1

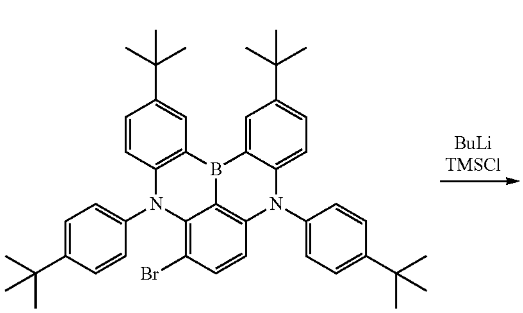

1-C

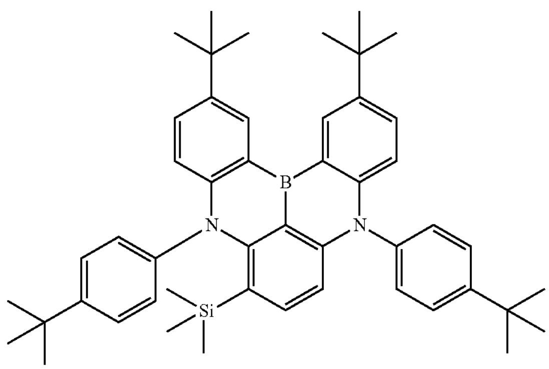

1

Intermediate 1-C (2.0 g) was dissolved in 200 ml of anhydrous tetrahydrofuran under a nitrogen atmosphere, and the ambient temperature of the reactor was maintained at −78° C. Then, 1.1 ml of 2.5 M-butyllithium was slowly added dropwise. After completion of the dropwise addition, stirring was performed for 1 hour, 0.6 ml of chlorotrimethylsilane was dissolved in 20 ml of purified tetrahydrofuran, and then slowly added dropwise. The reaction solution was stirred for about 1 hour while being maintained at −78° C., and then diluted hydrochloric acid was added to the reaction solution to complete the reaction. Liquid layers were separated and extracted with methylene chloride. The resultant organic layer was dried with magnesium sulfate, filtered, and then distilled under reduced pressure. Column chromatography (developer:hexane/ethyl acetate=50%/50% (v/v)) was used to prepare Compound 1 (0.4 g). The mass spectrum of the obtained solid was measured, and as a result, a peak was confirmed at M/Z=717.

The Compound 1 was measured using a spectrophotometer U-3310 (manufactured by Hitachi High-Tech Science Corporation), and the absorption peak wavelength was observed at 437 nm. Further, Compound 1 was measured using a fluorescence spectrum measuring device, fluorescence spectrophotometer F-7000 (manufactured by Hitachi High-Tech Science Corporation), and the phosphor light emission peak wavelength was observed at 452 nm. FIG. 3 is a graph in which the absorption peak wavelength of the compound 1 is measured by fluorescence spectrophotometry.

In addition, the half-value width was measured using fluorescence spectrophotometer F-7000 (manufactured by Hitachi High-Tech Science Corporation), and the measurement method is as follows. Specifically, Compound 1 was dissolved in a solvent (toluene) (sample 5 [μmol/mL]) and used as a sample for fluorescence measurement. A sample for fluorescence measurement placed in a quartz cell was irradiated with excitation light at room temperature, and the fluorescence intensity was measured while changing the wavelength. In the light emission spectrum, the vertical axis represents fluorescence intensity, and the horizontal axis represents wavelength. The half-value width was measured from this light emission spectrum, and as a result, the half-value width of Compound 1 was 30 nm. FIG. 4 is a graph in which the half-value width of Compound 1 is measured by fluorescence spectrophotometry.

Example 2: Synthesis of Compound 2

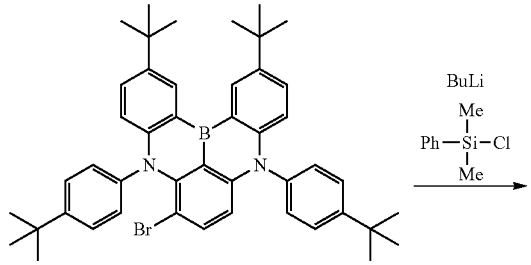

1-C

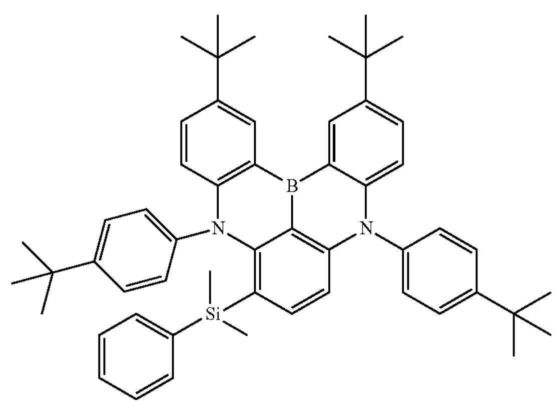

2

Compound 2 (0.2 g) was prepared in the same manner as in the step 1-d for synthesizing Compound 1, except that 0.6 ml of chlorotrimethylsilane was changed to 0.8 ml of chloro(dimethyl)phenylsilane. The mass spectrum of the obtained solid was measured, and as a result, a peak was confirmed at M/Z=779.

Example 3: Synthesis of Compound 3

(3-a) Synthesis of Intermediate 3-A

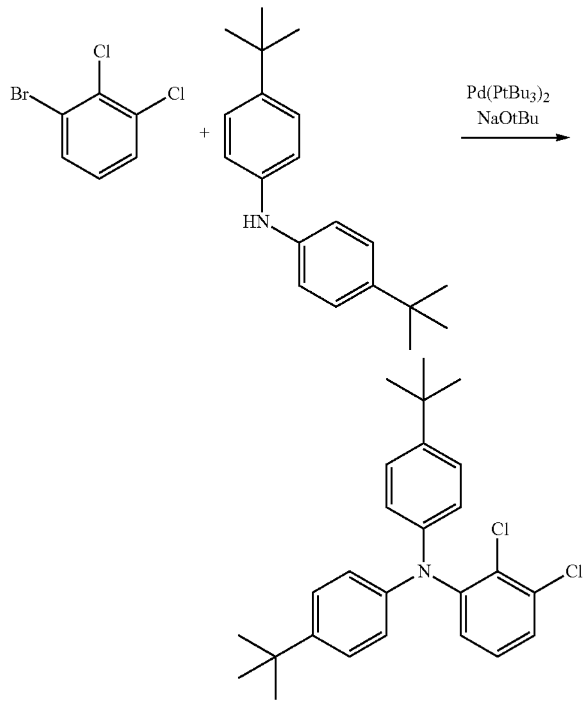

3-A

A flask containing 1-bromo-2,3-dichlorobenzene (22.6 g), bis(4-(tert-butyl)phenyl)amine (28.2 g), $Pd(PtBu_3)_2$ (0.2 g), NaOtBu (12.6 g), and toluene (130 ml) was heated to 110° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 3-A (20.8 g). The mass spectrum of the obtained solid was measured, and as a result, a peak was confirmed at M/Z=426.

(3-b) Synthesis of Intermediate 3-B

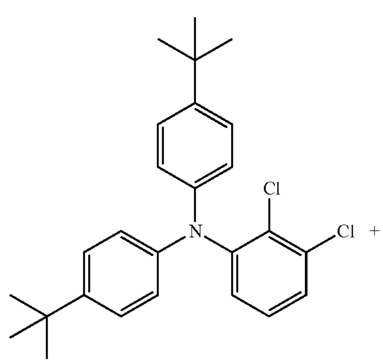

3-A

-continued

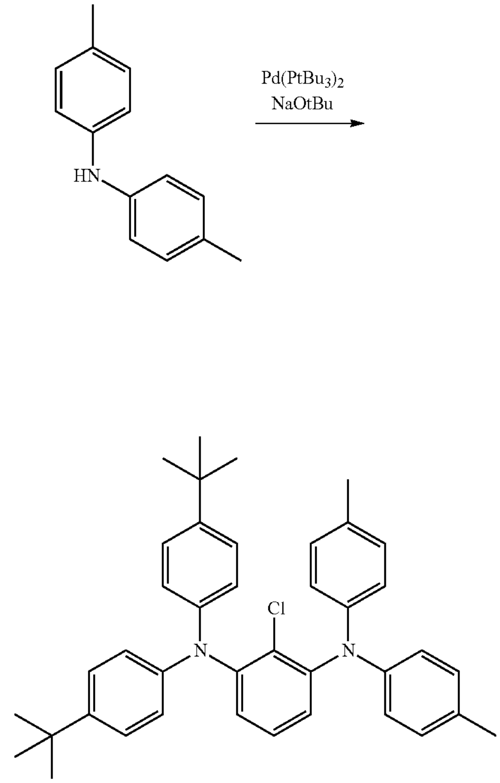

3-B

A flask containing Intermediate 3-A (41.1 g), di-p-tolylamine (20.6 g), $Pd(PtBu_3)_2$ (0.2 g), NaOtBu (12.6 g), and toluene (130 ml) was heated to 110° C. and stirred for 4 hours. The reaction solution was cooled to room temperature, and water and ethyl acetate were added to separate liquid layers. The solvent was then distilled off under reduced pressure. It was purified by silica gel column chromatography (developerhexane/ethyl acetate=50%/50% (v/v)) to obtain Intermediate 3-B (19.2 g). The mass spectrum measurement of the obtained solid was measured, and as a result, a peak was confirmed at M/Z=587.

(3-c) Synthesis of Intermediate 3-C

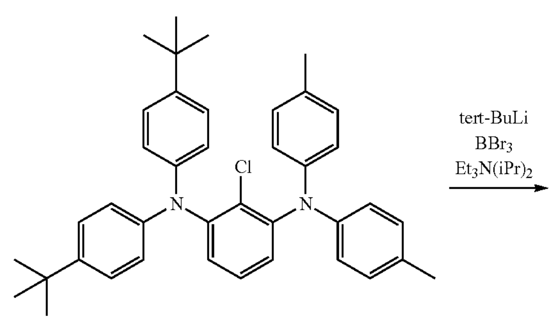

3-B

-continued

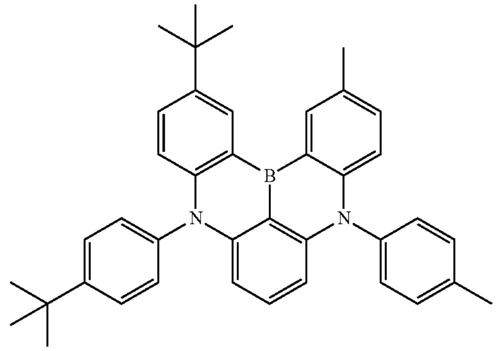

3-C

Intermediate 3-C (3.0 g) was obtained in the same manner as in the step 1-b for synthesizing Intermediate 1-B, except that Intermediate 1-A was changed to Intermediate 3-B (8.7 g). The mass spectrum of the obtained solid was measured, and as a result, a peak was confirmed at M/Z=561.

(3-d) Synthesis of Intermediate 3-D

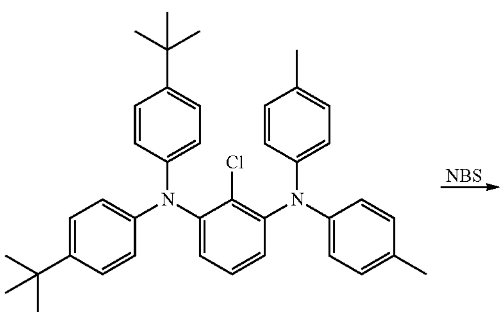

3-C

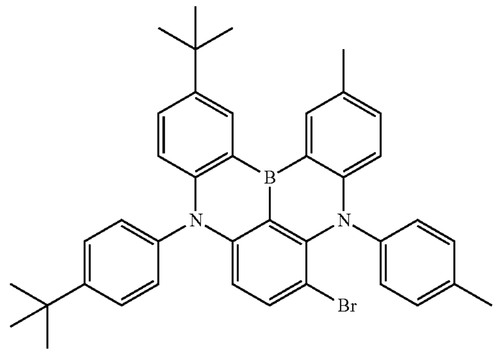

3-D

Intermediate 3-D (1.6 g) was obtained in the same manner as in the step 1-c for synthesizing Intermediate 1-C, except that Intermediate 1-B was changed to Intermediate 3-C (3.5 g). The mass spectrum of the obtained solid was measured, and as a result, a peak was confirmed at M/Z=639.

(3-e) Synthesis of Compound 3

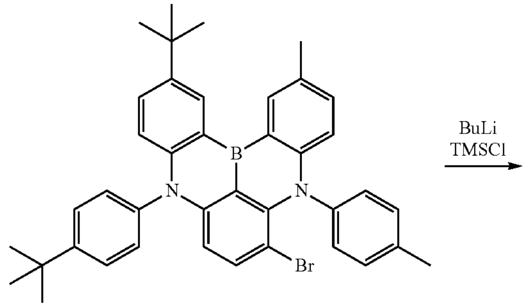

3-D

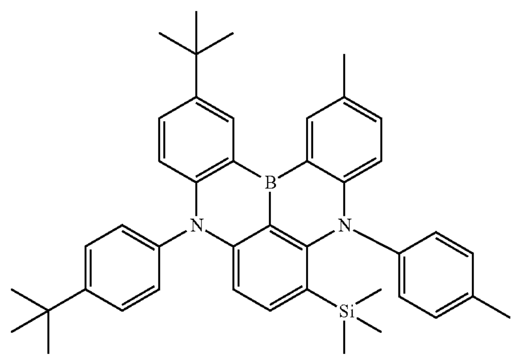

3

Compound 3 (0.3 g) was obtained in the same manner as in the step 1-d for synthesizing Compound 1, except that Intermediate 1-C was changed to Intermediate 3-D (1.8 g). The mass spectrum of the obtained solid was measured, and as a result, a peak was confirmed at M/Z=633.

Example 4: Synthesis of Compound 4

(4-a) Synthesis of Intermediate 4-A

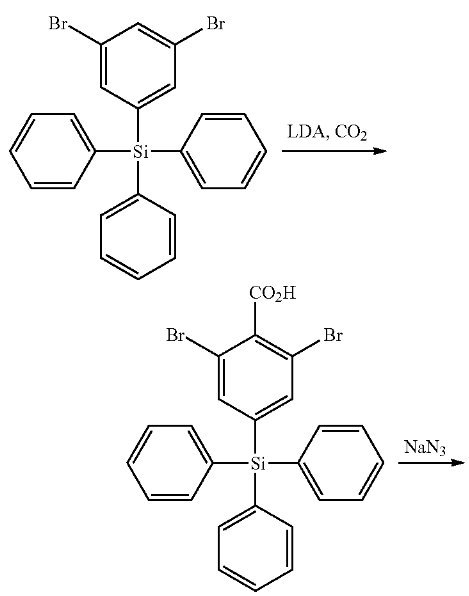

-continued

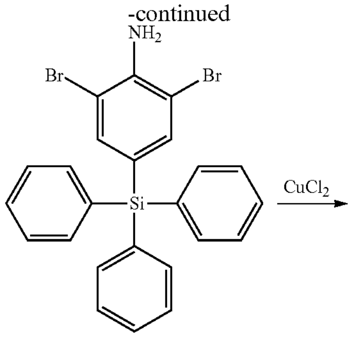

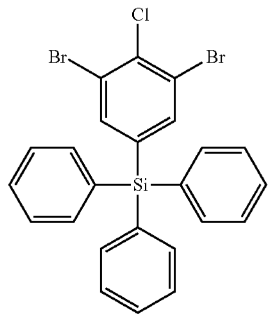

4-A

Diisopropylamine (15.5 ml) was added to 200 ml of anhydrous tetrahydrofuran under a nitrogen atmosphere, and then 42.0 ml of 2.5M-butyllithium was slowly added dropwise at −78° C. The reaction solution was stirred for about 2 hours while being maintained at −78° C. 49.4 g of (3,5-dibromophenyl)triphenylsilane was dissolved in 100 ml of tetrahydrofuran and slowly added dropwise. After stirring at −78° C. for 2 hours, an excess amount of carbon dioxide gas was added and the temperature was gradually raised to room temperature. The diluted hydrochloric acid was added to the reaction solution to complete the reaction, and then liquid layers were separated and extracted with methylene chloride. The resultant organic layer was dried with magnesium sulfate, filtered, and then distilled under reduced pressure. Column chromatography (developer:hexane/ethyl acetate=60%/40% (v/v)) was used to prepare 34.2 g of 2,6-dibromo-4-(triphenylsilyl)benzoic acid.

Subsequently, 34.2 g of 2,6-dibromo-4-(triphenylsilyl) benzoic acid was dissolved in 160 ml of sulfuric acid and heated at 60° C. for 2 hours. After cooling to room temperature, sodium azide ($NaN_3$) (8.2 g) was added, and stirred at 0° C. for 48 hours. After completion of the reaction, liquid layers were separated and extracted using ammonia water and ethyl acetate. The resultant organic layer was dried with magnesium sulfate, filtered, and then distilled under reduced pressure. Column chromatography (developer:ethyl acetate) was used to prepare 22.6 g of 2,6-dibromo-4-(triphenylsilyl) aniline.

Subsequently, 2,6-dibromo-4-(triphenylsilyl)aniline (22.6 g) was suspended in a sulfuric acid aqueous solution, and 6.0 g of sodium nitrite was added at 0° C. to perform diazotization. Thereafter, an aqueous solution of urea was added. This solution was added to a hydrochloric acid aqueous solution of $CuCl_2$ (13.1 g) over a plurality of additions, and stirred at room temperature for 2 hours and at 60° C. for 4 hours. After completion of the reaction, liquid layers were separated and extracted using ammonia water and ethyl acetate. The resultant organic layer was dried with magnesium sulfate, filtered, and distilled under reduced pressure. The precipitated solid was washed with water and ethanol and dried to obtain Intermediate 4-A (10.6 g). The mass spectrum of the obtained solid was measured, and as a result, a peak was confirmed at M/Z=529.

(4-b) Synthesis of Intermediate 4-B

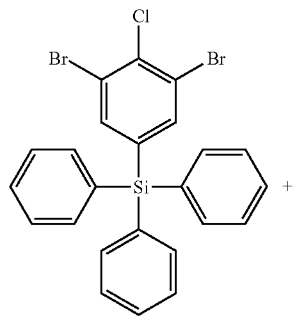

4-A

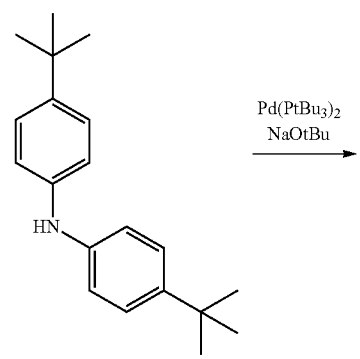

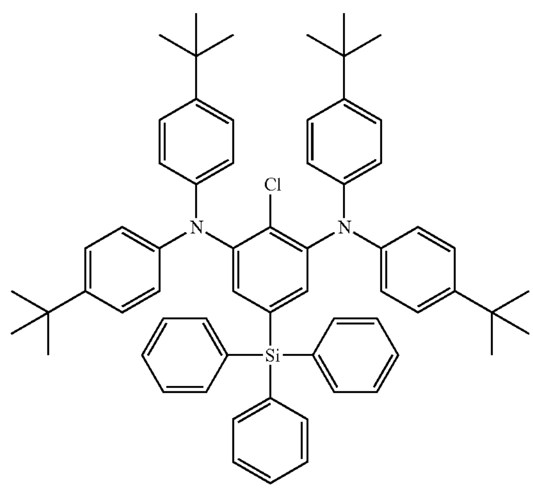

4-B

Intermediate 4-B (36.0 g) was obtained in the same manner as in the step 1-a for synthesizing Intermediate 1-A, except that 1-bromo-2,3-dichlorobenzene (22.6 g) was changed to Intermediate 4-A (52.9 g). The mass spectrum of the obtained solid was measured, and as a result, a peak was confirmed at M/Z=930.

(4-c) Synthesis of Compound 4

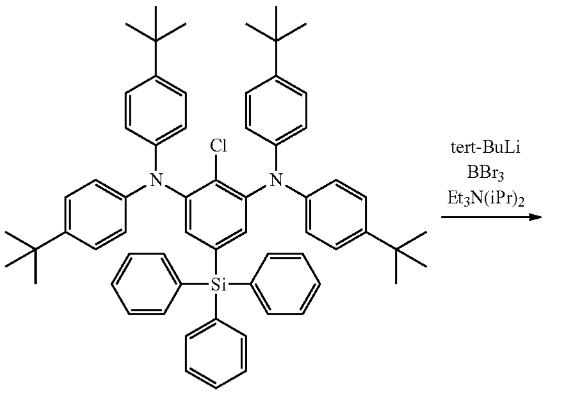

4-B

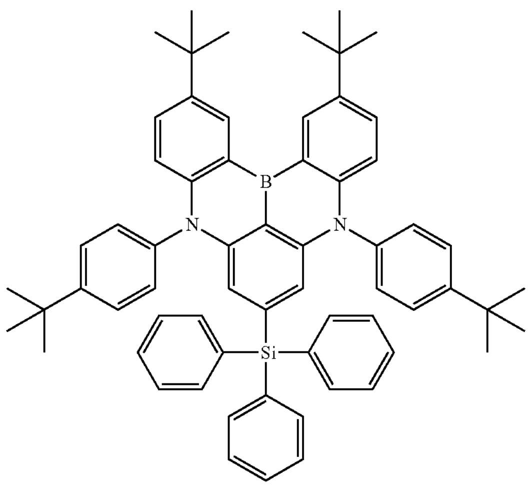

4

Compound 4 (1.2 g) was obtained in the same manner as in the step 1-b for synthesizing Intermediate 1-B, except that Intermediate 1-A was changed to Intermediate 4-B (13.8 g). The mass spectrum of the obtained solid was measured, and as a result, a peak was confirmed at M/Z=903.

Example 5: Synthesis of Compound 5

(5-a) Synthesis of Intermediate 5-A

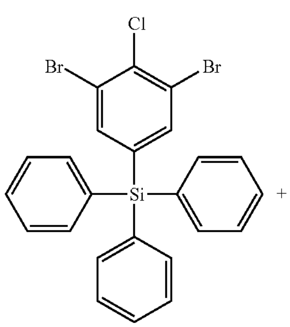

4-a

-continued

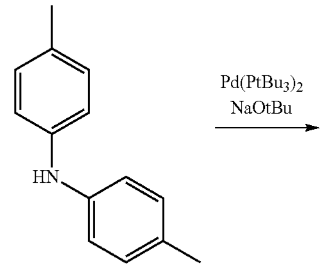

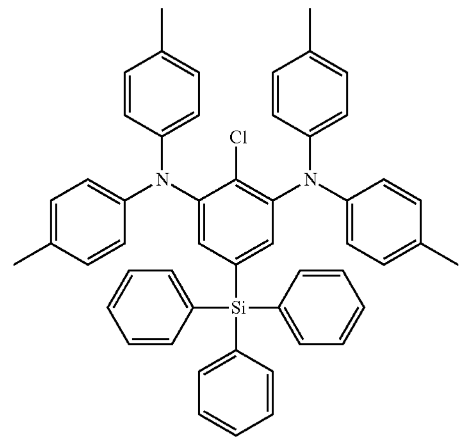

5-A

Compound 5-A (29.0 g) was obtained in the same manner as in the step 4-b for synthesizing Intermediate 4-B, except that bis(4-(tert-butyl)phenyl)amine (58.0 g) was changed to di-p-tolylamine (40.7 g). The mass spectrum of the obtained solid was measured, and as a result, a peak was confirmed at M/Z=761.

(5-b) Synthesis of Compound 5

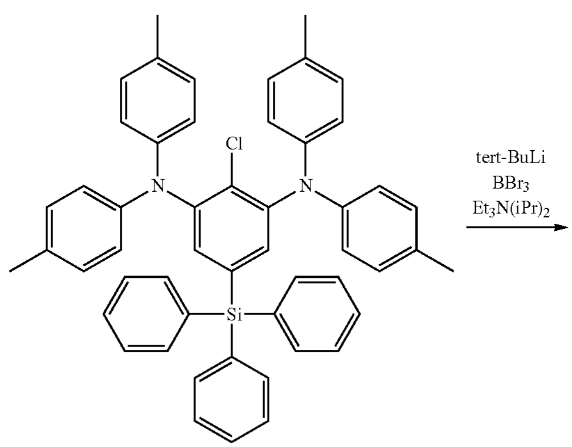

5-A

-continued

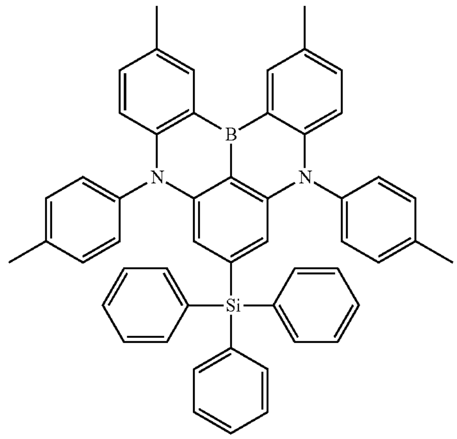

5

Compound 5 (1.8 g) was obtained in the same manner as in the step 4-b for synthesizing Compound 4-B, except that Intermediate 4-B (13.8 g) was changed to Intermediate 5-A (11.3 g). The mass spectrum of the obtained solid was measured, and as a result, a peak was confirmed at M/Z=735.

Example 6: Synthesis of Compound 6

(6-a) Synthesis of Intermediate 6-A

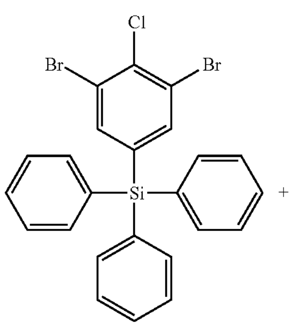

4-A

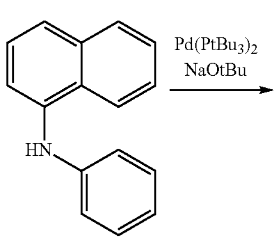

-continued

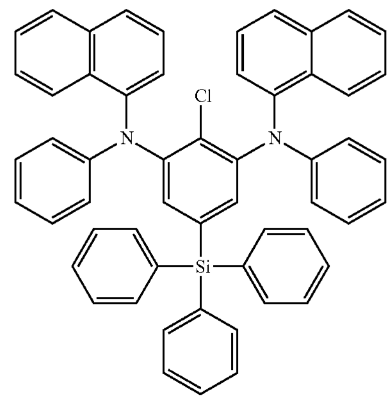

6-A

A flask containing Intermediate 4-A (26.4 g), N-phenylnaphthalen-1-amine (24.0 g), $Pd(PtBu_3)_2$ (0.4 g), NaOtBu (13.0 g), and xylene (260 ml) was heated to 130° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 6-A (12.8 g). The mass spectrum of the obtained solid was measured, and as a result, a peak was confirmed at M/Z=805.

(6-b) Synthesis of Compound 6

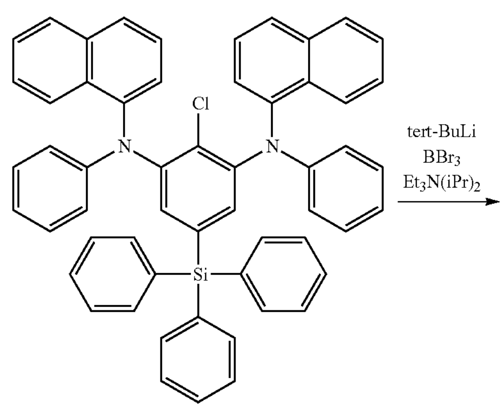

6-A

-continued

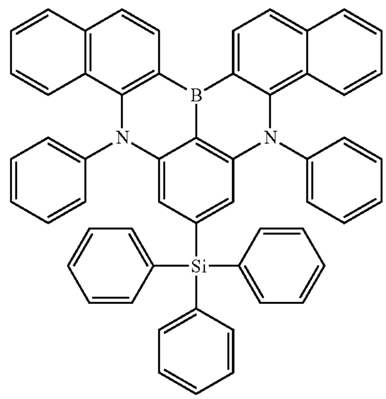

6

Compound 6 (2.0 g) was obtained in the same manner as in the step 4-b for synthesizing Compound 4, except that Intermediate 4-B (13.8 g) was changed to Intermediate 6-A (12.0 g). The mass spectrum of the obtained solid was measured, and as a result, a peak was confirmed at M/Z=779.

Example 7: Synthesis of Compound 7

(7-a) Synthesis of Intermediate 7-A

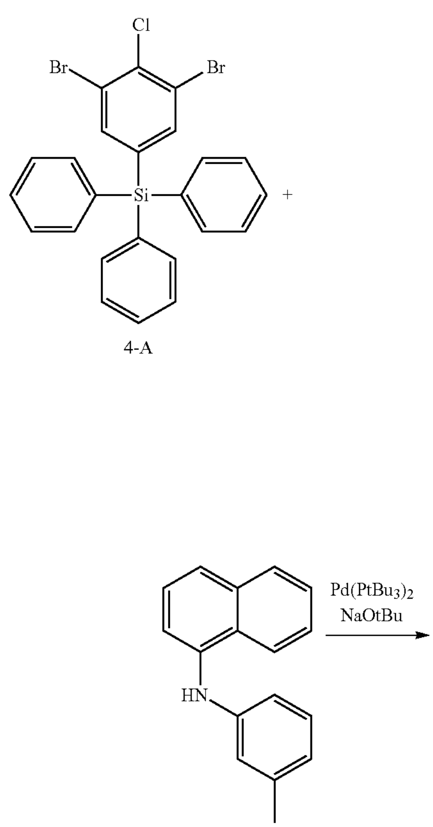

-continued

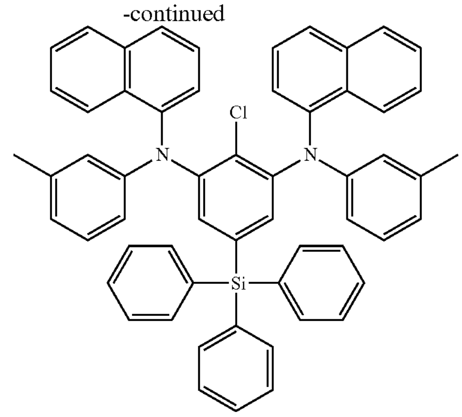

7-A

Intermediate 7-A (10.6 g) was obtained in the same manner as in the step 6-a for synthesizing Compound 6-A, except that N-phenylnaphthalen-1-amine (24.0 g) was changed to N-(m-tolyl)naphthalen-1-amine (25.5 g). The mass spectrum of the obtained solid was measured, and as a result, a peak was confirmed at M/Z=834.

(7-b) Synthesis of Compound 7

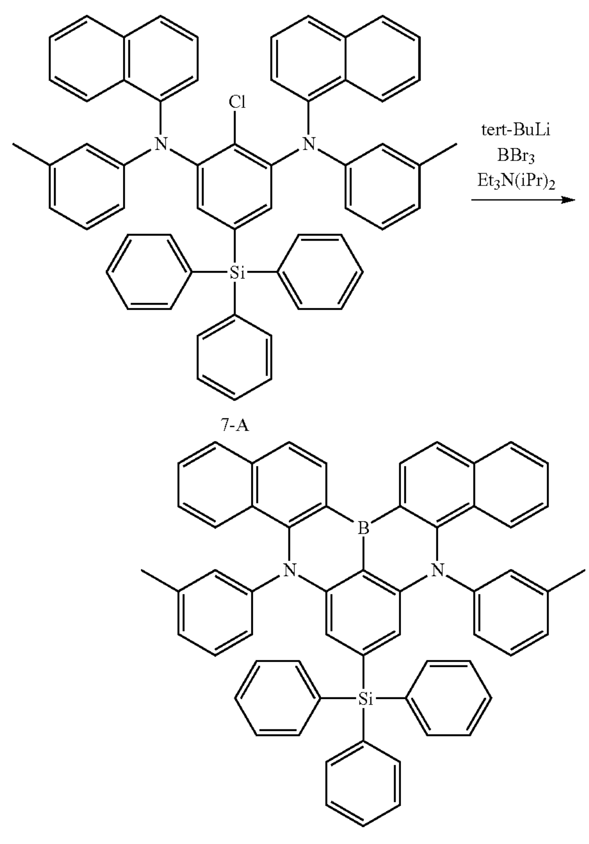

Compound 7 (2.2 g) was obtained in the same manner as in the step 4-b for synthesizing Compound 4, except that Intermediate 4-B (13.8 g) was changed to Intermediate 7-A (12.4 g). The mass spectrum of the obtained solid was measured, and as a result, a peak was confirmed at M/Z=807.

Example 8: Synthesis of Compound 8

(8-a) Synthesis of Intermediate 8-A

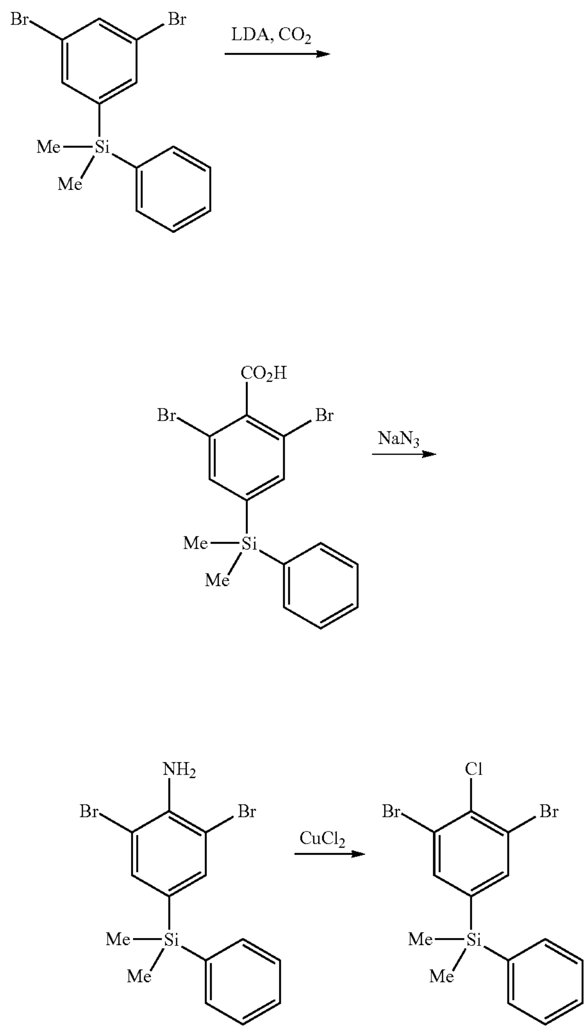

8-A

Diisopropylamine (15.5 ml) was added to 200 ml of anhydrous tetrahydrofuran under a nitrogen atmosphere, and then 42.0 ml of 2.5M-butyllithium was slowly added dropwise at −78° C. The reaction solution was stirred for about 2 hours while being maintained at −78° C., and 37.0 g of (3,5-dibromophenyl)dimethyl(phenyl)silane was dissolved in 100 ml of tetrahydrofuran, and slowly added dropwise. After stirring at −78° C. for 2 hours, an excess amount of carbon dioxide gas was added, and the temperature was gradually raised to room temperature. The diluted hydrochloric acid was added to the reaction solution to complete the reaction, and then liquid layers were separated and extracted using methylene chloride. The resultant organic layer was dried with magnesium sulfate, filtered, and distilled under reduced pressure. Column chromatography (developer:hexane/ethyl acetate=60%/40% (v/v)) was used to prepare 28.2 g of 2,6-dibromo-4-(dimethyl(phenyl)silyl)benzoic acid.

Subsequently, 26.3 g of 2,6-dibromo-4-(dimethyl(phenyl)silyl)benzoic acid was dissolved in 160 ml of sulfuric acid and heated at 60° C. for 2 hours. After cooling to room temperature, sodium azide ($NaN_3$) (8.2 g) was added, and stirred at 0° C. for 48 hours. After completion of the reaction, liquid layers were separated and extracted using ammonia water and ethyl acetate. The resultant organic layer was dried with magnesium sulfate, filtered, and then distilled under reduced pressure. Column chromatography (developer:ethyl acetate) was used to prepare 16.6 g of 2,6-dibromo-4-(dimethyl(phenyl)silyl)aniline.

Subsequently, 2,6-dibromo-4-(dimethyl(phenyl)silyl)aniline (17.1 g) was suspended in a sulfuric acid aqueous solution, and 6.0 g of sodium nitrite was added at 0° C. to perform diazotization. Thereafter, an aqueous solution of urea was added. This solution was added to a hydrochloric acid aqueous solution of $CuCl_2$ (13.1 g) over a plurality of additions, and stirred at room temperature for 2 hours and at 60° C. for 4 hours. After completion of the reaction, liquid layers were separated and extracted using ammonia water and ethyl acetate. The resultant organic layer was dried with magnesium sulfate, filtered, and distilled under reduced pressure. The precipitated solid was washed with water and ethanol and dried to obtain Intermediate 8-A (6.8 g). The mass spectrum of the obtained solid was measured, and as a result, a peak was confirmed at M/Z=405.

(8-b) Synthesis of Intermediate 8-B

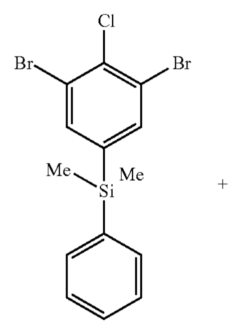

8-A

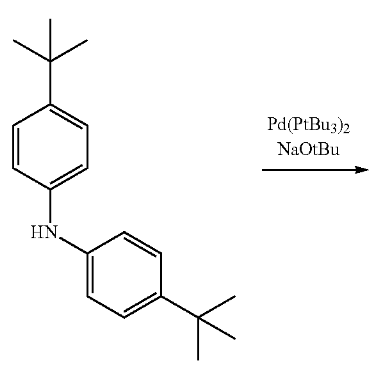

-continued

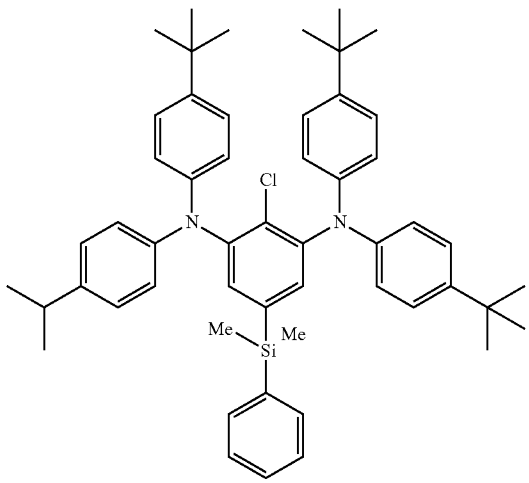

8-B

A flask containing Intermediate 8-A (10.1 g), bis(4-(tert-butyl)phenyl)amine (14.5 g), $Pd(PtBu_3)_2$ (0.2 g), NaOtBu (6.2 g), and xylene (70 ml) was heated to 130° C. and stirred for 4 hours. The reaction solution was cooled to room temperature, and water and ethyl acetate were added to separate liquid layers. The solvent was then distilled off under reduced pressure. Silica gel column chromatography (developer:hexane/ethyl acetate=50%/50% (v/v)) was used to prepare Intermediate 8-B (5.0 g). The mass spectrum of the obtained solid was measured, and as a result, a peak was confirmed at M/Z=792.

(8-c) Synthesis of Compound 8

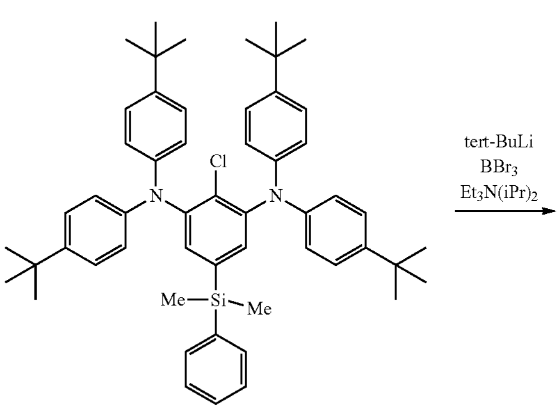

8-B

-continued

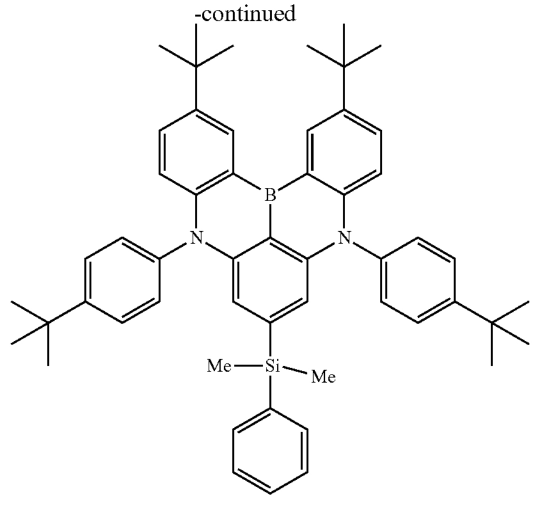

8

Compound 8 (1.7 g) was obtained in the same manner as in the step 4-b for synthesizing Compound 4, except that Intermediate 4-B (13.8 g) was changed to Intermediate 8-B (11.7 g). The mass spectrum of the obtained solid was measured, and as a result, a peak was confirmed at M/Z=779.

Example 9: Synthesis of Compound 9

(9-a) Synthesis of Intermediate 9-A

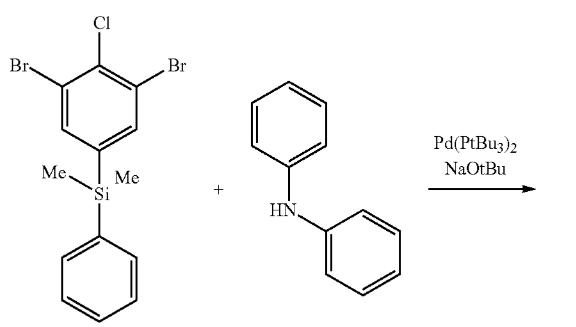

8-A

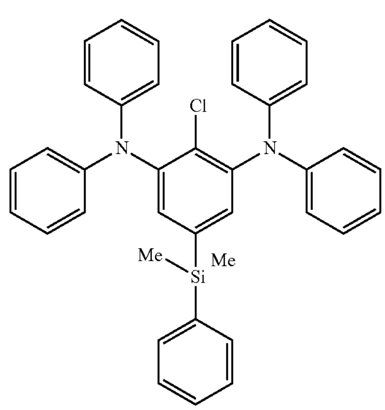

9-A

Intermediate 9-A (4.2 g) was obtained in the same manner as in the step 8-b for synthesizing Intermediate 8-B, except that bis(4-(tert-butyl)phenyl)amine (14.5 g) was changed to diphenyl amine (8.7 g). The mass spectrum of the obtained solid was measured, and as a result, a peak was confirmed at M/Z=581.

(9-b) Synthesis of Compound 9

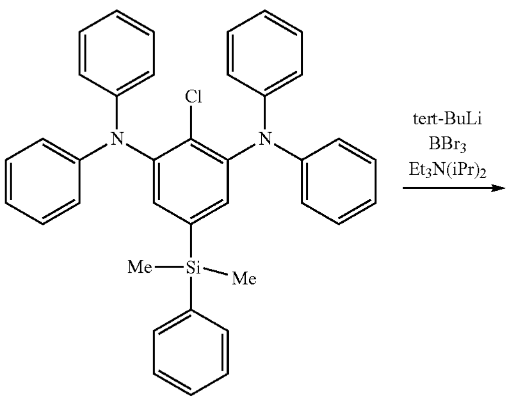

9-A

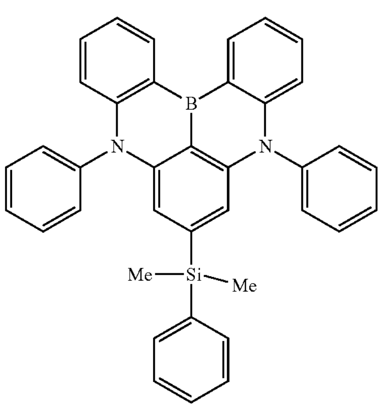

9

Compound 9 (1.0 g) was obtained in the same manner as in the step 4-b for synthesizing Compound 4, except that Intermediate 4-B (13.8 g) was changed to Intermediate 9-A (8.6 g). The mass spectrum of the obtained solid was measured, and as a result, a peak was confirmed at M/Z=555.

Example 10: Synthesis of Compound 10

(10-a) Synthesis of Intermediate 10-A

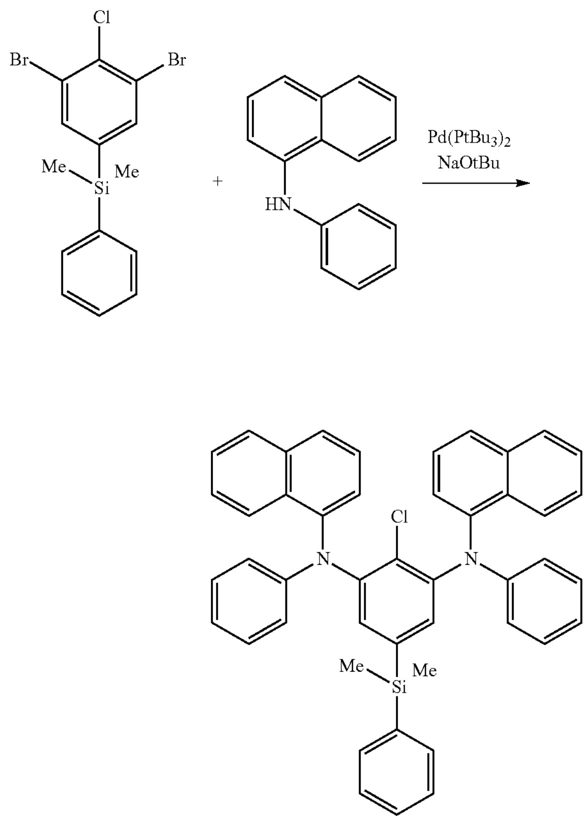

Intermediate 10-A (4.6 g) was obtained in the same manner as in the step 8-b for synthesizing Intermediate 8-B, except that diphenylamine (8.7 g) was changed to N-phenylnaphthalen-1-amine (11.3 g). The mass spectrum of the obtained solid was measured, and as a result, a peak was confirmed at M/Z=681.

(10-b) Synthesis of Compound 10

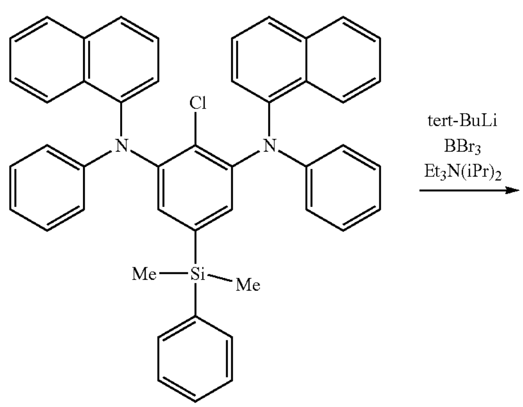

-continued

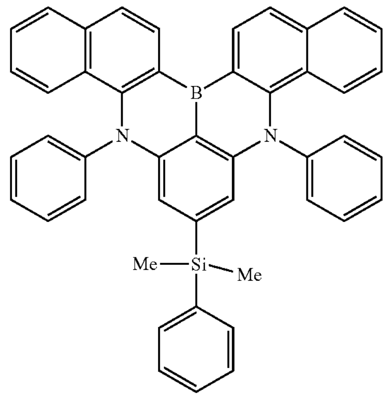

Compound 10 (1.2 g) was obtained in the same manner as in the step 4-b for synthesizing Compound 8, except that Intermediate 4-B (13.8 g) was changed to Intermediate 10-A (10.1 g). The mass spectrum of the obtained solid was measured, and as a result, a peak was confirmed at M/Z=655.

Example 11: Synthesis of Compound 11

(11-a) Synthesis of Intermediate 11-A

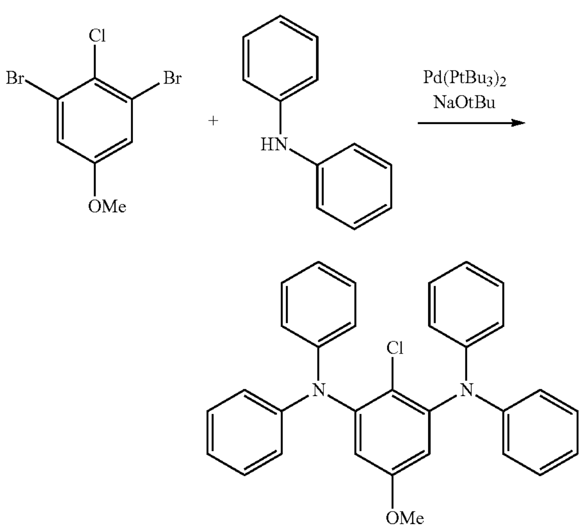

11-A

A flask containing 1,3-dibromo-2-chloro-5-methoxybenzene (7.5 g), diphenylamine (8.9 g), $Pd(PtBu_3)_2$ (0.2 g), NaOtBu (6.2 g), and xylene (60 ml) was heated to 130° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to prepare Intermediate 11-A (3.2 g). The mass spectrum of the obtained solid was measured, and as a result, a peak was confirmed at M/Z=477.

(11-b) Synthesis of Intermediate 11-B

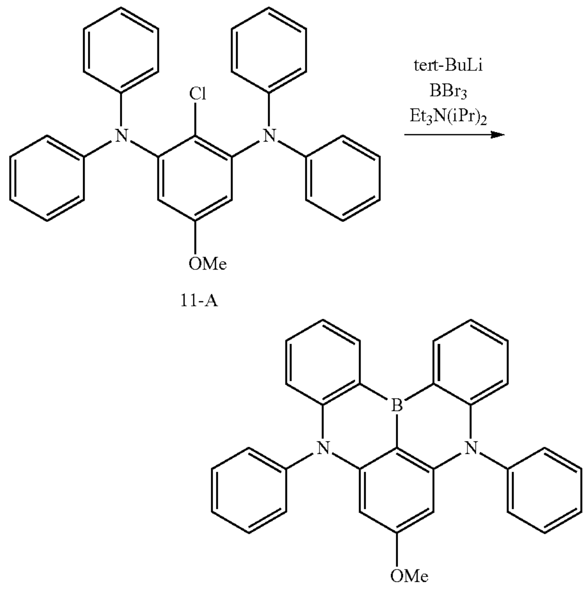

11-A

11-B

Intermediate 11-B (2.0 g) was obtained in the same manner as in the step 4-b for synthesizing Compound 4, except that Intermediate 4-B (13.8 g) was changed to Intermediate 11-A (7.1 g). The mass spectrum of the obtained solid was measured, and as a result, a peak was confirmed at M/Z=450.

(11-c) Synthesis of Intermediate 11-C

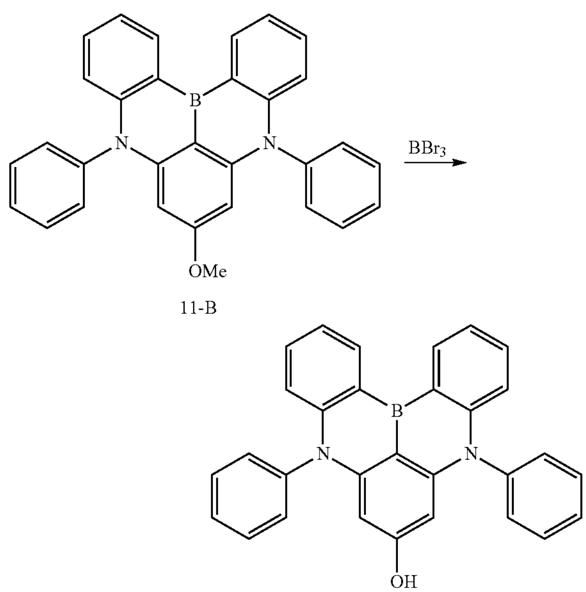

11-B

11-C

To a flask containing Intermediate 11-B (4.4 g) and chloroform (100 ml) was added boron tribromide (1.0 ml) at room temperature under a nitrogen atmosphere, and the mixture was stirred at room temperature for 48 hours. Thereafter, the reaction solution was distilled off, a sodium hydrogen carbonate aqueous solution (200 ml) was added, and liquid layers were separated with chloroform. The solvent was distilled off under reduced pressure to obtain Intermediate 11-C (2.8 g). The mass spectrum of the obtained solid was measured, and as a result, a peak was confirmed at M/Z=436.

(11-d) Synthesis of Intermediate 11-D

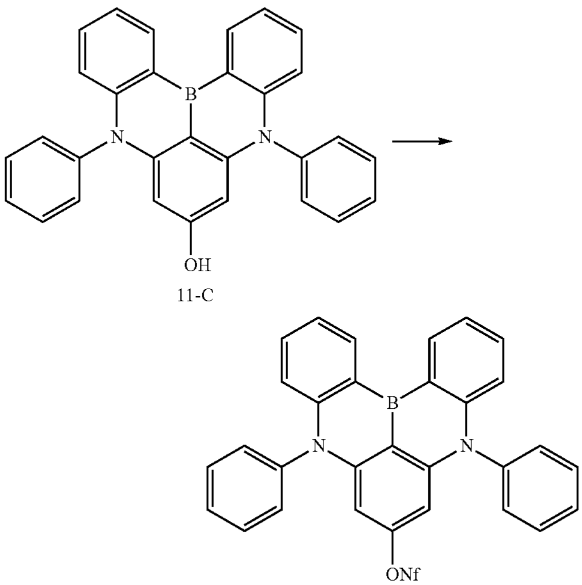

11-C

11-D

Intermediate 11-C (2.8 g), nonafluorobutane-1-sulfonyl fluoride (2.2 g), and potassium carbonate (1.5 g) were dissolved in acetonitrile (40 ml), heated to 50° C., and stirred for 4 hours. After cooling to room temperature, distilled water was added to remove potassium carbonate. Thereby, Intermediate 11-D (1.4 g) was obtained.

(11-e) Synthesis of Compound 11

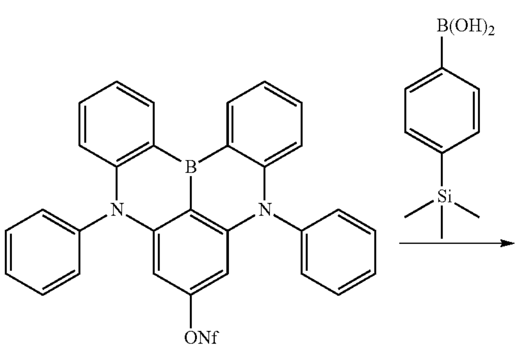

11-D

-continued

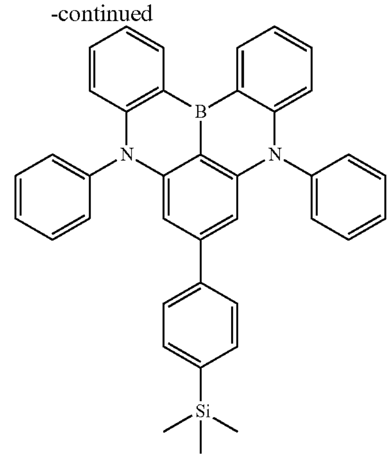

11

Intermediate 11-D (2.4 g), (4-(trimethylsilyl) phenyl) boronic acid (0.8 g) and potassium carbonate (1.4 g) were dissolved in 20 ml of tetrahydrofuran and 10 ml of distilled water, and tetrakis(triphenylphosphine)palladium (0.2 g) was added thereto and then refluxed for 12 hours. After cooling to room temperature, the aqueous layer was removed, magnesium sulfate was added to the organic layer, and then filtered. After concentration, acetonitrile was added to obtain Compound 11 (0.6 g). The mass spectrum of the obtained solid was measured, and as a result, a peak was confirmed at M/Z=569.

Example 12: Synthesis of Compound 12

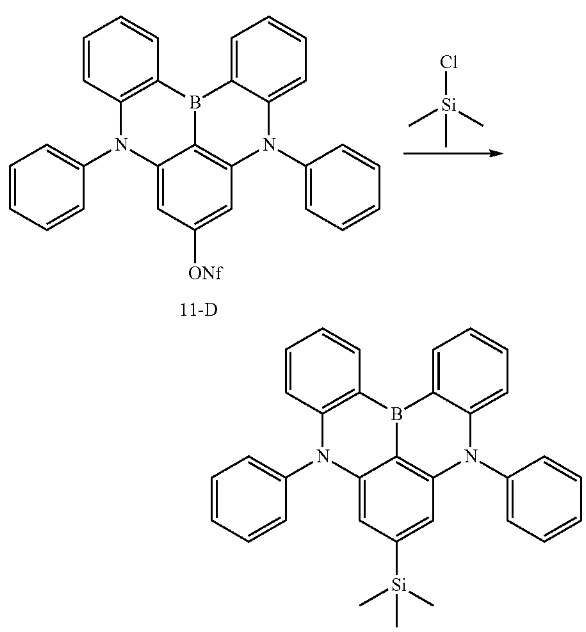

11-D

12

Intermediate 11-D (2.4 g) was dissolved in 24 ml of anhydrous tetrahydrofuran under a nitrogen atmosphere, and the ambient temperature of the reactor was maintained at −78° C. Then, 1.4 ml of 2.5 M-butyllithium was slowly added dropwise. After completion of the dropwise addition, stirring was performed for 1 hour, and 0.7 ml of chlorotrimethylsilane was dissolved in 10 ml of purified tetrahydrofuran and then slowly added dropwise. The reaction solution was stirred for about 1 hour while being maintained at −78° C., and then diluted hydrochloric acid was added to the reaction solution to complete the reaction, followed by liquid separation using methylene chloride. The resultant organic layer was dried with magnesium sulfate, filtered, and then distilled under reduced pressure. Column chromatography (developer:hexane/ethyl acetate=50%/50% (v/v)) was used to prepare Compound 12 (0.4 g). The mass spectrum of the obtained solid was measured, and as a result, a peak was confirmed at M/Z=493.

Example 13: Synthesis of Compound 13

(13-a) Synthesis of Intermediate 13-A

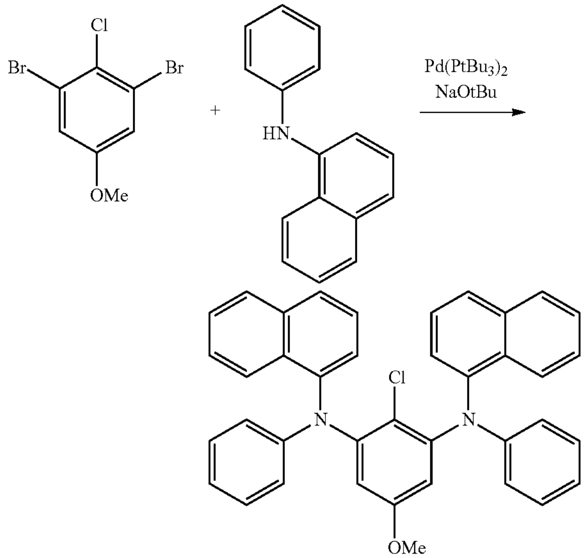

13-A

Intermediate 13-A (4.0 g) was obtained in the same manner as in the step 11-a for synthesizing Compound 11-A, except that diphenylamine (8.9 g) was changed to N-phenylnaphthalen-1-amine (11.5 g). The mass spectrum of the obtained solid was measured, and as a result, a peak was confirmed at M/Z=577.

(13-b) Synthesis of Intermediate 13-B

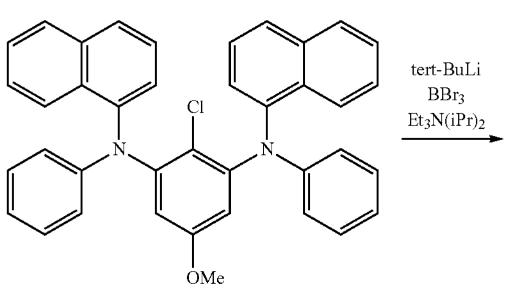

13-A

-continued

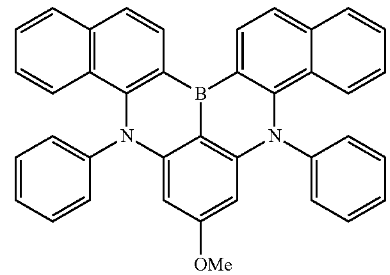

13-B

Intermediate 13-B (13.0 g) was obtained in the same manner as in the step 4-b for synthesizing Compound 4, except that Intermediate 4-B (13.8 g) was changed to Intermediate 13-A (8.6 g). The mass spectrum of the obtained solid was measured, and as a result, a peak was confirmed at M/Z=550.

(13-c) Synthesis of Intermediate 13-C

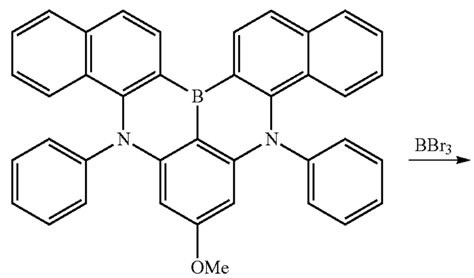

13-B

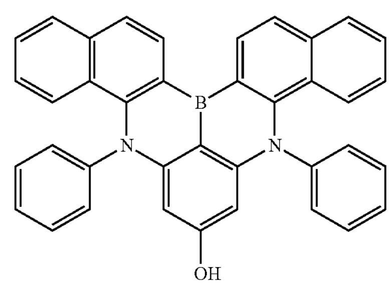

13-C

To a flask containing Intermediate 13-B (5.4 g) and chloroform (100 ml), boron tribromide (1.0 ml) was added at room temperature under a nitrogen atmosphere, and the mixture was stirred at room temperature for 48 hours. Thereafter, the reaction solution was distilled off, a sodium hydrogencarbonate aqueous solution (200 ml) was added, and liquid layers were separated with chloroform. The solvent was distilled off under reduced pressure to obtain Intermediate 13-C (2.8 g). The mass spectrum of the obtained solid was measured, and as a result, a peak was confirmed at M/Z=536.

(13-d) Synthesis of Intermediate 13-D

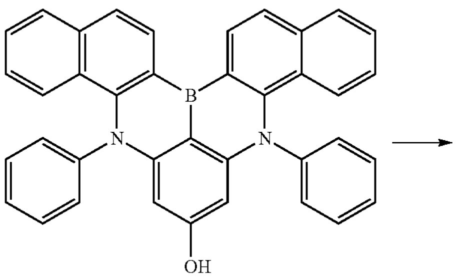

13-C

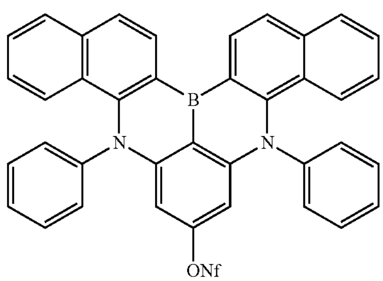

13-D

Intermediate 13-C (3.4 g), nonafluorobutane-1-sulfonyl fluoride (2.2 g), and potassium carbonate (1.5 g) were dissolved in acetonitrile (40 ml), heated to 50° C., and then stirred for 4 hours. After cooling to room temperature, distilled water was added to remove potassium carbonate. Thereby, Intermediate 13-D (1.6 g) was obtained.

(13-e) Synthesis of Compound 13

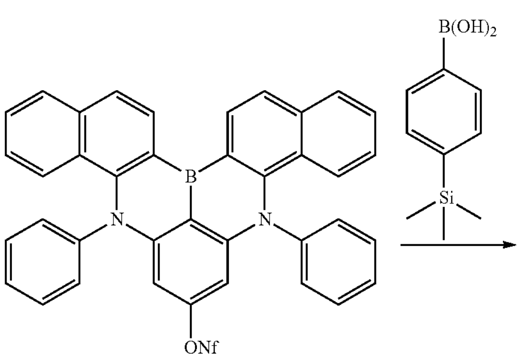

13-D

-continued

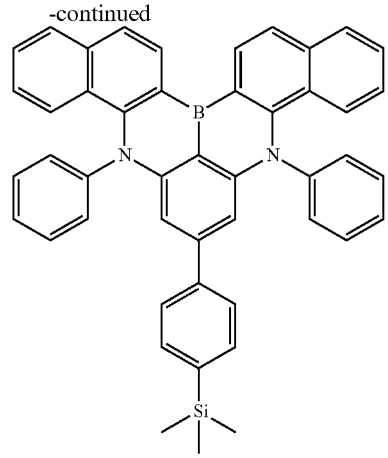

13

Intermediate 13-D (2.7 g), (4-(trimethylsilyl)phenyl)boronic acid (0.8 g), and potassium carbonate (1.4 g) were dissolved in 20 ml of tetrahydrofuran and 10 ml of distilled water, and tetrakis(triphenylphosphine)palladium (0.2 g) was added thereto, and then refluxed for 12 hours. After cooling to room temperature, the aqueous layer was removed, magnesium sulfate was added to the organic layer, and then filtered. After concentration, acetonitrile was added to obtain Compound 13 (0.8 g). The mass spectrum measurement of the obtained solid was measured, and as a result, a peak was confirmed at M/Z=669.

Example 14: Synthesis of Compound 14

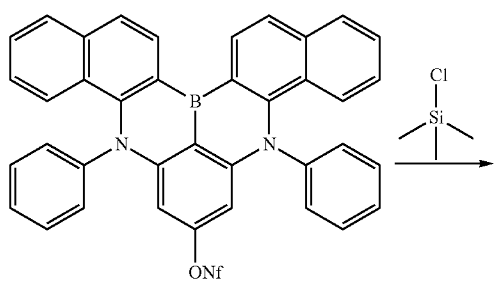

13-D

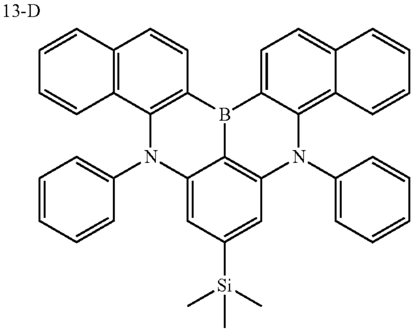

14

Intermediate 13-D (2.7 g) was dissolved in anhydrous tetrahydrofuran (24 ml) under a nitrogen atmosphere, and the ambient temperature of the reactor was maintained at −78° C. Then, 1.4 ml of 2.5 M-butyl lithium was slowly added dropwise. After completion of the dropwise addition, stirring was carried out for 1 hour, and then 0.7 ml of chlorotrimethylsilane was dissolved in 10 ml of purified tetrahydrofuran, and then slowly added dropwise. The reaction solution was stirred for about 1 hour while being maintained at −78° C. Diluted hydrochloric acid was added to the reaction solution to complete the reaction, followed by liquid separation using methylene chloride. The resultant organic layer was dried with magnesium sulfate, filtered, and then distilled under reduced pressure. Column chromatography (developer:hexane/ethyl acetate=50%/50% (v/v)) was used to prepare Compound 14 (0.6 g). The mass spectrum of the obtained solid was measured, and as a result, a peak was confirmed at M/Z=593.

Example 15: Synthesis of Compound 15

(15-a) Synthesis of Intermediate 15-A

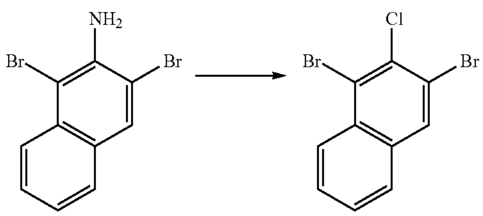

15-A 1,3-dibromonaphthalen-2-amine (13.5 g) was suspended in a sulfuric acid aqueous solution, and 6.0 g of sodium nitrite aqueous solution was added at 0° C. to perform diazotization. Thereafter, an aqueous solution of urea was added. This solution was added to a hydrochloric acid aqueous solution of $CuCl_2$ (13.1 g) over a plurality of additions, and stirred at room temperature for 2 hours and at 60° C. for 4 hours. After completion of the reaction, liquid layers were separated and extracted using ammonia water and ethyl acetate. The resultant organic layer was dried with magnesium sulfate, filtered, and distilled under reduced pressure. The precipitated solid was washed with water and ethanol and dried to obtain Intermediate 15-A (5.4 g). The mass spectrum of the obtained solid was measured, and as a result, a peak was confirmed at M/Z=320.

(15-b) Synthesis of Intermediate 15-B

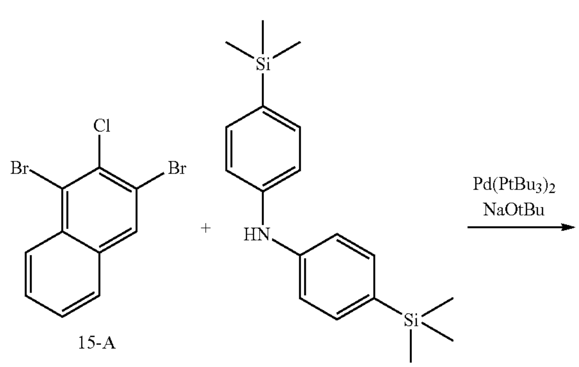

15-A

-continued

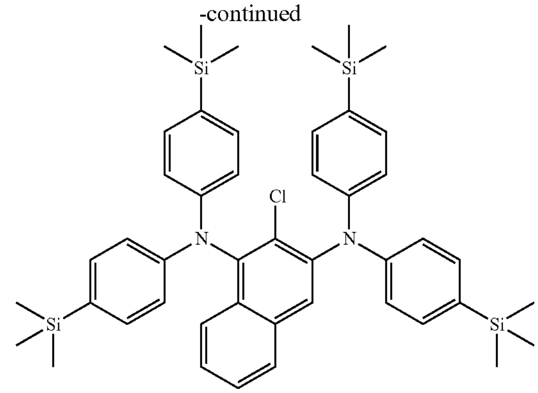

15-B

A flask containing Intermediate 15-A (8.0 g), bis (4-(trimethylsilyl) phenyl) amine (16.4 g), $Pd(PtBu_3)_2$ (0.2 g), NaOtBu (6.2 g), and xylene (60 ml) was heated to 130° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 15-B (4.8 g). The mass spectrum of the solid was measured, and as a result, a peak was confirmed at M/Z=786.

(15-c) Synthesis of Compound 15

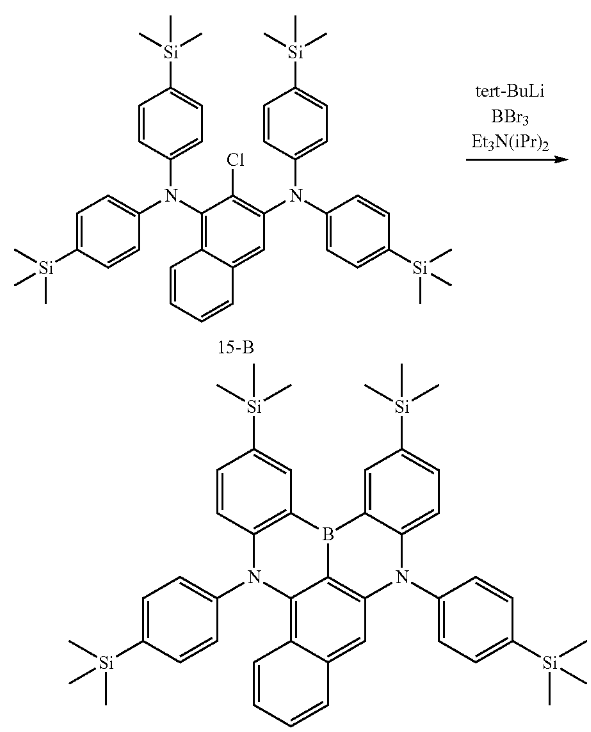

15

Compound 15 (3.0 g) was obtained in the same manner as in the step 4-b for synthesizing Compound 4, except that Intermediate 4-B (13.8 g) was changed to Intermediate 15-B (11.7 g). The mass spectrum of the obtained solid was measured, and as a result, a peak was confirmed at M/Z=759.

Example 16: Synthesis of Compound 16

(16-a) Synthesis of Intermediate 16-A

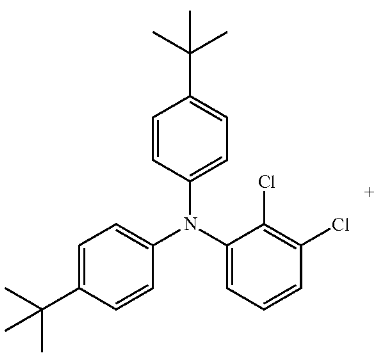

3-A

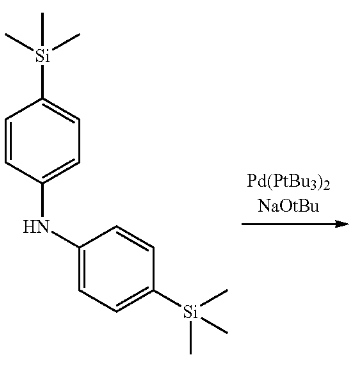

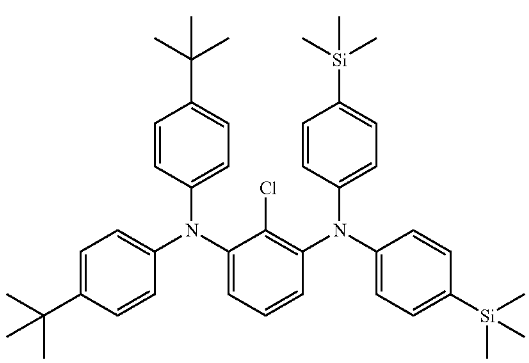

16-A

A flask containing Intermediate 3-A (41.1 g), bis (4-(trimethylsilyl)phenyl)amine (31.7 g), $Pd(PtBu_3)_2$ (0.2 g), NaOtBu (12.6 g), and xylene (130 ml) was heated to 110° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 16-A (19.8 g). The mass spectrum of the solid was measured, and as a result, a peak was confirmed at M/Z=704.

(16-b) Synthesis of Compound 16

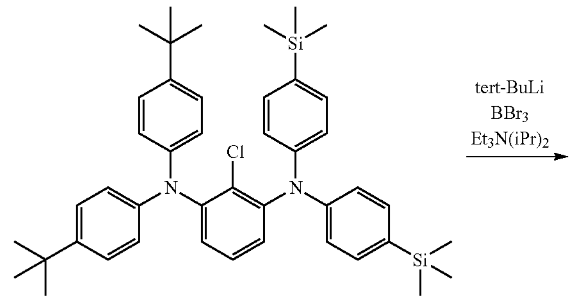

16-A

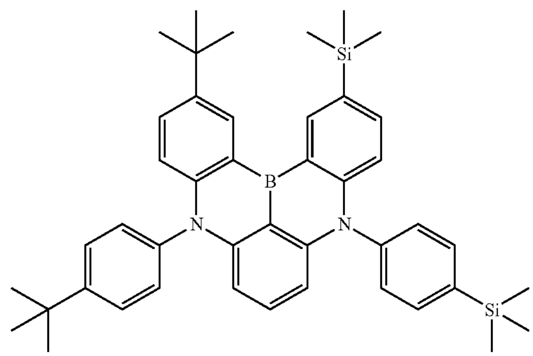

16

Compound 16 (3.0 g) was obtained in the same manner as in the step 4-b for synthesizing Compound 4, except that Intermediate 4-B (13.8 g) was changed to Intermediate 16-A (11.2 g). The mass spectrum of the obtained solid was measured, and as a result, a peak was confirmed at M/Z=677.

Example 17: Synthesis of Compound 17

(17-a) Synthesis of Intermediate 17-A

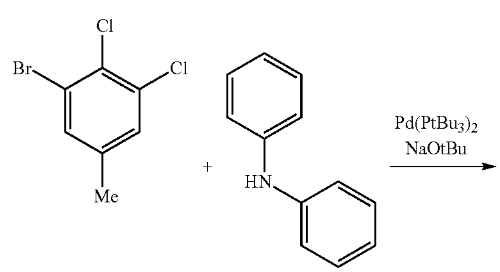

-continued

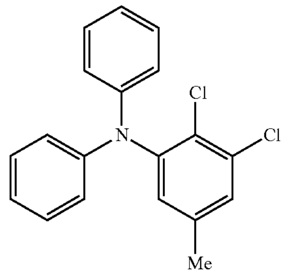

17-A

A flask containing 1-bromo-2,3-dichloro-5-methylbenzene (9.3 g), diphenylamine (6.9 g), $Pd(PtBu_3)_2$ (0.2 g), NaOtBu (6.2 g), and toluene (90 ml) was heated to 110° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 17-A (4.0 g). The mass spectrum of the solid was measured, and as a result, a peak was confirmed at M/Z=328.

(17-b) Synthesis of Intermediate 17-B

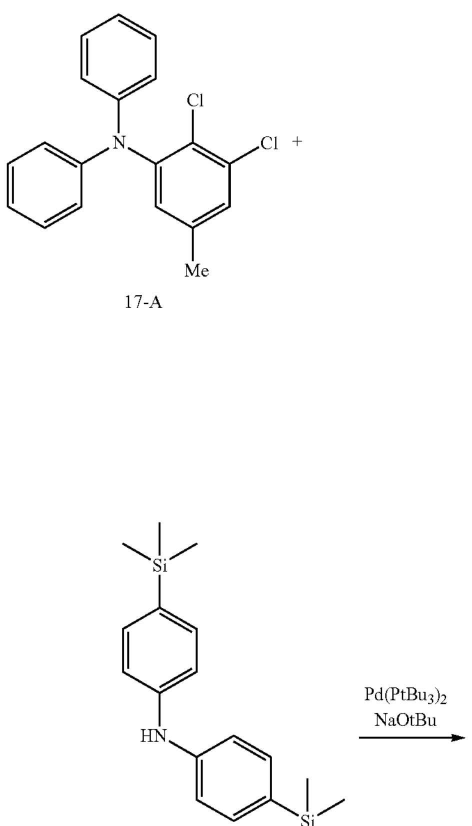

-continued

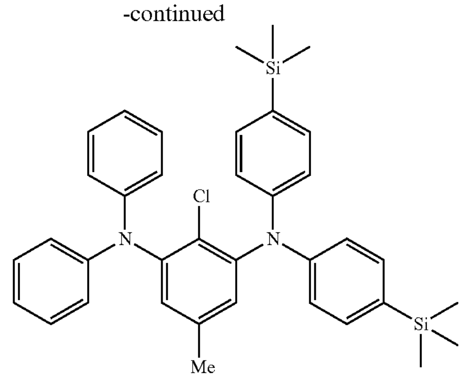

17-B

A flask containing Intermediate 17-A (6.6 g), bis(4-(trimethylsilyl)phenyl)amine (6.9 g), $Pd(PtBu_3)_2$ (0.2 g), NaOtBu (6.2 g), and xylene (90 ml) was heated to 130° C. and stirred for 8 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 17-B (2.8 g). The mass spectrum of the solid was measured, and as a result, a peak was confirmed at M/Z=605.

(17-c) Synthesis of Compound 17

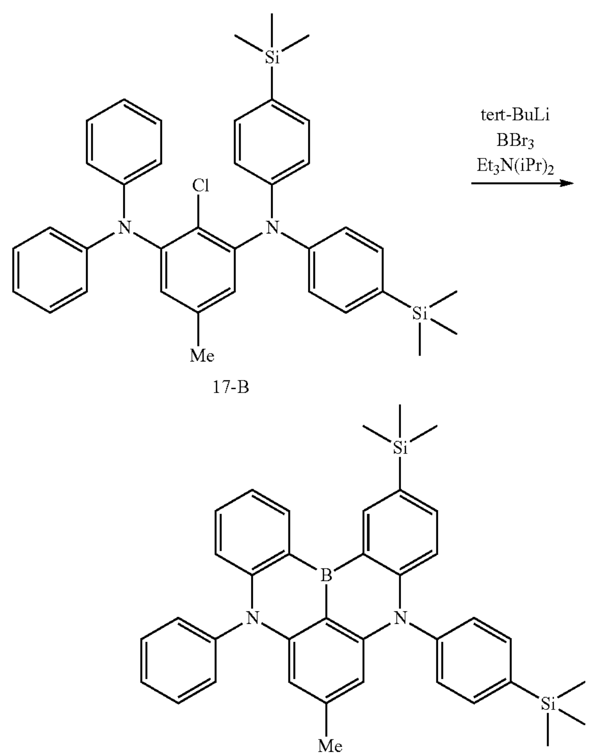

17

Compound 17 (1.4 g) was obtained in the same manner as in the step 4-b for synthesizing Compound 4, except that Intermediate 4-B (13.8 g) was changed to Intermediate 17-B (9.0 g). The mass spectrum of the obtained solid was measured, and as a result, a peak was confirmed at M/Z=579.

Example 18: Synthesis of Compound 18

(18-a) Synthesis of Intermediate 18-A

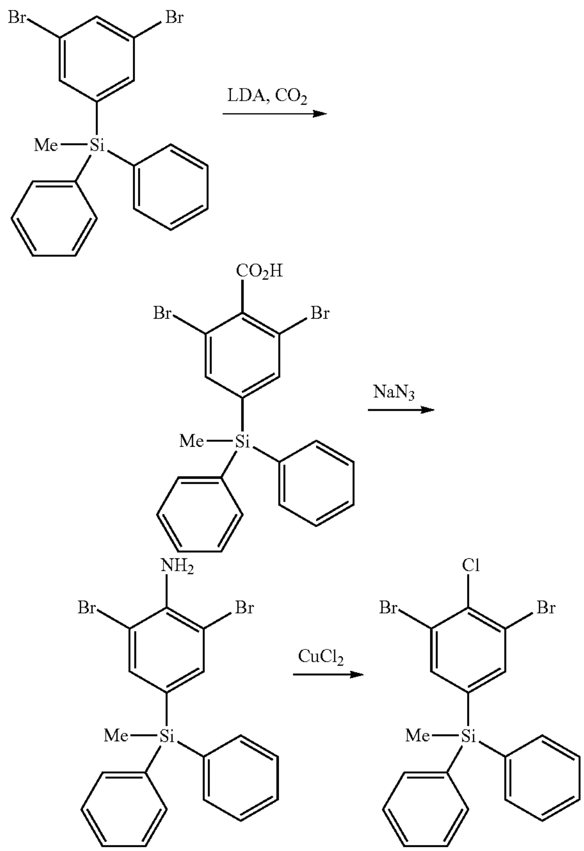

18-A

Diisopropylamine (15.5 ml) was added to 200 ml of anhydrous tetrahydrofuran under a nitrogen atmosphere, and then 42.0 ml of 2.5M-butyllithium was slowly added dropwise at −78° C. The reaction solution was stirred for about 2 hours while being maintained at −78° C., and 43.2 g of (3,5-dibromophenyl)(methyl)diphenylsilane was dissolved in 160 ml of tetrahydrofuran, and slowly added dropwise. After stirring at −78° C. for 2 hours, an excess amount of carbon dioxide gas was added, and the temperature was gradually raised to room temperature. The diluted hydrochloric acid was added to the reaction solution to complete the reaction, and then liquid layers were separated and extracted using methylene chloride. The resultant organic layer was dried with magnesium sulfate, filtered, and then distilled under reduced pressure. Column chromatography (developer:hexane/ethyl acetate=60%/40% (v/v)) was used to prepare 14.6 g of 2,6-dibromo-4-(methyldiphenylsilyl) aniline.

Subsequently, 30.2 g of 2,6-dibromo-4-(methyldiphenylsilyl)benzoic acid was dissolved in 160 ml of sulfuric acid and heated at 60° C. for 2 hours. After cooling to room temperature, sodium azide ($NaN_3$) (8.2 g) was added thereto and was stirred at 0° C. for 48 hours. After completion of the reaction, liquid layers were separated and extracted using ammonia water and ethyl acetate. The resultant organic layer was dried with magnesium sulfate, filtered, and then distilled under reduced pressure. Column chromatography (developer:ethyl acetate) was used to prepare 14.6 g of 2,6-dibromo-4-(methyldiphenylsilyl)aniline.

Subsequently, 2,6-dibromo-4-(methyldiphenylsilyl)aniline (19.9 g) was suspended in a sulfuric acid aqueous solution, and 6.0 g of sodium nitrite was added at 0° C. to perform diazotization. Thereafter, an aqueous solution of urea was added. This solution was added to a hydrochloric acid aqueous solution of $CuCl_2$ (13.1 g) over a plurality of additions, and stirred at room temperature for 2 hours and at 60° C. for 4 hours. After completion of the reaction, liquid layers were separated and extracted using ammonia water and ethyl acetate. The resultant organic layer was dried with magnesium sulfate, filtered, and distilled under reduced pressure. The precipitated solid was washed with water and ethanol and dried to obtain Intermediate 18-A (7.0 g). The mass spectrum of the obtained solid was measured, and as a result, a peak was confirmed at M/Z=467.

(18-b) Synthesis of Intermediate 18-B

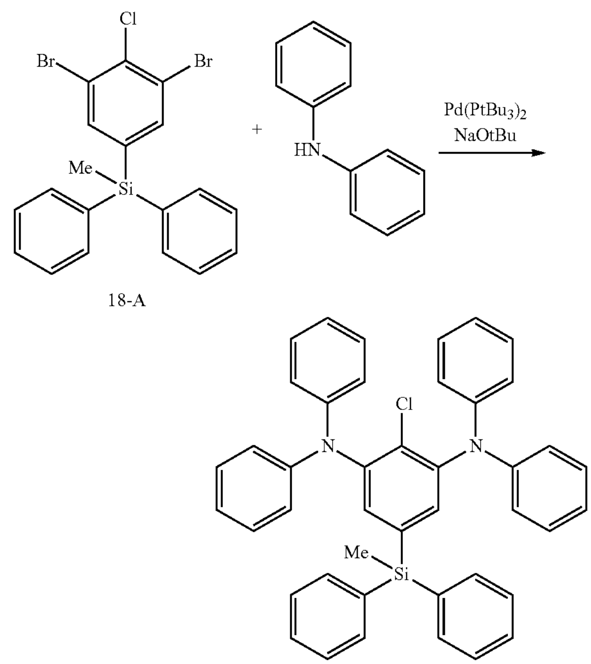

18-B

A flask containing Intermediate 18-A (11.6 g), diphenylamine (9.0 g), $Pd(PtBu_3)_2$ (0.2 g), NaOtBu (6.2 g) and xylene (70 ml) was heated to 130° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 18-B (4.0 g). The mass spectrum of the solid was measured, and as a result, a peak was confirmed at M/Z=643.

(18-c) Synthesis of Compound 18

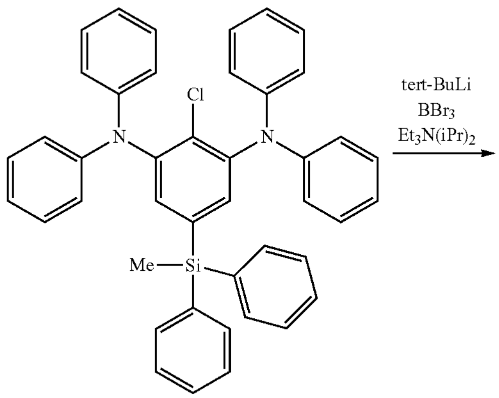

18-B

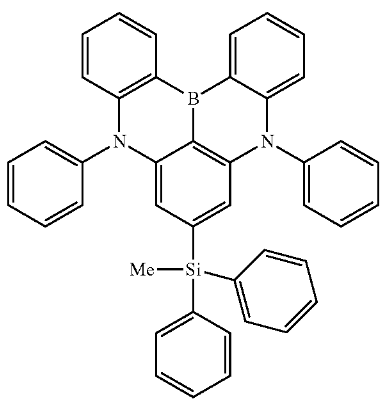

18

Compound 18 (1.2 g) was obtained in the same manner as in the step 4-b for synthesizing Compound 4, except that Intermediate 4-B (13.8 g) was changed to Intermediate 18-B (9.5 g). The mass spectrum of the obtained solid was measured, and as a result, a peak was confirmed at M/Z=617.

Example 19: Synthesis of Inter Compound 19

(19-a) Synthesis of Intermediate 19-A

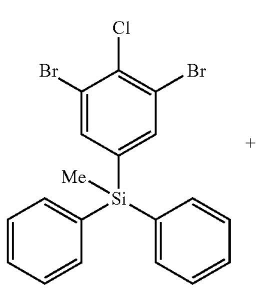

-continued

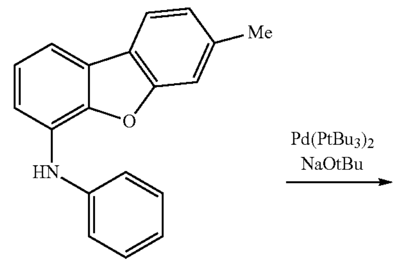

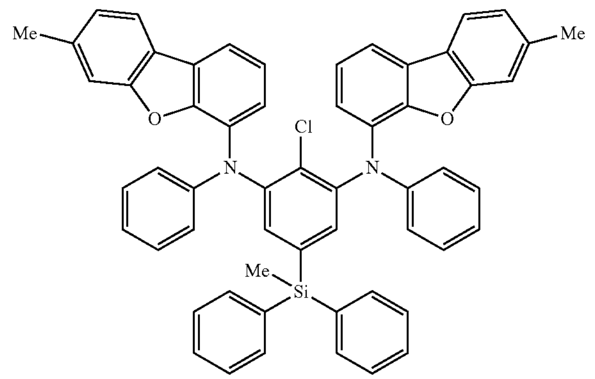

19-A

A flask containing (3,5-dibromo-4-chlorophenyl)(methyl)diphenylsilane (11.6 g), 7-methyl-N-phenyldibenzo[b,d]furan-4-amine (14.4 g), $Pd(PtBu_3)_2$ (0.2 g), NaOtBu (6.2 g), and xylene (70 ml) was heated to 130° C. and stirred for 8 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Intermediate 19-A (4.8 g). The mass spectrum of the solid was measured, and as a result, a peak was confirmed at M/Z=852.

(19-b) Synthesis of Compound 19

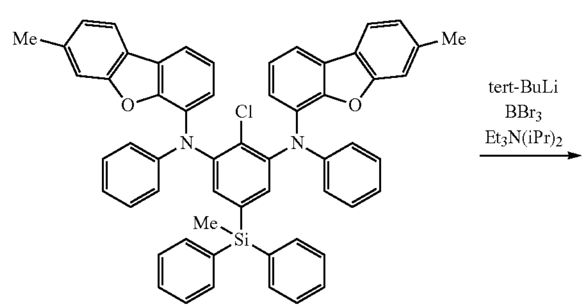

19-A

-continued

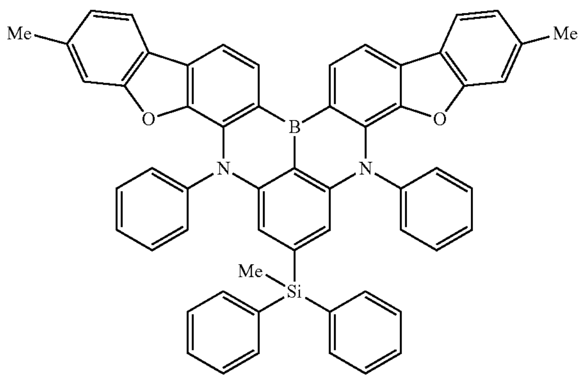

19

Compound 19 (1.4 g) was obtained in the same manner as in the step 4-b for synthesizing Compound 4, except that Intermediate 4-B (13.8 g) was changed to Intermediate 19-A (12.6 g). The mass spectrum of the obtained solid was measured, and as a result, a peak was confirmed at M/Z=825.

Example 20: Synthesis of Compound 20

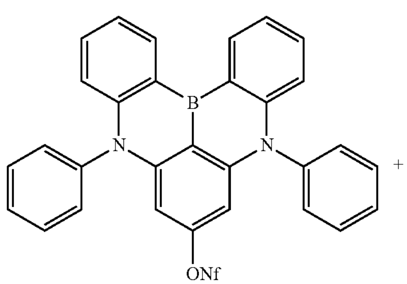

11-D

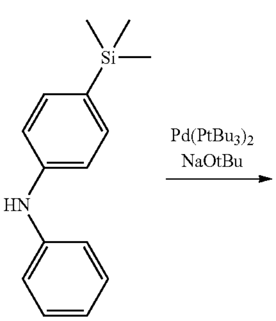

-continued

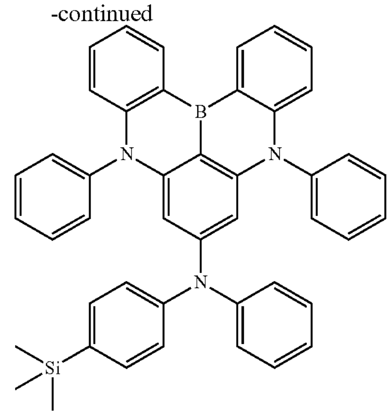

20

A flask containing Intermediate 11-D (1.8 g), N-phenyl-4-(trimethylsilyl)aniline (0.7 g), $Pd(PtBu_3)_2$ (0.1 g), NaOtBu (3.8 g), and toluene (20 ml) was heated to 110° C. and stirred for 4 hours. The reaction solution was cooled to room temperature, and water and ethyl acetate were added to separate liquid layers. The solvent was then distilled off under reduced pressure. It was purified by silica gel column chromatography (developer:hexane/ethyl acetate=50%/50% (v/v)) to obtain Compound 20 (0.6 g). The mass spectrum of the solid was measured, and as a result, a peak was confirmed at M/Z=660.

Experimental Example 1

A glass substrate (Corning 7059 glass) on which a thin film of ITO (indium tin oxide) was applied to a thickness of 1000 Å was immersed into distilled water having a dispersant dissolved therein and washed by ultrasonic waves. The detergent used was a product commercially available from Fisher Co., and the distilled water was one which had been filtered twice by using a filter commercially available from Millipore Co. The ITO was washed for 30 minutes, and ultrasonic washing was then repeated twice for 10 minutes by using distilled water. After the completion of washing with distilled water, washing with ultrasonic waves was performed using isopropyl alcohol, acetone, and methanol solvent in this order, and the resulting product was dried.

A compound of formula HAT below was thermally vacuum-deposited in a thickness of 50 Å on the prepared ITO transparent electrode to form a hole injection layer. A compound of formula HT-A below was vacuum-deposited thereon in a thickness of 1000 Å as a hole transport layer, following by vacuum deposition of a compound of formula HT-B below (100 Å). A compound BH-1 as a host and a compound 1 prepared in Example 1 as a dopant were vacuum-deposited at a weight ratio of 98:2 to form a light emitting layer in a thickness of 200 Å.

Subsequently, a compound of formula ET-A below and the compound of formula Liq were deposited at a ratio of 1:1 in a thickness of 300 Å. Magnesium (Mg) doped with 10 wt % silver (Ag) in a thickness of 150 Å and aluminum in a thickness of 1000 Å were sequentially deposited to form a cathode. Thereby, an organic light emitting device was manufactured.

In the above process, the vapor deposition rate of the organic material was maintained at 1 Å/s, the vapor deposition rate of LiF was maintained at 0.2 Å/s, and the vapor deposition rate of aluminum was maintained at 3 Å/s to 7 Å/s.

HAT
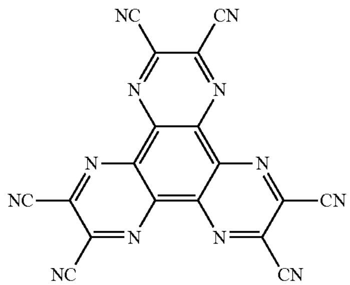
HT-A
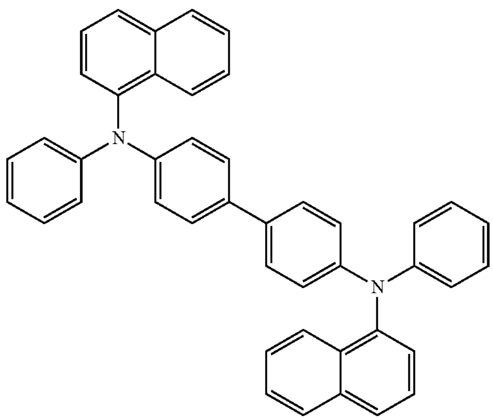
HT-B
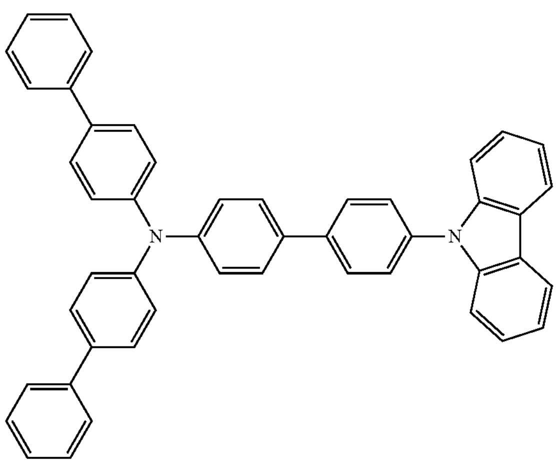
BH-1
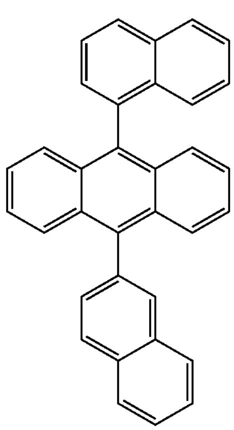
-continued
ET-A
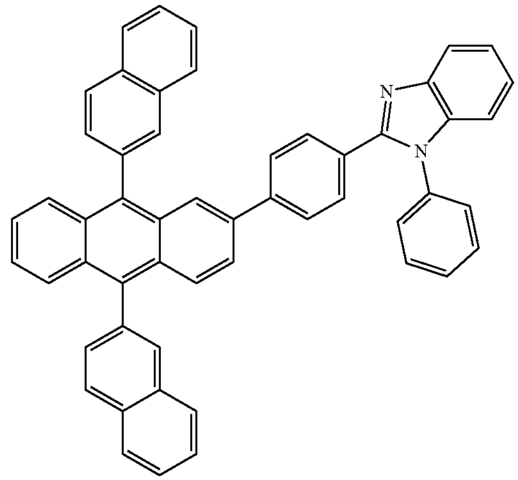
Liq
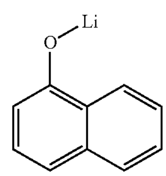
Experimental Examples 2 to 22
The organic light emitting devices were manufactured in the same manner as in Experimental Example 1, except that the compounds shown in Table 1 below were used instead of the compound 1 in Experimental Example 1. In Table 1 below, BH-2 means the following compound.
BH-2
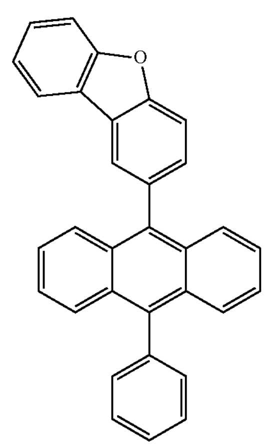

Comparative Experimental Examples 1 to 4

The organic light emitting devices were manufactured in the same manner as in Example 1, except that the compounds shown in Table 1 below were used instead of the compound 1 in Experimental Example 1. In Table 1 below, D-1 to D-4 mean the following compounds, respectively.

D-1

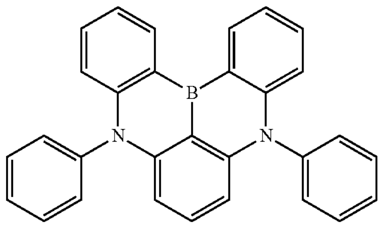

D-2

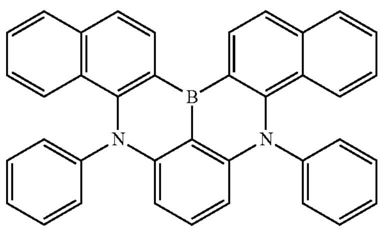

-continued

D-3

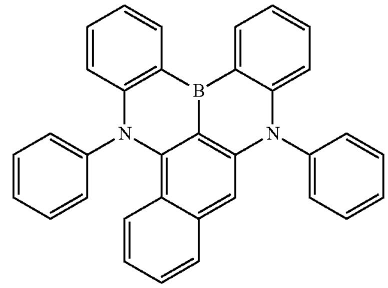

D-4

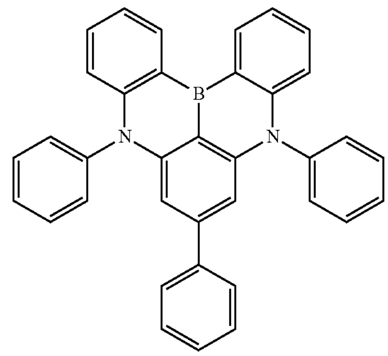

The driving voltage, light emitting efficiency, and color coordinate (CIEy) were measured at an electric current of 10 mA/$cm^2$ for the organic light emitting devices manufactured in Experimental Examples 1 to 22 and Comparative Experimental Examples 1 to 4, and the time ($LT_{95}$) at which the luminance became 95% relative to the initial luminance at the current density of 20 mA/$cm^2$ was measured. The above results are shown in Table 1 below.

TABLE 1

| | Host | Dopant | 10 mA/$cm^2$ Driving voltage (v) | 10 mA/$cm^2$ Efficiency (cd/A) | 10 mA/$cm^2$ CIEy | 20 mA/$cm^2$ Lifetime (h) |
|---|---|---|---|---|---|---|
| Experimental Example 1 | BH-1 | Compound 1 | 4.4 | 6.0 | 0.100 | 204 |
| Experimental Example 2 | BH-1 | Compound 2 | 4.6 | 6.1 | 0.098 | 206 |
| Experimental Example 3 | BH-1 | Compound 3 | 4.5 | 6.0 | 0.096 | 207 |
| Experimental Example 4 | BH-1 | Compound 4 | 4.5 | 6.2 | 0.098 | 224 |
| Experimental Example 5 | BH-1 | Compound 5 | 4.6 | 6.3 | 0.097 | 222 |
| Experimental Example 6 | BH-1 | Compound 6 | 4.2 | 6.3 | 0.099 | 208 |
| Experimental Example 7 | BH-1 | Compound 7 | 4.2 | 6.2 | 0.098 | 208 |
| Experimental Example 8 | BH-1 | Compound 8 | 4.4 | 6.1 | 0.098 | 221 |
| Experimental Example 9 | BH-1 | Compound 9 | 4.4 | 6.2 | 0.094 | 212 |
| Experimental Example 10 | BH-1 | Compound 10 | 4.0 | 6.2 | 0.092 | 210 |
| Experimental Example 11 | BH-1 | Compound 11 | 4.2 | 6.3 | 0.094 | 213 |
| Experimental Example 12 | BH-1 | Compound 12 | 4.1 | 6.2 | 0.093 | 214 |
| Experimental Example 13 | BH-1 | Compound 13 | 4.4 | 6.3 | 0.098 | 204 |
| Experimental Example 14 | BH-1 | Compound 14 | 4.2 | 6.4 | 0.098 | 203 |
| Experimental Example 15 | BH-1 | Compound 15 | 4.3 | 6.0 | 0.098 | 200 |
| Experimental Example 16 | BH-1 | Compound 16 | 4.1 | 6.0 | 0.096 | 209 |
| Experimental Example 17 | BH-1 | Compound 17 | 4.3 | 6.1 | 0.098 | 220 |
| Experimental Example 18 | BH-1 | Compound 18 | 4.2 | 6.1 | 0.094 | 202 |
| Experimental Example 19 | BH-1 | Compound 19 | 4.2 | 6.1 | 0.098 | 202 |
| Experimental Example 20 | BH-1 | Compound 20 | 4.3 | 6.1 | 0.096 | 201 |
| Experimental Example 21 | BH-1 + BH-2 | Compound 17 | 4.4 | 6.2 | 0.094 | 222 |
| Experimental Example 22 | BH-1 + BH-2 | Compound 20 | 4.2 | 6.0 | 0.096 | 204 |
| Comparative Experimental Example 1 | BH-1 | D-1 | 4.3 | 5.1 | 0.096 | 164 |
| Comparative Experimental Example 2 | BH-1 | D-2 | 4.6 | 5.3 | 0.098 | 156 |

TABLE 1-continued

| | Host | Dopant | 10 mA/cm$^2$ Driving voltage (v) | 10 mA/cm$^2$ Efficiency (cd/A) | 10 mA/cm$^2$ CIEy | 20 mA/cm$^2$ Lifetime (h) |
|---|---|---|---|---|---|---|
| Comparative Experimental Example 3 | BH-1 | D-3 | 4.3 | 5.2 | 0.100 | 153 |
| Comparative Experimental Example 4 | BH-1 | D-4 | 4.6 | 5.4 | 0.094 | 159 |

As shown in Table 1, it was confirmed that Experimental Examples 1 to 22 exhibited excellent efficiency and lifetime compared with Comparative Experimental Examples 1 to 4. Specifically, when comparing Experimental Examples 9, 11, and 12 with Comparative Experimental Example 1, it was confirmed that Experimental Examples 9, 11, and 12 in which a silyl group was introduced showed the tendency for the lifetime of the device to be increased by about 30% compared to that of Comparative Experimental Example 1 in which a silyl group was not introduced. In addition, comparing Experimental Examples 6 and 14 with Comparative Experimental Example 2 and Experimental Examples 6 and 14 in which a silyl group was introduced showed the tendency that the lifetime of the device was increased by about 30 to 33% compared with Comparative Experimental Example 1 in which a silyl group was not introduced. It was confirmed that these tendencies were similarly displayed between Experimental Example 15 and Comparative Experimental Example 3, and between Example 11 and Comparative Example 4. Therefore, in the case where the silyl group is connected to Formula 1 of the present disclosure, excellent heat resistance and resistance to decomposition can be achieved. Thus, it was confirmed that a device adopting this, for example, an organic light emitting device, has high stability and a long lifetime when manufactured, stored, and driven.

DESCRIPTION OF SYMBOLS

| | |
|---|---|
| 1: substrate, | 2: anode, |
| 3: light emitting layer | 4: cathode |
| 5: hole injection layer | |
| 6: hole transport layer | |
| 7: light emitting layer | |
| 8: electron transport layer | |

What is claimed is:

1. A compound represented by one of the following Formulas 1-1 to 1-13:

[Formula 1-1]

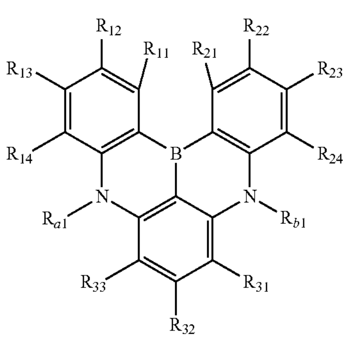

-continued

[Formula 1-2]

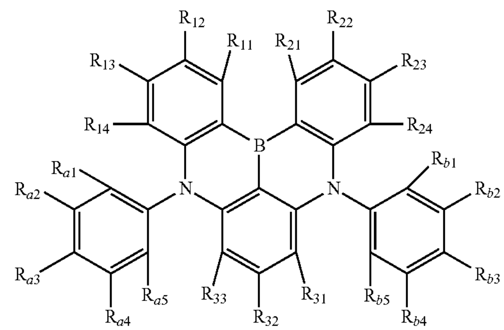

[Formula 1-3]

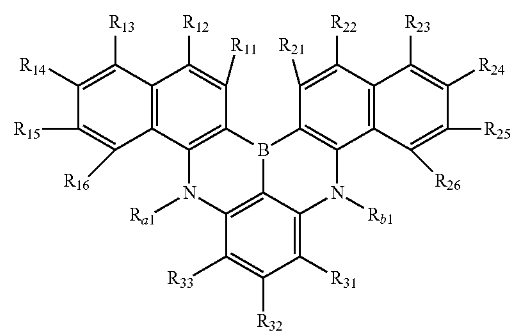

[Formula 1-4]

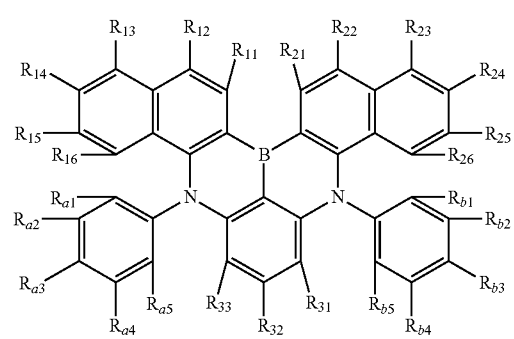

-continued
[Formula 1-5]
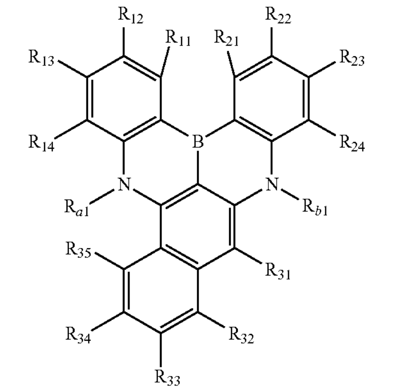
[Formula 1-6]
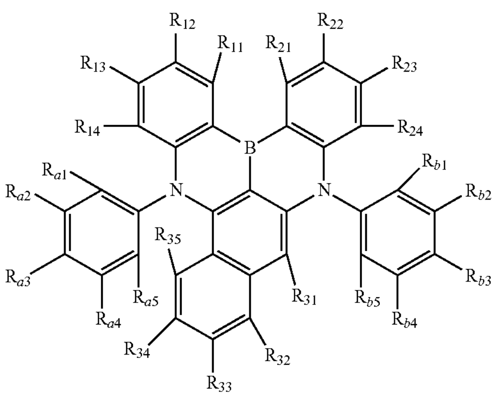
[Formula 1-7]
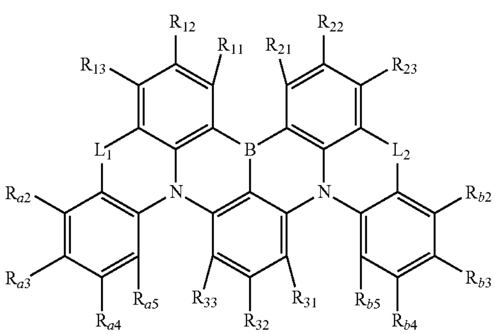
[Formula 1-8]
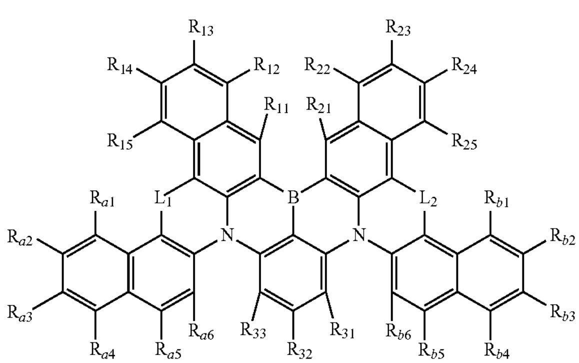
-continued
[Formula 1-9]
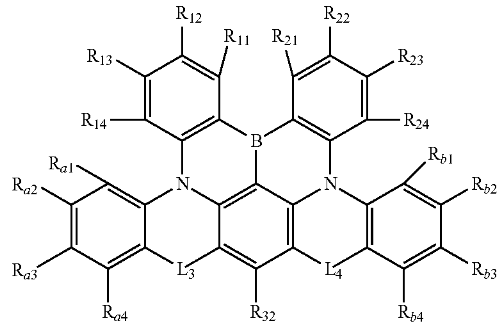
[Formula 1-10]
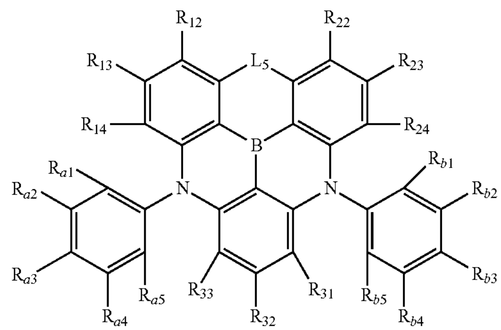
[Formula 1-11]
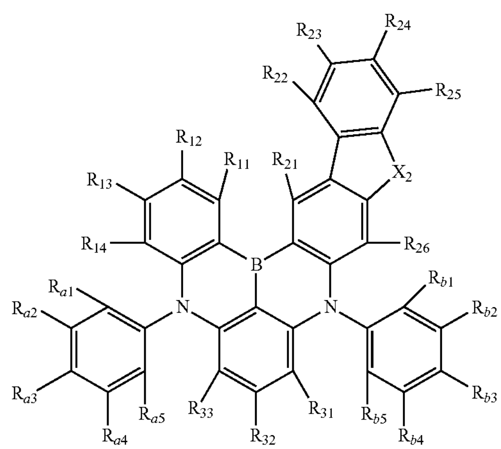
[Formula 1-12]
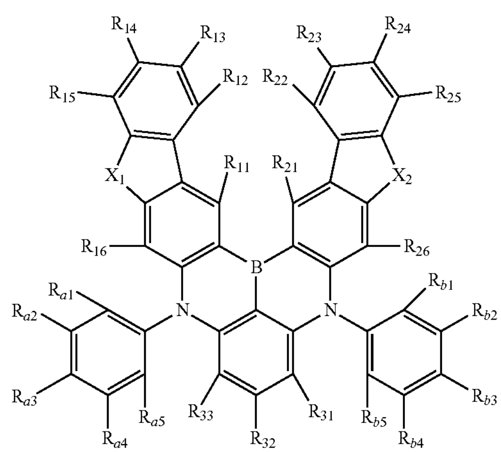

-continued

[Formula 1-13]

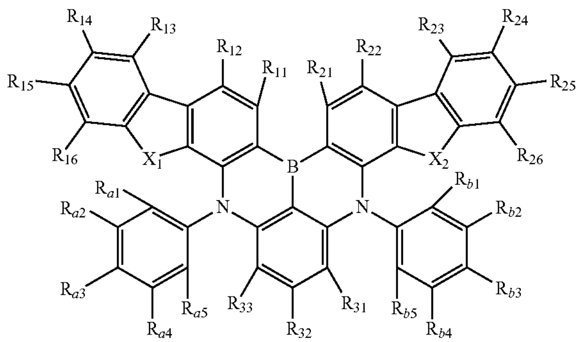

wherein, in Formulas 1-1 to 1-13, $X_1$ and $X_2$ are each independently O, S, or N($C_{6-20}$ aryl), $L_1$ to $L_5$ are each independently a single bond, —O—, —S—, —C($C_{1-4}$ alkyl)($C_{1-4}$ alkyl)-, or —N($C_{6-20}$ aryl)-, $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ are each independently hydrogen; deuterium; a halogen; a substituted or unsubstituted tri($C_{1-20}$ alkyl) silyl; a substituted or unsubstituted tri($C_{6-20}$ aryl)silyl; a substituted or unsubstituted di($C_{6-20}$ aryl)amino; a substituted or unsubstituted ($C_{6-20}$ aryl)($C_{2-20}$ heteroaryl)amino; a substituted or unsubstituted $C_{1-20}$ alkyl; a substituted or unsubstituted $C_{1-20}$ haloalkyl; a substituted or unsubstituted $C_{1-20}$ alkoxy; a substituted or unsubstituted $C_{1-20}$ haloalkoxy; a substituted or unsubstituted $C_{6-20}$ aryl; a substituted or unsubstituted $C_{6-20}$ aryloxy; or a substituted or unsubstituted $C_{2-20}$ heteroaryl containing at least one heteroatom selected from the group consisting of N, O, and S, wherein adjacent substituents of $R_{a1}$ to $R_{a6}$ and $R_{b1}$ to $R_{b6}$ are optionally connected to each other to form a substituted or unsubstituted $C_{6-20}$ aromatic ring, with the proviso that at least one of $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ in one formula is a substituted or unsubstituted tri($C_{1-20}$ alkyl)silyl group, or a substituted or unsubstituted tri($C_{6-20}$ aryl) silyl group; or is substituted by a tri($C_{1-20}$ alkyl)silyl group or a tri($C_{6-20}$ aryl)silyl group.

2. The compound of claim 1, wherein in Formulas 1-1 to 1-13, $X_1$ and $X_2$ are each independently O, S, or N($C_6H_5$).

3. The compound of claim 1, wherein in Formulas 1-1 to 1-13, $L_1$ to $L_4$ are each independently a single bond, —O—, —S—, or —C($CH_3$)$_2^-$, and $L_5$ is —N($C_6H_5$)—.

4. The compound of claim 1, wherein in Formulas 1-1 to 1-13, at least one of $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ is —Si($CH_3$)$_3$ or —Si$C_6H_5$)$_3$; or is substituted by —Si($CH_3$)$_3$ or —Si($C_6H_5$)$_3$.

5. The compound of claim 1, wherein in Formulas 1-1 to 1-13, $R_{a1}$ to $R_{a6}$, $R_{b1}$ to $R_{b6}$, $R_{11}$ to $R_{16}$, $R_{21}$ to $R_{26}$, and $R_{31}$ to $R_{35}$ are each independently hydrogen; deuterium; a halogen; —Si($CH_3$)$_3$; —Si($C_6H_5$)$_3$; —$CH_3$; —CH($CH_3$)$_2$; —C($CH_3$)$_3$; —$CF_3$; or —O$CF_3$; and are selected from the group consisting of:

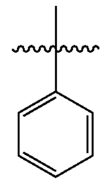

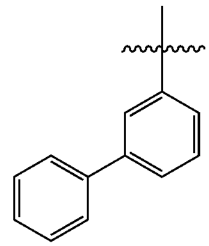

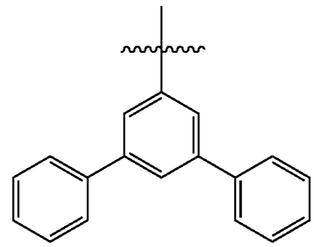

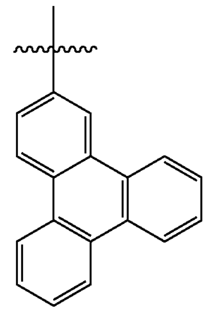

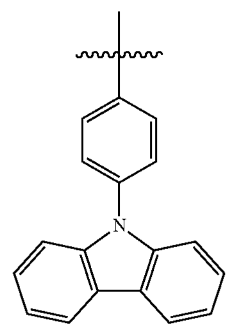

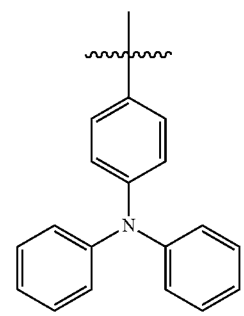

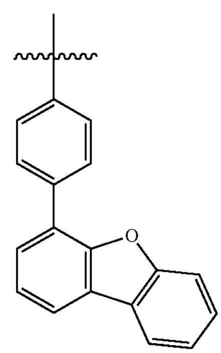

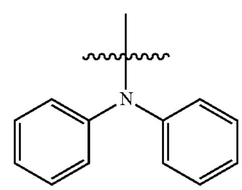

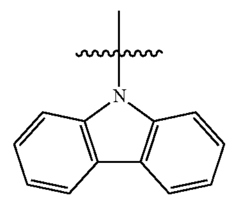

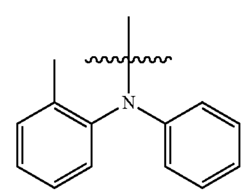

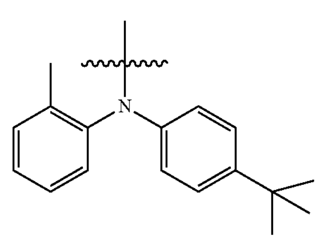

-continued
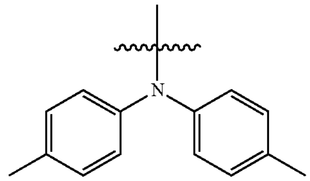
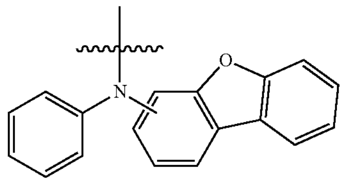
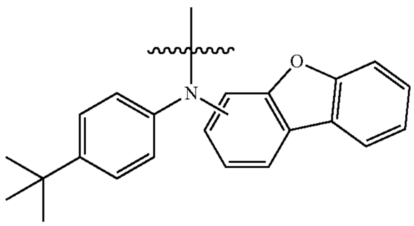
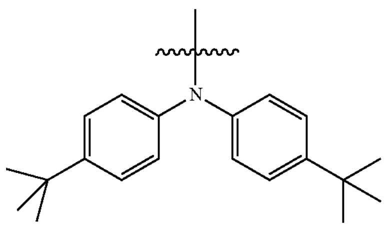
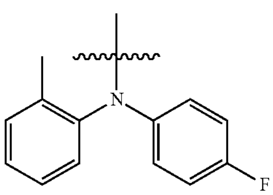
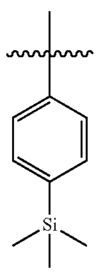
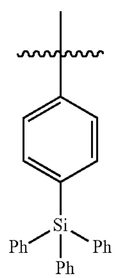
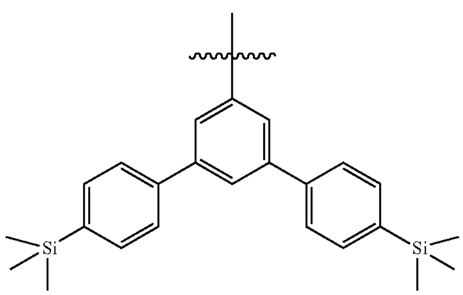
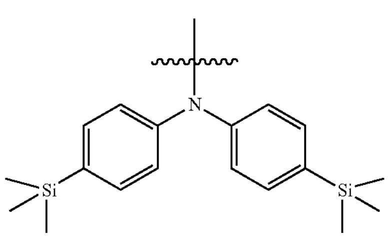
-continued
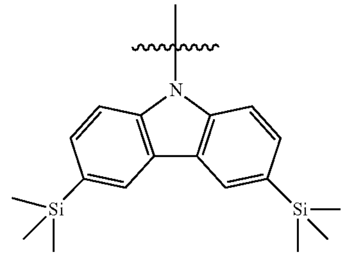
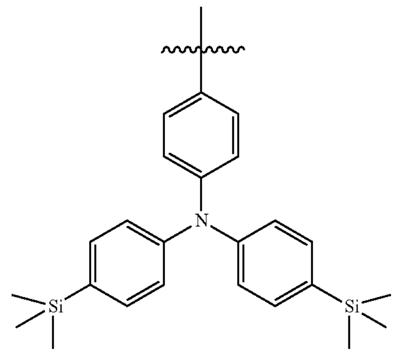
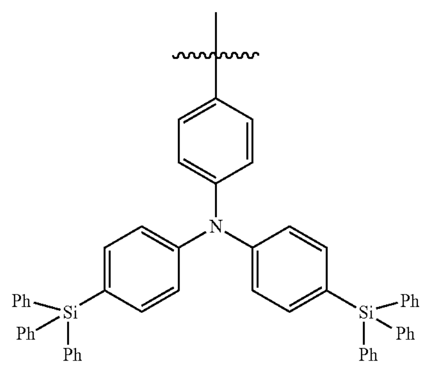
wherein Ph is a phenyl group.
6. The compound of claim 1, wherein the compound represented by Formula 1 is any one of the following Formulas 1-1A to 1-13A:
[Formula 1-1A]
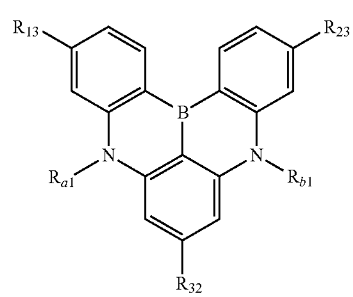

-continued
[Formula 1-2A]
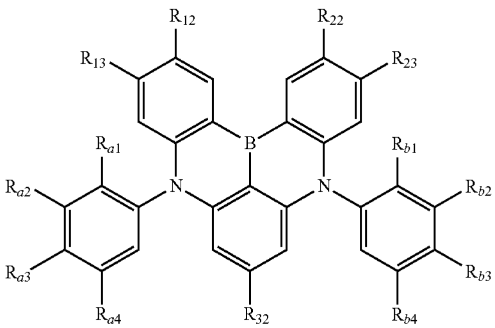
[Formula 1-3A]
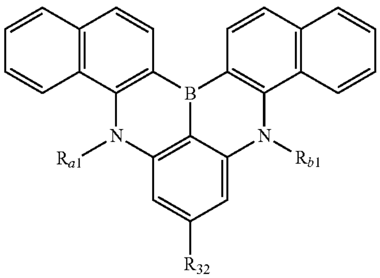
[Formula 1-4A]
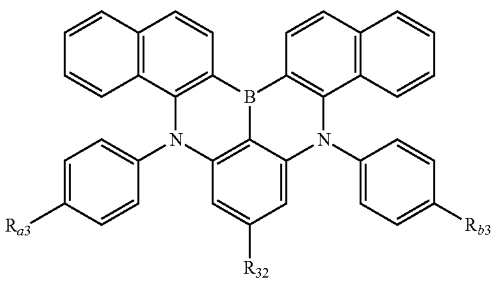
[Formula 1-5A]
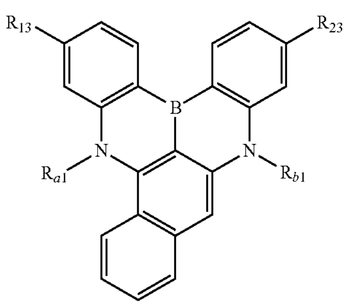
[Formula 1-6A]
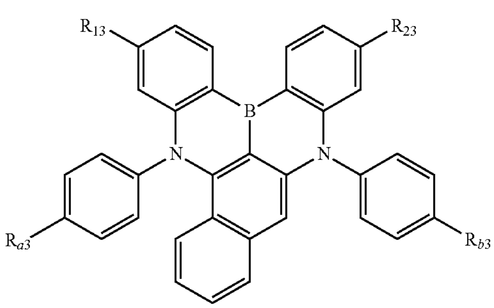
-continued
[Formula 1-7A]
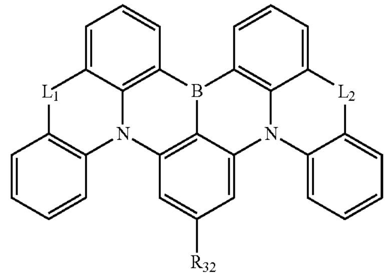
[Formula 1-8A]
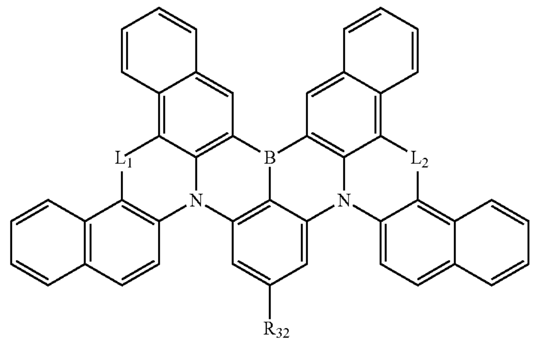
[Formula 1-9A]
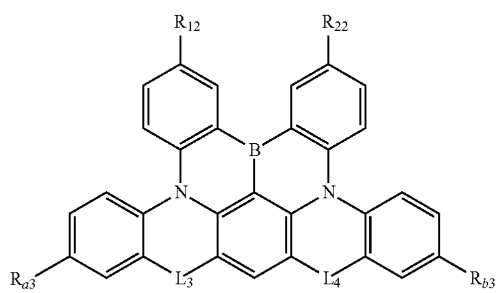
[Formula 1-10A]
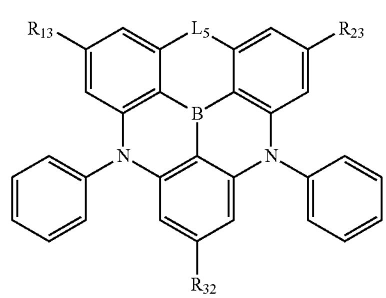

-continued

[Formula 1-11A]

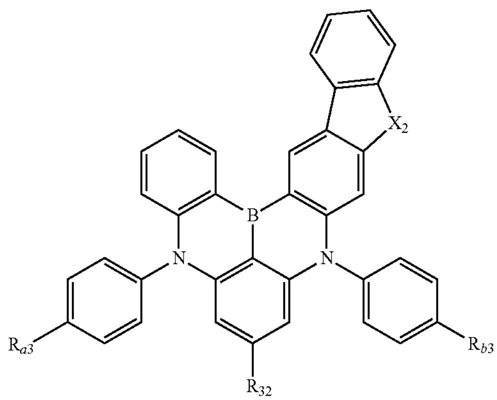

[Formula 1-12A]

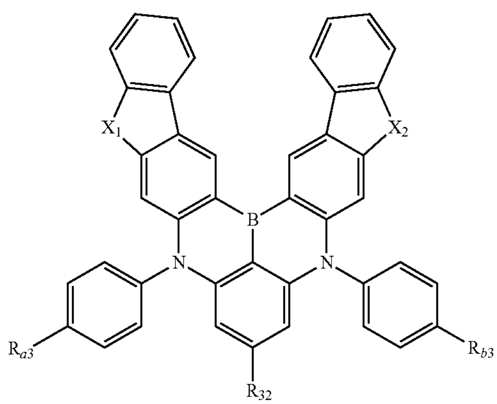

[Formula 1-13A]

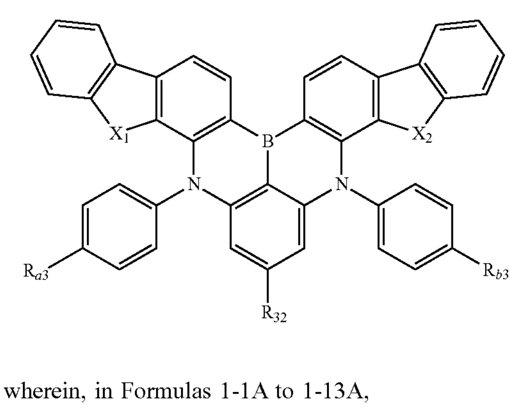

wherein, in Formulas 1-1A to 1-13A, $X_1$, $X_2$, $L_1$ to $L_5$, $R_{a1}$ to $R_{a4}$, $R_{b1}$ to $R_{b4}$, $R_{12}$, $R_{13}$, $R_{22}$, $R_{23}$, and $R_{32}$ are as defined in claim 1, with the proviso that at least one of $R_{a1}$ to $R_{a4}$, $R_{b1}$ to $R_{b4}$, $R_{12}$, $R_{13}$, $R_{22}$, $R_{23}$, and $R_{32}$ in one formula is —$Si(CH_3)_3$ or —$Si(C_6H_5)_3$; or is substituted by —$Si(CH_3)_3$ or —$Si(C_6H_5)_3$.

7. The compound of claim 1, wherein the compound is any one selected from the group consisting of the following compounds:

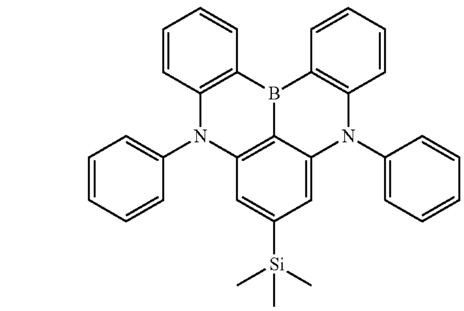

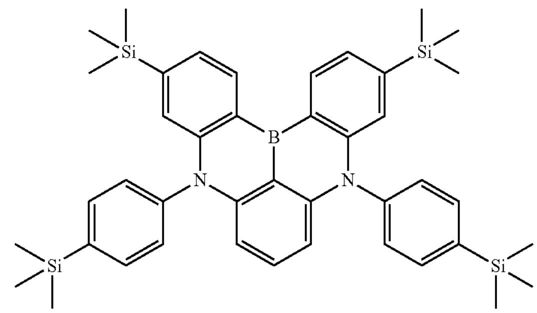

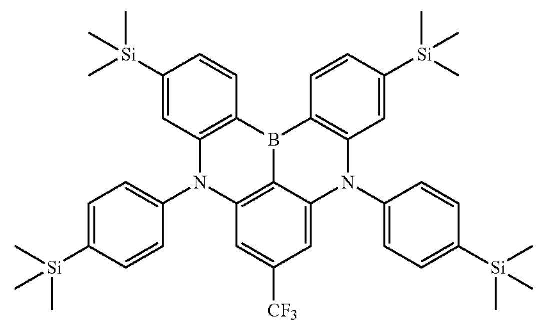

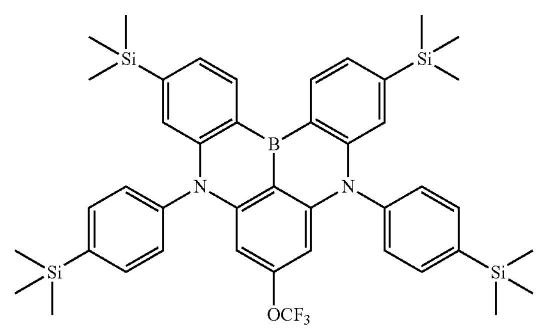

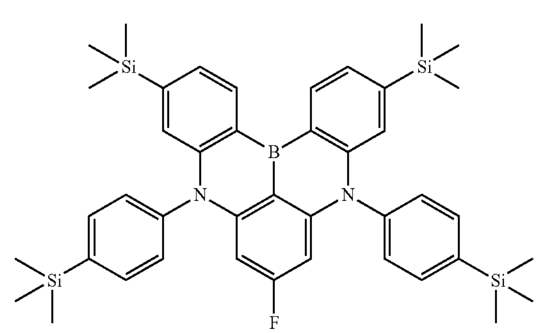

-continued
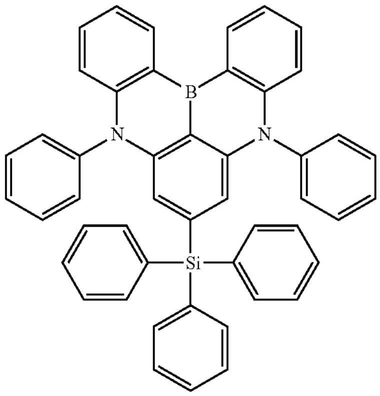
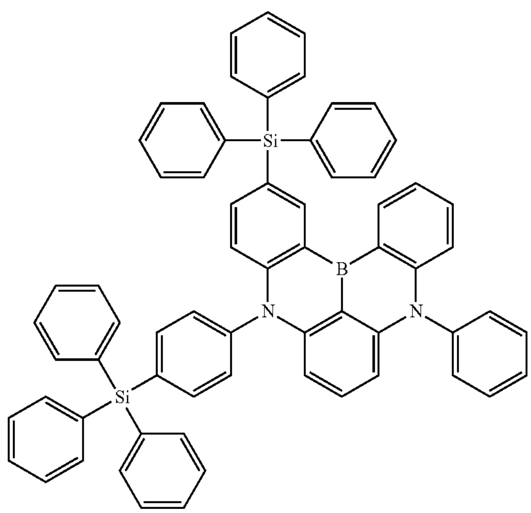
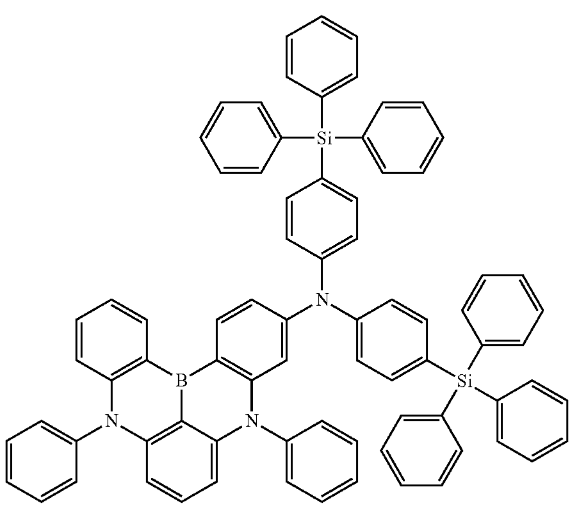
-continued
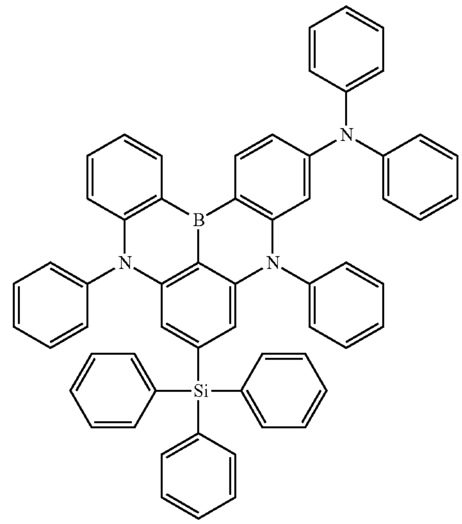
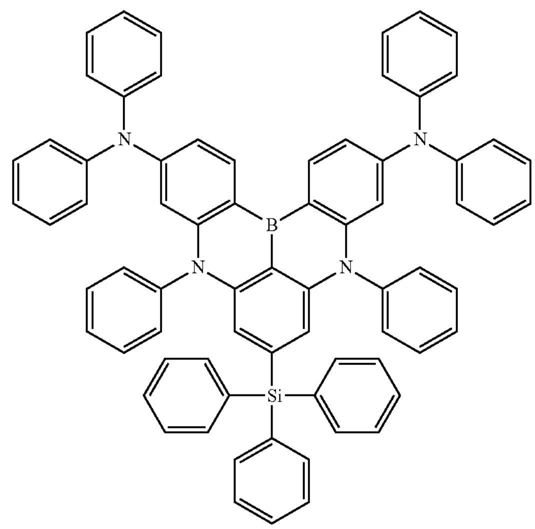
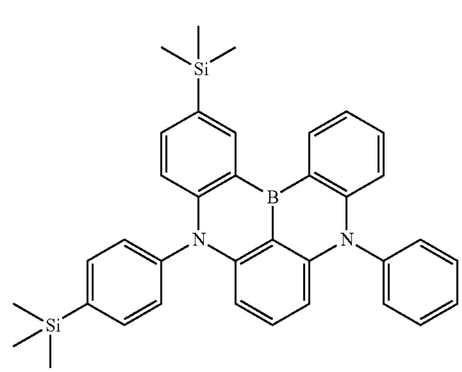

-continued
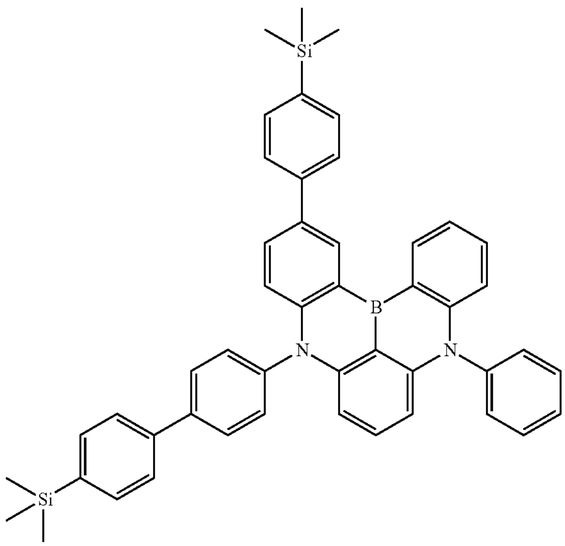
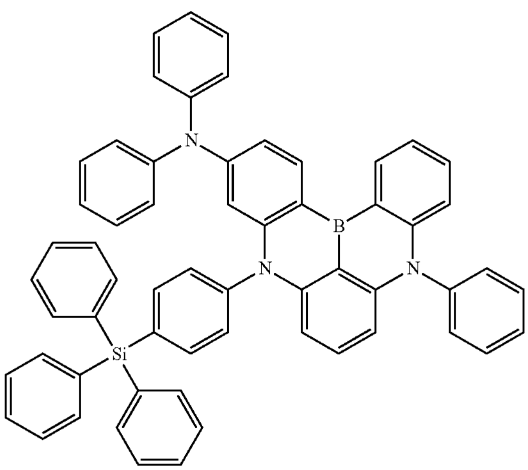
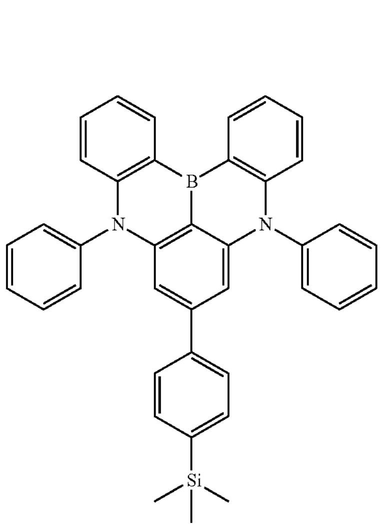
-continued
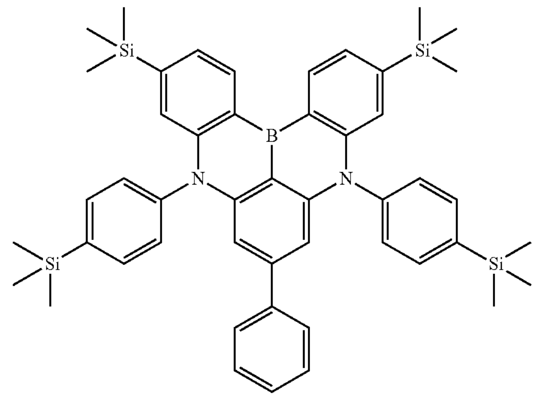
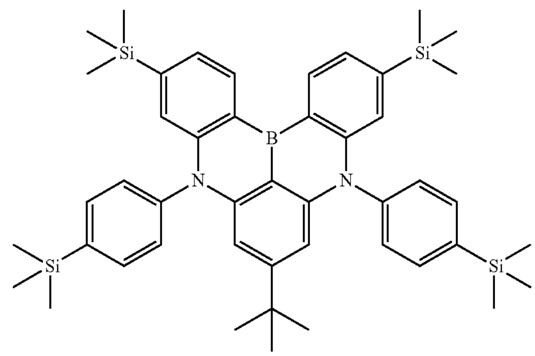
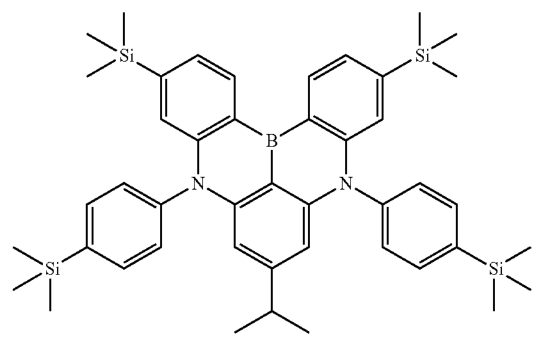
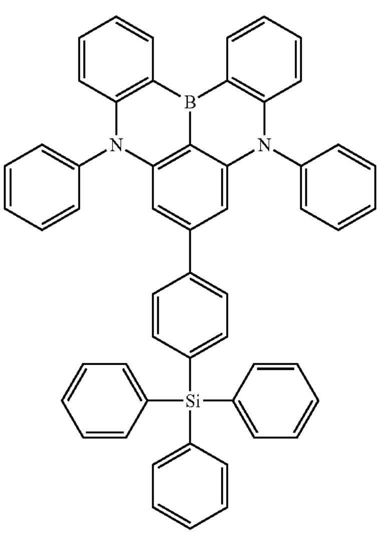

-continued
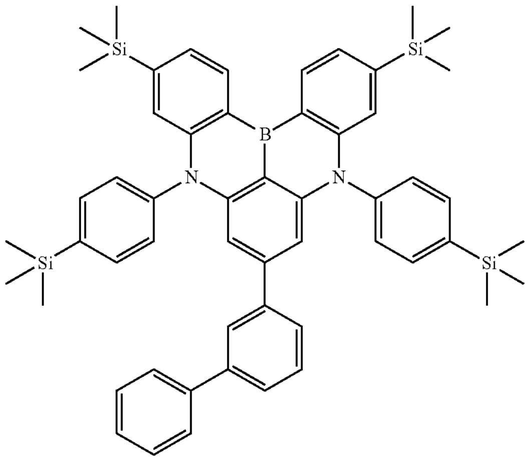
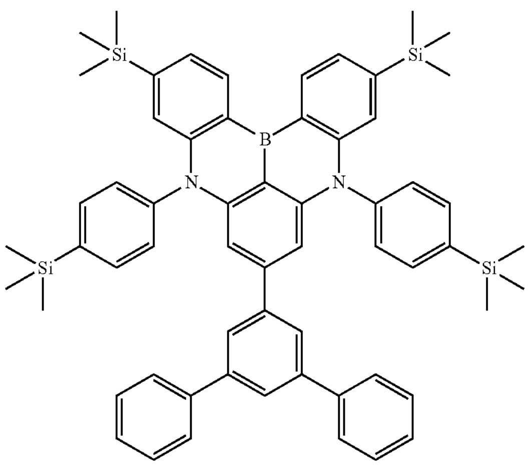
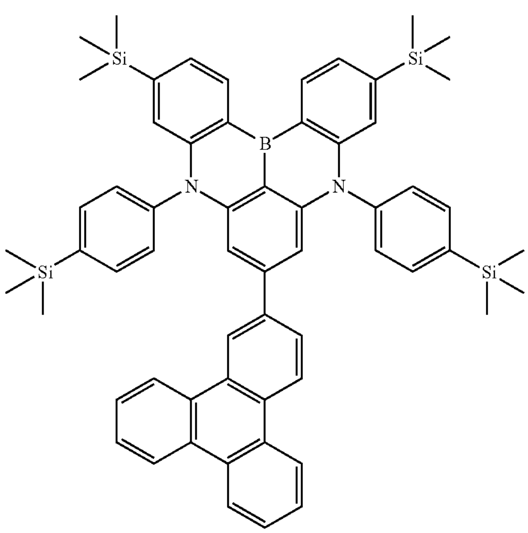
-continued
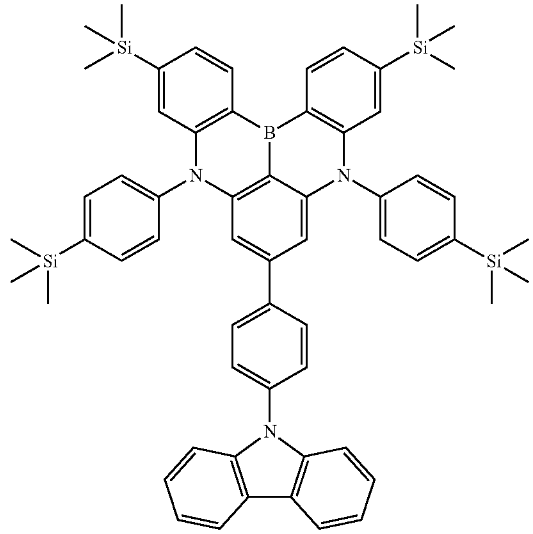
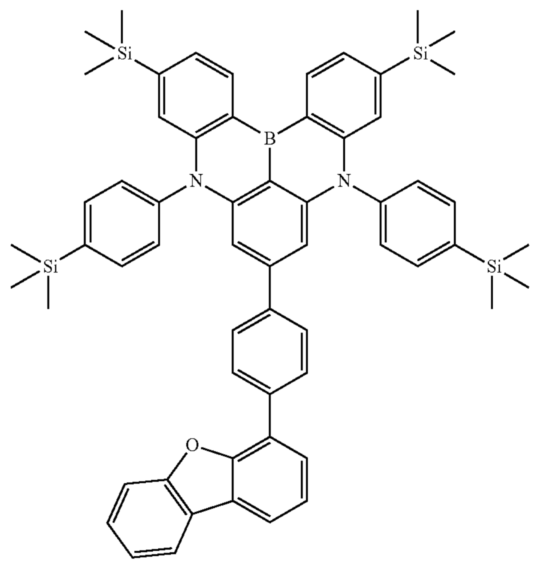
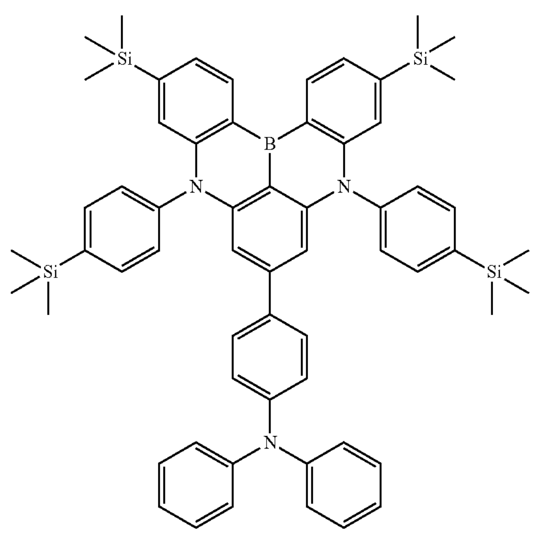

-continued
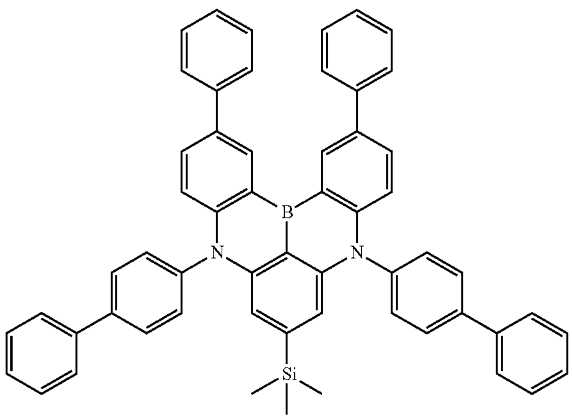
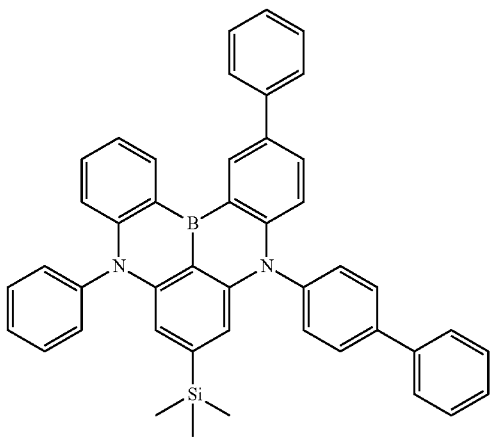
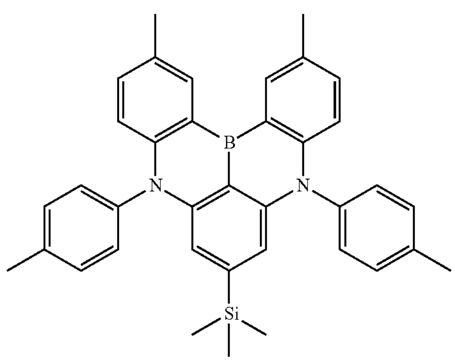
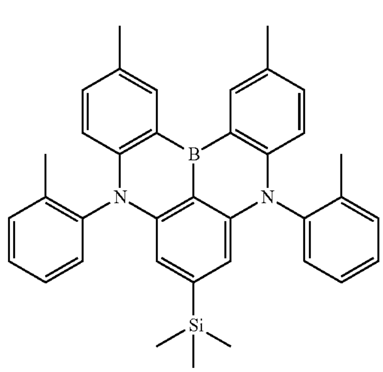
-continued
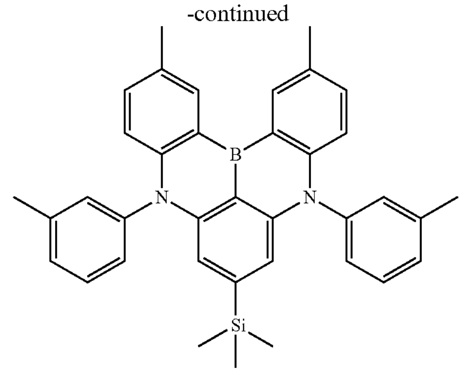
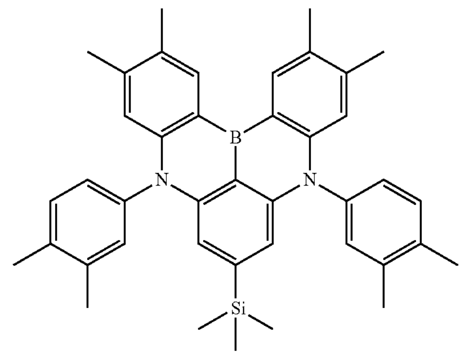
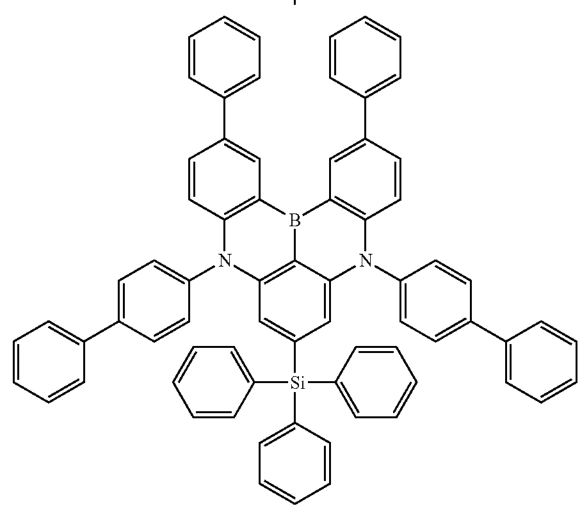
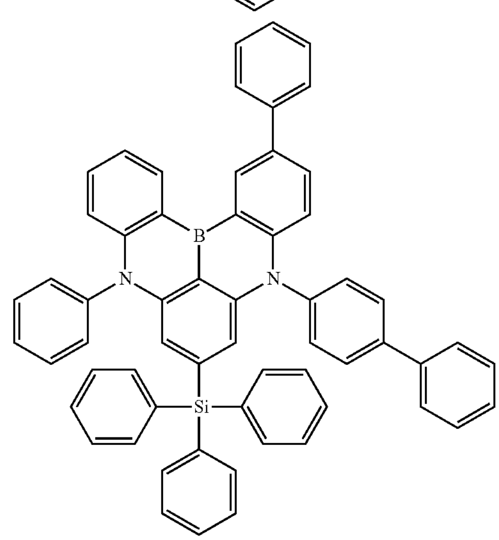

-continued
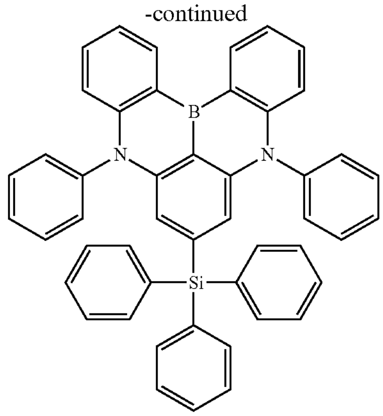
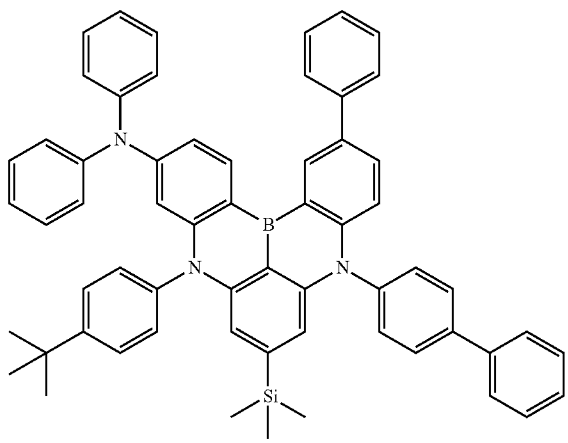
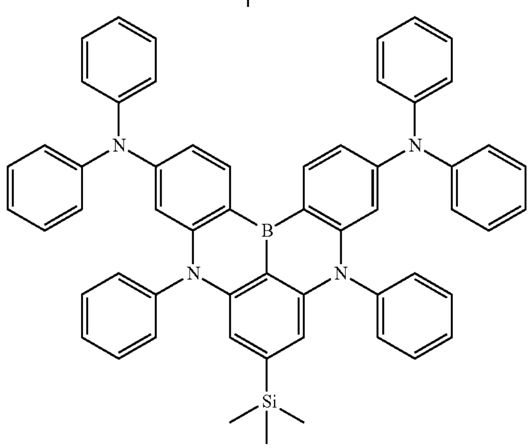
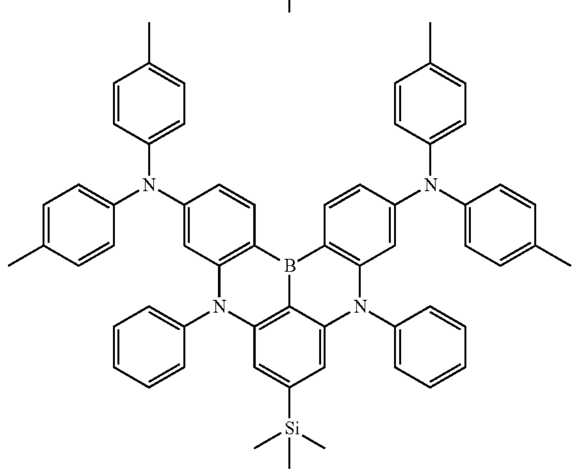
-continued
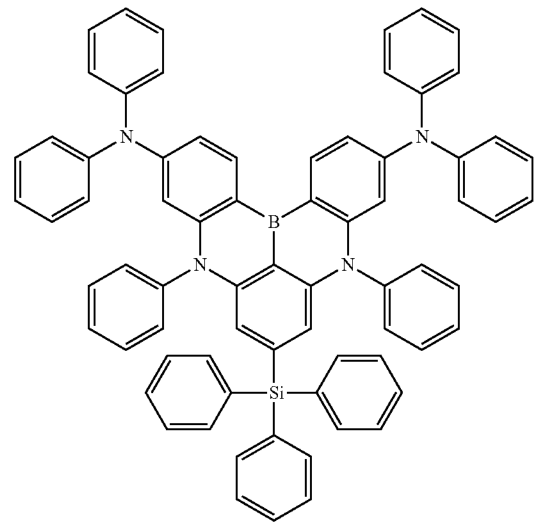
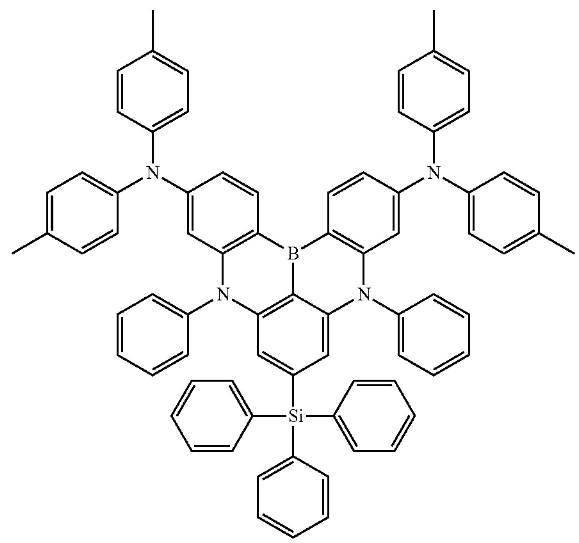
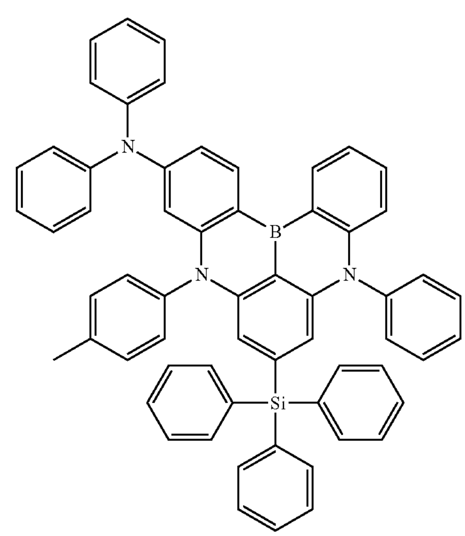

-continued
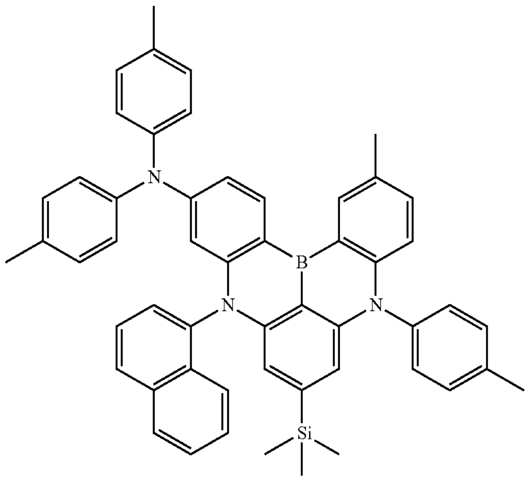
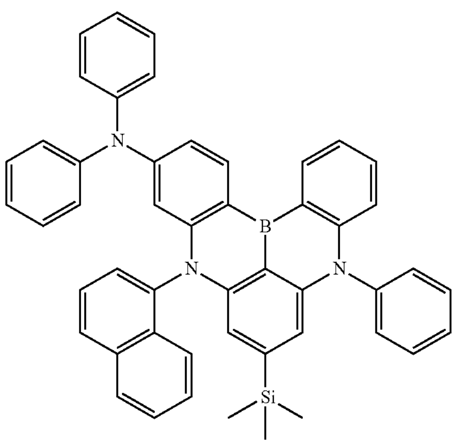
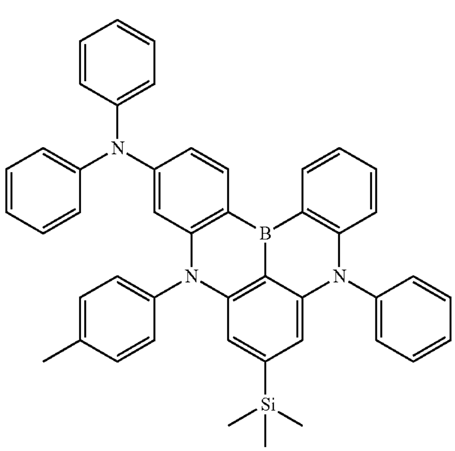
-continued
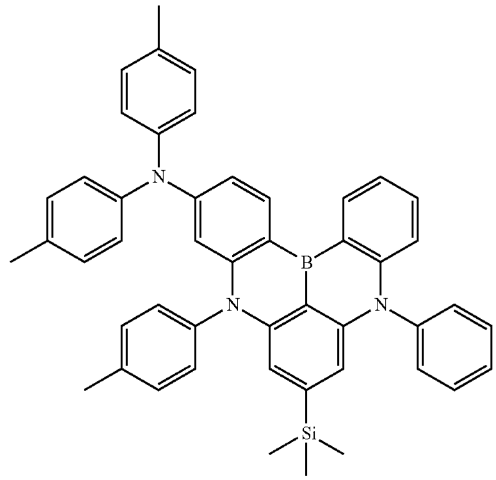
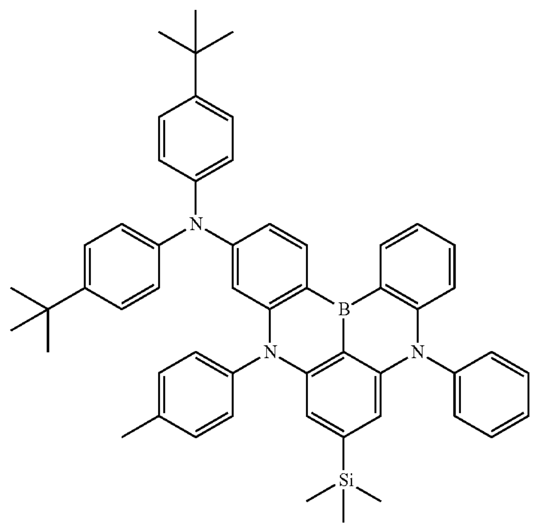
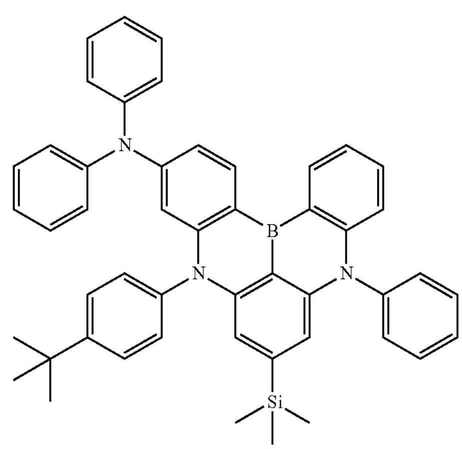

-continued
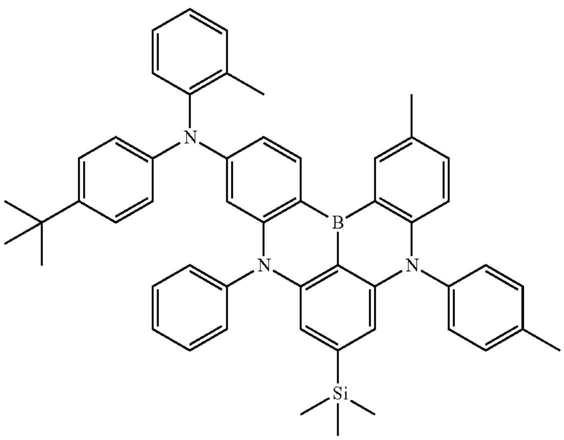
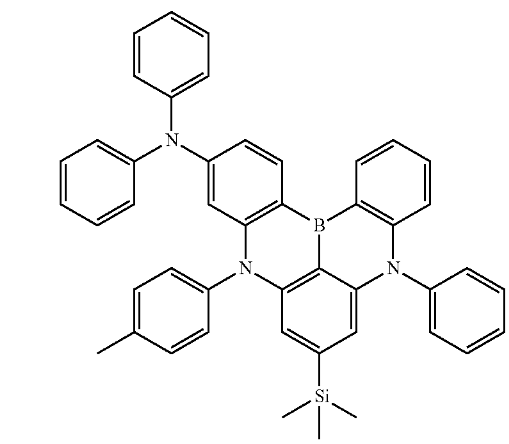
-continued
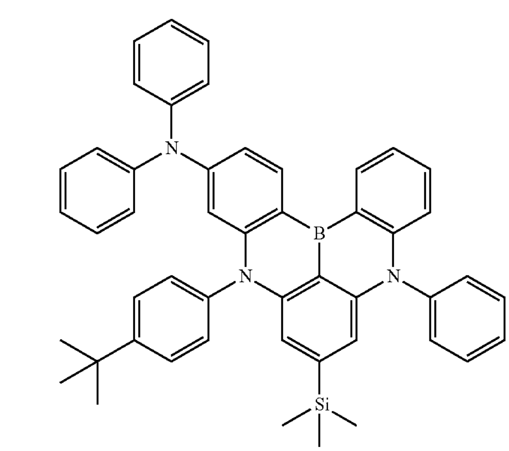
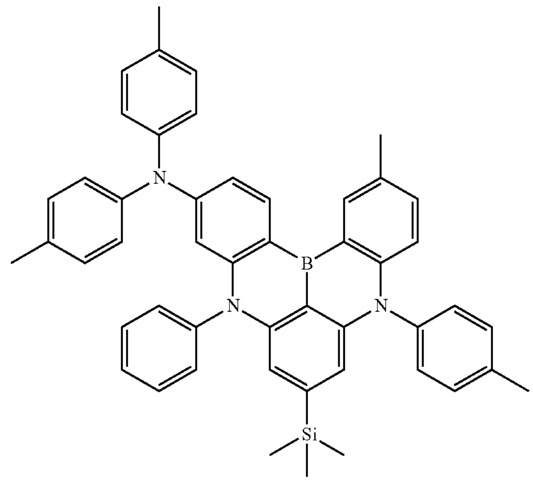
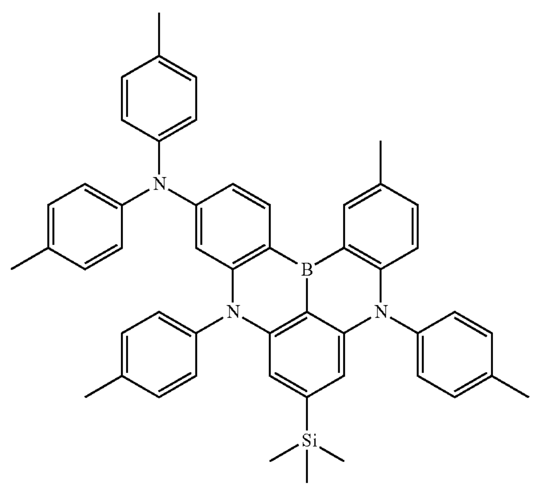
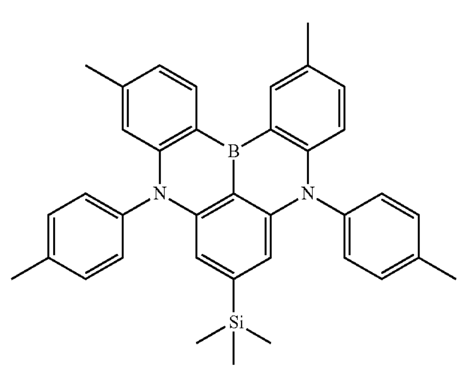

-continued
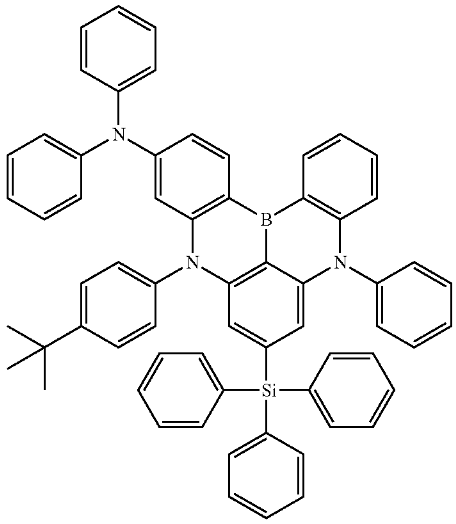
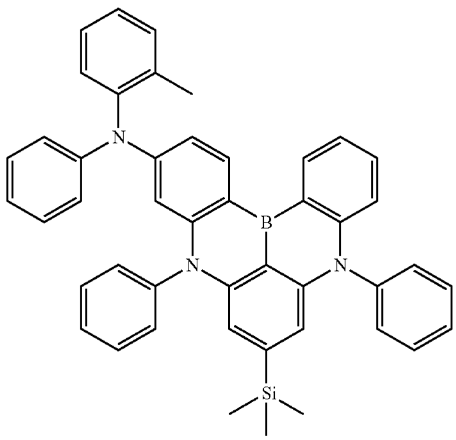
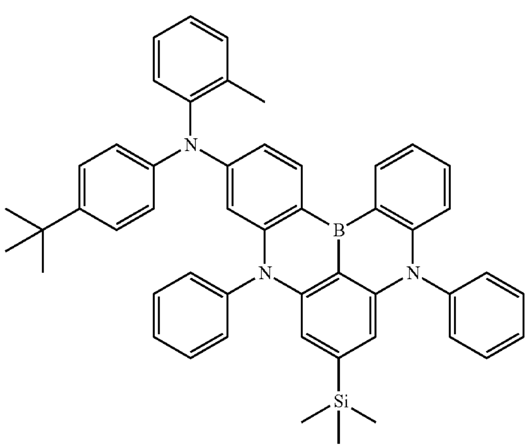
-continued
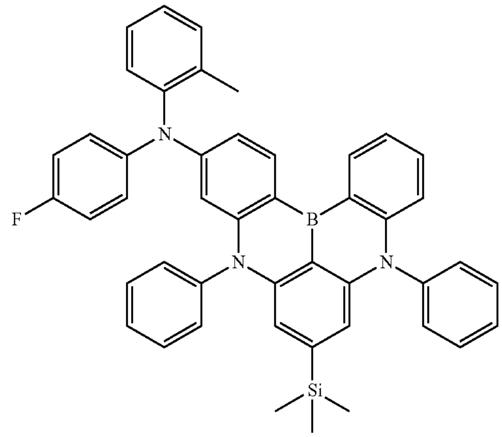
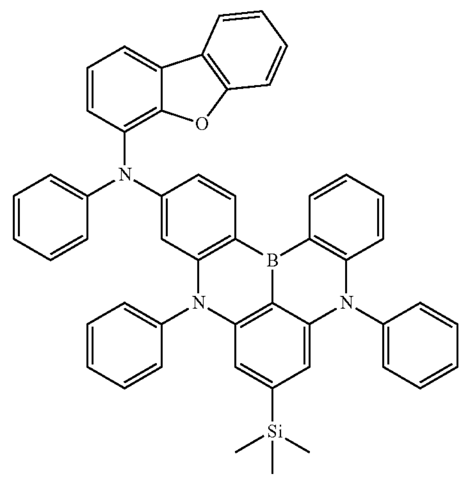
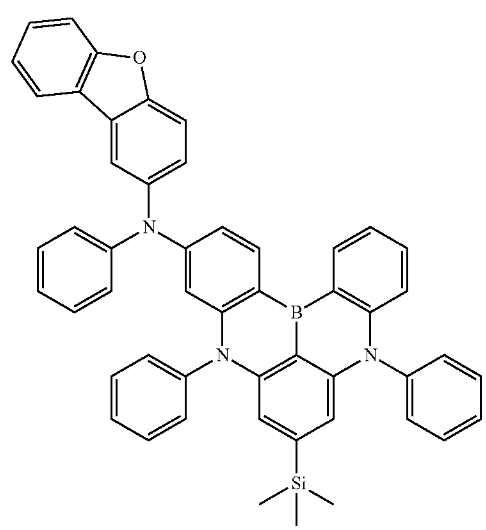 [SMILES: C[Si](C)(C)c1cc2c3c(c1)N(c1ccccc1)c1cc(N(c4ccccc4)c4ccc5oc6ccccc6c5c4)ccc1B3c1ccccc1N2c1ccccc1]

-continued
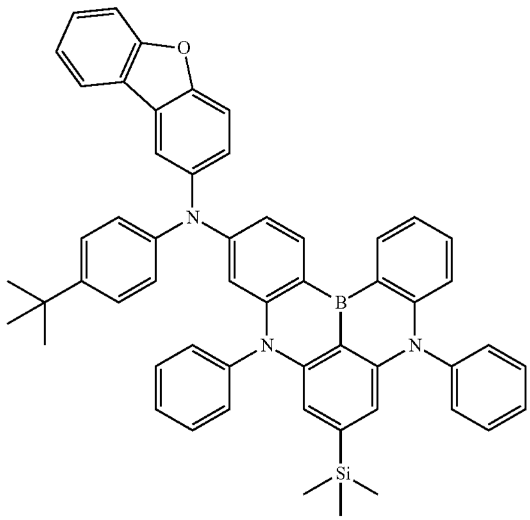
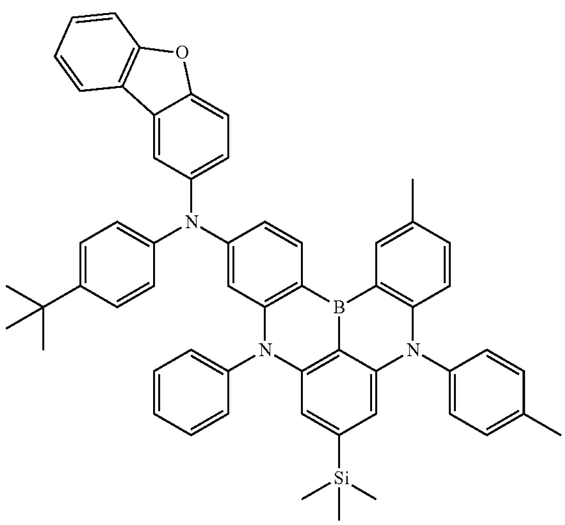
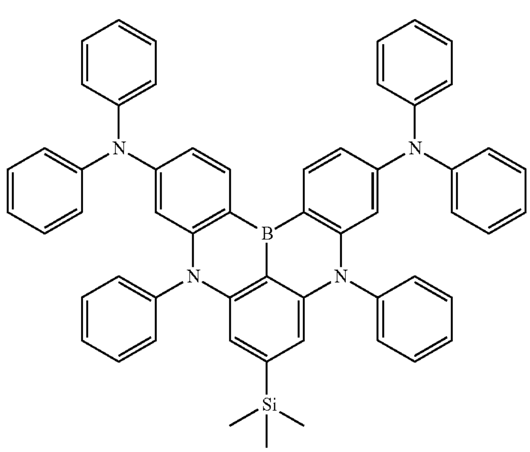
-continued
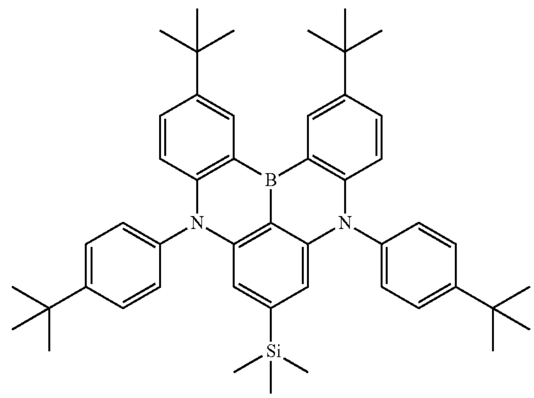
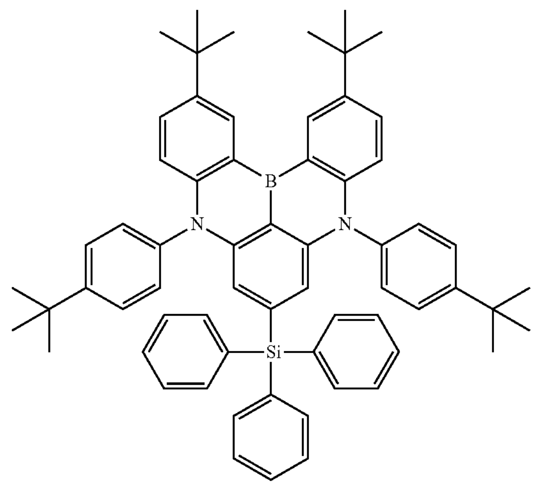
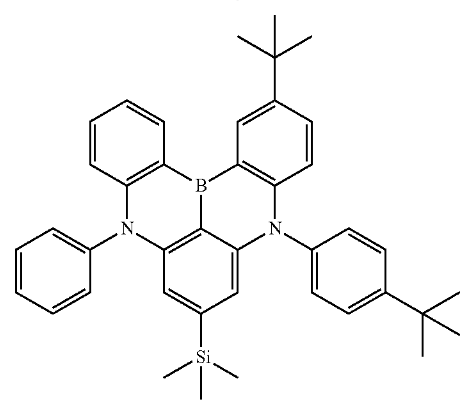
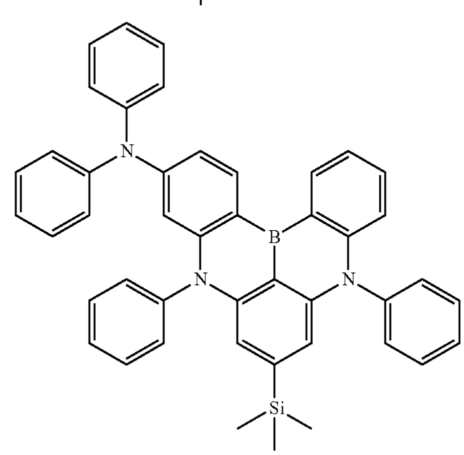

-continued
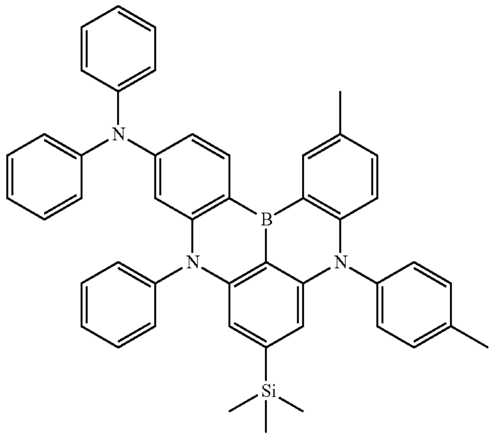
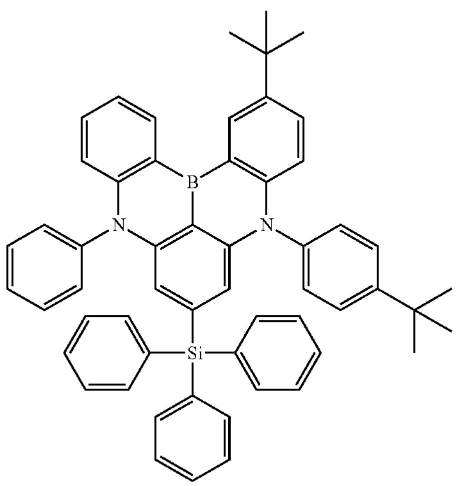
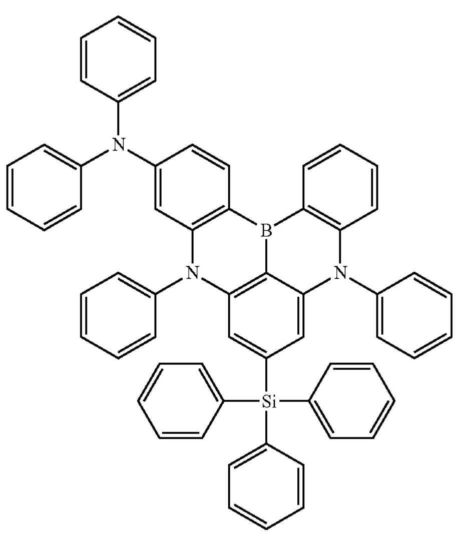
-continued
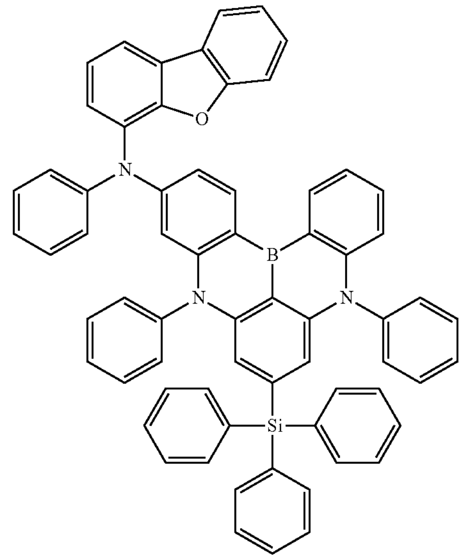
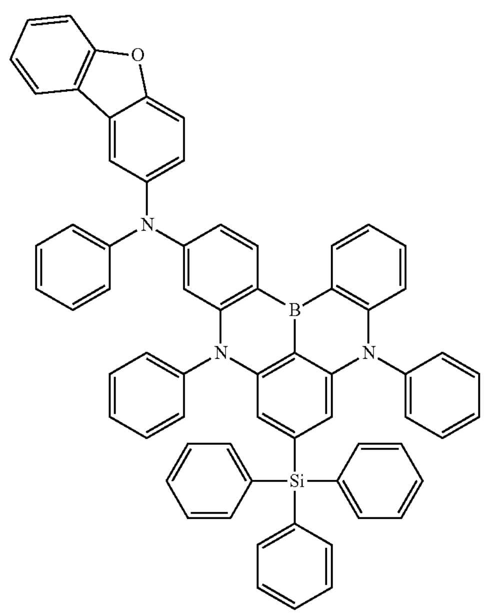

-continued
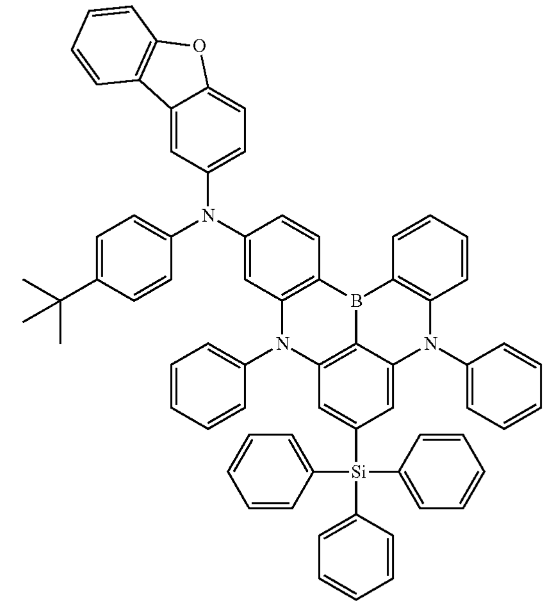
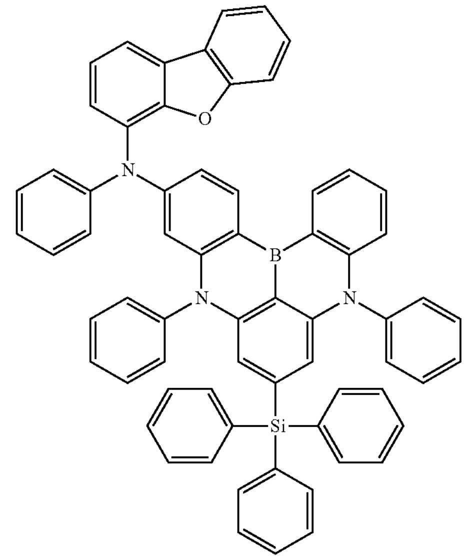
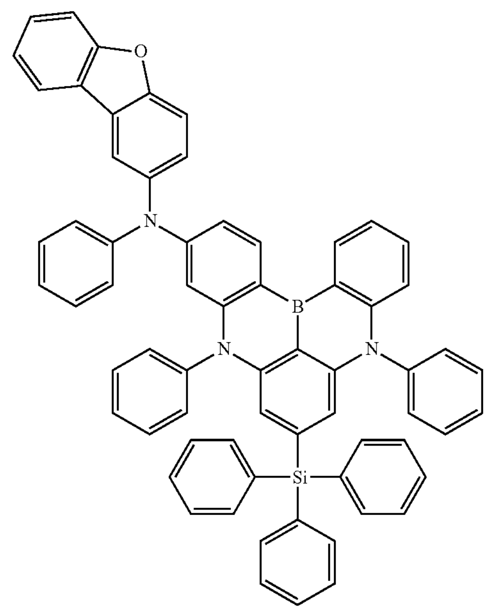
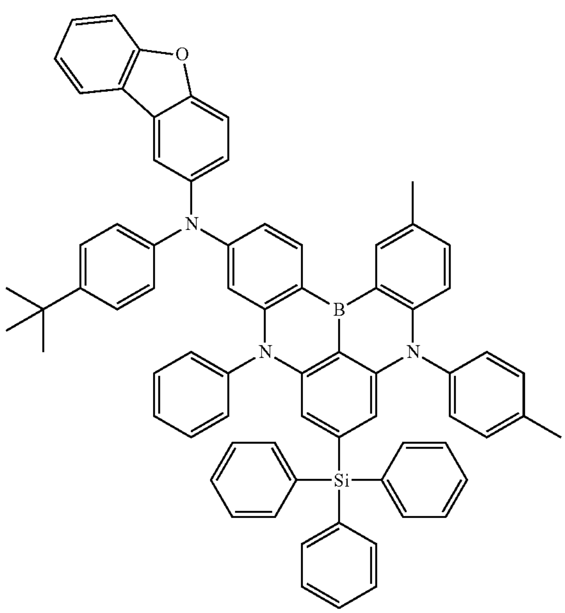
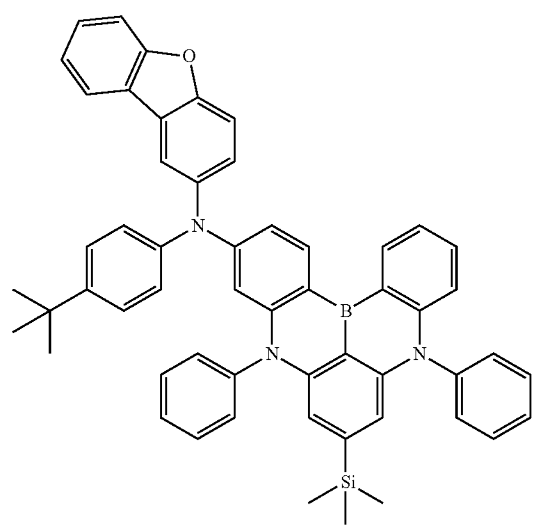

-continued
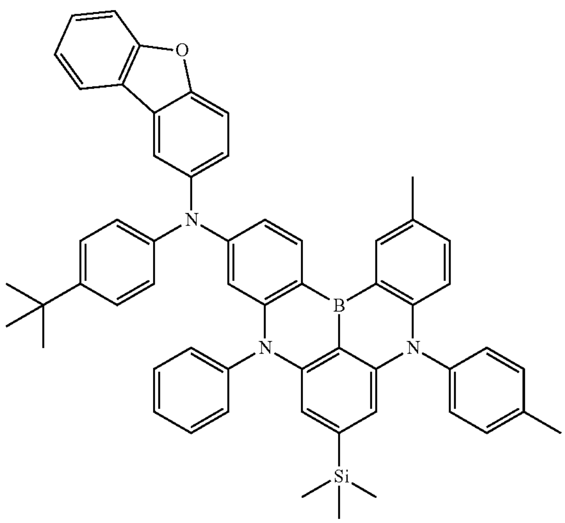
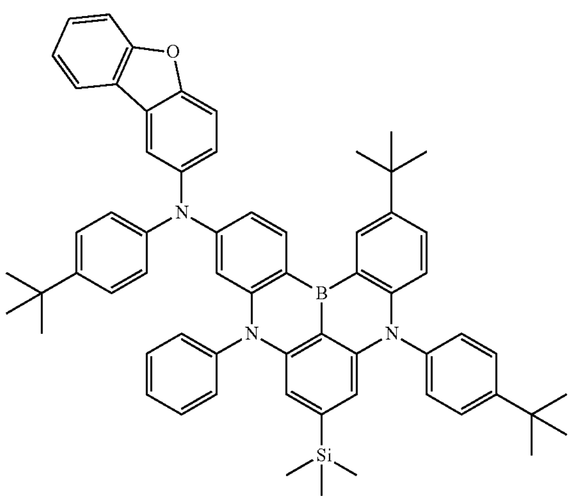
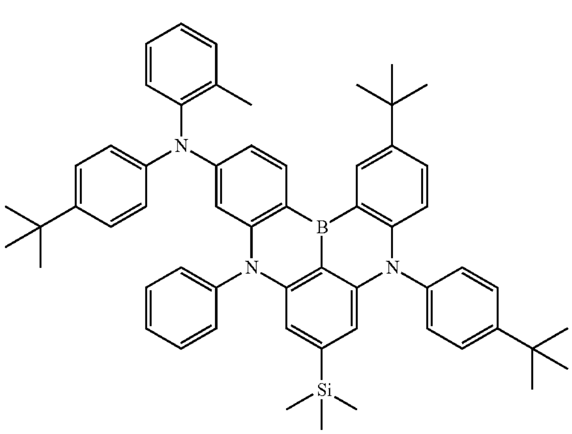
-continued
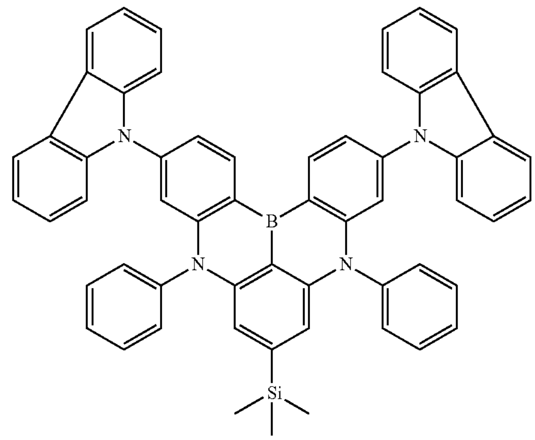
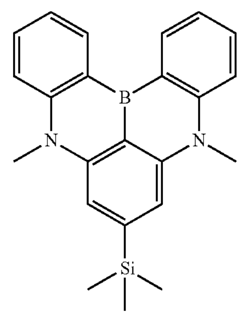
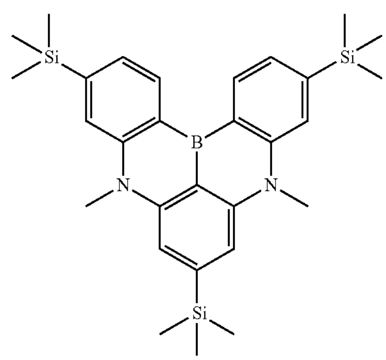
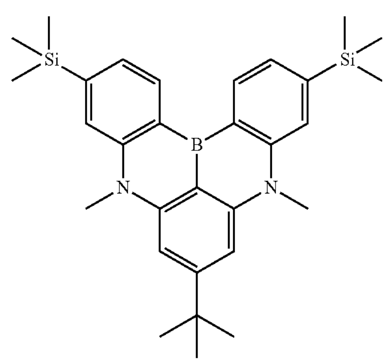

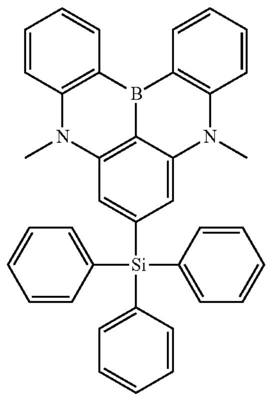
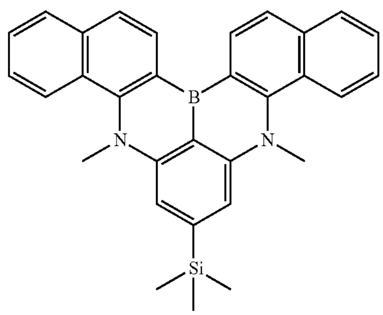
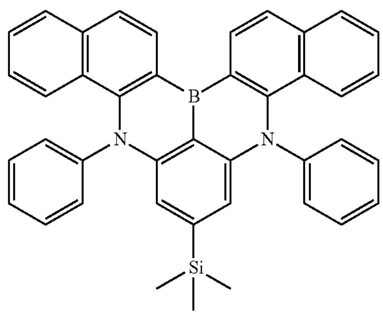
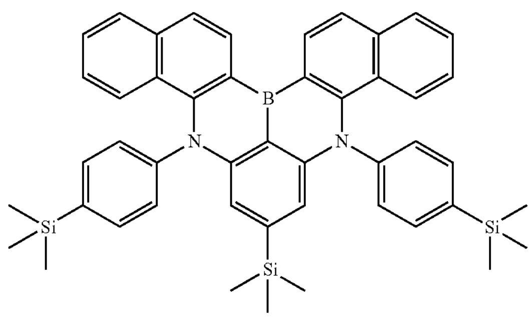
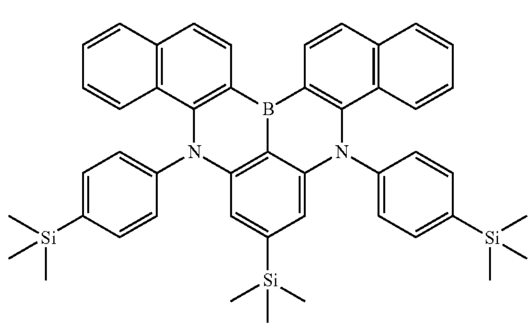
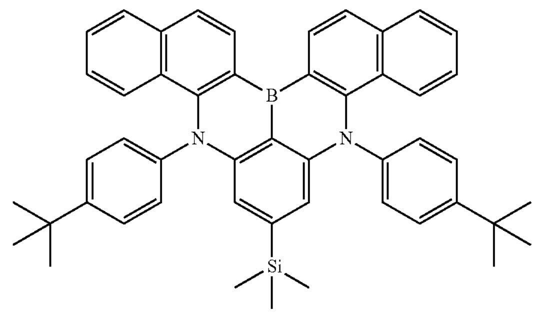
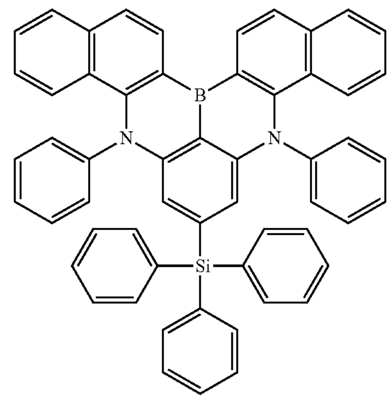
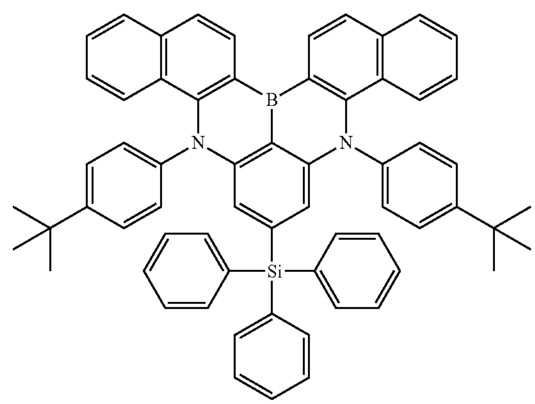
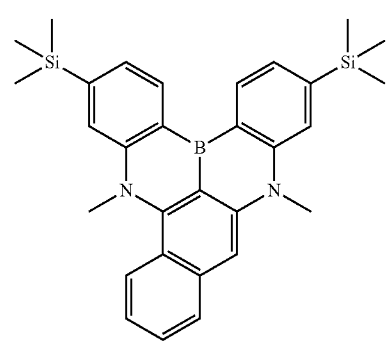

-continued
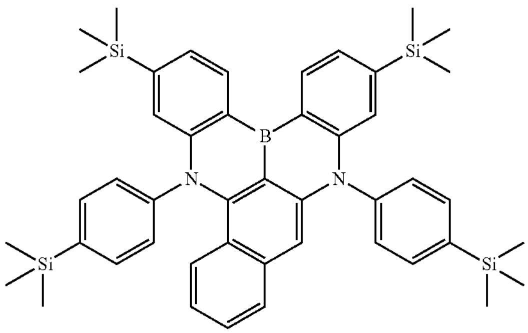
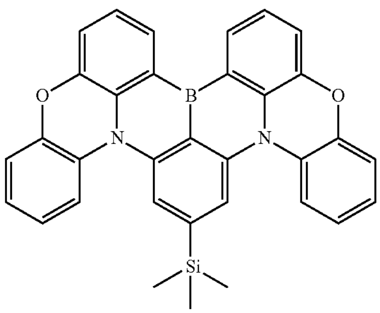
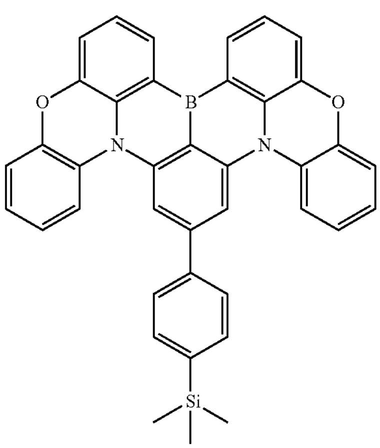
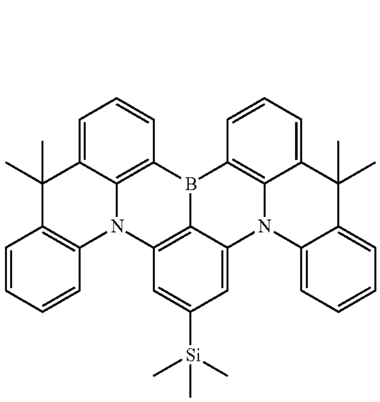
-continued
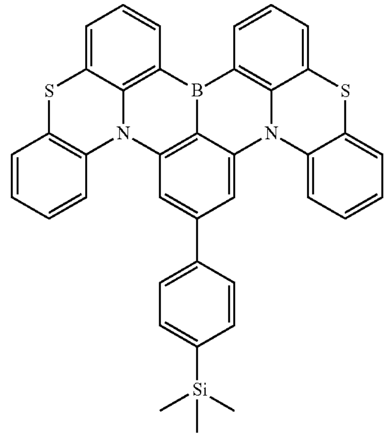
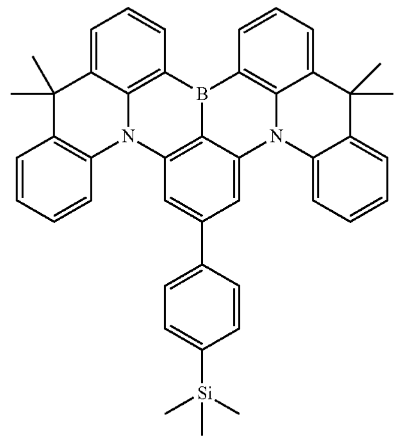
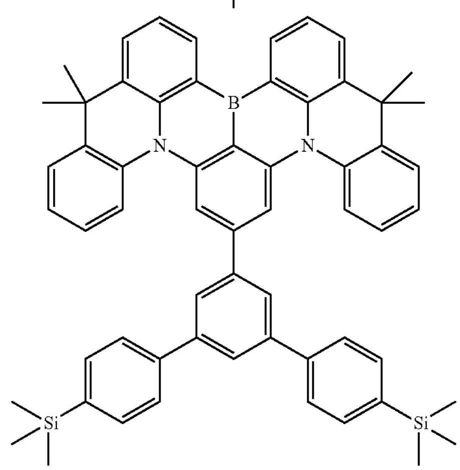
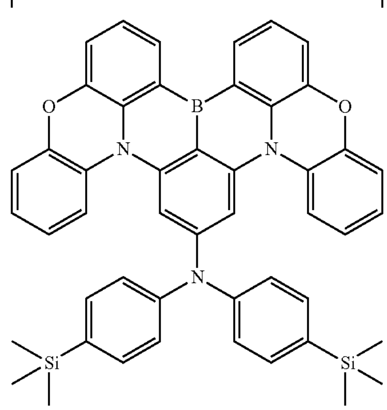

-continued
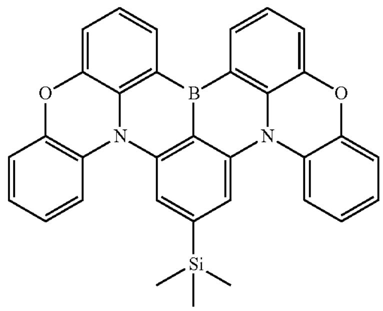
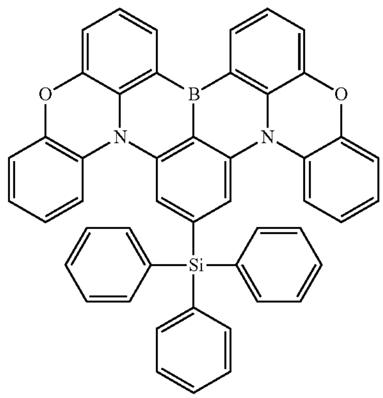
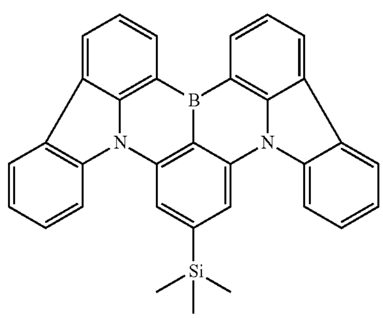
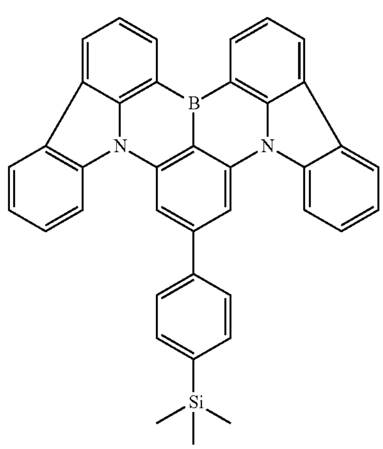
-continued
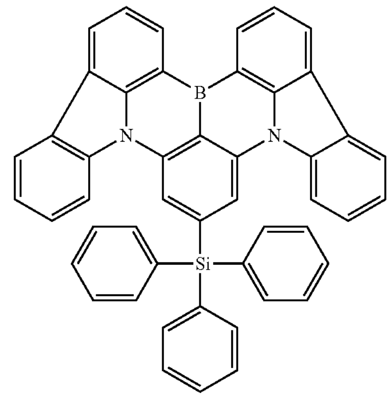
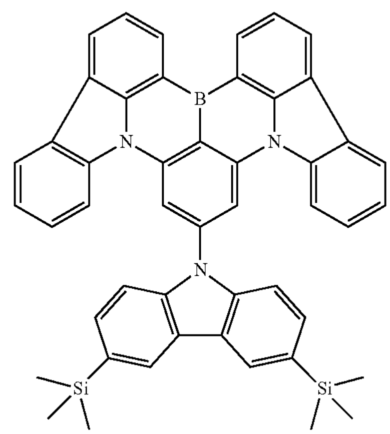
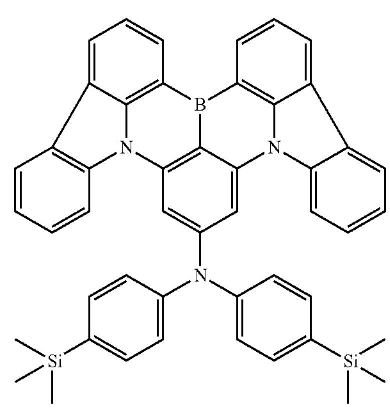

-continued
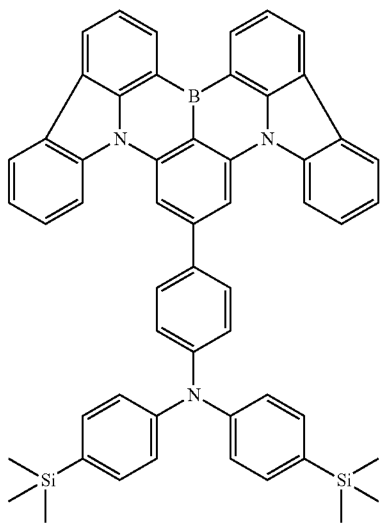
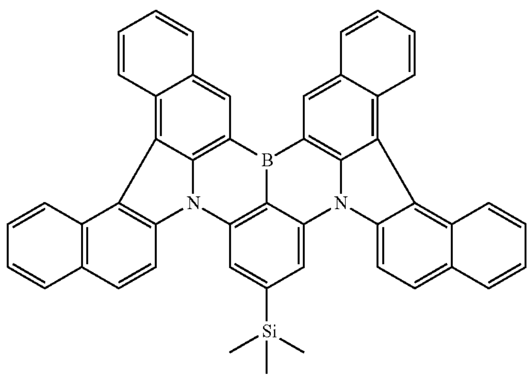
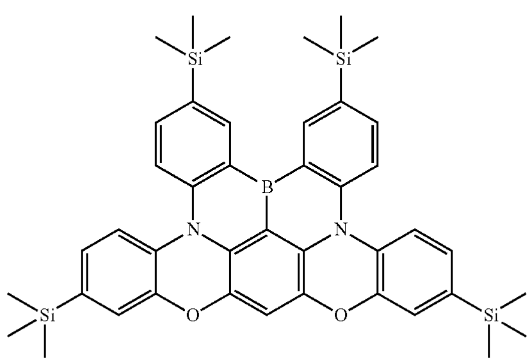
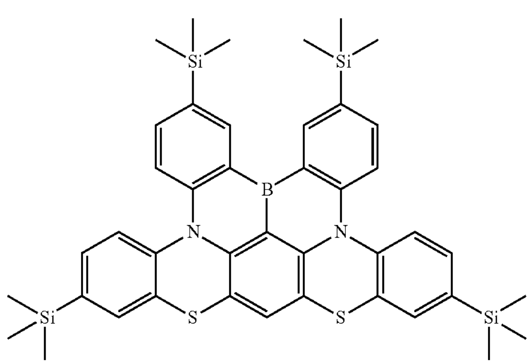
-continued
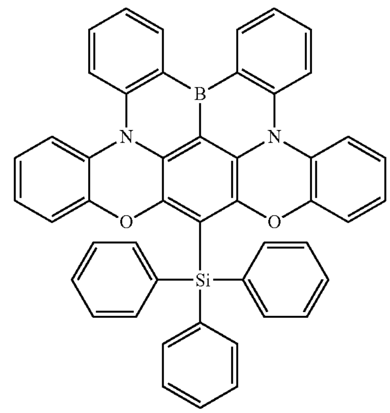
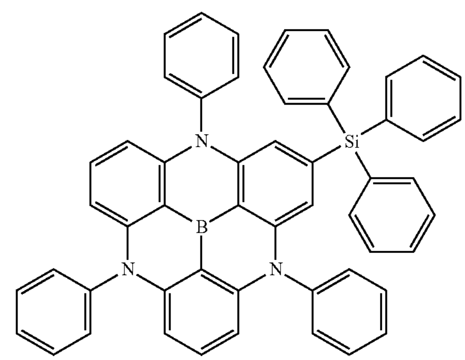
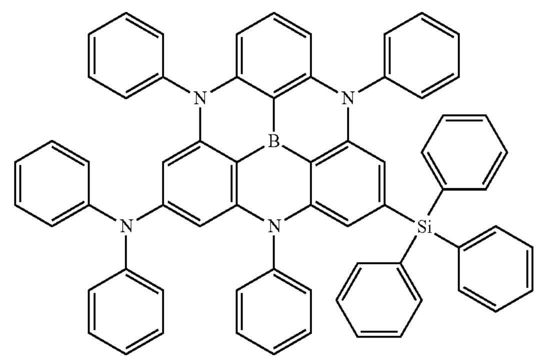
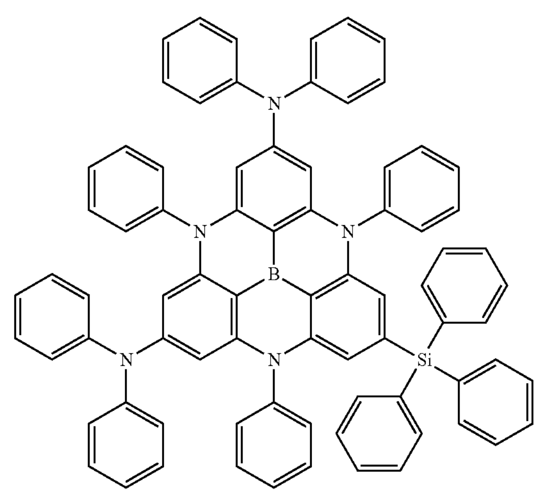

-continued
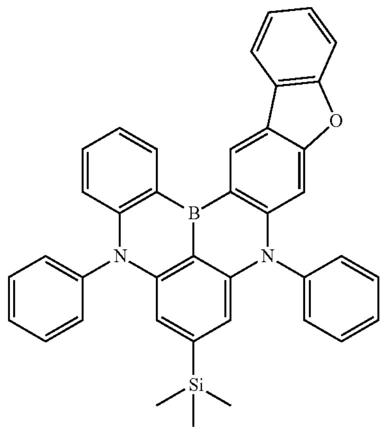
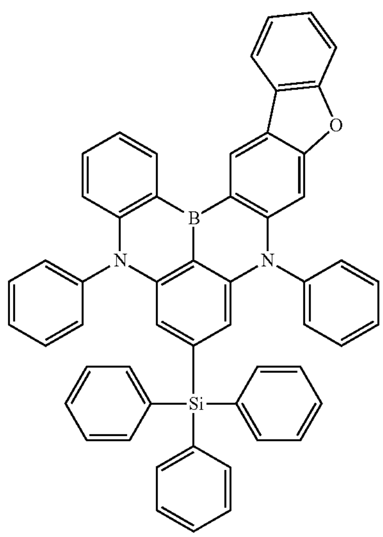
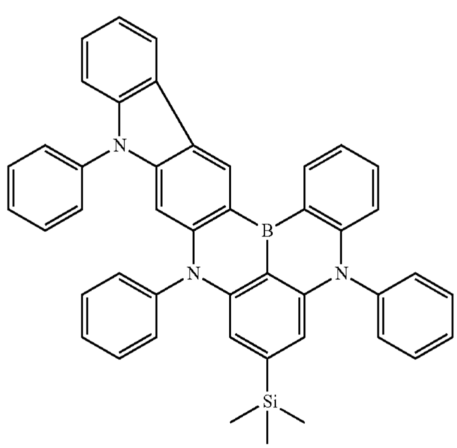
-continued
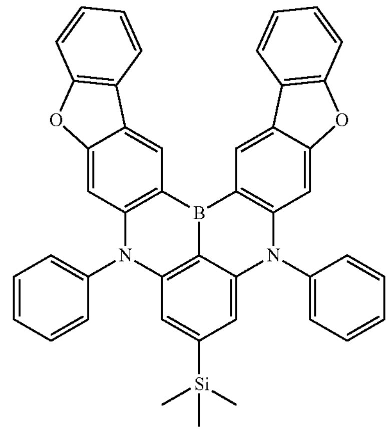
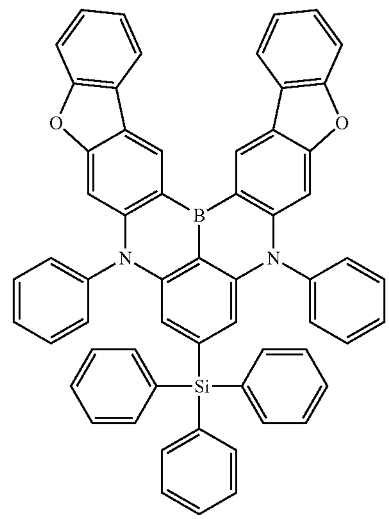
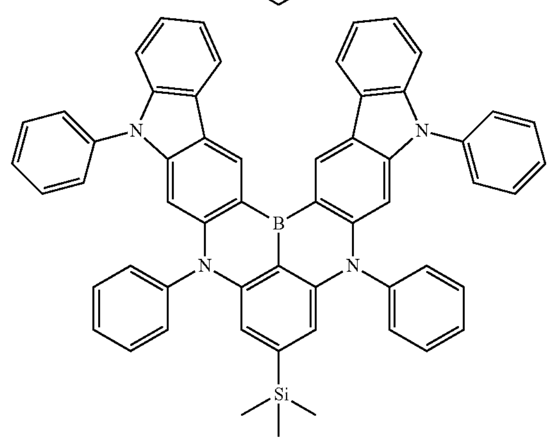
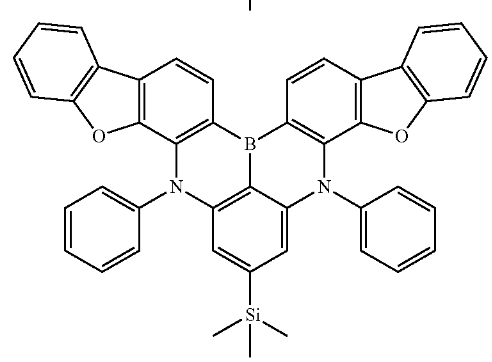

-continued
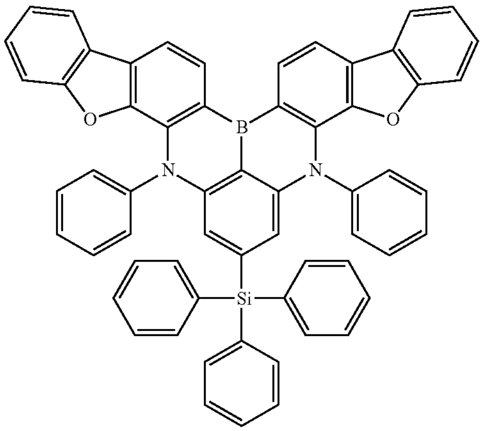
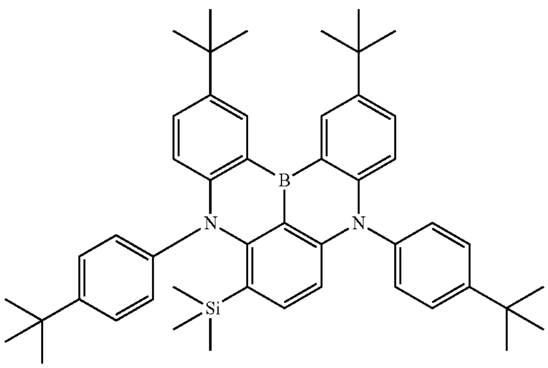
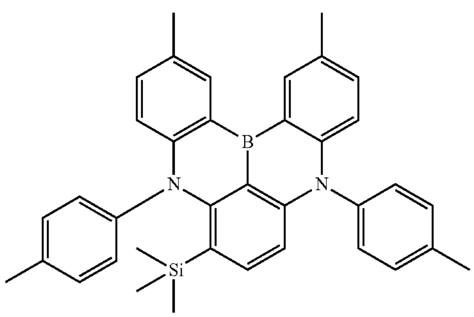
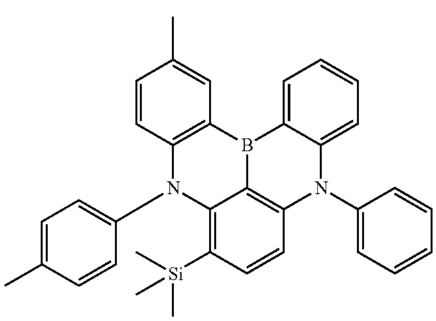
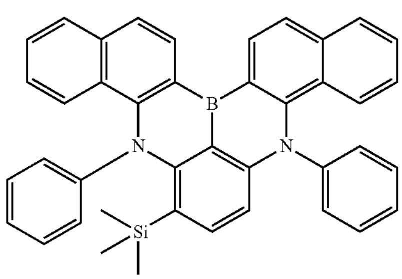
-continued
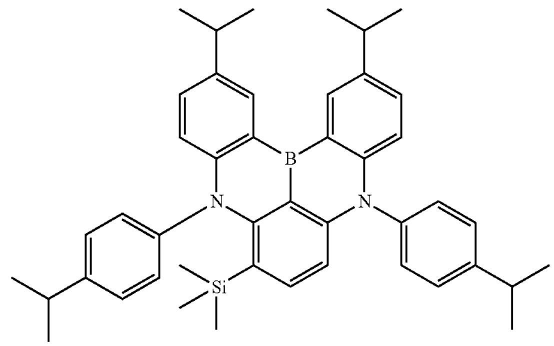
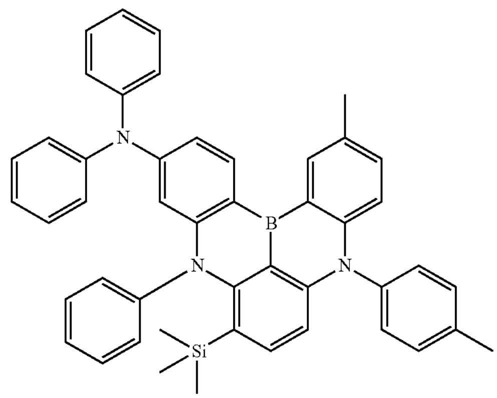
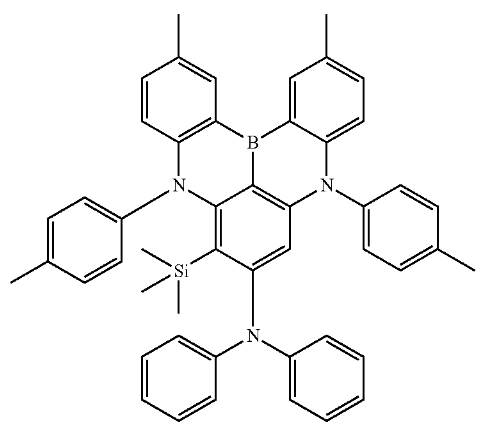
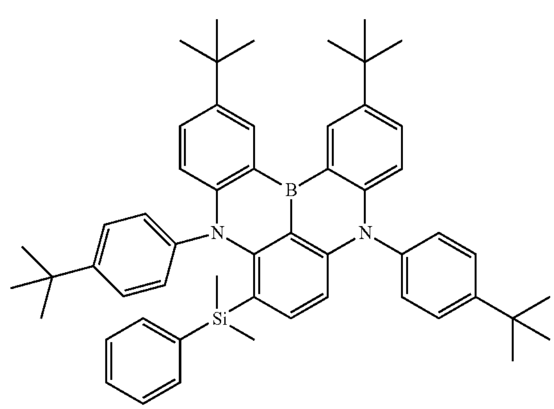

-continued
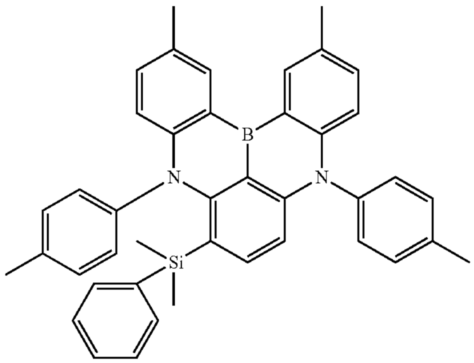
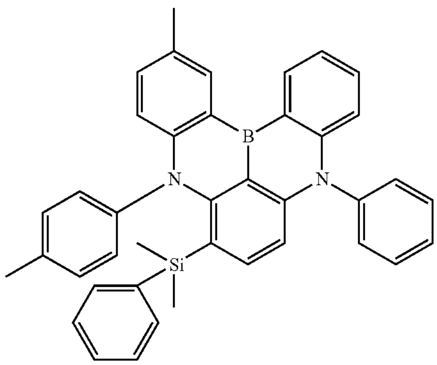
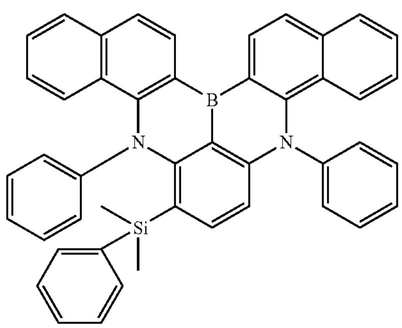
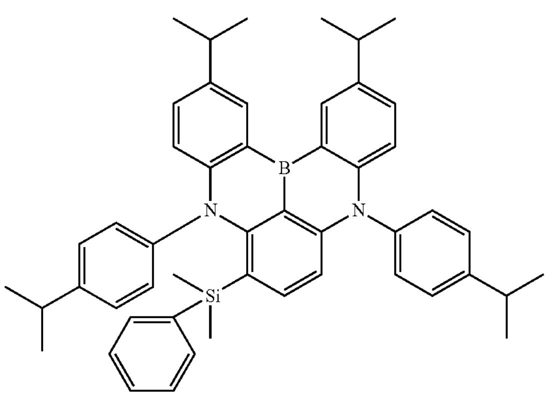
-continued
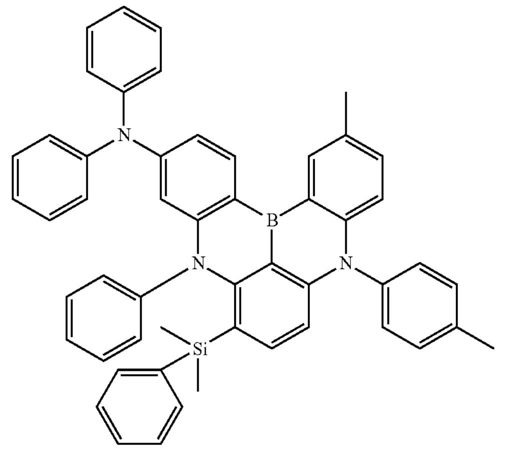
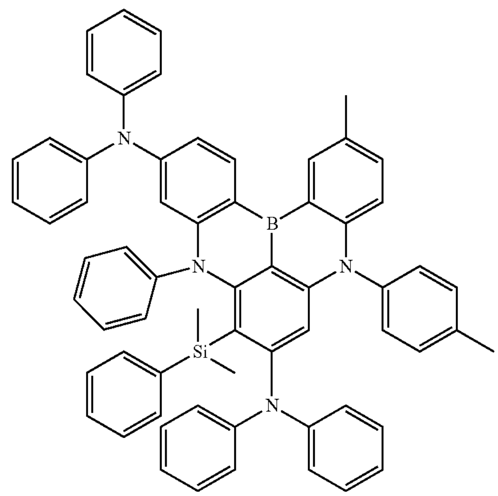
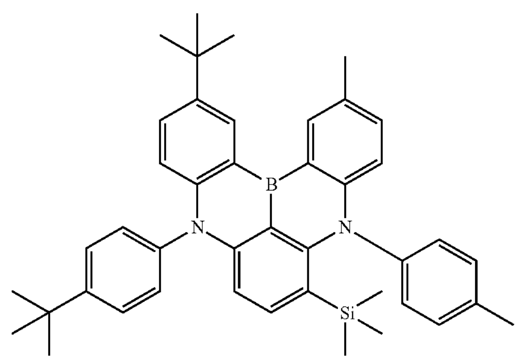
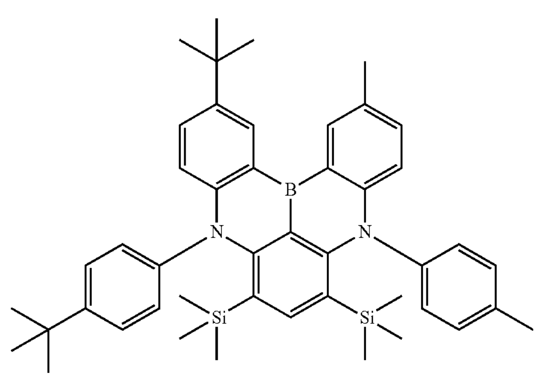

-continued
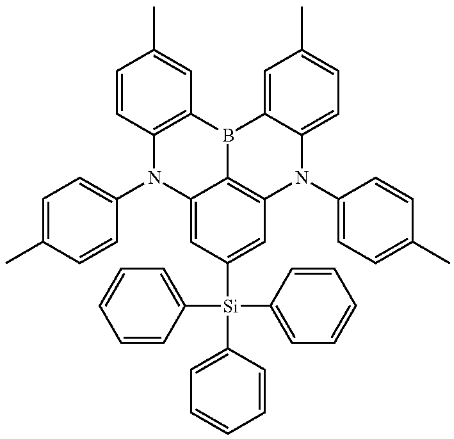
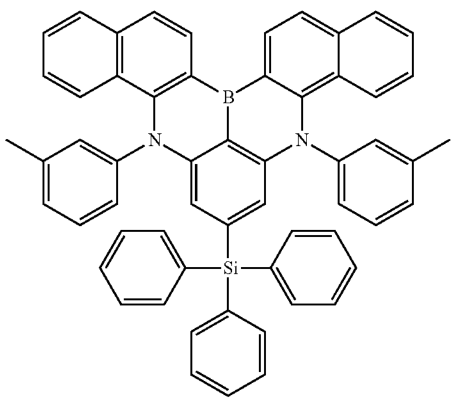
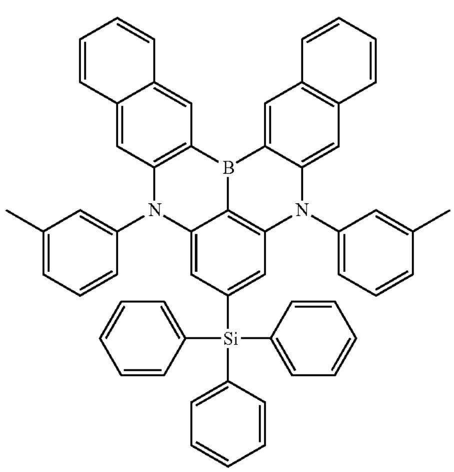
-continued
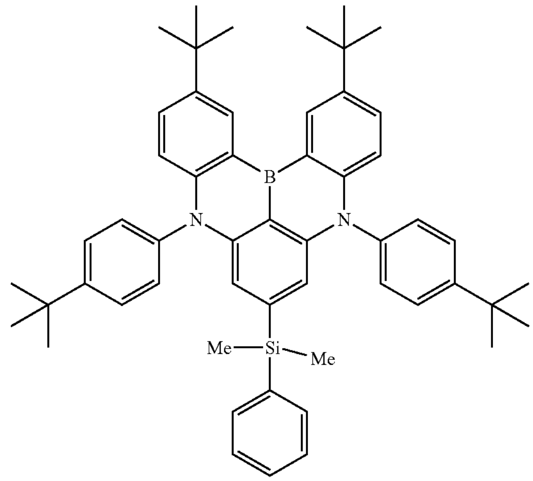
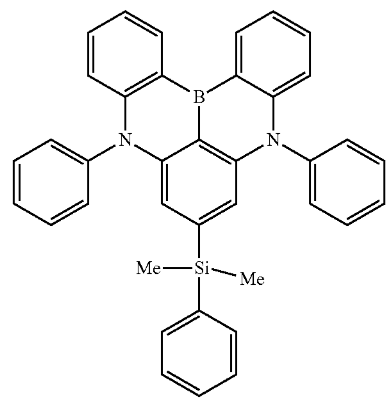
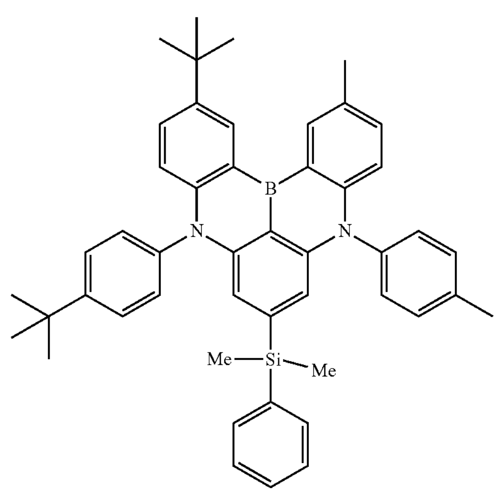

-continued
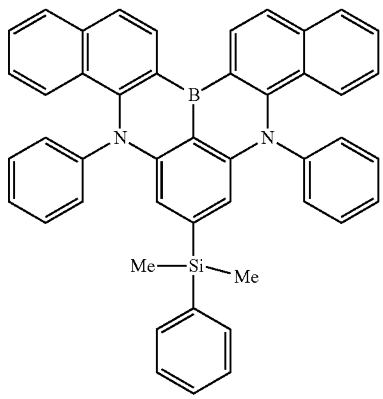
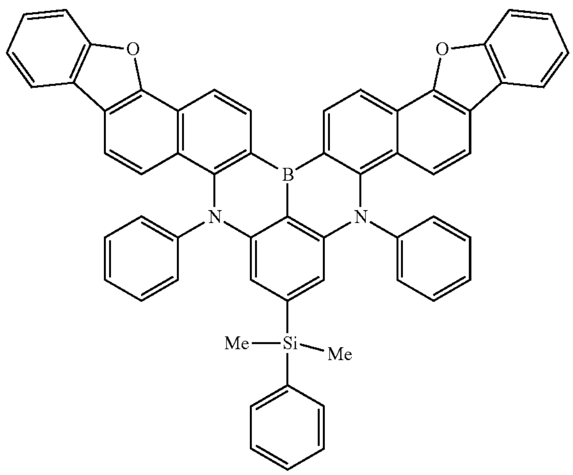
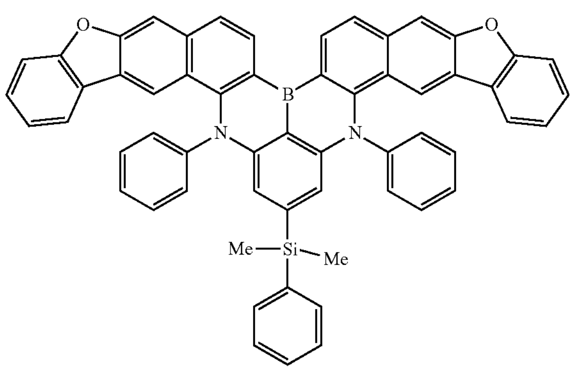
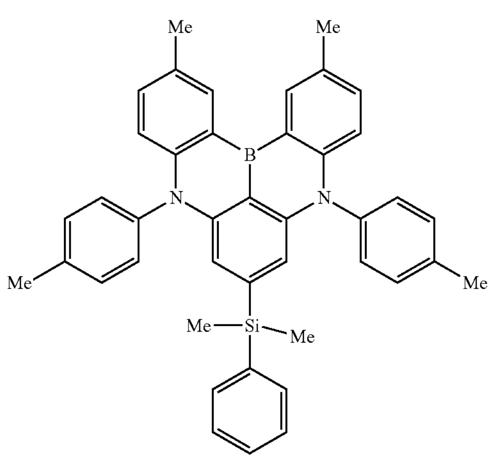
-continued
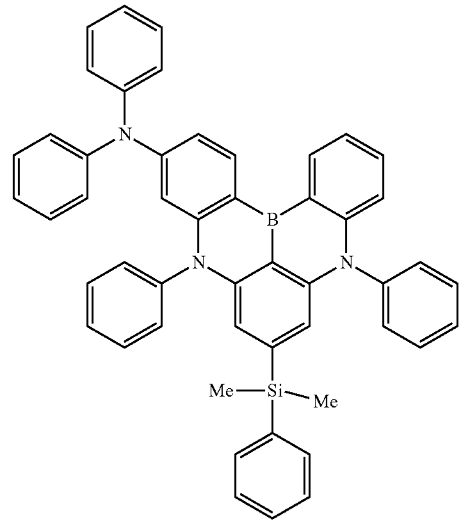
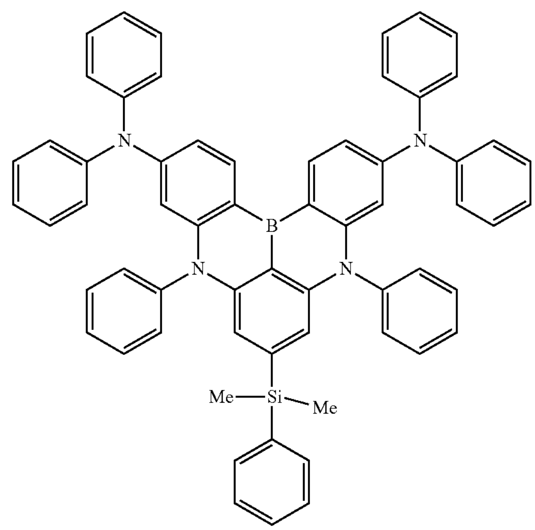
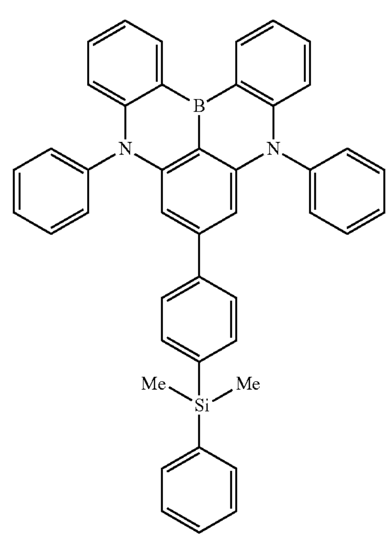

-continued
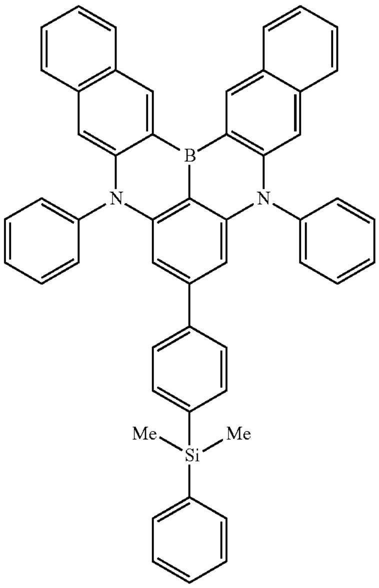
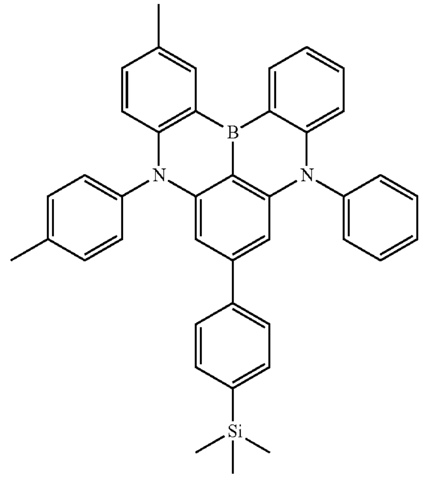
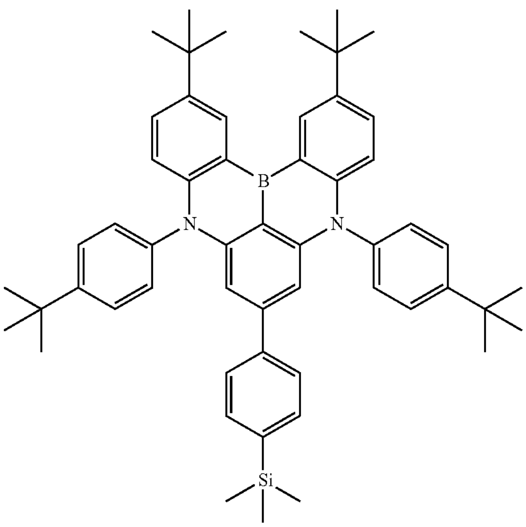
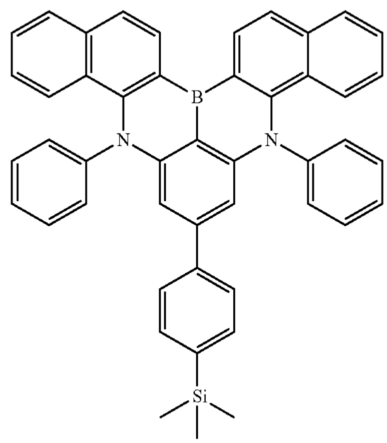
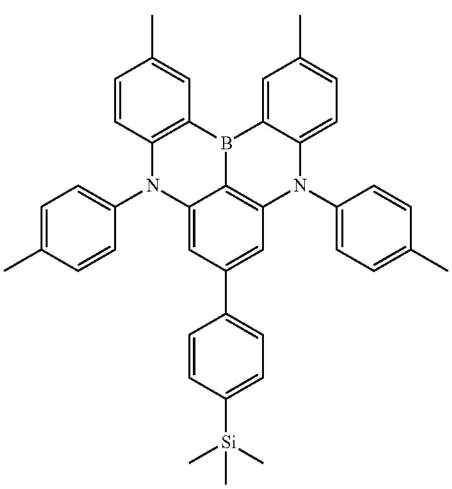
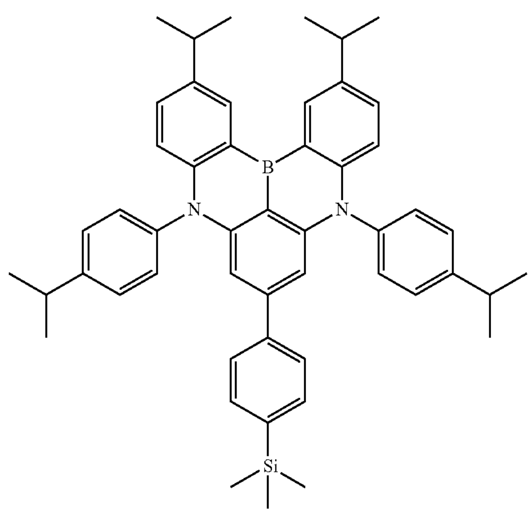

-continued
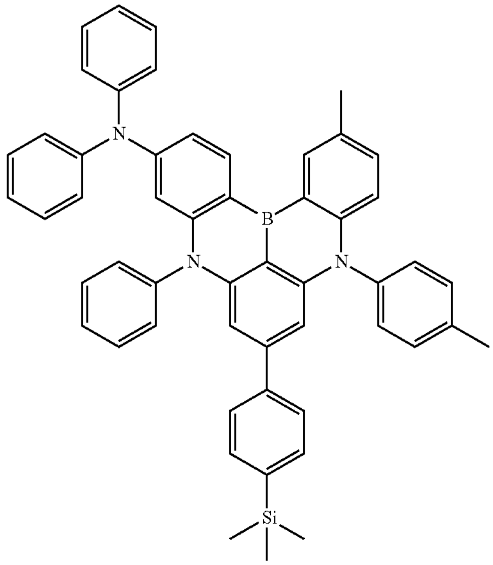
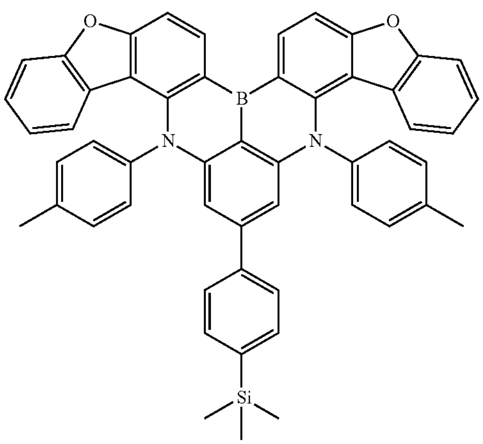
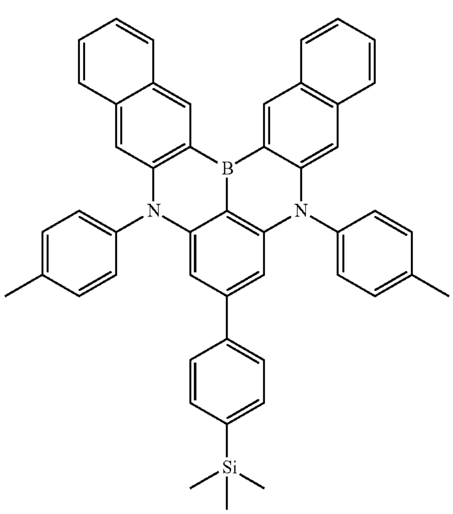
-continued
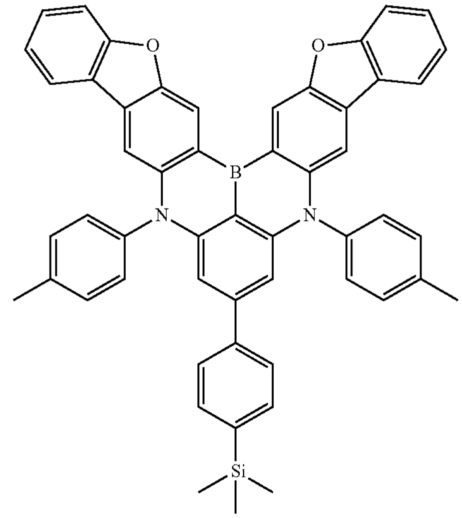
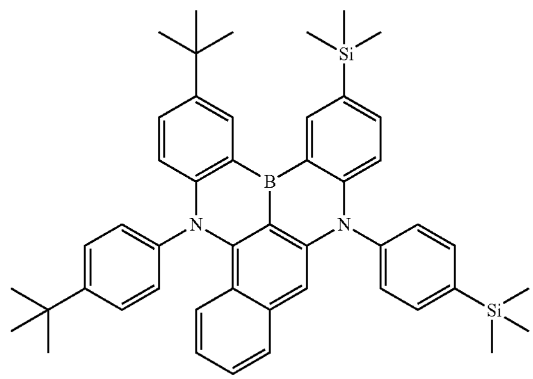
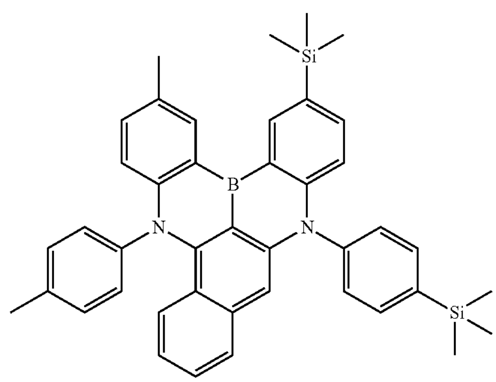
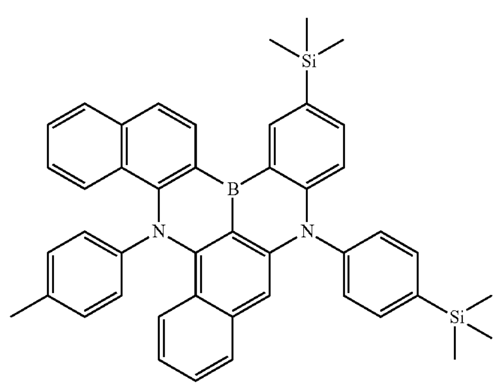

-continued
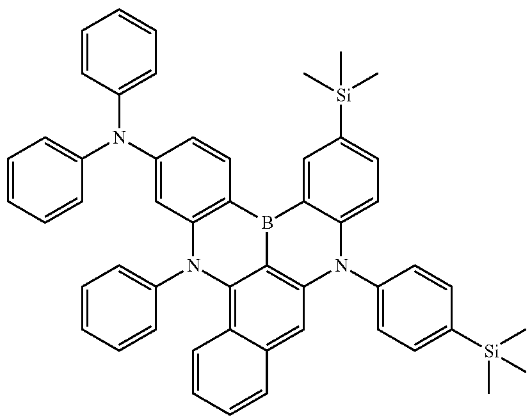
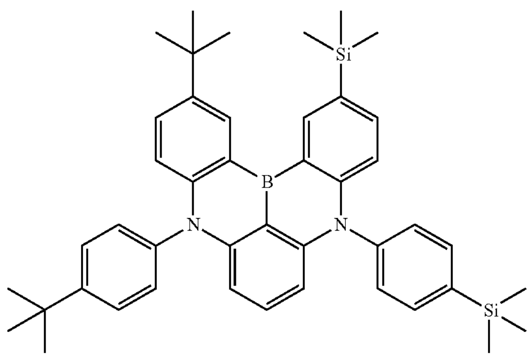
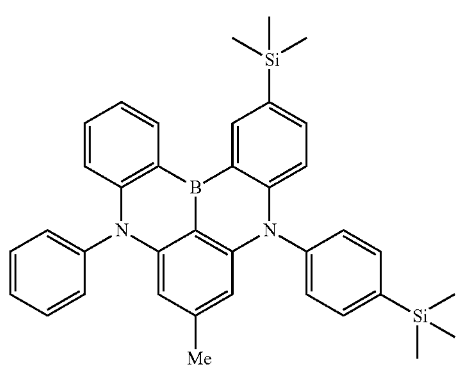
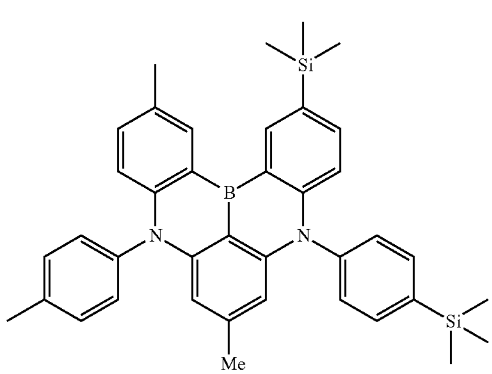
-continued
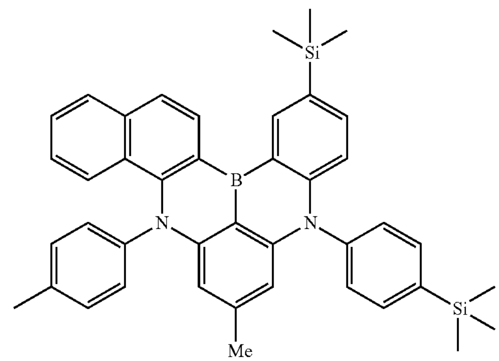
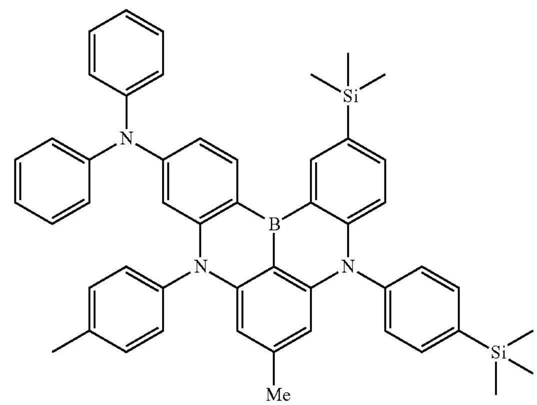
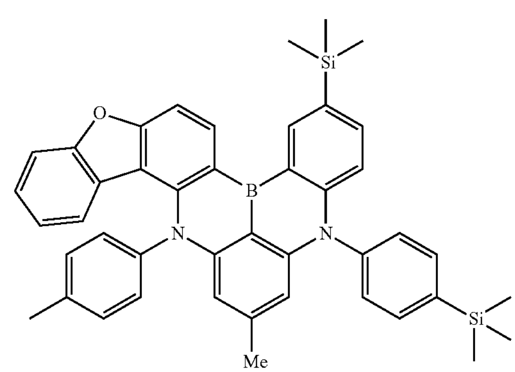
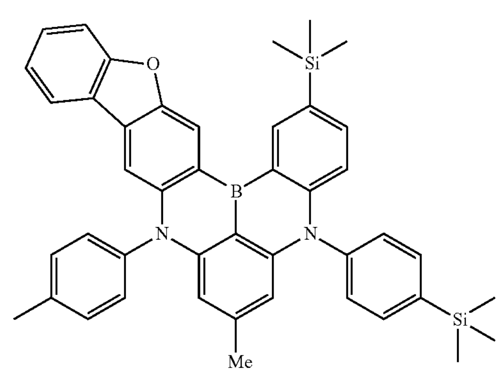

-continued
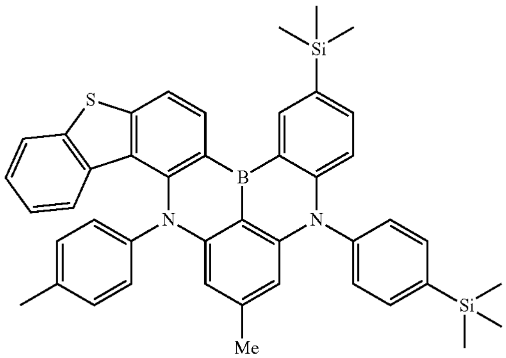
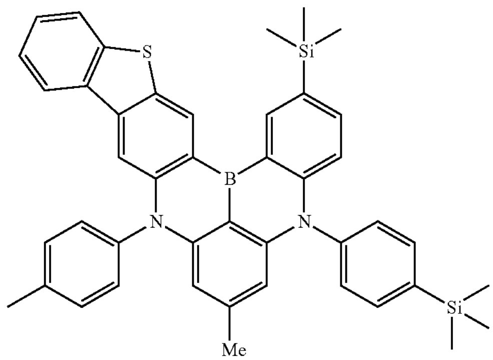
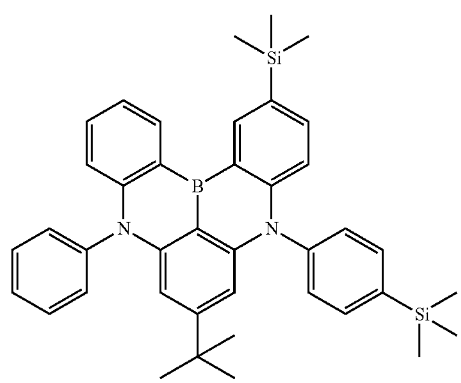
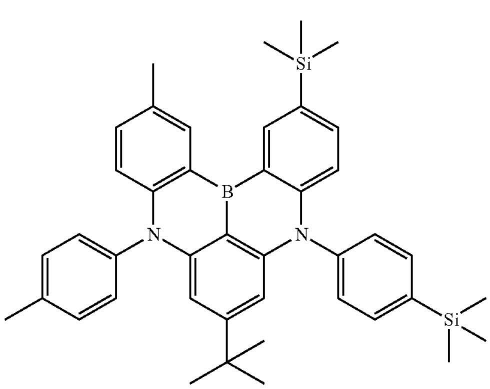
-continued
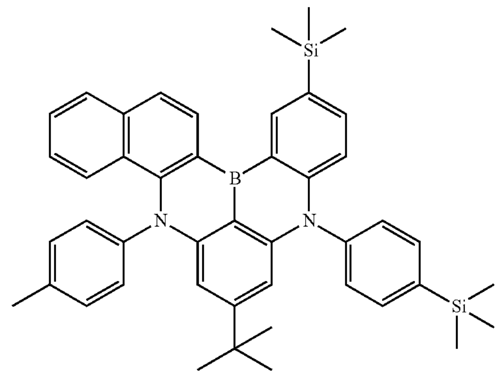
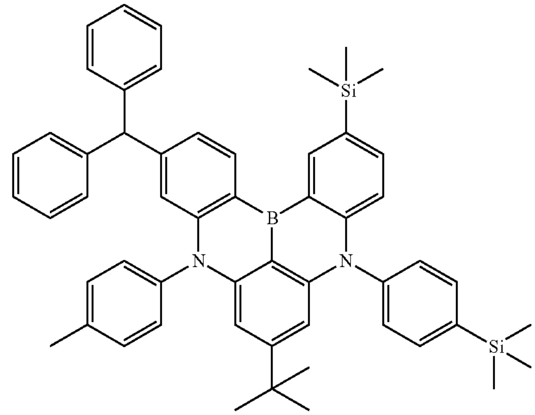
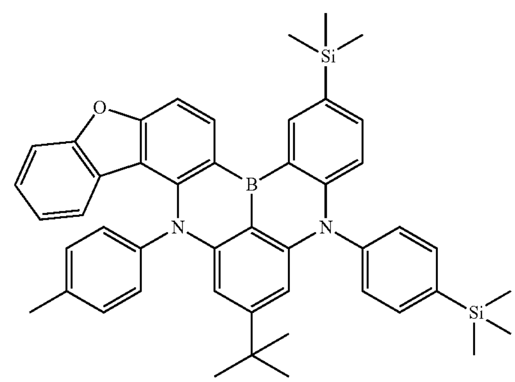
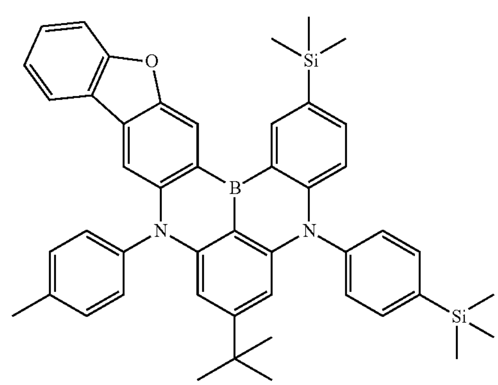

-continued
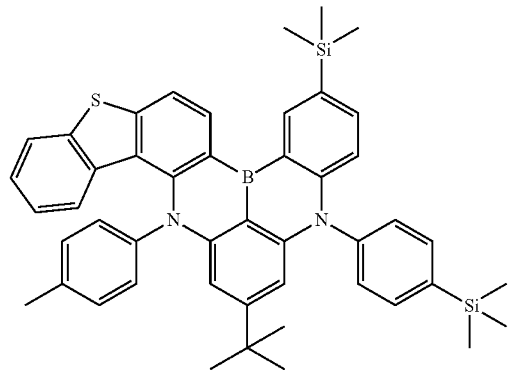
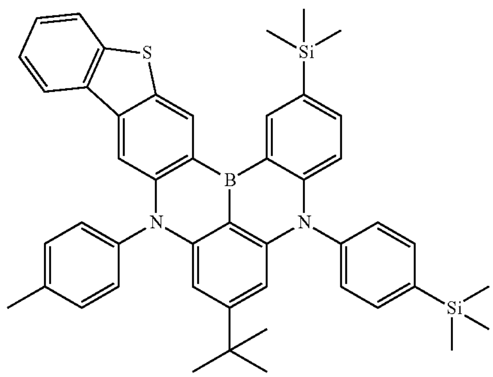
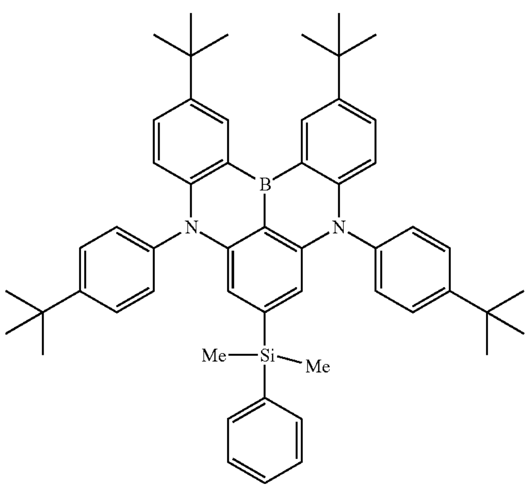 [SMILES: CC(C)(C)c1ccc(N2c3ccc(C(C)(C)C)cc3B3c4cc(C(C)(C)C)ccc4N(c4ccc(C(C)(C)C)cc4)c4cc([Si](C)(C)c5ccccc5)cc2c43)cc1]
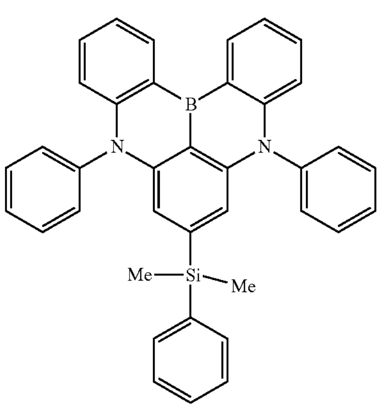
-continued
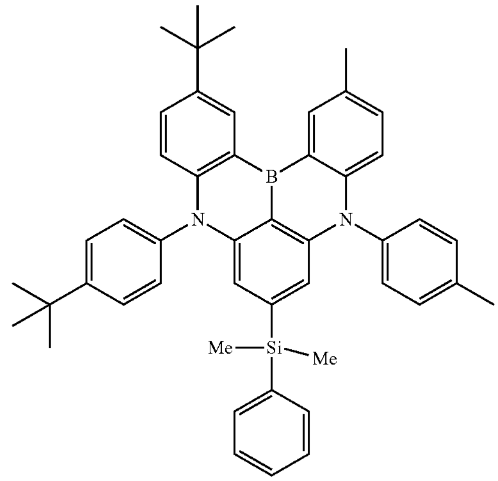
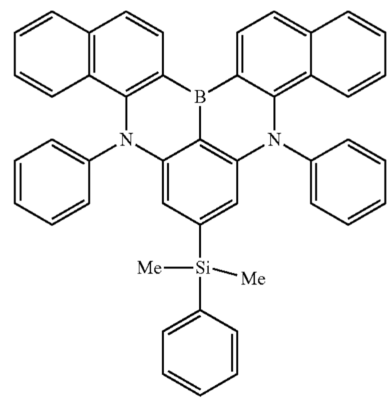
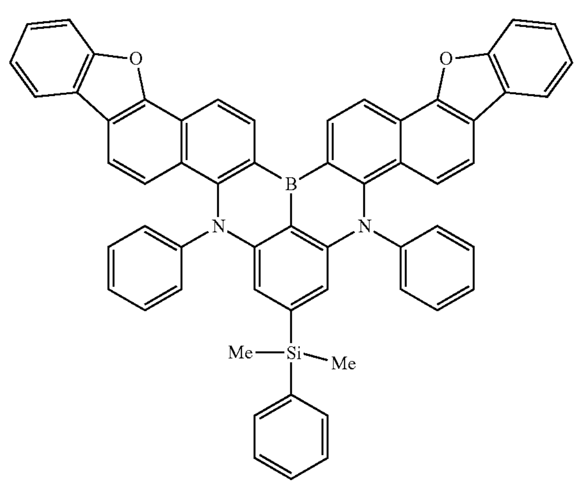

-continued
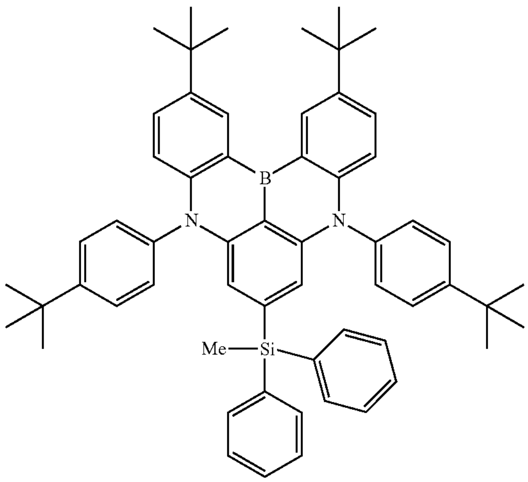 [SMILES: CC(C)(C)c1ccc(N2c3ccc(C(C)(C)C)cc3B3c4cc(C(C)(C)C)ccc4N(c4ccc(C(C)(C)C)cc4)c4cc([Si](C)(c5ccccc5)c5ccccc5)cc2c43)cc1]
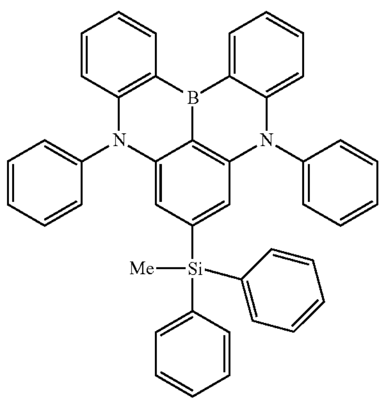
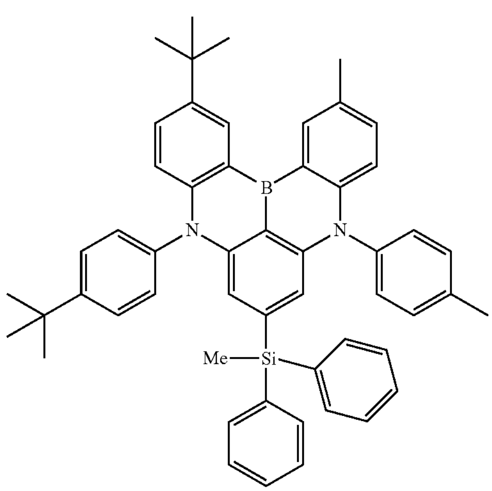
-continued
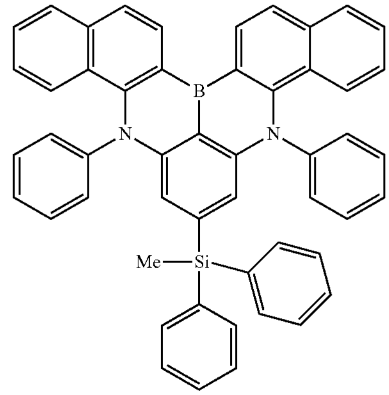
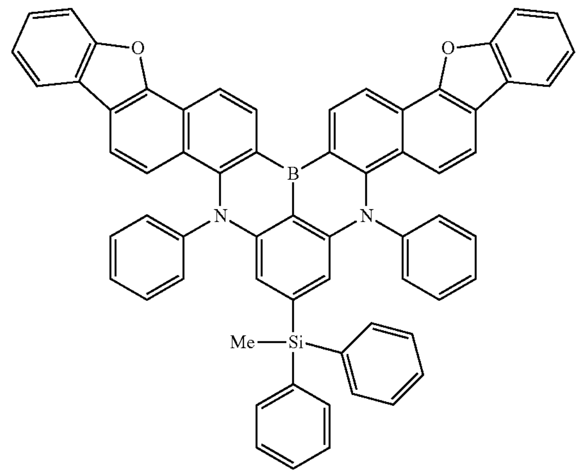
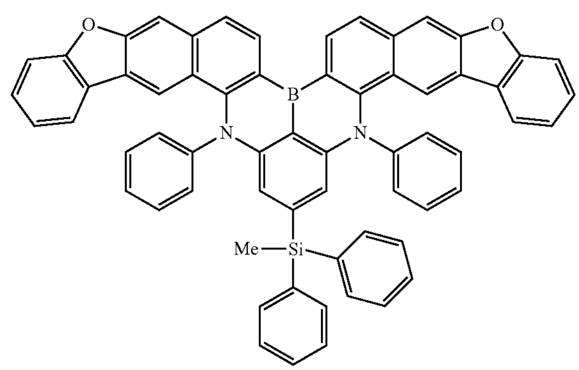
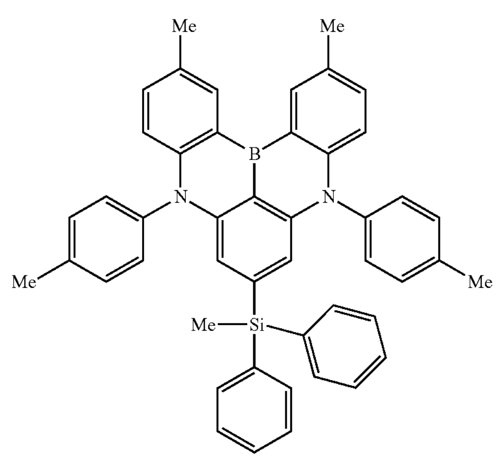

-continued
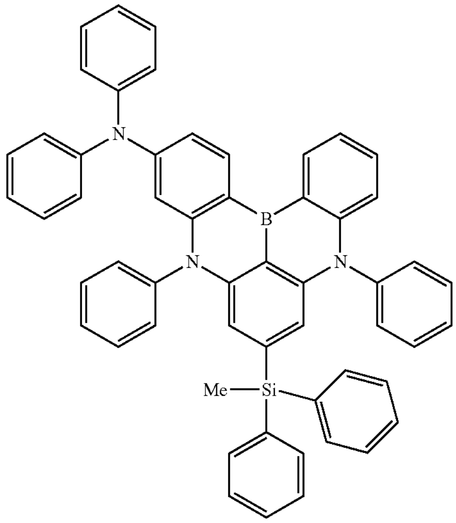
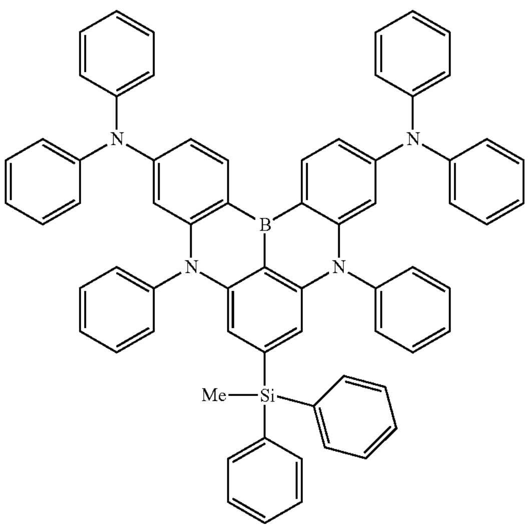
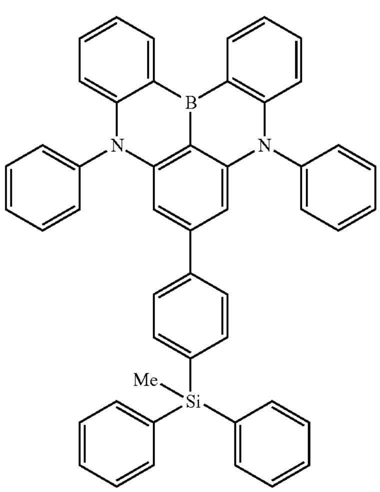
-continued
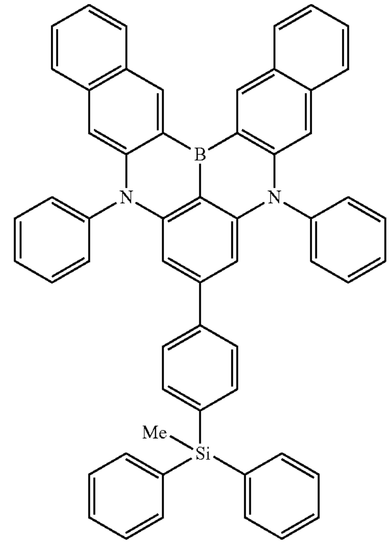
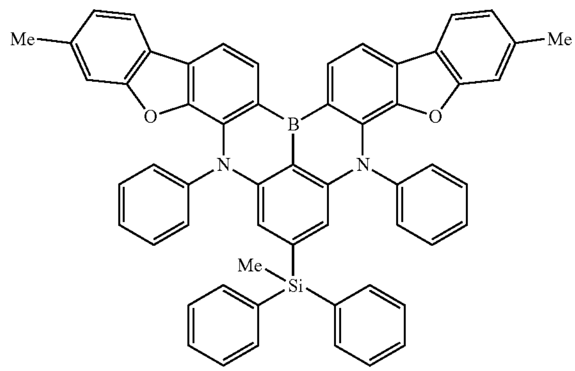
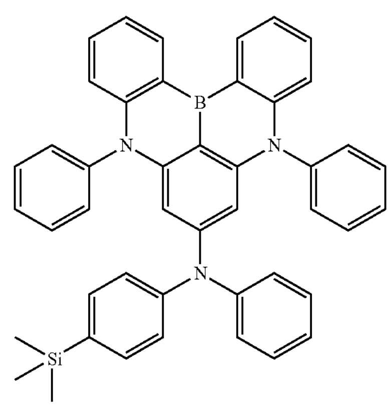

-continued
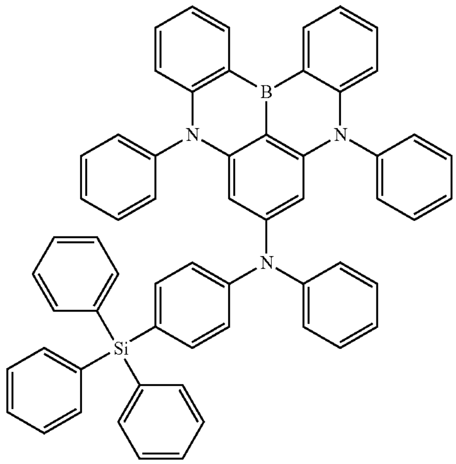
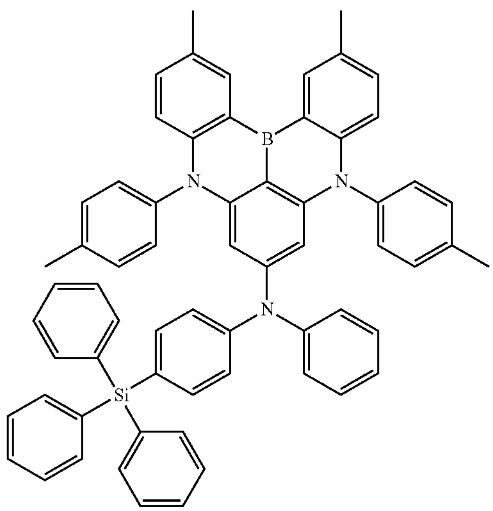
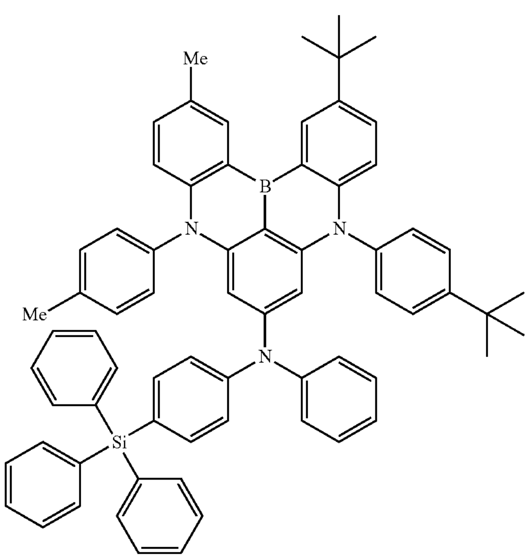
-continued
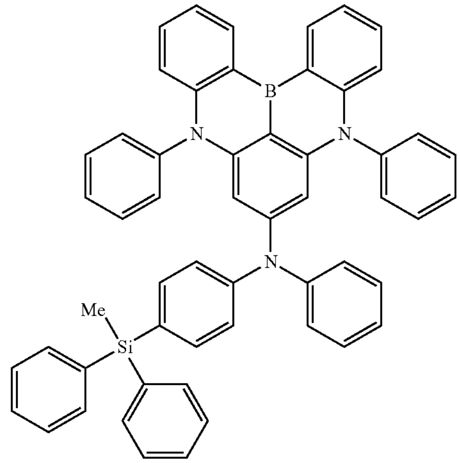
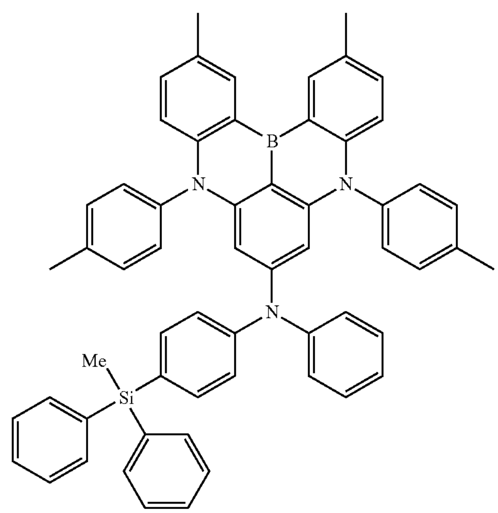
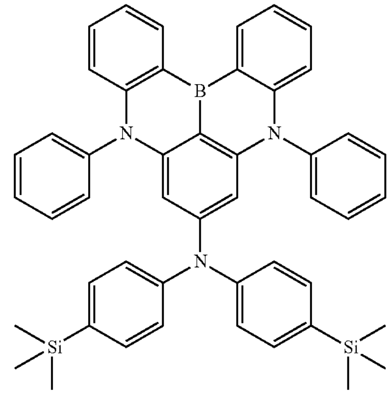

-continued

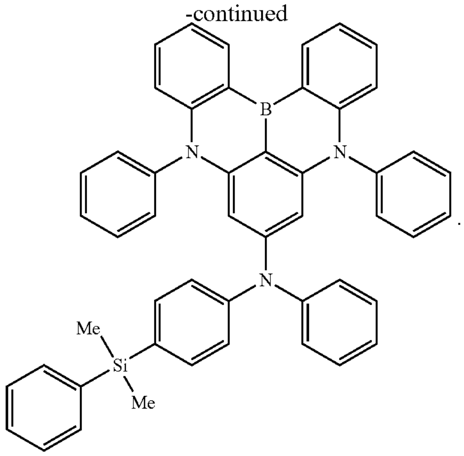

8. An organic light emitting device including: a first electrode; a second electrode provided to face the first electrode; and at least one layer of organic material layers provided between the first electrode and the second electrode, wherein the at least one layer of the organic material layers includes a compound according to claim 1.

9. The organic light emitting device of claim 8, wherein the organic material layer including the compound is a light emitting layer, and the light emitting layer is formed by a vacuum deposition method.

10. The organic light emitting device of claim 9, wherein the compound is a dopant material, and the content of the dopant material is 0.5 to 20% by weight with respect to the total material content of the light emitting layer.

11. The organic light emitting device of claim 9, wherein the light emitting layer further includes a host material, and the host material is a compound represented by the following Formula 3:

[Formula 3]

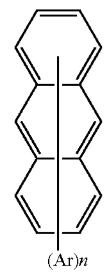

wherein, in Formula 3,

Ar is a $C_{6-20}$ aryl or a $C_{2-60}$ heteroaryl containing at least one heteroatom selected from the group consisting of N, O, and S, and n is an integer of 1 to 10.

* * * * *